(12) United States Patent
Komoto et al.

(10) Patent No.: US 6,674,097 B2
(45) Date of Patent: Jan. 6, 2004

(54) SEMICONDUCTOR LIGHT EMITTING DEVICE INCLUDING A FLUORESCENT MATERIAL

(75) Inventors: Satoshi Komoto, Suginami-Ku (JP); Koichi Nitta, Yokohama (JP); Nobuhiro Suzuki, Yokohama (JP); Kuniaki Konno, Kitakyushu (JP); Hideto Sugawara, Kawasaki (JP); Chisato Furukawa, Atsugi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/011,045

(22) Filed: Oct. 24, 2001

(65) Prior Publication Data

US 2002/0079506 A1 Jun. 27, 2002

Related U.S. Application Data

(62) Division of application No. 09/143,905, filed on Aug. 31, 1998, now Pat. No. 6,340,824.

(30) Foreign Application Priority Data

| Sep. 1, 1997 | (JP) | 9-236257 |
| Sep. 2, 1997 | (JP) | 9-237448 |
| Sep. 2, 1997 | (JP) | 9-237492 |

(51) Int. Cl.[7] ............................................. H01L 33/00
(52) U.S. Cl. ...................... 257/98; 257/99; 257/100; 257/89
(58) Field of Search .......................... 257/98, 99, 100, 257/89; 313/512

(56) References Cited

U.S. PATENT DOCUMENTS

| 5,825,052 A | | 10/1998 | Shakuda | 257/103 |
| 5,962,971 A | * | 10/1999 | Chen | 313/512 |
| 5,998,925 A | * | 12/1999 | Shimizu et al. | 313/503 |
| 6,057,562 A | * | 5/2000 | Lee et al. | 257/98 |
| 6,340,824 B1 | * | 1/2002 | Komoto et al. | 257/100 |
| 2001/0000622 A1 | * | 5/2001 | Reeh et al. | 257/98 |

FOREIGN PATENT DOCUMENTS

| JP | 5291621 | 5/1993 | H01L/33/00 |
| JP | 07-193281 | 7/1995 | |
| JP | 07-193282 | 7/1995 | |
| JP | 07-099345 | 11/1995 | |
| JP | 08-007614 | 12/1996 | |
| JP | 52-009334 | 1/1997 | |
| JP | 09-153645 | 10/1997 | |
| JP | 2001-015860 | 1/2001 | |
| WO | WO-97/48138 | 12/1997 | |

OTHER PUBLICATIONS

Hiroshi Amano, et al.; "P–Type Conduction in Mg–Doped GaN Treated with Low–Energy Electron Beam Irradiation (LEEBI);" *Japanese Journal of Applied Physics*, vol. 28, No. 12, pp. L2112–L2114, Dec. 1989.

Shuji Nakamura, et al.; "P–GaN/N–InGaN/N–GaN Double Heterostructure Blue–Light–Emitting Diodes;" *Japanese Journal of Applied Physics*, vol. 32 (1993), Part 2, No. 1A/B, 15, pp. L8–L11, Jan. 15, 1993.

\* cited by examiner

Primary Examiner—Minh Loan Tran
(74) Attorney, Agent, or Firm—Hogan & Hartson, LLP

(57) ABSTRACT

A light emitting device or image display includes a fluorescent material as a wavelength converter for converting a wavelength into another. The fluorescent material is disposed in a predetermined positional relation, to prevent external leakage of primary light and to extract secondary light made by wavelength-converting the primary light with a very high efficiency. By using a semiconductor light emitting element for ultraviolet emission and combining it with a fluorescent material or any other appropriate material having a wavelength converting function, various kinds of applications, such as illuminator, having a remarkably long-life light source can be made. The semiconductor light emitting element preferably has a emission wavelength near 330 nm, and preferably uses BGaN in its light emitting layer.

20 Claims, 87 Drawing Sheets

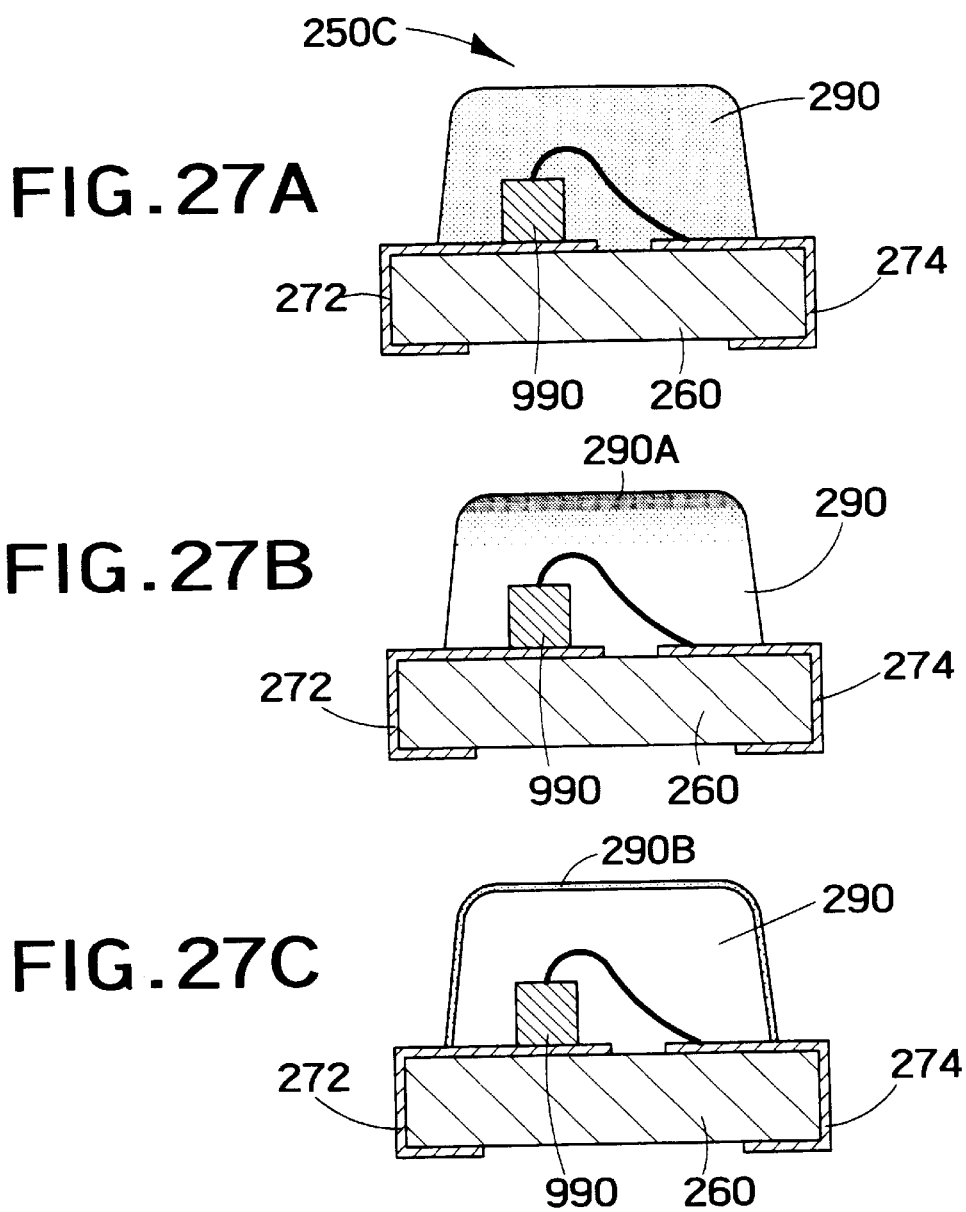

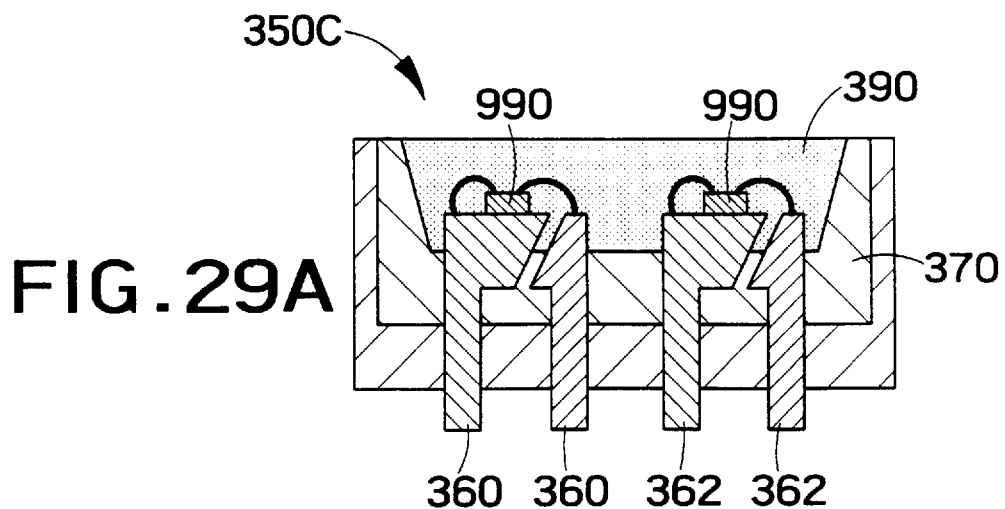
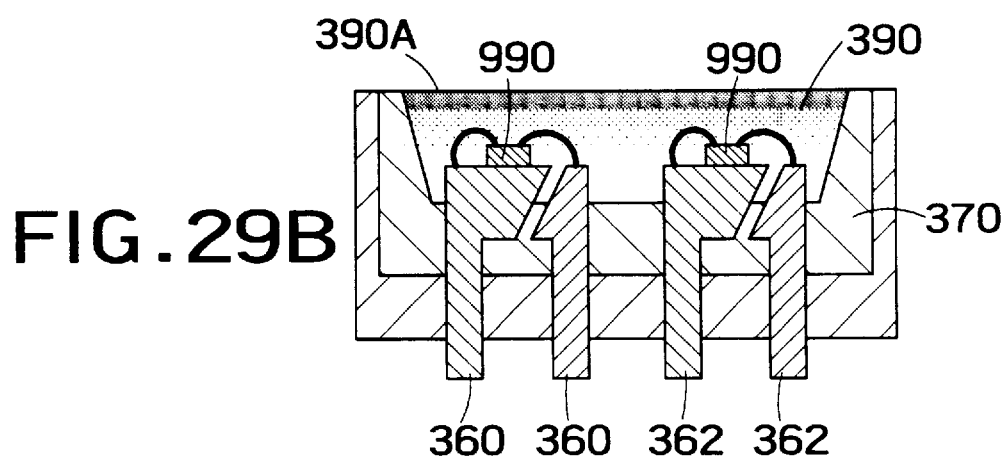
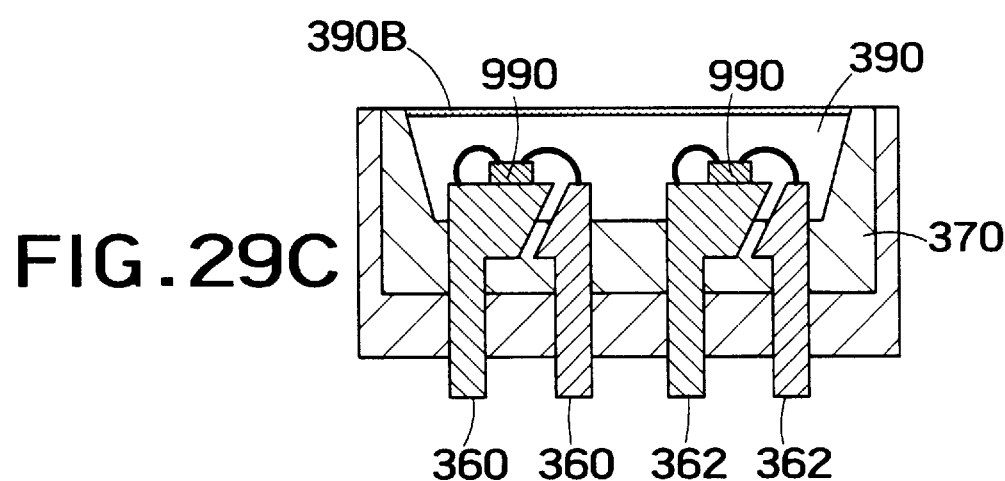

SEMICONDUCTOR LIGHT EMITTING DEVICE INCLUDING A FLUORESCENT MATERIAL

This is a divisional of application Ser. No. 09/143,905 filed Aug. 31, 1998, now U.S. Pat. No. 6,340,824 which application is hereby incorporated by reference in its entirety.

BACKGROUND OF THE INVENTION

This invention relates to a semiconductor light emitting element, semiconductor light emitting device, image display device, and so on. More specifically, the invention relates to a semiconductor light emitting element, semiconductor light emitting device, image display device, and any other elements and devices configured to prevent external leakage of primary light emitted from a light emitting layer and to thereby waveform-convert it into secondary light and extract it with a remarkably high efficiency.

Semiconductor light emitting elements and various types of semiconductor light emitting devices using same have various advantages, such as compactness, low power consumption and high reliability, and are used in progressively wider applications, such as indoor and outdoor display panels, railway and traffic signals, car-borne signal illuminators, which are required to be highly luminous and highly reliable.

Among these semiconductor light emitting elements, those using gallium nitride compound semiconductors are being remarked recently. Gallium nitride compound semiconductors are direct-transitional III-V compound semiconductors which can efficiently emit light in relatively short wavelength ranges.

Throughout the present application, the "gallium nitride compound semiconductor" pertain to III–V compound semiconductors expressed by $B_xIn_yAl_zGa_{(1-x-y-z)}N$ ($0 \leq x \leq 1$, $0 \leq y \leq 1$, $0 \leq z \leq 1$) and to any mixed crystal which includes phosphorus (P) or arsenic (As), for example, as group V species in addition to N in the above-mentioned chemical formula.

Gallium nitride compound semiconductors are remarked as hopeful materials of LEDs (light emitting diodes) and semiconductor lasers because the band gap can be changed from 1.89 to 6.2 eV by controlling the mole fractions x, y and z in the above-mentioned chemical formula. If highly luminous emission is realized in short wavelength ranges of blue and ultraviolet, the recording capacities of all kinds of optical discs may be doubled, and full color images will be realized on display devices. Under such and other prospects, short wavelength light emitting elements using gallium nitride compound semiconductors are under rapid developments toward improvements in their initial characteristics and reliability.

Structures of conventional light emitting elements using gallium nitride compound semiconductors are disclosed in, for example, Jpn. J. Appl. Phys., 28 (1989) p.L2112; Jpn. J. Appl. Phys., 32(1993) p.L8; and Japanese Patent Laid-Open Publication No. 5-291621.

FIG. 141 is a cross-sectional view schematically showing a conventional semiconductor light emitting element. The semiconductor light emitting element 6100 shown here is a gallium nitride semiconductor light emitting element. The light emitting element 6100 has a multi-layered structure of semiconductors stacked on a sapphire substrate 6120, namely, a buffer layer 6140, n-type contact layer 6160, n-type cladding layer 6118, light emitting layer 6120, p-type cladding layer 6122 and p-type contact layer 6124 which are stacked in this order on the sapphire substrate 6120.

The buffer layer 6140 may be made of n-type GaN, for example. The n-type contact layer 6160 has a high n-type carrier concentration to ensure ohmic contact myth the n-side electrode 6134, and its material may be GaN, for example. The n-type cladding layer 6118 and the p-type cladding layer 6122 function to confine carriers within the light emitting layer 6120, and their refractive index must be lower than that of the light emitting layer 6120. The light emitting layer 6120 is a layer in which emission occurs due to recombination of electric charges injected as a current into the light emitting element.

The light emitting layer 6120 may be made of undoped InGaN, for example, and the cladding layers 6118 and 6122 may be made of AlGaN having a larger band gap than the light emitting layer 6120. The p-type contact layer 6124 has a high p-type carrier concentration to ensure ohmic contact with the p-side electrode 6126, and its material may be GaN, for example.

Stacked on the p-type contact layer 6124 is the p-side electrode 6126 which is transparent to the emitted light. Stacked on the n-type contact layer 6160 is the n-side electrode 6134. Bonding pads 6132 of Au are stacked on these electrodes, respectively, so that wires (not shown) for supplying a operating current to the-element be bonded. The surface of the element is covered by the protective films 6130 and 6145 of silicon oxide, for example.

The conventional light emitting element 6100 is so configured that light emitted from the light emitting layer be directly extracted externally, and involved the problems indicated below.

One of the problems lies in variable emission wavelengths caused by structural varieties of light emitting elements. That is, semiconductor light emitting elements, even when manufactured under the same conditions, are liable to vary in quantity of impurities and in thicknesses of respective layers, which results in variety in emission wavelength.

Another problem lies in changes in emission wavelength depending upon the operating current. That is, emission wavelength of a semiconductor light emitting element may change depending upon the quantity of electric current supplied thereto, and it was difficult to control the emission luminance and emission wavelength independently.

Another problem lies in changes in emission wavelength depending upon the temperature. That is, when the temperature of a semiconductor light emitting element, particularly of its light emitting layer, changes, the effective band gap of the light emitting layer also changes, and causes an instability of the emission wavelength.

As explained above, in conventional semiconductor light emitting elements, it was difficult to entirely control varieties in structure, temperature and electric current and to thereby limit changes in emission wavelength within a predetermined range, such as several nm (nanometers).

Conventional semiconductor light emitting devices involved an additional problem, namely, materials and structures of semiconductor light emitting elements used therein had to be determined and changed appropriately in accordance with desired emission wavelengths, such as selecting AlGaAs materials for emission of red light, GaAsP or InGaAlP materials for yellow light, GaP or InGaAlP materials for green light and InGaN materials for blue light.

SUMMARY OF THE INVENTION

It is therefore an object of the invention to provide a semiconductor light emitting element and a semiconductor light emitting device which are highly stable in emission wavelength and can wavelength-convert light with a high conversion efficiency in a wide wavelength range from visible light to infrared band.

According to the first aspect of the invention, there is provided a semiconductor light emitting element and a light emitting device comprising a wavelength converter located adjacent to a light extraction end of the light emitting layer to absorb the primary light emitted from the light emitting layer and to release secondary light of a second wavelength different from the first wavelength.

The first aspect of the present invention is embodied in the above-mentioned mode, and attains the effects explained below.

Light from the light emitting layer is not extracted directly but converted in wavelength by a fluorescent material. Therefore, it is prevented that the emission wavelength varies with varieties of manufacturing parameters of the semiconductor light emitting elements, drive current, temperature and other inevitable factors. That is, the invention realizes remarkable stability of emission wavelengths and makes it possible to control the emission luminance and the emission wavelength independently.

The fluorescent material may include a plurality of different materials to obtain a plurality of different emission wavelengths. For example, by appropriately mixing different fluorescent materials for red (R), green (G) and blue (B) to form the fluorescent material in each light emitting element, emission of white light can be obtained easily.

The material and the structure of the semiconductor light emitting elements used in a device need not be changed depending on the desired emission wavelength of the device. That is, in conventional techniques, optimum materials had to be selected to form semiconductor light emitting elements in accordance with desired emission wavelengths, such as selecting AlGaAs materials for emission of red light, GaP materials for yellow light, InGaAlP materials for green light and InGaN materials for blue light. However, according to the invention, it is sufficient to select appropriate fluorescent materials, and the material of the semiconductor light emitting element need not be changed.

Even when a device needs an arrangement of a plurality of semiconductor light emitting elements having different emission colors, such elements for different emission colors can be made only by changing the material of the fluorescent member, and all of the semiconductor light emitting elements may be common in materials and structure. This contributes to simplification of the structure of the light emitting device, remarkable reduction of the manufacturing cost and higher reliability. Additionally, by uniforming the drive current, supplied voltage or the size of the elements, its application can be extended remarkably.

According to the second aspect of the invention, there is provided a semiconductor light emitting element, a light emitting device and a image display device comprising a light emitting layer for emitting primary light of a first wavelength, a wavelength converter located adjacent to a light extraction end of the light emitting layer to absorb the primary light emitted from the light emitting layer and to release secondary light of a second wavelength different from the first wavelength, and a first optical reflector located adjacent to a light release end of the wavelength converter and having a lower reflectance for the secondary light released from the wavelength converter and a higher reflectance for the primary light passing through the wavelength converter.

Since the optical reflector RE1 is provided, the primary light having leaked through the wavelength converter FL can be reflected with a high efficiency and can be returned back to the wavelength converter FL. The primary light returned back in this manner is wavelength-converted by the wavelength converter FL, and passes through the optical reflector RE1 as secondary light. That is, the optical reflector RE1 located adjacent to the emission end of the wavelength converter FL prevents leakage of primary light by returning part of the primary light passing through the wavelength converter FL back to it for wavelength conversion thereby. Therefore, the primary light can be wavelength-converted with a high efficiency. Additionally, the wavelength converter FL is prevented from being exited by outer turbulent light and from emitting undesired light.

The semiconductor light emitting element may include an optical absorber AB. In this case, the optical absorber absorbs primary light passing through the optical reflector RE1 and prevents external leakage thereof. The light absorber AB also functions to adjust the spectrum of the extracted light and to improve the chromatic pureness. Additionally, since the light absorber AB absorbs ultraviolet rays entering from the exterior, it is prevented that such external turbulent light undesirably excites the wavelength converter FL and causes undesired emission.

The semiconductor light emitting element may further include a reflector RE2 to reflect primary light back into the wavelength converter FL. As a result, primary light can be wavelength-converted and extracted with a higher efficiency.

The semiconductor light emitting element may further includes an optical reflector RE3 for greater improvement of the wavelength conversion efficiency. In this case, not only the primary light but also the secondary light or any other optical component different in wavelength from the primary light can be prevented from external leakage. The optical reflector RE3 has a limitative aperture so that light can exit only through the aperture. By decreasing the size of the aperture, a light emitting element as a point-sized light source can be made easily. Such a point-sized light source enables effective collection of light by lenses or other optical elements, and it is therefore practically advantageous in most cases.

The semiconductor light emitting element may further include an optical reflector RE4 to more efficiently extract secondary light by reflecting it after wavelength conversion by the wavelength converter FL.

According to the invention, it is also possible to realize an image display device with a low power consumption, long life, high reliability, quick rising and good mechanical reliability.

As explained above, the invention provides a semiconductor light emitting element, semiconductor light emitting device and image display device which are simple in structure, stable in emission wavelength, excellent in emission efficiency, and capable of highly luminous emission in a wide wavelength range from visible light to infrared bands, and the invention promises great industrial contribution.

Moreover, the invention can provide various applications of the semiconductor light emitting element or device, such as illuminators, which are more efficient, lower in power consumption and longer in life than conventional fluorescent lamps and bulbs.

The illuminator according to the invention comprises: a semiconductor light emitting element for emitting ultraviolet rays; and a fluorescent element for absorbing said ultraviolet rays emitted from said semiconductor light emitting element and for releasing secondary light having a longer wavelength than said ultraviolet rays.

Said semiconductor light emitting element preferably contains gallium nitride compound semiconductor in a light emitting layer thereof.

Preferably, said secondary light is substantially a visible light.

Preferably, a predetermined number of said semiconductor light emitting elements are serially connected to form a unit, and a plurality of said units are connected in parallel.

The illuminator preferably further comprises a converter circuit for converting a high frequency voltage into a d.c voltage so that said semiconductor light emitting elements be driven when connected to a power source of a fluorescent lamp.

The illuminator preferably further comprises a first optical reflection film located between said semiconductor light emitting element and said fluorescent element, and having a wavelength selectivity to pass said ultraviolet rays and to reflect said secondary light released from said fluorescent element.

The illuminator preferably further comprises a second optical reflection film located on one side of said fluorescent element opposite from said semiconductor light emitting element, and having a wavelength selectivity to reflect said ultraviolet rays and to pass said secondary light released from said fluorescent element.

The illuminator preferably further comprises a light absorber located on one side of said fluorescent element opposite from said semiconductor light emitting element, and having a wavelength selectivity to absorb said ultraviolet rays and to pass said secondary light released from said fluorescent element.

The illuminator preferably comprises a firing board; light emitting devices supported on said wiring board; and a translucent outer shell encapsulating said wiring board, each said semiconductor light emitting device including: said semiconductor light emitting element; and said fluorescent element.

The illuminator preferably comprises a wiring board; a plurality of semiconductor light emitting elements supported on said wiring boards; and a translucent outer shell encapsulating said wiring board, said outer shell having a fluorescent element on the inner wall surface thereof.

The illuminator preferably further comprises a pulse generator for supplying a pulsating operating current to said semiconductor light emitting element.

The illuminator preferably further comprises a concave mirror for reflecting said visible light to orient it in a predetermined direction.

Preferably, the emission wavelength of said semiconductor light emitting element is approximately 330 nm.

A read-out device according to the invention comprises: a semiconductor light emitting element for emitting ultraviolet rays; a fluorescent element for absorbing said ultraviolet rays emitted from said semiconductor light emitting element and for releasing light having a longer wavelength than said ultraviolet rays; and a photodetector for detecting said light with the longer wavelength reflected in the exterior, said light emitted released from said fluorescent element being irradiated onto a manuscript to read out information therefrom.

Preferably, said semiconductor light emitting element contains a gallium nitride compound semiconductor in a light emitting layer thereof.

A projector according to the invention for projecting a profile on a translucent medium in an enlarged scale, comprises: a semiconductor light emitting element for emitting ultraviolet rays; a fluorescent element for absorbing said ultraviolet rays emitted from said semiconductor light emitting element and for releasing visible light; and an optical system for collecting said visible light to direct it onto a screen.

Preferably, said semiconductor light emitting element contains a gallium nitride compound semiconductor in a light emitting layer thereof.

A purifier according to the invention comprises: a purifying circuit for passing a liquid or a as therethrough; and a semiconductor light emitting element located along said purifying circuit to emit ultraviolet rays.

Preferably, said semiconductor light emitting element contains a gallium nitride compound semiconductor in a light emitting layer thereof.

The purifier preferably further comprises an ozone generator along said purifying circuit so that said ultraviolet rays are irradiated to a liquid containing ozone generated by said ozone generator.

The purifier preferably further comprises a heater along said purifying circuit a gas purified by said purifying circuit be discharged after being heated.

Preferably the emission wavelength of said semiconductor light emitting element is approximately 330 nm.

A display device according to the invention comprises: a semiconductor light emitting element for releasing ultraviolet rays; and a display panel having stacked a fluorescent element for absorbing said ultraviolet rays released from said semiconductor light emitting element and for releasing visible light.

Preferably, said semiconductor light emitting element contains a gallium nitride compound semiconductor in a light emitting layer thereof.

Illuminators according to the invention have high mechanical strengths against impulses or vibrations.

Light from the light emitting layer is not extracted directly but converted in wavelength by a fluorescent material. Therefore, it is prevented that the emission wavelength varies with varieties of manufacturing parameters of the semiconductor light emitting elements, drive current, temperature and other inevitable factors. That is, the invention realizes remarkable stability of emission wavelengths and makes it possible to control the emission luminance and the emission wavelength independently.

The fluorescent material may include a plurality of different materials to obtain a plurality of different emission wavelengths. For example, by appropriately mixing different fluorescent materials for red (R), green (G) and blue (B) to form the fluorescent material in each light emitting element, emission of white light can be obtained easily.

The light emitting layer may be made of GaN containing boron. In this case, ultraviolet rays near 330 nm which efficiently excites the fluorescent member can be obtained and enhanced.

Efficiency of the wavelength conversion can be enhanced to more effectively extract the secondary light by reflecting and confining ultraviolet rays emitted from the semiconductor light emitting element and by reflecting and externally guiding the secondary light emitted from the fluorescent member.

The material and the structure of the semiconductor light emitting elements used in a device need not be changed depending on the desired emission wavelength of the device. That is, in conventional techniques, optimum materials had to be selected to form semiconductor light emitting elements in accordance with desired emission wavelengths, such as selecting AlGaAs materials for emission of red light, GaAsP materials for yellow light, InGaAlP or GaP materials for green light and InGaN materials for blue light. However, according to the invention, it is sufficient to select appropriate fluorescent materials, and the material of the semiconductor light emitting element need not be chanced.

Even when a device needs an arrangement of a plurality of semiconductor light emitting elements having different emission colors, such elements for different emission colors can be made only by changing the material of the fluorescent member, and all of the semiconductor light emitting elements may be common in materials and structure. This contributes to simplification of the structure of the light emitting device, remarkable reduction of the manufacturing cost and higher reliability. Additionally, by uniforming the drive current, supplied voltage or the size of the elements, its application can be extended remarkably.

As explained above, the invention provides an illuminator and other various kind of applications which are simple in structure, stable in emission wavelength, and capable of highly luminous emission in a wide wavelength range from visible light to infrared bands, and the invention promises great industrial contribution.

BRIEF DESCRIPTION OF THE DRAWINGS

The present invention will be understood more fully from the detailed description given hereinbelow and from the accompanying drawings of the preferred embodiments of the invention. However, the drawings are not intended to imply limitation of the invention to a specific embodiment, but are for explanation and understanding only.

In the drawings:

FIG. 10A is a perspective view and FIG. 10B is a partially enlarged perspective view in a partially see-through mode, and the substrate type includes a cavity type as shown in FIG. 10C as the cross sectional view and a resin mold type as shown in FIG. 10D as the cross sectional view, FIGS. 27A through 27C are a roughly illustrated cross sectional view of a example of the light emitting device according to the embodiment, FIGS. 29A through 29C are roughly illustrated cross-sectional views of third examples of the light emitting device according to the embodiment.

DETAILED DESCRIPTION OF THE PREFERRED EMBODIMENTS

Explained below some embodiments of the invention fifth reference to the drawings.

Figure 1:
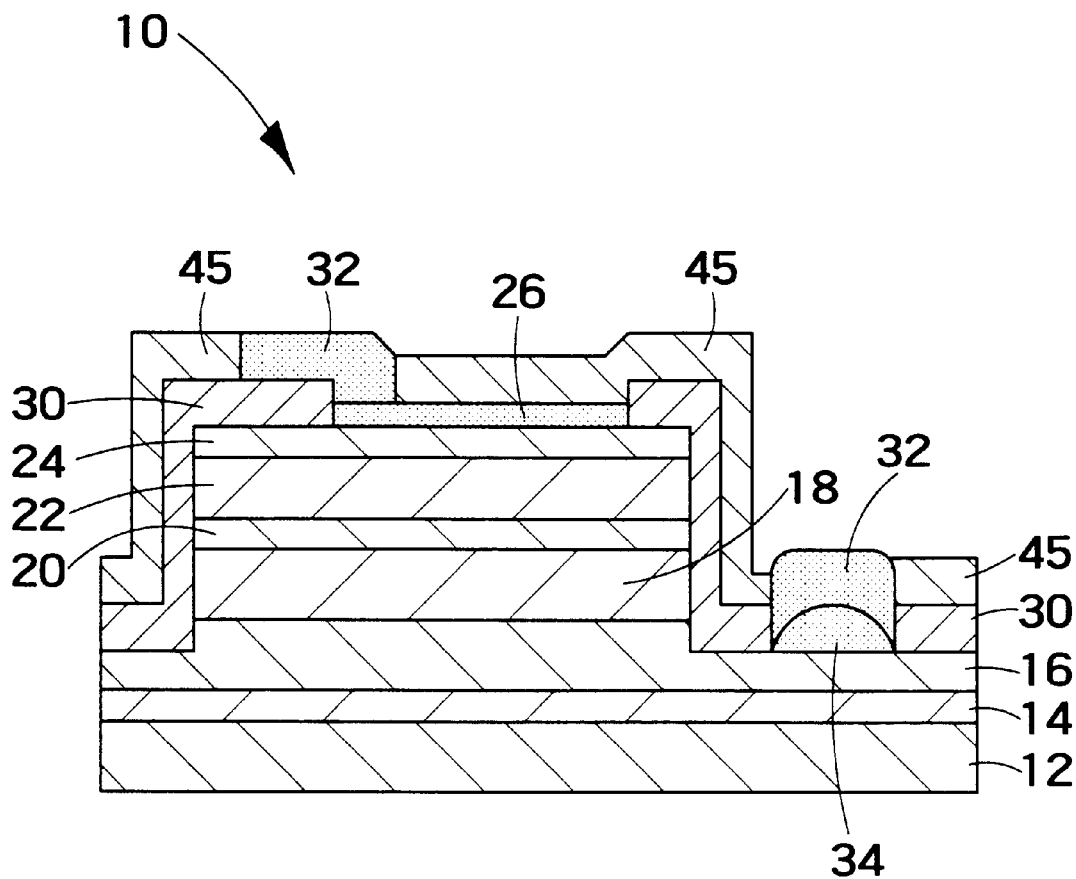
FIG. 1 is a cross-sectional view schematically showing a semiconductor light emitting element taken as the first embodiment of the invention.

FIG. 1 is a cross-sectional view schematically showing a semiconductor light emitting element taken as the first embodiment of the invention. The semiconductor light emitting element 10 shown here is a gallium nitride semiconductor light emitting element. The light emitting element 10 has a multi-layered structure of semiconductors stacked on a sapphire substrate 12, namely, a buffer layer 14, n-type contact layer 16, n-type cladding layer 18, light emitting layer 20, p-type cladding layer 22 and p-type contact layer 24 which are stacked in this order on the sapphire substrate 12.

The buffer layer 14 may be made of n-type GaN, for example. The n-type contact layer 16 has a high n-type carrier concentration to ensure ohmic contact smith the n-side electrode 34, and its material may be GaN, for example. The n-type cladding layer 18 and the p-type cladding layer 22 function to confine carriers within the light emitting layer 20. The light emitting layer 20 is a layer in which emission occurs due to recombination of electric charges injected as a current into the light emitting element.

The light emitting layer 20 may be made of undoped InGaN, for example, and the cladding layers 18 and 22 may be made of AlGaN having a larger band gap than the light emitting layer 20. The p-type contact layer 24 has a high p-type carrier concentration to ensure ohmic contact fifth the p-side electrode 26, and its material may be GaN, for example.

Stacked on the p-type contact layer 24 is the p-side electrode 26 which is transparent to the emitted light. Stacked on the n-type contact layer 18 is the n-side electrode 34. Bonding pads 32 of Au are stacked on these electrodes, respectively, so that N-wires (not shown) for supplying a operating current to the element be bonded. The surface of the element is covered by the protective films 30 and 45 of silicon oxide, for example.

According to the embodiment, the fluorescent material is mixed in or deposited on either part of the element 10. Appropriate fluorescent materials being efficiently excited by a light in the ultraviolet band are, for example, $Y_2O_2S$:Eu or $La_2O_2S$:(Eu,Sm) for mission of red light, (Sr, Ca, Ba, Eu)$_{10}$(PO$_1$)$_6$·Cl$_2$ for emission of blue light, and 3(Ba, Mg, Eu, Mn)O.8Al$_2$O$_6$ for emission of green light. By mixing these fluorescent materials in the appropriate ratio, almost all colors in the visible wavelength range can be realized.

Most of these fluorescent materials have their absorption peaks in the wavelength band of about 300 to 380 nm. Therefore, in order to ensure efficient wavelength conversion by the fluorescent materials, the light emitting element 20 is preferably configured to emit ultraviolet rays in the wavelength band below 380 nm. For maximizing the conversion efficiency by the fluorescent materials, the light emitting element is more preferably configured to emit ultraviolet rays of a wavelength near 330 nm.

The fluorescent material may be mixed in the p-side electrode 26. It also may be mixed in at least either of the protective films 30 and 45. It also may be mixed in at least either of the semiconductor layers 14 through 24 or substrate 12.

In order to mix the fluorescent material into the p-side electrode 26, a sputter deposition or a vacuum deposition, for example, can be used. When the p-side electrode 26 is formed by these method, the fluorescent material may be added. As for the protective films 30 and 45, the same method may be used to incorporate the fluorescent material. A chemical vapor deposition (CVD) may be also usable to incorporate the fluorescent material.

The fluorescent material may be incorporated into the any one of the semiconductor layers 14 through 24 during the crystal growth process. It may also be incorporated into the semiconductor layer by using the ion implantation after growing the layers. The ion implantation is also usable to incorporate the fluorescent material into the substrate 12.

The fluorescent material may also be deposited either on the surface of the element 10 or between the any adjacent layers thereof. That is, it may be deposited between any adjacent layers of substrate 12 through p-type contact layer 24, between the semiconductor layer and the protective film 30, between the semiconductor layer and the electrode 26 or 34, on the surface of the film 45, or on the surface of the electrode 26 or 34. As the deposition method of the fluorescent material, for example, electron beam vacuum deposition, sputtering deposition, and coating method may be employed. The fluorescent material may be formed on the p-type contact layer 24 as a insulating layer, which functions as a current blocking layer.

In order to deposit the fluorescent material onto the surface of the light emitting element, one can disperse the fluorescent material into the appropriate solvent, coat it onto the light emitting element and harden it up. As the solvent to disperse the fluorescent material, for example, alkalic silicate solution, silicate colloid aqua-solution, phosphate aqua-solution, organic solvent containing silicate compound, organic solvent containing rubber and natural glue aqua-solution may be used. Instead of dispersing the fluorescent material into these solvent and coating it on the light emitting element, one can coat these solvent without dispersing the fluorescent material then scatter or spray the fluorescent material on the coated solvent layer to deposit it, for example.

According to the invention, by incorporating or depositing the fluorescent material on any part of the light emitting element, the light emitted from the light emitting layer is efficiently converted into the secondary light having a longer wavelength.

For example, in the case that the light emitting layer 20 of the element is made of GaN, the emitted primary light is a ultraviolet ray having a wavelength of 360 to 380 nanometers. The ultraviolet ray is converted by the fluorescent material into a visible or infrared light having a desired wavelength and the secondary light is extracted.

In the case that the light emitting layer 20 is made of InGaN, a blue light can be obtained depending on the mole fraction of indium (In) thereof. In that case, the fluorescent material which absorbs the blue light and converts it into a light having a longer wavelength can be employed. As such a fluorescent material, for example, organic fluorescent may be used in addition to the inorganic fluorescent explained above. As such a organic fluorescent, rhodamine B for emission of red light, brilliant sulfoflavine FF for emission of green light may be used.

According to the embodiment, instead of extracting the primary light from the light emitting layer, the primary light is converted by the fluorescent material. Therefore, the fluctuation of the emission wavelength caused by the change in process parameters, operating current or temperature is dispelled. That is, according to the invention, the emission power and the emission wavelength can be independently controlled.

Besides, according to the invention, by mixing the fluorescent materials aforementioned, a multi-wavelength emission is easily realized. For example, by mixing the fluorescent materials, emitting red (R), green (G) and blue (B) respectively, in an appropriate ratio, and by incorporating them into the light emitting element, a white light is readily realized.

In FIG. 1, the gallium nitride compound semiconductor light emitting element formed on the sapphire substrate is exemplary shown. However, the invention is not limited to the specific example, and applicable to the any gallium nitride semiconductor light emitting elements formed on the substrate made of SiC, GaN, spinel, ZnO, Si or GaAs, for example.

As for the structure of the light emitting element, the invention is not limited to the exemplary double-heterostructure and applicable to various structures such as the single heterostructure or multiquantum well structure.

Explained next is a second light emitting element according to the invention.

Figure 2:
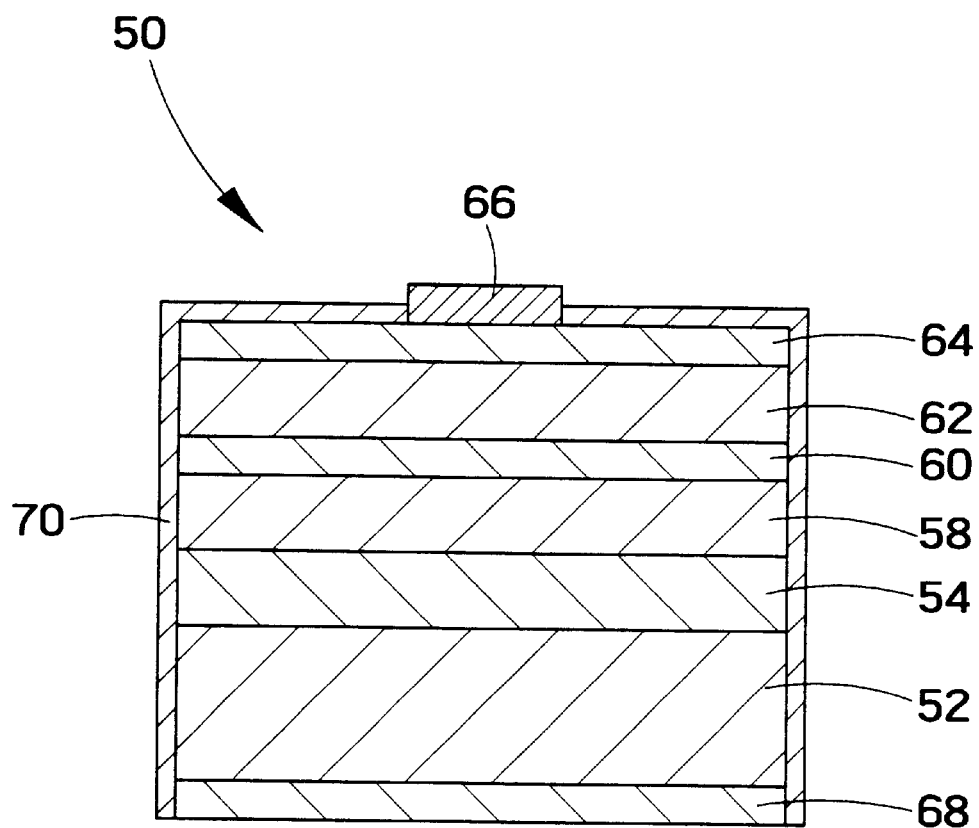
FIG. 2 is a cross-sectional view schematically showing the second semiconductor light emitting element of the invention.

FIG. 2 is a cross-sectional view schematically shorting the second semiconductor light emitting element of the invention. The semiconductor light emitting element 50 shown here is a zinc selenide (ZnSe) semiconductor light emitting element which has a multi-layered structure of semiconductors, namely, a buffer layer 54, n-type cladding layer 58, light emitting layer 60, p-type cladding layer 62 and transparent conductive layer 64 which are stacked in this order on a GaAs substrate 52.

The buffer layer 54 may be made of n-type ZnSe, for example. The n-type cladding layer 58 and the p-type cladding layer 62 function to confine carriers within the light emitting layer 60. These cladding layers may be made of ZnSe having a larger band gap than the light emitting layer 60. The light emitting layer 60 is a layer in which emission occurs due to recombination of electric charges injected as a current into the light emitting element. The light emitting layer 60 may be made of undoped ZnSe, for example. The transparent conductive layer 64 is a electrically conductive layer having a high optical transparency, which may be made of indium tin oxide, for example.

Stacked on the conductive layer 64 is the p-side electrode 66 which may be made of a metal such as gold (Au). On the bottom surface of the substrate 52, the n-side electrode 68 is formed. The surface of the element is covered by the protective films 70 made of silicon oxide, for example.

The ZnSe light emitting element 50 emits the light having a wavelength of blue or blue-violet from its light emitting layer 60. This blue emission is converted by the fluorescent material into a visible or infrared light having a longer wavelength which is extracted outside.

The fluorescent material can be incorporated into various part of the element 50 as explained with reference to the element 10. For example, it is incorporated into the p-side electrode 66, the transparent conductive layer 64, any one of the semiconductor layers 54 through 62 or substrate 52.

In order to mix the fluorescent material into the p-side electrode 66 or conductive layer 64, a sputter deposition or a vacuum deposition, for example, can be used. When the conductive layer 64 or electrode 66 is formed by these method, the fluorescent material may be added. As for the protective film 70, the same method may be used to incorporate the fluorescent material. A chemical vapor deposition (CVD) may be also usable to incorporate the fluorescent material.

The fluorescent material may be incorporated into the any one of the semiconductor layers 54 through 62 during the crystal growth process. It may also be incorporated into the semiconductor layer by using the ion implantation after growing the layers. The ion implantation is also usable to incorporate the fluorescent material into the substrate 52.

The fluorescent material may also be deposited either on the surface of the element 50 or between the any adjacent layers thereof. That is, it may be deposited between any adjacent layers of substrate 52 through conductive layer 64, between the semiconductor layer and the protective film 70, between the semiconductor layer and the electrode 66 or 68, on the surface of the film 70, or on the surface of the electrode 66 or 68. As the deposition method of the fluorescent material, for example, electron beam vacuum deposition, sputtering deposition, and coating method may be employed. The fluorescent material may be formed on the conductive layer 64 as a insulating layer, which functions as a current blocking layer.

Although the ZnSe light emitting element is exemplary shown in FIG. 2, the invention is not limited to the specific example. The invention is also applicable to any other light emitting element made of SiC, ZnS or BN, for example. These light emitting elements are capable of emitting a short wavelength emission such as blue with a high efficiency. The short wavelength emission is converted into the visible or infrared light by the fluorescent material and extracted.

Next explained are 13 examples of the light emitting devices mounted with the semiconductor light emitting element explained with reference to FIGS. 1 and 2.

Figure 3:
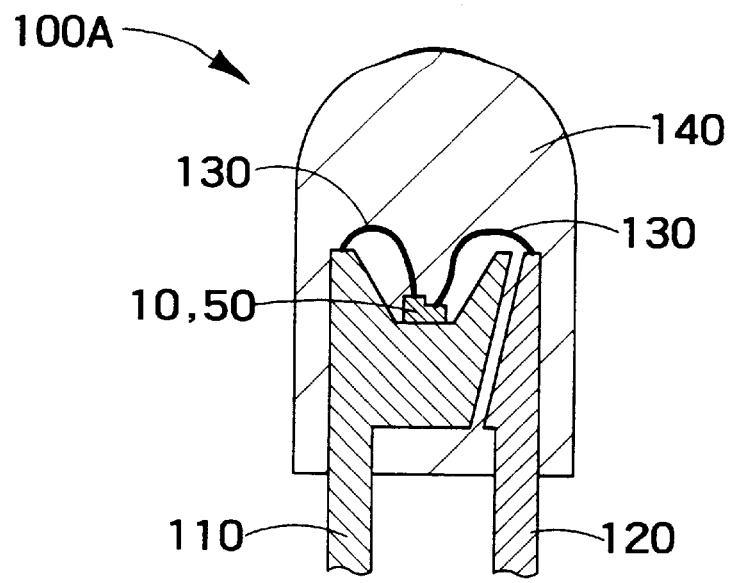
FIG. 3 is a roughly illustrated cross-sectional view of a light emitting device according to the invention.

FIG. 3 is a roughly illustrated cross-sectional view of a light emitting device according to the invention. The light emitting device 100A shown here is a device called "LED (light emitting diode) lamp" of a so-called "lead frame type". The device 100A includes a semiconductor light emitting element 10 or 50 mounted on the bottom of a cup of a lead frame 110. The p-side electrode and the n-side electrode of the light emitting element are connected to lead frames 110 and 120 by wires 130, 130, respectively. Inner lead parts of the lead frames are protected by a resin 140.

According to the invention, the light emitting device 100A can be assembled by the same procedure as the conventional devices which include no fluorescent material because the light emitting element itself includes the fluorescent material. Besides, the durability of device against the change in temperature is not degraded because the resin does not include the fluorescent material. Therefore, the reliability is improved as compared to the devices which include fluorescent material in their resin.

According to the invention, even if the emission from the light emitting layer of the light emitting element is a ultraviolet ray whose wavelength is shorter than 380 nanometers, the resin or other part of the device is not damaged by the ultraviolet emission because the emission is converted into the longer wavelength light before it goes out from the light emitting element. The above mentioned advantages about the productivity and the reliability are good as well if a semiconductor laser is employed as the light emitting element. Also the device is easy to assemble because the cup enclosure to fill the resin containing the fluorescent material is not necessary.

Figure 4:
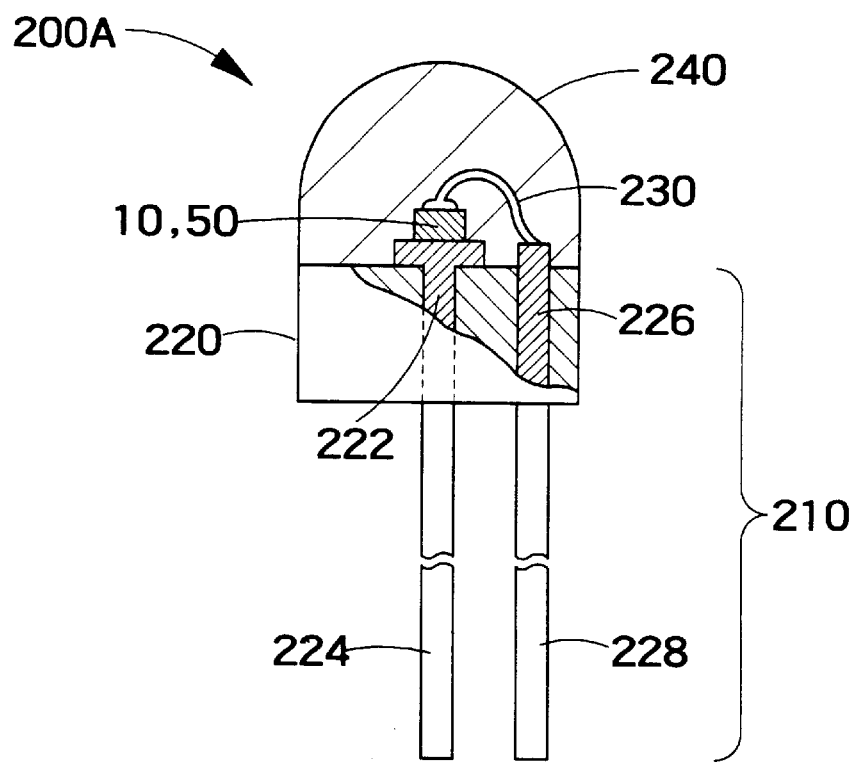
FIG. 4 is a roughly illustrated cross-sectional view of a light emitting device according to the invention.

FIG. 4 is a roughly illustrated cross-sectional view of a light emitting device according to the invention. The light emitting device 200A shown here is a device called "LED (light emitting diode) lamp" of-a so-called "stem type". The stem 210 includes the lead pins 222 and 226 which are partially molded in the insulator 220. As the material of the insulator 220, ceramics or resin can be used. The lead pins 222 and 226 have the outer lead part 224 and 228 extending to the outside. The element 10 or 50 is mounted onto the top of the lead pin 222 and the resin 240 is molded to protect the element. The one electrode of the light emitting element is connected to the pin 226 by a wire 230.

By mounting with the light emitting element 10 or 50, the LED lamp of the stem type as shown in FIG. 4 also has various advantages as explained with reference to FIG. 3.

Figure 5:
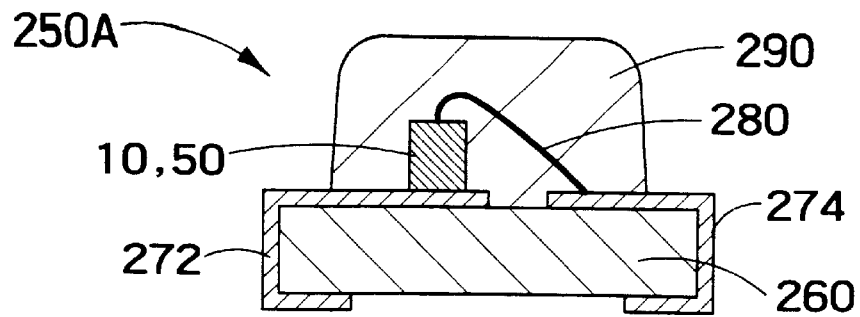
FIG. 5 is a roughly illustrated cross-sectional view of a third example of the light emitting device according to the invention.

FIG. 5 is a roughly illustrated cross-sectional view of a third example of the light emitting device according to the invention. The light emitting device 250A shown here is a device called "SMD (surface mounted device) lamp" of a so-called "substrate type". The SMD lamp 250A has a substrate 260 which has electrode patterns 272 and 274. On one of the electrode patterns, the light emitting element 10 or 50 is mounted. As the material of the substrate, a resin such as epoxy, or ceramics such as alumina or glass may be employed. The electrode of the light emitting element is connected to the pattern 274 by a wire 280. The light emitting element is protected by the resin 290.

By mounting with the light emitting element 10 or 50, the LED lamp of the stem type as shown in FIG. 5 also has various advantages as explained with reference to FIG. 3.

Figure 6:
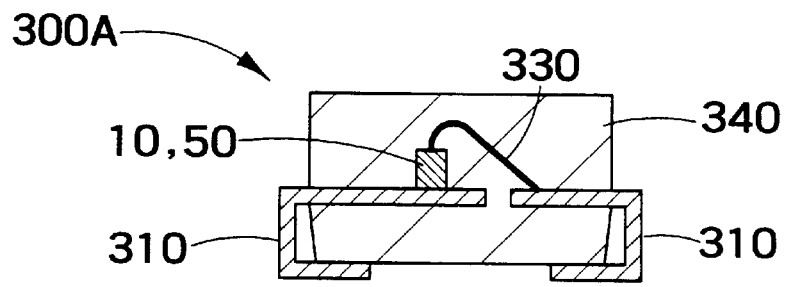
FIG. 6 is a roughly illustrated cross-sectional view of a forth example of the light emitting device according to the invention.

FIG. 6 is a roughly illustrated cross-sectional view of a forth example of the light emitting device according to the invention. The light emitting device 300A shown here is a device called "SMD (surface mounted device) lamp" of a so-called "lead frame type". The SMD lamp 300A has a lead frame 310 on which the light emitting element 10 or 50 is mounted. As the material of the lead frame 310, a metal such ion coated by tin is employed. The electrode of the light emitting element is connected to the lead pin of the lead frame 310. The light emitting element is protected by the resin 340.

By mounting with the light emitting element 10 or 50, the LED lamp of the lead frame tripe as show-n in FIG. 6 also has various advantages as explained with reference to FIG. 3.

Figure 7:
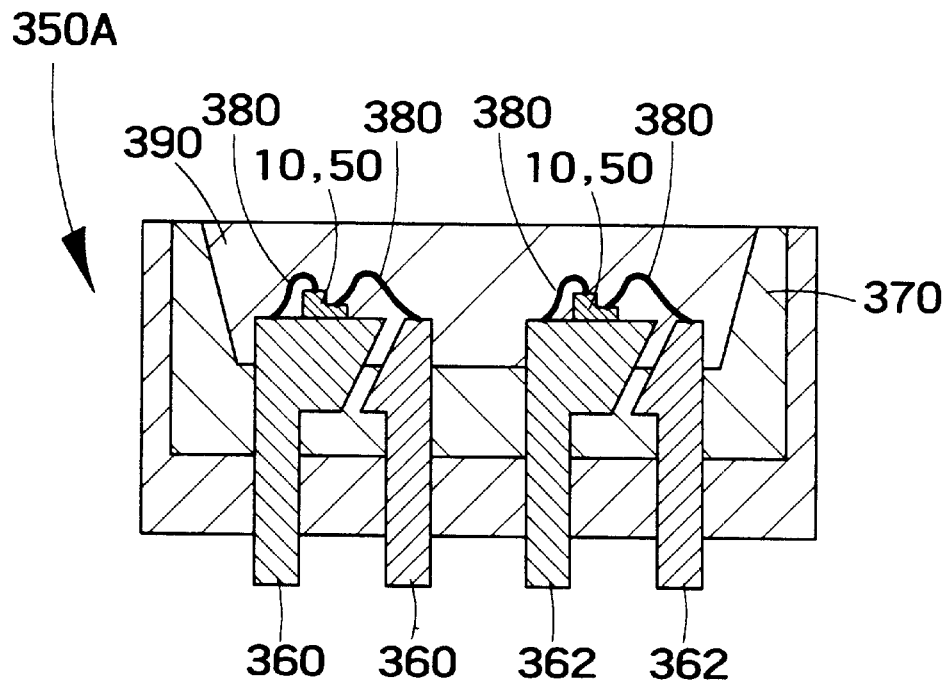
FIG. 7 is a roughly illustrated cross-sectional view of a fifth example of the light emitting device according to the invention.

FIG. 7 is a roughly illustrated cross-sectional view of a fifth example of the light emitting device according to the invention. The light emitting device 350A shown here is a device called "planer emission type". The planer emission type device 350A has lead frames 360 and 362 on which the light emitting elements 10 or 50 are mounted respectively. Each element is electrically connected to the lead frames by wire 380. The light emitting elements in the cup part of the reflector 370 are protected by the resin 390. The emission from each element is reflected by the reflector 370 and form a planer light which is extracted.

By mounting with the light emitting element 10 or 50, the light emitting device of the planer emission type as shown in FIG. 7 also has various advantages as explained with reference to FIG. 3.

Figure 8:
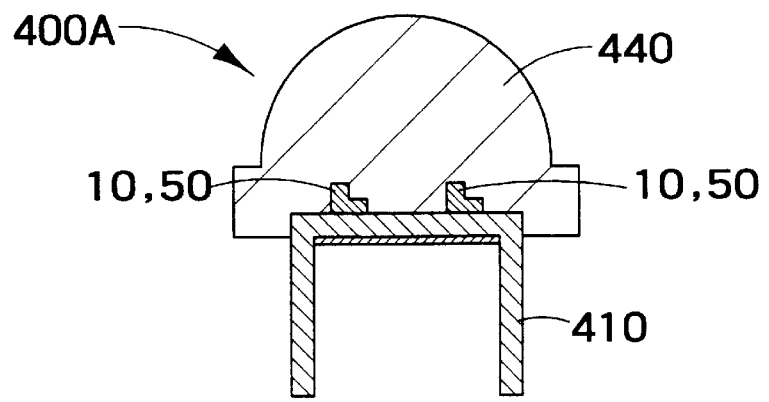
FIG. 8 is a roughly illustrated cross-sectional view of a sixth example of the light emitting device according to the invention.

FIG. 8 is a roughly illustrated cross-sectional view of a sixth example of the light emitting device according to the invention. The light emitting device 400A shown here is a device called "dome type". The dome type device 400A has a lead frame 410 on which a plurality (five to ten, for example) of the light emitting elements 10 or 50 are mounted peripherally. Each element is electrically connected to the corresponding terminal pin of the lead frame 410 by wire (not shown). The light emitting elements are protected by the resin 440. The dome type light emitting device 400A can emit highly luminous and uniform light because it has a many light emitting elements.

By mounting with the light emitting element 10 or 20, the light emitting device of the dome type 400A as shown in FIG. 8 also has various advantages as explained with reference to FIG. 3.

Figure 9A:
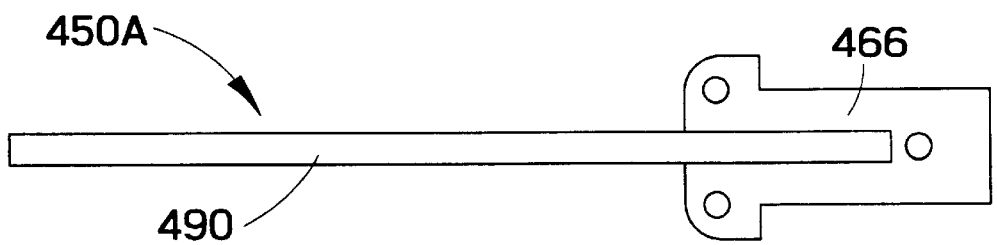
FIG. 9A is a roughly illustrated plan view and FIG. 9B is a roughly illustrated cross-sectional view of a seventh example of the light emitting device according to the invention.
Figure 9B:
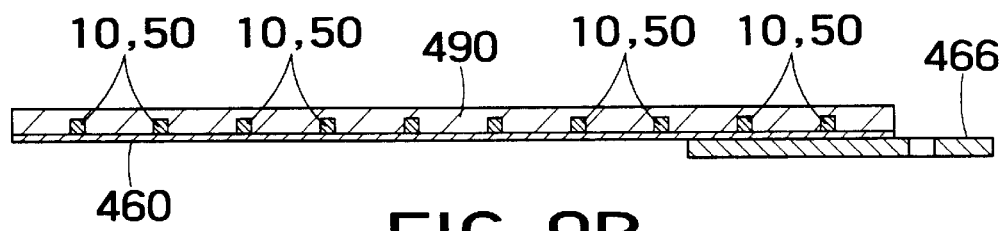

FIG. 9A is a roughly illustrated plan view and FIG. 9B is a roughly illustrated cross-sectional view of a seventh example of the light emitting device according to the invention. The light emitting device 450A shown here is a device called "meter needle type". The device of this type is used for a self-illuminating needle of a meter such as a speed meter of a vehicle. The light emitting device 450A has a substrate or a lead frame 460 on which a plurality (five to twenty, for example) of the light emitting elements 10 or 50 are mounted at certain intervals. Each element is electrically connected to the corresponding terminal pin by a wire (not shown). The light emitting elements are protected by the resin 490. The meter needle type device 450A is mounted to a flange 466 and fixed to the axis of a speed meter, for example.

The meter needle type device 450A is compact and light-weight, and is capable of emitting a highly luminous and uniform light because it includes many light emitting elements.

By mounting with the light emitting elements 10 or 50, the light emitting device of the meter needle type 450A as shown in FIG. 9 also has various advantages as explained with reference to FIG. 3.

Besides, emission color can be easily changed along the needle by arranging light emitting elements having a different emission color. According to the invention, it is easily realized only by changing the fluorescent material which is incorporated into the light emitting element. The other materials and the basic structure of the light emitting elements are the same each other. Therefore, the operating current and the voltage can be advantageously the same for all the light emitting elements.

Figure 10A:
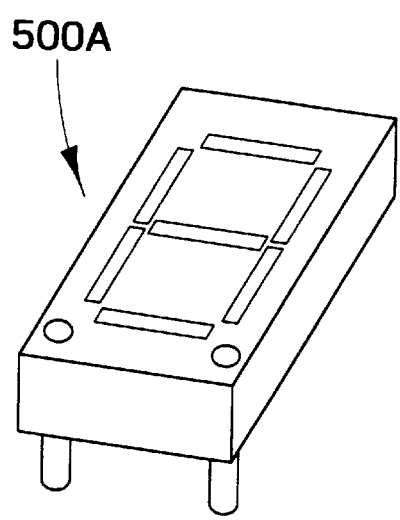
FIGS. 10A through 10D are roughly illustrated views of the eighth example of the light emitting devices according to the invention.
Figure 10B:
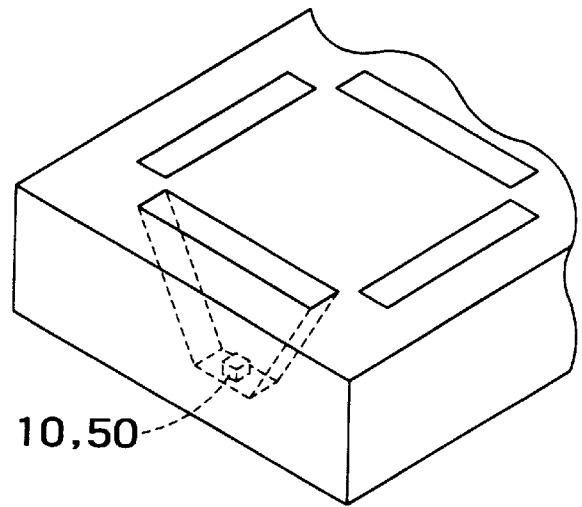
Figures 10C, 10D:
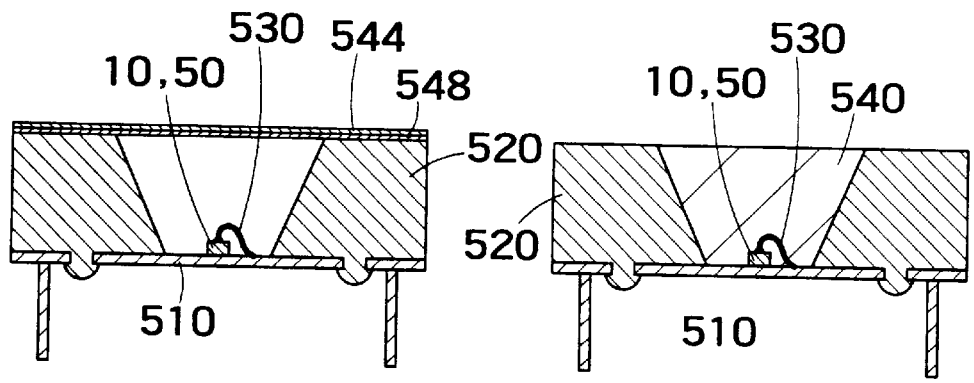

FIGS. 10A through 10D are roughly illustrated views of the eighth example of the light emitting devices according to the invention. The light emitting devices 500A shown here are devices called "seven segment type" among which so-called "substrate type" is specifically shown in the figure. The light emitting device of this type is used to indicate a character such as a digit or an alphabet. FIG. 10A is a perspective view and FIG. 10B is a partially enlarged perspective view in a partially see-through mode. The substrate type includes a cavity type as shown in FIG. 10C as the cross sectional view and a resin mold type as shown in FIG. 10D as the cross sectional view. The light emitting element 10 or 30 is electrically connected to the corresponding terminal pin by a fire 530. The light emitted from the element is reflected by the reflector 520 and extracted. At the aperture, a color filter 544 and/or a diffusing film 548 is arranged.

By mounting with the a light emitting element 10 or 50, the light emitting devices of the seven segment type 500A as shown in FIGS. 10A through 10D also have various advantages as explained with reference to FIG. 3.

Figure 11:
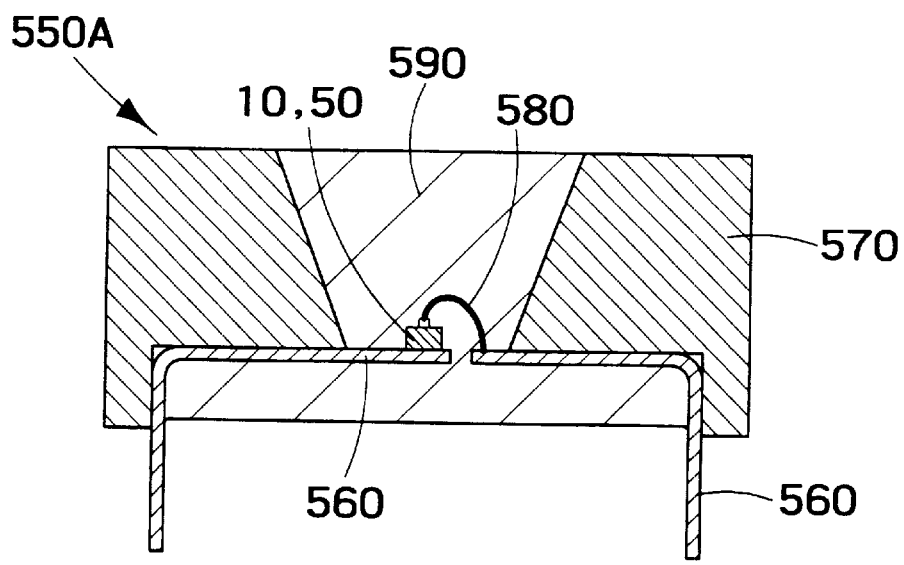
FIG. 11 is a roughly illustrated cross sectional view of the ninth example of the light emitting device according to the invention.

FIG. 11 is a roughly illustrated cross sectional view of the ninth example of the light emitting device according to the invention. The light emitting device 550A shown here is also a device called "seven segment type" among which so-called "lead frame type" is specifically shown in the figure. The light emitting element 10 or 50 according to the invention is mounted on the lead frame 360 and is electrically connected to the corresponding terminal by a wire 580. The light emitting element is molded by the resin 590. The light emitted from the element is reflected by the reflector 570 and extracted.

By mounting myth the a light emitting element 10 or 50, the light emitting device of the seven segment type 50A as shown in FIG. 11 also has various advantages as explained with reference to FIG. 3.

Figure 12A:
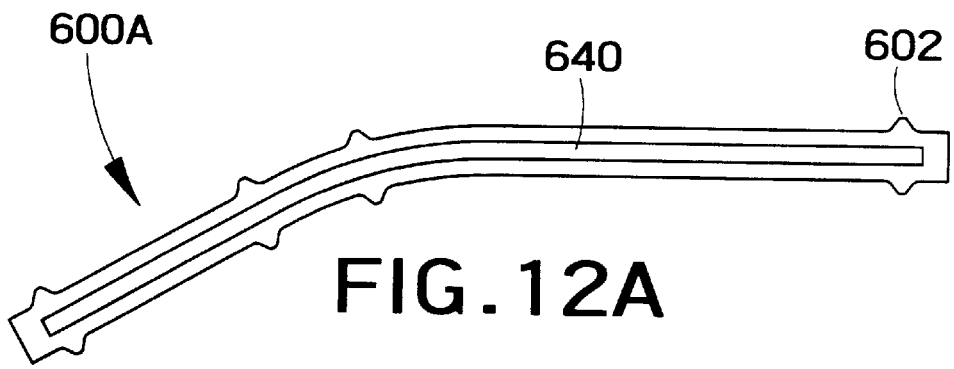
FIG. 12A is a roughly illustrated plan view and FIG. 12B is a roughly illustrated cross-sectional view of a tenth example of the light emitting device according to the invention.
Figure 12B:
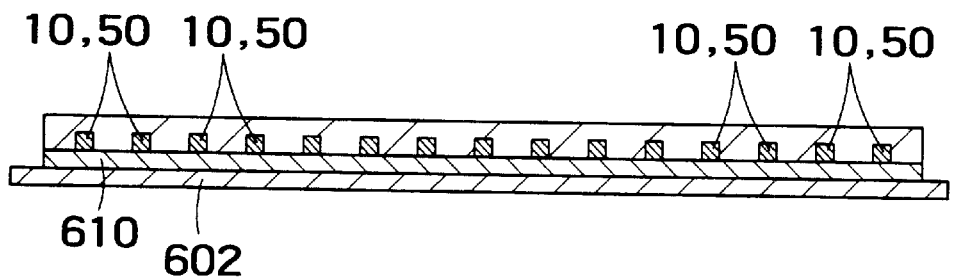

FIG. 12A is a roughly illustrated plan view and FIG. 12B is a roughly illustrated cross-sectional view of a tenth example of the light emitting device according to the invention. The light emitting device 600A shown here is a device called "level meter type". The device of this type is used as the level meter to indicate speed of a vehicle or rotation of an engine, for example. The level meter type device 600A has a flange 602, and a substrate or a lead frame 610 on which a plurality (ten to thirty, for example) of the light emitting elements 10 or 50 are mounted at certain intervals. In many case, the elements are selected and mounted so that the emission color changes continuously or step wise along the line. Each element is connected to the corresponding terminal pin by a sire (not shown). The light emitting elements are protected by the resin 640.

By mounting with the light emitting elements 10 or 50, the light emitting device of the level meter type 600A as shown in FIGS. 12A and 12B also have various advantages as explained with reference to FIG. 3.

In many case, such a light emitting device of the level meter type need to have light emitting elements having different emission color. According to the invention, the emission color of each element can be easily changed only by changing the fluorescent material which is incorporated into the light emitting element. The other materials and the basic structure of the light emitting elements remain the same each other. Therefore, the operating current and the voltage can be advantageously the same for all the light emitting elements.

Figure 13A:
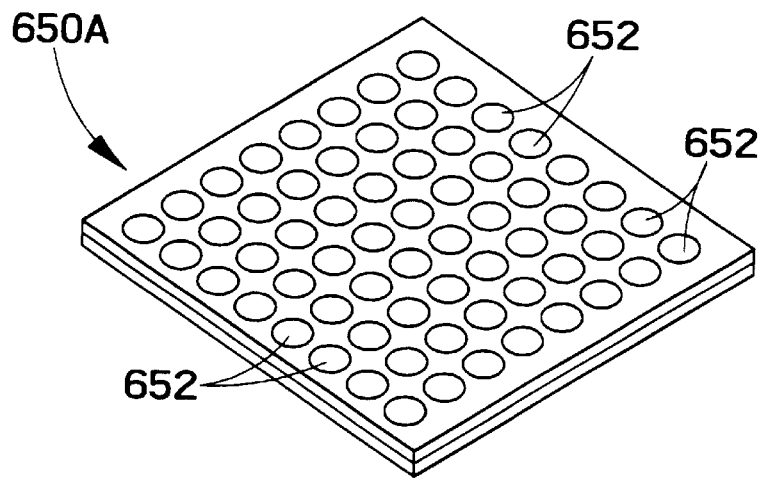
FIG. 13A is a roughly illustrated perspective view and FIG. 13B is a roughly illustrated cross-sectional view of a eleventh example of the light emitting device according to the invention.

FIG. 13A is a roughly illustrated perspective view and Fit. 13B is a roughly illustrated cross-sectional view of a eleventh example of the light emitting device according to the invention. The light emitting device 650A shown here is a device called "matrix type". The device of this type has a plurality of emission spot 652 which is arranged in a grid pattern, and is used to indicate characters, symbols or figures.

Figure 13B:
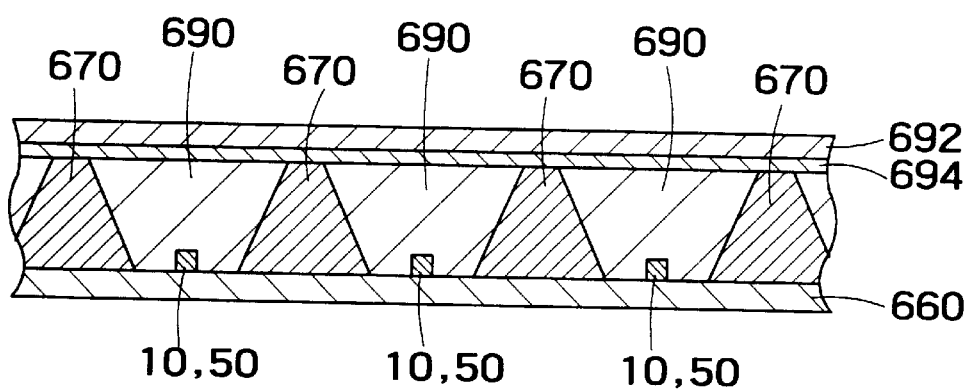

As shown in FIG. 13B, the device 650A has a substrate 660 on which a plurality of the light emitting elements 10 or 50 are mounted at certain intervals. Each element is connected to the corresponding terminal by a wire (not shown). The light emitting elements are protected by the resin 690. The emission from the element is reflected by the reflector 670 and extracted. A color filter 692 and/or diffusing film 694 may be arranged if necessary.

By mounting with the light emitting elements 10 or 50, the light emitting device of the matrix type 650A as shown in FIGS. 13A and 13B also have various advantages as explained with reference to FIG. 3.

If the device 650A needs to have more than two kinds of emission colors, the emission color of each emission spot 692 can be easily changed only by changing the fluorescent material of the corresponding element. The materials and the basic structure of the each light emitting element remain the same each other. Therefore, the operating current and the voltage of the each light emitting element can remain advantageously the same. Besides, the fluctuation of the emission color is fairly small.

Figure 14:
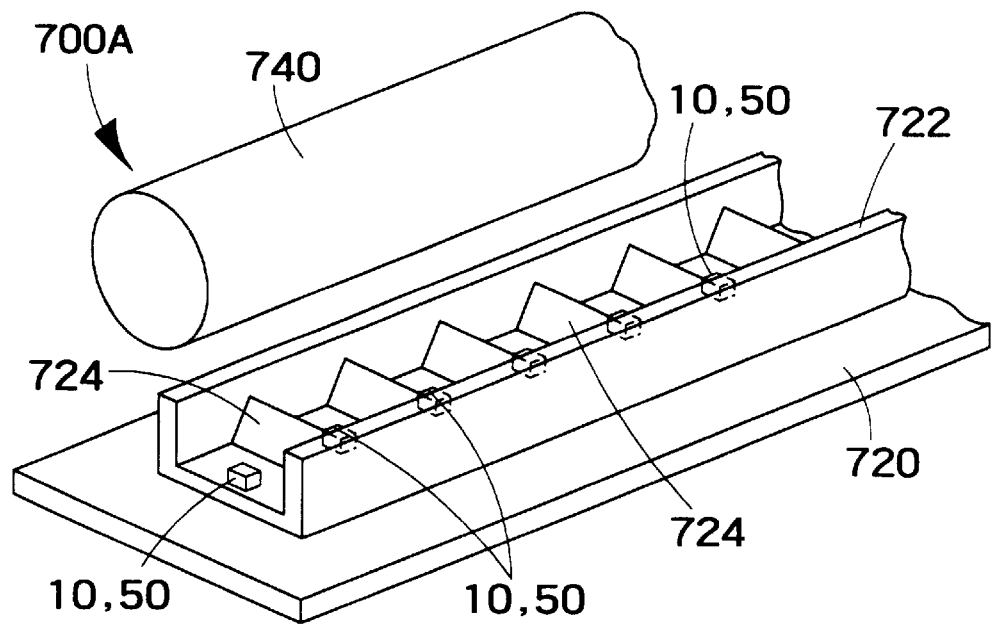
FIG. 14 is a roughly illustrated perspective view of a twelfth example of the light emitting device according to the invention.

FIG. 14 is a roughly illustrated perspective view of a twelfth example of the light emitting device according to the invention. The light emitting device 700A shown here is a device called "array type" which is used as a light source of a facsimile or a image scanner. The device of this type has a rail-like reflector 722 which is fixed to the substrate 720.

A plurality of light emitting elements 10 or 50 according to the invention are mounted on the reflector 722. Between each of the elements, a separator 724 is located. A rod lens 740 is arranged above the light emitting elements and converge the emission from the element.

By mounting with the light emitting elements 10 or 50, the light emitting device of the array type 700A as shown in FIG. 14 also has various advantages as explained with reference to FIG. 3. Besides, the fluctuation of the emission color is fairly small.

If the device 700A needs to have more than two kinds of emission colors, the emission color of each element can be easily changed only by changing the fluorescent material thereof. The materials and the basic structure of the each light emitting element remain the same each other. Therefore, the operating current, the voltage and the size of the each light emitting element can remain advantageously the same.

Figure 15:
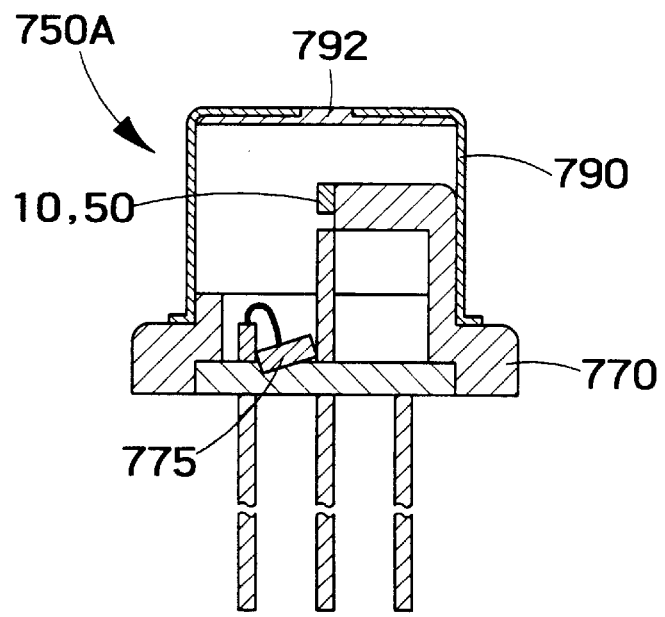
FIG. 15 is a roughly illustrated cross sectional view of a thirtieth example of the light emitting device according to the invention.

FIG. 15 is a roughly illustrated cross sectional view of a thirteenth example of the light emitting device according to the invention. The light emitting device 750A shown here is a semiconductor laser device called "can type". The device of this type has a stem 770 on which a semiconductor laser elements 10 or 50 according to the invention is mounted. On the backside of the element, a photodetector 775 is arranged to monitor the output of the element 10 or 50. The head of the stem 770 is sealed by the can 790. The laser beam emitted from the element is extracted through the window.

By mounting with the light emitting elements 10 or 50, the light emitting device of the can type 750A as shown in FIG. 15 also has various advantages as explained with reference to FIG. 3.

Next explained is a third embodiment of the invention.

Figure 16:
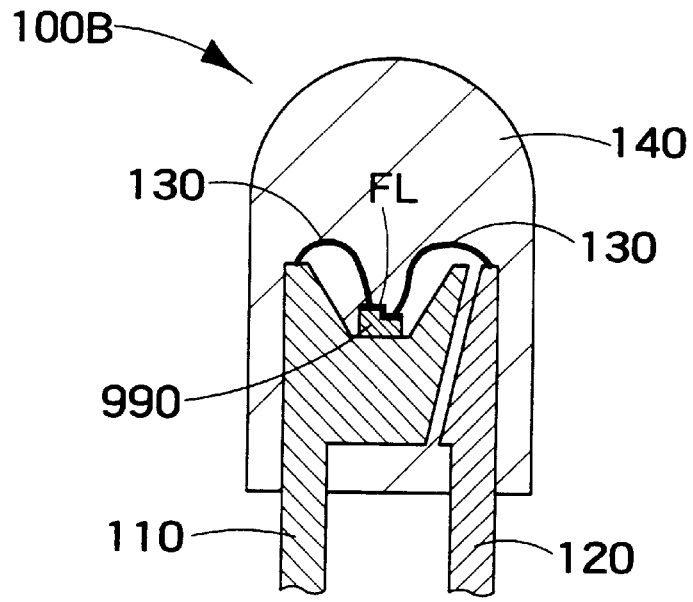
FIG. 16 is a roughly illustrated cross sectional view of a example of the light emitting device according to the embodiment.

FIG. 16 is a roughly illustrated cross sectional view of a example of the light emitting device according to the embodiment. The light emitting device 100B shown here is a LED lamp of the lead frame type. According to the embodiment, the semiconductor light emitting element 990 is mounted on the lead frame 110 then the fluorescent material is deposited on the surface of the element 990 to from the fluorescent layer FL.

In the embodiment, the element 990 need not to include a fluorescent material. However, the element preferably have a luminous emission in the wavelength range of blue or ultraviolet in order to obtain a high conversion yield by using the fluorescent materials which are easily available. As such a element having a light emitting layer made of, for example, gallium nitride, zinc selenide, silicon carbide or boron nitride may be employed.

In order to deposit the fluorescent material, first, the fluorescent material is dispersed into an appropriate solvent, then, it is coated on the surface of the element 990 and finally it is dried up. Another way to form the fluorescent layer is, first, coat an appropriate solvent on the surface of the element 990, then, scatter or spray the fluorescent material onto the solvent, finally, harden it up.

The solvent is preferably adhesive. The examples of the solvent are the ones including an inorganic polymer as a main component. The ones including a rubber material, farinaceous material or protein as a main component are also usable as the solvent. If the inorganic solvent is used, the product advantageously becomes highly
durable against the heat and chemicals and becomes flame-retardant. If the rubber material, the farinaceous material or the protein is used, the residual stress of the dried product is relaxed. Therefore, the problems caused by the stress such as deterioration of the device or the breakage of the wire are advantageously prevented. The farinaceous material and the protein are also easy to handle because they are water-soluble.

The specific examples of the solvent are the alkalic silicate solution, the silicate colloid aqua-solution, the phosphate aqua-solution, the organic solvent containing silicate compound, the organic solvent containing rubber and the natural glue aqua-solution.

The refractive index of the dried product of the solvent may be preferably between the refractive index of the surface of light emitting element and the refractive index of its outside. For example, if the light emitting element is molded by a resin, the refractive index of the dried product of the solvent preferably between the surface of light emitting element and the refractive index of the resin. This relationship in the refractive indices prevents the total reflection at the emission edge of the element so that the external quantum efficiency is improved.

As the fluorescent material of the embodiment, the inorganic materials or organic materials explained with reference to the first embodiment may be used as well. The material should be selected so that a high conversion efficiency is obtained for the given wavelength of semiconductor element and the desired wavelength of the secondary light.

According to the embodiment, the fluorescent material FL is deposited at the emission surface of the light emitting element 990. Therefore, almost 100% of the primary light emitted from the element is absorbed and successfully converted by the fluorescent material. The embodiment is especially advantageous, if the emission wavelength is the ultraviolet having a wavelength shorter than 380 nanometers.

Besides, according to the embodiment, the light source is limited to the vicinity of the emission edge of the light emitting element. Therefore, the optical path of the primary light in the fluorescent layer FL becomes uniform and independent to the direction. This solves the problem that the wavelength of the secondary light varies depending to the direction of the light.

Further, according to the embodiment, the secondary light can be easily converged by using lenses or reflector, because the light source is limited to the vicinity of the emission edge of the light emitting element. Therefore, the light emitting device having a high emission density is realized. The inorganic polymer, the rubber material, the farinaceous material or the protein have large volume contraction ratios when they dries up. Therefore, if any of these materials is used as a main component of a solvent to disperse the fluorescent material, the fluorescent material can be easily limited to the vicinity of the emission edge of the light emitting element. This makes the above-mentioned advantages successfully realized.

Further according to the invention, by selecting the solvent so that the refractive index thereof is between the refractive index of the light emitting element and the refractive index of its adjacent layer, external quantum efficiency is further improved and high power light emitting device is realized.

Figure 17:
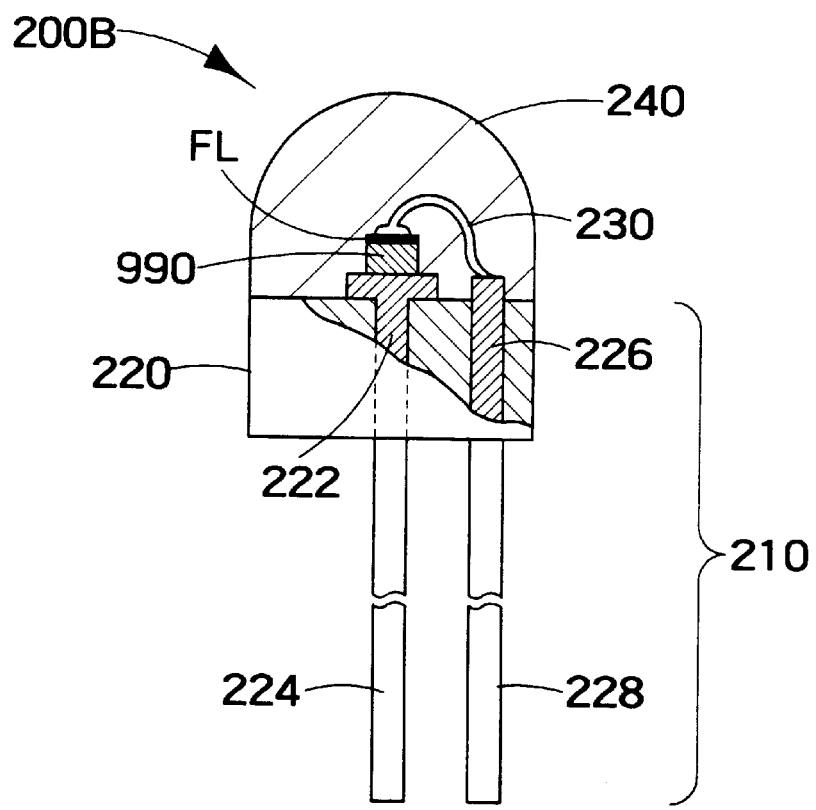
FIG. 17 is a roughly illustrated cross-sectional view of a light emitting device according to the invention.

Next explained are specific examples of the embodiment. In the explanation of these examples, the same components as those of the light emitting device shown in FIGS. 1 through 16 are labeled with common reference numerals, and their detailed explanation is omitted. FIG. 17 is a roughly illustrated cross-sectional view of a light emitting device according to the invention. The light emitting device 200B shown here is a LED lamp of a stem type. The element 990 is mounted onto the top of the lead pin 222. The fluorescent layer FL is formed by any method as explained above. In order to deposit the fluorescent layer FL, the fluorescent material may be dispersed in the solvent before it is coated on the surface of the element or it may be sprayed after the solvent is coated on the element.

Figure 18:
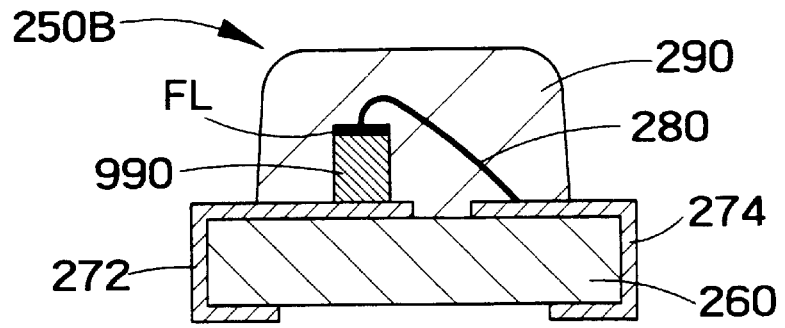
FIG. 18 is a roughly illustrated cross-sectional view of a third example of the light emitting device according to the invention.

FIG. 18 is a roughly illustrated cross-sectional view of a third example of the light emitting device according to the invention. The light emitting device 250B shown here is an SMD lamp of a substrate type. The light emitting element 10 or 50 is mounted on the substrate 260 and the fluorescent layer FL is formed on it by any method as explained above.

Figure 19:
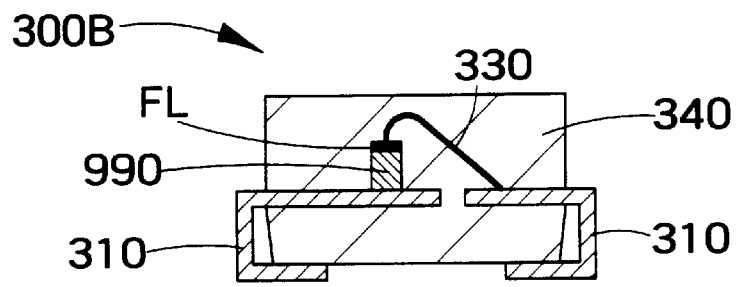
FIG. 19 is a roughly illustrated cross-sectional view of a forth example of the light emitting device according to the invention.

FIG. 19 is a roughly illustrated cross-sectional view of a forth example of the light emitting device according to the invention. The light emitting device 300B shown here is an SMD lamp of a lead frame type. The light emitting element 990 is mounted on the lead frame 310, on which the fluorescent layer FL is formed by any method as explained above.

Figure 20:
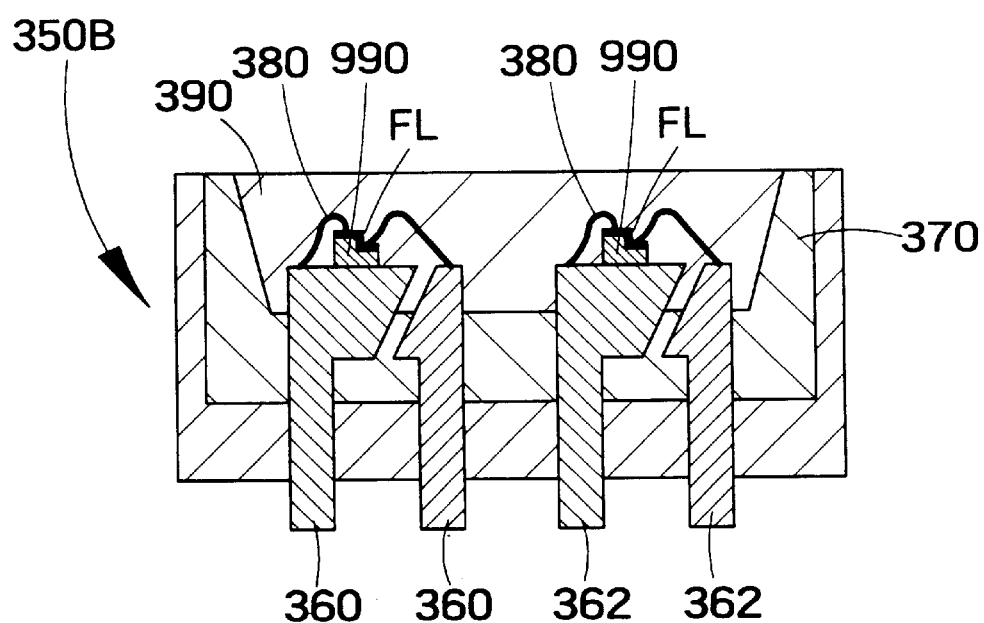
FIG. 20 is a roughly illustrated cross-sectional view of a fifth example of the light emitting device according to the invention.

FIG. 20 is a roughly illustrated cross-sectional view of a fifth example of the light emitting device according to the invention. The light emitting device 350B shown here is a device of planer emission type. The light emitting elements 990 are mounted on the lead frames 360 and 362 respectively, on which the fluorescent lasers FL is formed by any method as explained above.

Figure 21:
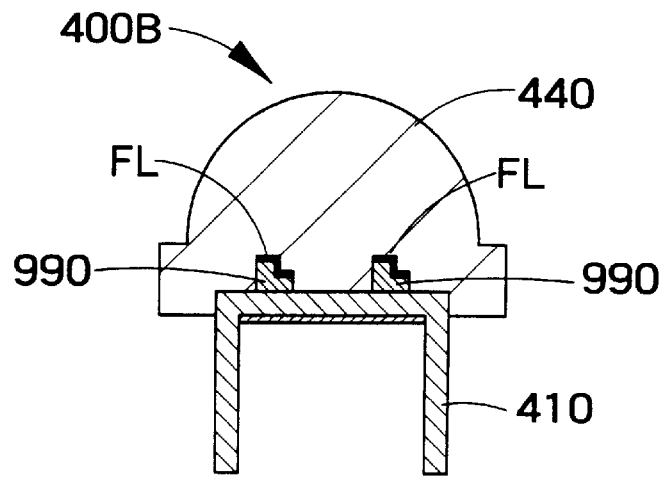
FIG. 21 is a roughly illustrated cross-sectional view of a sixth example of the light emitting device according to the invention.

FIG. 21 is a roughly illustrated cross-sectional view of a sixth example of the light emitting device according to the invention. The light emitting device 400B shown here is a device of the dome type. The light emitting elements 990 are mounted on the lead frame, on which the fluorescent layers FL is formed by any method as explained above.

Figure 22A:
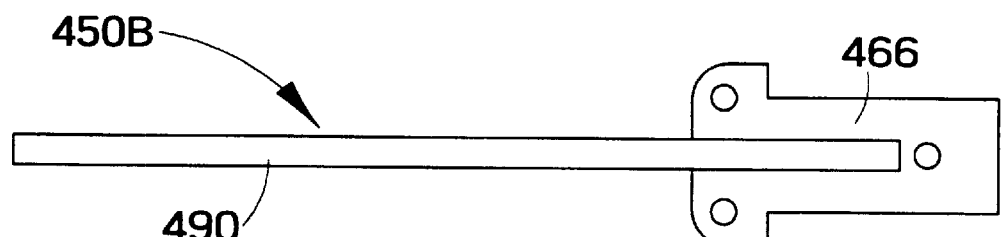
FIG. 22A is a roughly illustrated plan view and FIG. 22B is a roughly illustrated cross-sectional view of a seventh example of the light emitting device according to the invention.
Figure 22B:
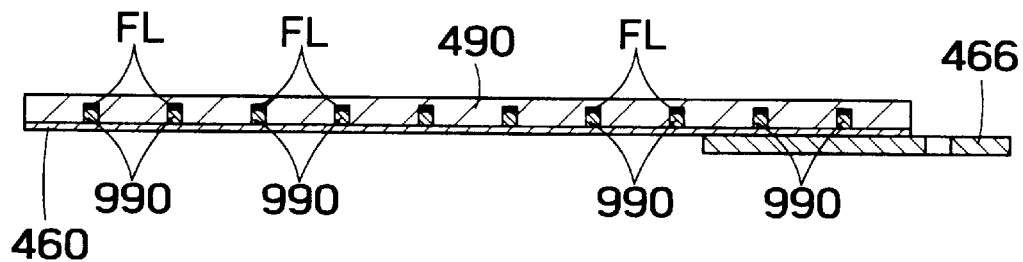

FIG. 22A is a roughly illustrated plan view and FIG. 22B is a roughly illustrated cross-sectional view of a seventh example of the light emitting device according to the invention. The light emitting device 450 shown here is a device of a meter needle type. The light emitting elements 990 are mounted in the lead frame 460, on which the fluorescent layers FL is formed by any method as explained above.

Figure 23A:
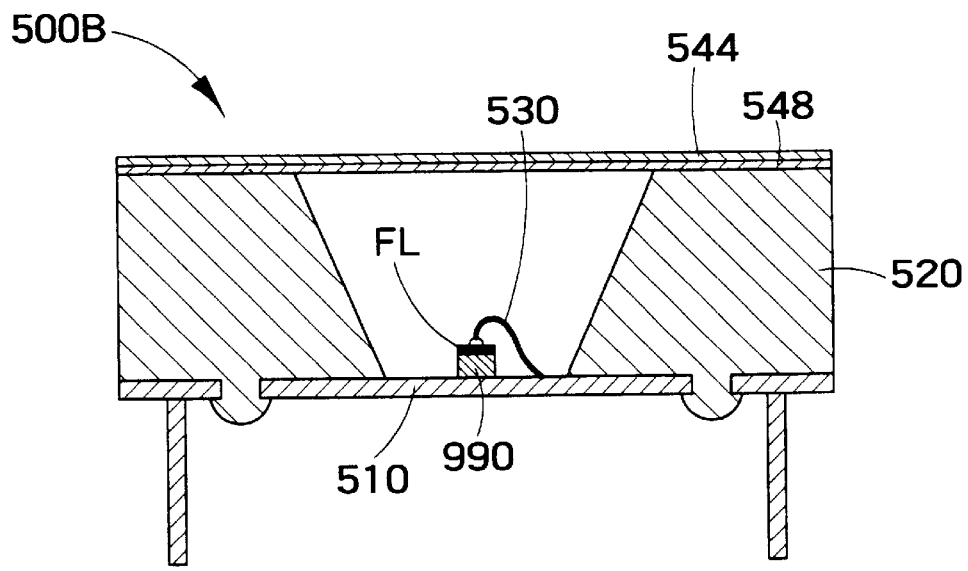
FIGS. 23A and 23B are roughly illustrated cross sectional views of the eighth example of the light emitting devices according to the invention.
Figure 23B:
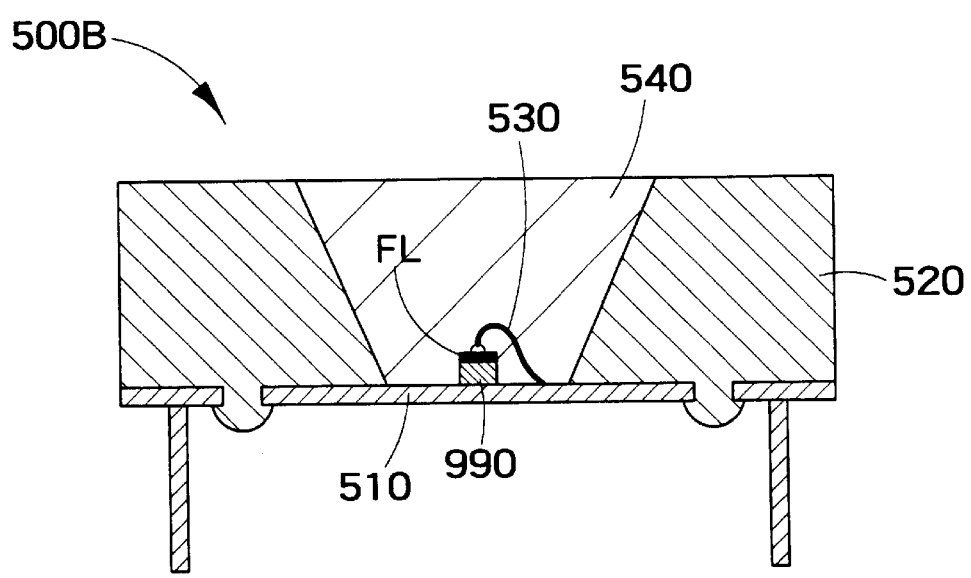

FIGS. 23A and 23B are roughly illustrated cross sectional views of the eighth example of the light emitting devices according to the invention. The light emitting devices 500B shown here are devices of seven segment type of a substrate type. The cavity type is shown in FIG. 23A and the resin mold type is shown in FIG. 23B.

The light emitting element 990 is mounted on the substrate 510, on which the fluorescent layers FL is formed by any method as explained above.

Figure 24:
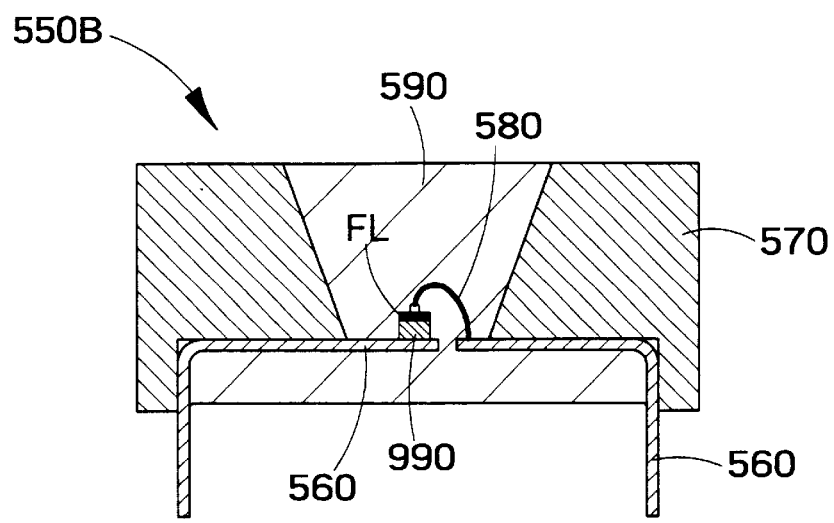
FIG. 24 is a roughly illustrated cross sectional view of the ninth example of the light emitting device according to the invention.

FIG. 24 is a roughly illustrated cross sectional view of the ninth example of the light emitting device according to the invention. The light emitting device 550B shown here is also a device of seven segment type among, which the lead frame type is specifically shown in the figure. The light emitting element 990 is mounted on the lead frame 560, on which the fluorescent layers FL is formed by any method as explained above.

Figure 25:
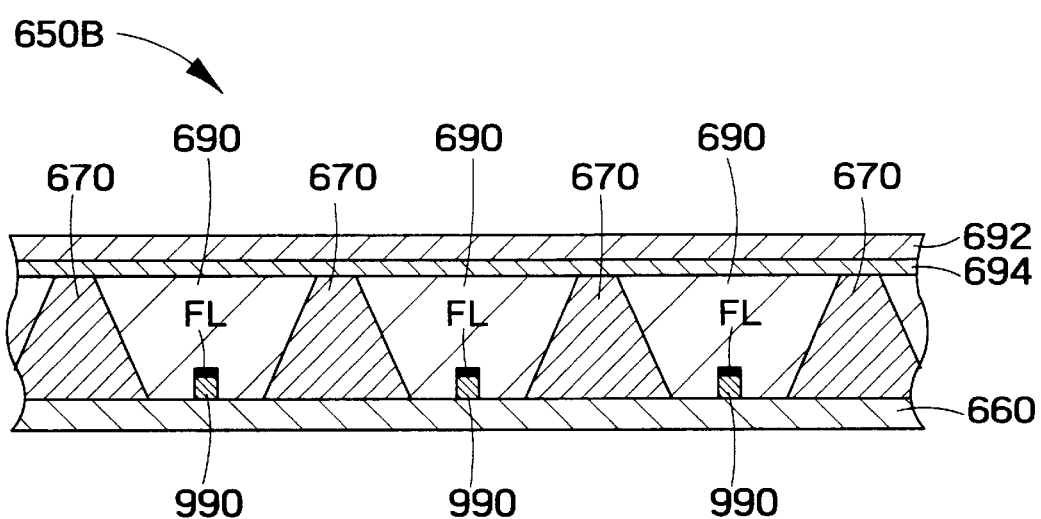
FIG. 25 is a roughly illustrated cross-sectional view of a tenth example of the light emitting device according to the invention.

FIG. 25 is a roughly illustrated cross-sectional view of a tenth example of the light emitting device according to the invention. The light emitting device 650B shown here is a device of the matrix type. A plurality of the light emitting elements 990 are mounted on the substrate 660, on which the fluorescent layers FL is formed by any method as explained above.

Figure 26:
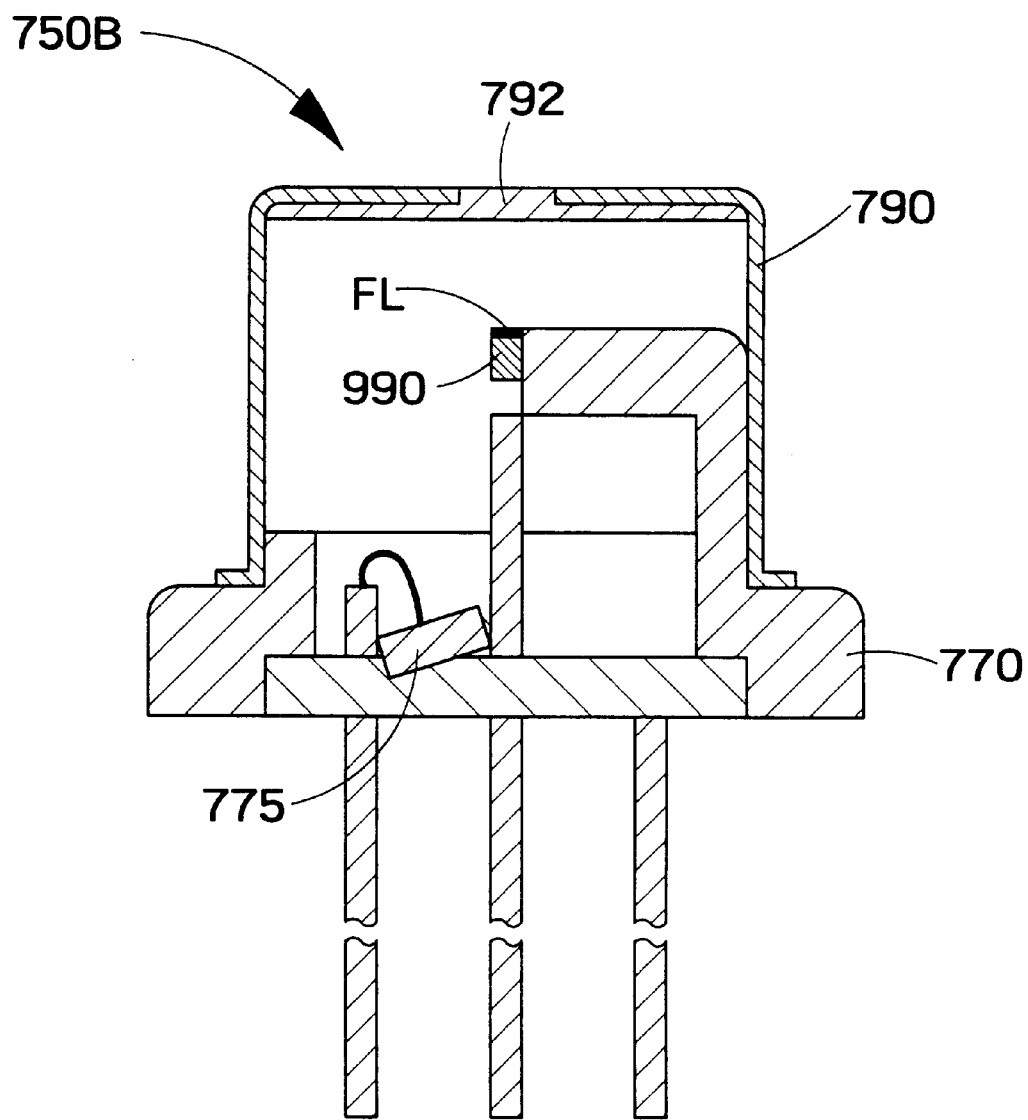
FIG. 26 is a roughly illustrated cross sectional view of a eleventh example of the light emitting device according to the invention.

FIG. 26 is a roughly illustrated cross sectional view of a eleventh example of the light emitting device according to the invention. The light emitting device 750B shown here is a semiconductor laser device of the can type. The light emitting element 990, which is a laser diode in this specific case, is mounted on the stem 770, on which the fluorescent layers FL is formed by any method as explained above.

The above explained specific examples shown in FIG. 17 through 26 also have various advantages as explained with reference to FIG. 16.

Next explained is a forth embodiment of the invention. In the following explanations, the same components as those of the light emitting device shown in FIGS. 1 through 26 are labeled with common reference numerals, and their detailed explanation is omitted.

FIGS. 27A through 27C are a roughly illustrated cross sectional view of a example of the light emitting device according to the embodiment. The light emitting devices 250C shown here are SMD lamps of the substrate type. In the example shown in FIG. 27A, a fluorescent material is uniformly incorporated into resin 290.

In the example shown in FIG. 27B, a fluorescent material is incorporated with a high concentration at the surface region 290A of the resin 290. By precipitating the dispersed fluorescent material before the resin 290 is cured while keeping the device upside down, the high concentration layer 290A of the fluorescent material is formed near the surface of the resin 290. By adjusting the degree of the precipitation, the distribution of the fluorescent material can be controlled. If the fluorescent material is completely precipitated, thin fluorescent layer is formed on the surface of the resin 290, which is substantially the same as coating the fluorescent material on the surface of the resin 290.

In the example shown in FIG. 27C, a layer 290B including the fluorescent material is coated uniformly on the surface of the resin 290. By coating a resin including the fluorescent material after the resin 290 is molded and cured, the uniform layer 290B including the fluorescent material can be formed. Alternatively, by molding the second resin including the fluorescent material on the surface of the first resin 290 after the resin 290 is molded and cured, the uniform layer 290B including the fluorescent material can also be formed.

In the present embodiment, the element 990 need not to include a fluorescent material. However, the element preferably have a luminous emission in the wavelength range of blue or ultraviolet in order to obtain a high conversion yield by using the fluorescent materials which are easily available. As such a element having a light emitting layer made of, for example, gallium nitride, zinc selenide, silicon carbide or boron nitride may be employed.

As the fluorescent material of the embodiment, the inorganic materials or organic materials explained with reference to the first embodiment may be used as well. The material should be selected so that a high conversion efficiency is obtained for the given wavelength of semiconductor element and the desired wavelength of the secondary light.

According to the embodiment, the fluorescent material is incorporated in the resin by the unique technique. Therefore, it is easy to get a multi-color emission, to prevent the fluctuation of the emission wavelength and to prevent the change in the emission wavelength caused by the increase in temperature. The embodiment is especially advantageous, if the emission wavelength is the ultraviolet having a wavelength shorter than 380 nanometers.

The SMD lamp of the embodiment is very compact and easy to mount, and can emit a white light. The conventional SMD lamp need to include a light scattering material in its resin to improve the uniformity of the emission. However, the light scattering material cause the decrease in intensity of the light output because it absorbs the emission. In contrast to this, the SMD lamp of the embodiment emits a uniform luminous light because the incorporated fluorescent material also functions as the light scattering material.

The SMD lamp shown in FIGS. 27B and 27C can convert the primary emission uniformly with a high efficiency because the fluorescent material is located densely at the surface of the resin.

Next explained are specific examples of the embodiment. In the explanation of these examples, the same components as those of the light emitting device shown in FIGS. 1 through 27C are labeled with common reference numerals, and their detailed explanation is omitted.

Figure 28A:
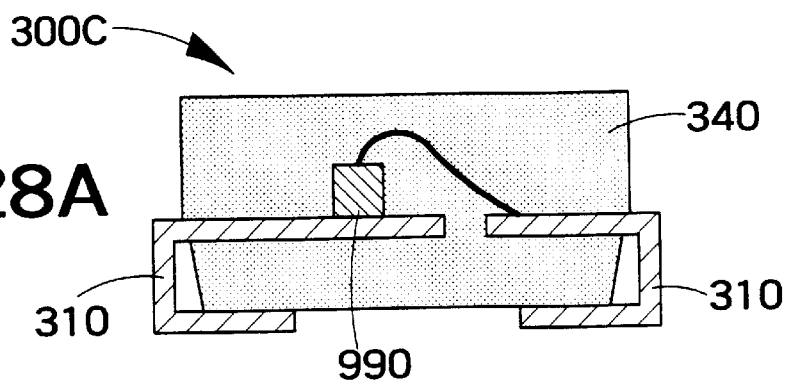
FIGS. 28A through 28C are roughly illustrated cross-sectional views of a second examples of the light emitting device according to the embodiment.
Figure 28B:
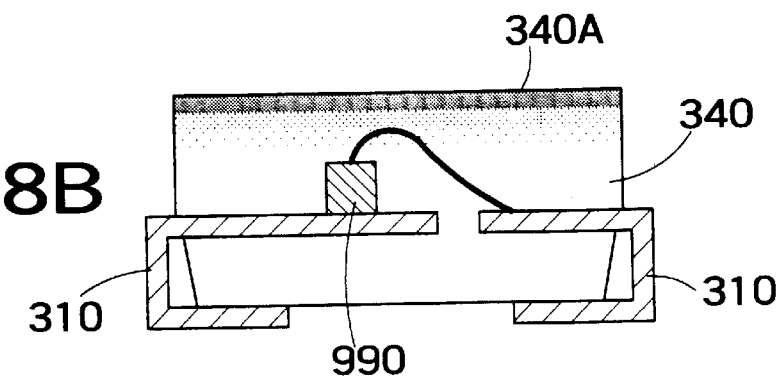
Figure 28C:
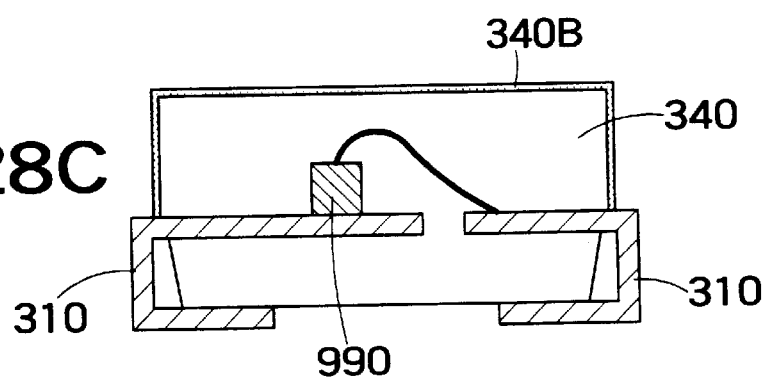

FIGS. 28A through 28C are roughly illustrated cross-sectional views of a second examples of the light emitting device according to the embodiment. The light emitting devices 300C shown here are SMD lamps of a lead frame type.

In the example shown in FIG. 28A, a fluorescent material is uniformly incorporated into resin 340.

In the example shown in FIG. 28B, a fluorescent material is incorporated with a high concentration at the surface region 340A of the resin 340. By precipitating the dispersed fluorescent material before the resin 340 is cured while keeping the device upside down, the high concentration layer 340A of the fluorescent material is formed near the surface of the resin 340.

In the example shown in FIG. 28C, a layer 340B including the fluorescent material is coated uniformly on the surface of the resin 340. By coating the second resin including the fluorescent material after the first resin 340 is molded and cured, the uniform layer 340B including the fluorescent material can be formed. Alternatively, by molding the second resin including the fluorescent material on the surface of first resin 340 after the resin is molded and cured, the uniform layer 340B including the fluorescent material can also be formed.

FIGS. 29A through 29C are roughly illustrated cross-sectional views of third examples of the light emitting device according to the embodiment. The light emitting device 350C shown here is a device of the planer emission type.

In the example shown in FIG. 29A, a fluorescent material is uniformly incorporated into resin 390. In the example shown in FIG. 29B, a fluorescent material is incorporated with a high concentration at the surface region 390A of the resin 390. In the example shown in FIG. 29C, a layer including the fluorescent material is formed uniformly on the surface of the resin 390. The fluorescent material can be incorporated by the same way as explained with reference to the FIGS. 27A through 27C.

According to the embodiment, a luminous uniform white emission is available.

Figure 30A:
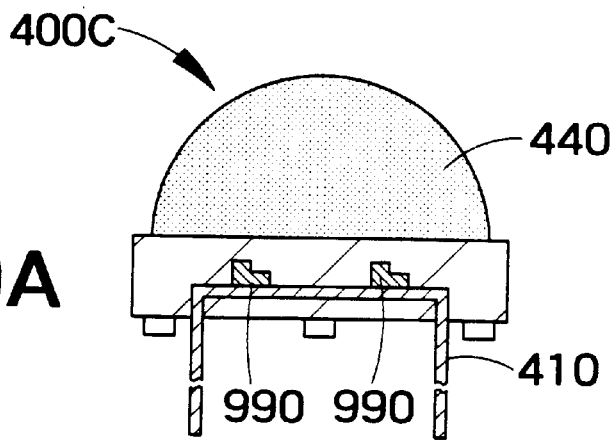
FIGS. 30A through 30C are roughly illustrated cross-sectional views of a forth examples of the light emitting device according to the embodiment.
Figure 30B:
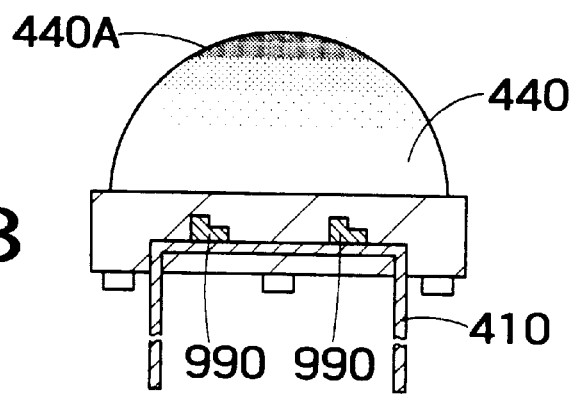
Figure 30C:
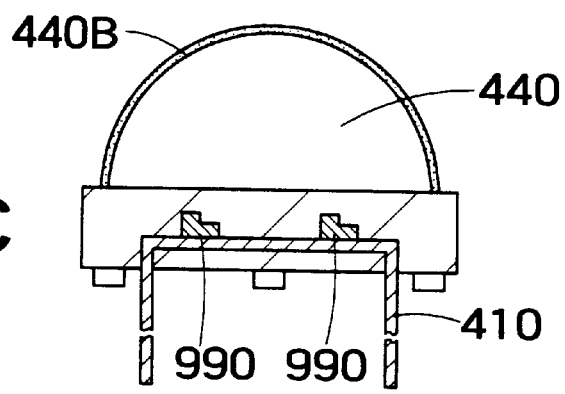

FIGS. 30A through 30C are roughly illustrated cross-sectional views of a forth examples of the light emitting device according to the embodiment. The light emitting devices 400C shown here are of the dome type.

In the example shown in FIG. 30A, a fluorescent material is uniformly incorporated into resin 440. In the example shown in FIG. 30B, a fluorescent material is incorporated with a high concentration at the surface region 440A of the resin 440. In the example shown in FIG. 30C, a layer 440B including the fluorescent material is coated uniformly on the surface of the resin 440. The fluorescent material can be incorporated as explained with reference to the FIGS. 27A through 27C.

According to the embodiment, a dome type device having a luminous uniform white emission is available.

Figure 31A:
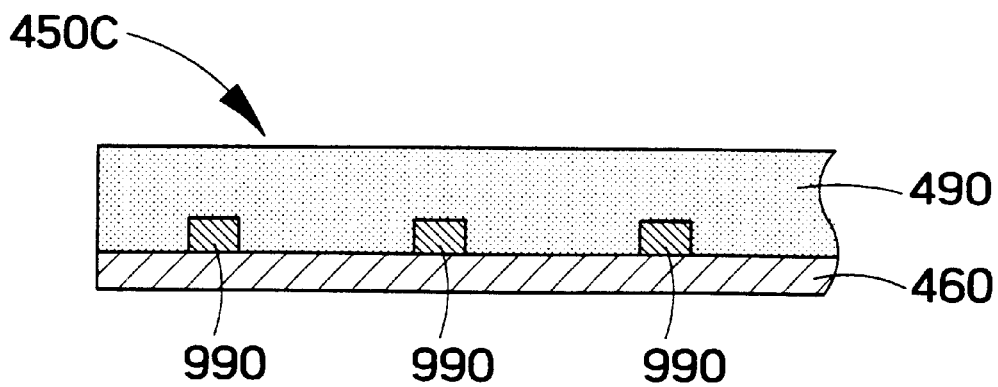
FIGS. 31A through 31C are roughly illustrated cross-sectional views of fifth examples of the light emitting device according to the embodiment.
Figure 31B:
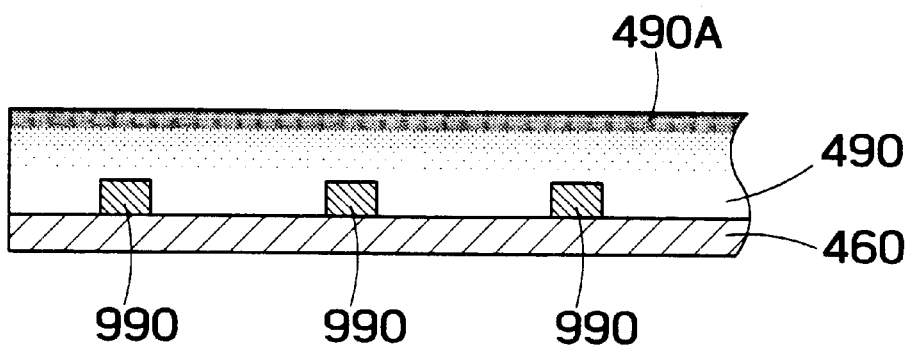
Figure 31C:
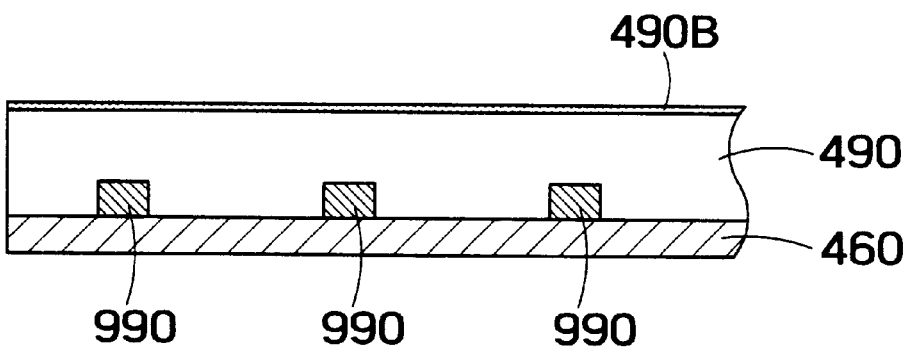

FIGS. 31A through 31C are roughly illustrated cross-sectional views of fifth examples of the light emitting device according to the embodiment. The light emitting devices 450C shown here are devices of the meter needle type.

In the example shown in FIG. 31A, a fluorescent material is uniformly incorporated into resin 490. In the example shown in FIG. 31B, a fluorescent material is incorporated with a high concentration at the surface region 490A of the resin 490. In the example shown in FIG. 31C, a layer 490B including the fluorescent material is coated uniformly on the surface of the resin 490. The fluorescent material can be incorporated as explained with reference to the FIGS. 27A through 27C.

According to the embodiment, a meter needle type device having a luminous uniform white emission is available. Especially, if used on the black meter panel, the meter needle according to the embodiment has a much improved contrast compared to the conventional red or green needles, which makes the driving of the vehicles much safer.

Figure 32A:
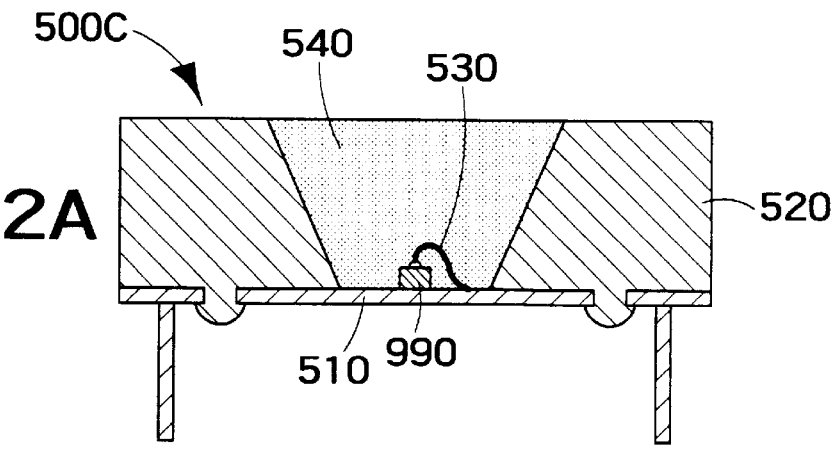
FIGS. 32A through 32C are roughly illustrated cross-sectional views of the sixth examples of the light emitting devices according to the embodiment.
Figure 32B:
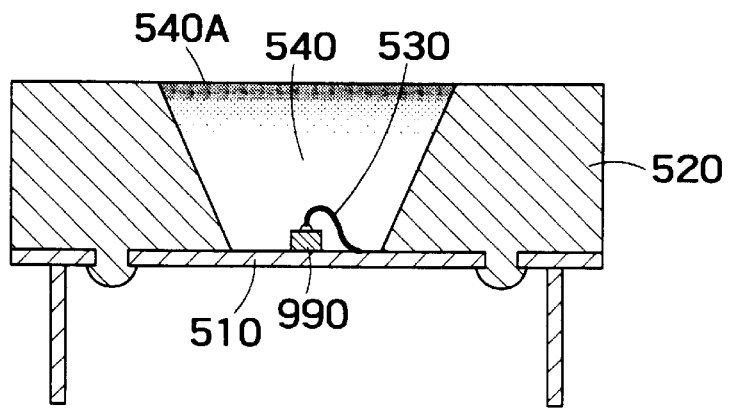
Figure 32C:
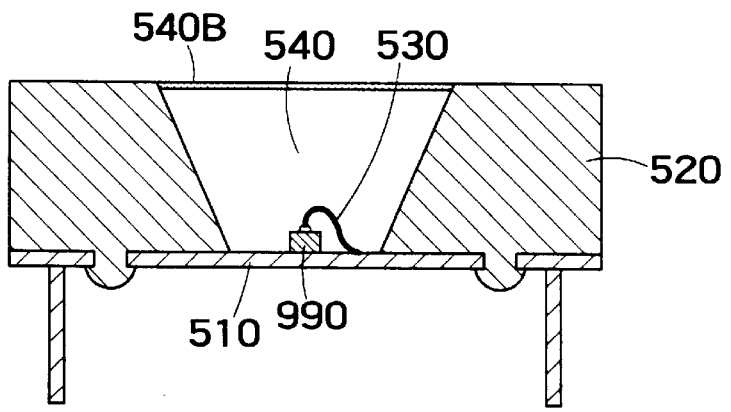

FIGS. 32A through 32C are roughly illustrated cross-sectional views of the sixth examples of the light emitting devices according to the embodiment. The light emitting devices 500C shown here are devices of the seven segment of the substrate type.

In the example shown in FIG. 32A, a fluorescent material is uniformly incorporated into resin 540. In the example shown in FIG. 32B, a fluorescent material is incorporated with a high concentration at the surface region 540A of the resin 540. In the example shown in FIG. 32C, a layer 540B including the fluorescent material is coated uniformly on the surface of the resin 540. The fluorescent material can be incorporated as explained with reference to the FIGS. 27A through 27C.

According to the embodiment, a seven segment type device having a luminous uniform white emission is available.

Figure 33A:
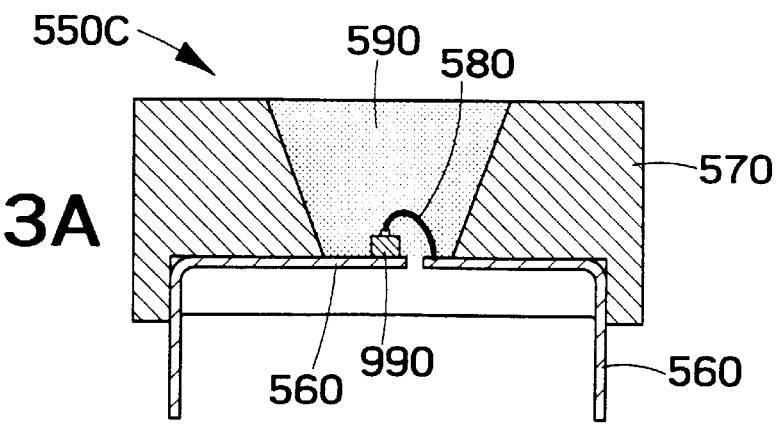
FIGS. 33A through 33C are roughly illustrated cross-sectional views of the seventh examples of the light emitting device according to the embodiment.
Figure 33B:
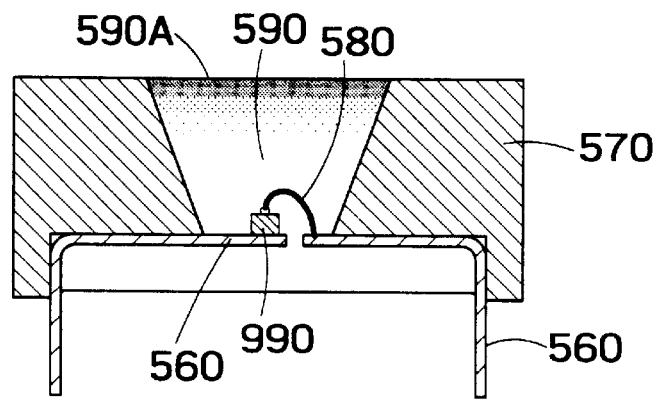
Figure 33C:
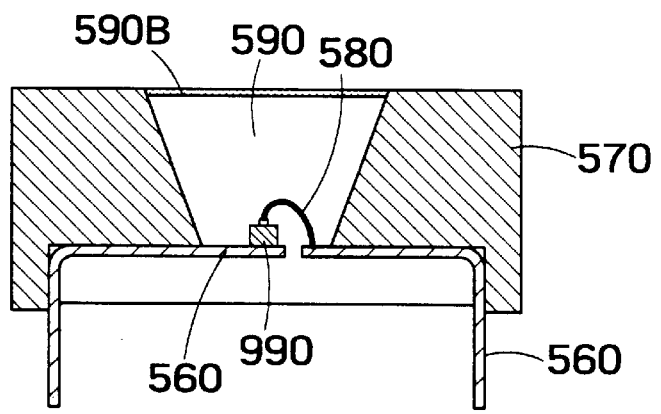

FIGS. 33A through 33C are roughly illustrated cross-sectional views of the seventh examples of the light emitting device according to the embodiment. The light emitting devices 550C shown here are also devices of seven segment type of lead frame type.

In the example shown in FIG. 33A, a fluorescent material is uniformly incorporated into resin 590. In the example shown in FIG. 33B, a fluorescent material is incorporated with a high concentration at the surface region 590A of the resin 590. In the example shown in FIG. 33C, a layer 590B including the fluorescent material is coated uniformly on the surface of the resin 590. The fluorescent material can be incorporated as explained with reference to the FIGS. 27A through 27C.

According to the embodiment, a seven segment type device having a luminous uniform white emission is available. Besides, the viewing angle becomes much wider compared to the conventional device because the primary emission is converted into the secondary light near the surface of the device.

Figure 34A:
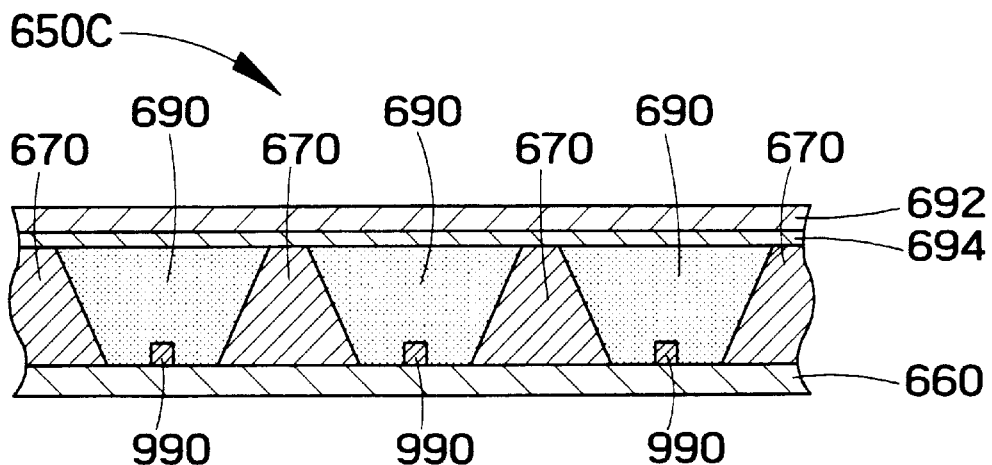
FIGS. 34A through 34C are roughly illustrated cross-sectional views of eighth examples of the light emitting device according to the embodiment.
Figure 34B:
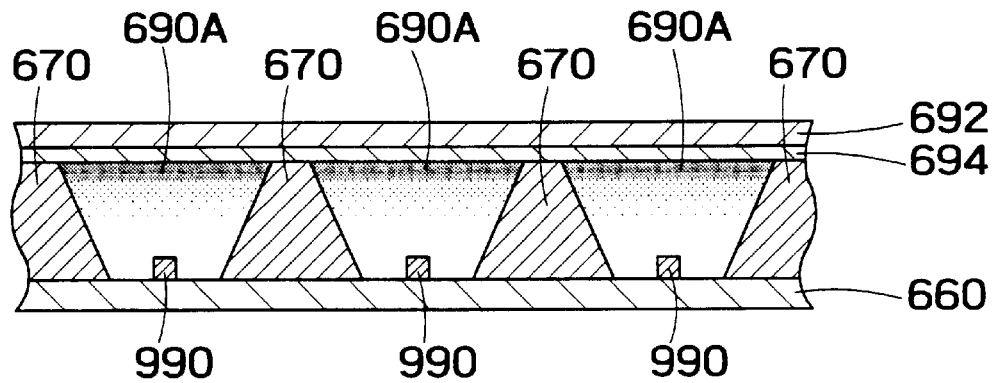
Figure 34C:
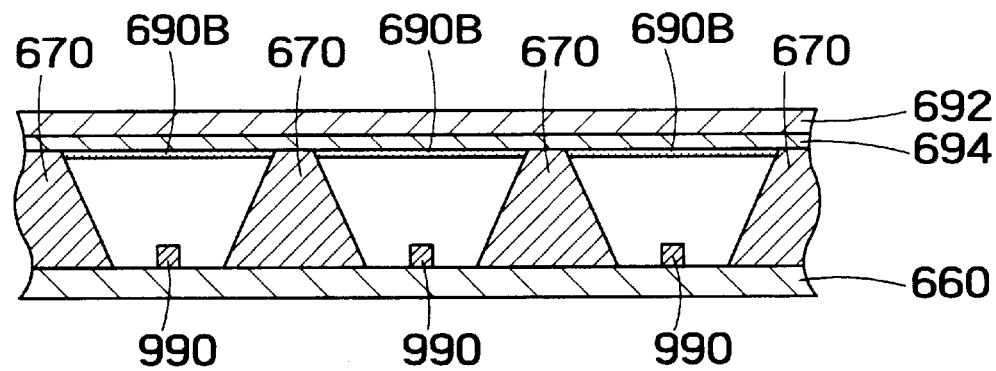

FIGS. 34A through 34C are roughly illustrated cross-sectional views of eighth examples of the light emitting device according to the embodiment. The light emitting device 600C shown here is a device of the matrix type.

In the example shown in FIG. 34A, a fluorescent material is uniformly incorporated into resin 690. In the example shown in FIG. 34B, a fluorescent material is incorporated with a high concentration at the surface region 690A of the resin 690. In the example shown in FIG. 34C, a layer 690B including the fluorescent material is coated uniformly on the surface of the resin 690. The fluorescent material can be incorporated as explained with reference to the FIGS. 27A through 27C.

According to the embodiment, a dot matrix type device having a luminous uniform white emission is available. Besides, a full-color display is easily realized simply by using light emitting elements having a ultraviolet emission and by arranging the appropriate fluorescent material at the appropriate pixel to convert the primary ultraviolet emission into red, green or blue light. When the light emitting elements are densely integrated, the caloric amount increases. However, the wavelength of the secondary emission does not change because the conversion function of the fluorescent material is stable. Besides, the viewing angle becomes much liter compared to the conventional device because the primary emission is converted into the secondary light near the surface of the device.

The above explained specific examples of the forth embodiment of the invention shown in FIGS. 28A through 34C also have various advantages as explained with reference to FIGS. 27A through 27C.

Next explained is a fifth embodiment of the invention.

Figure 35:
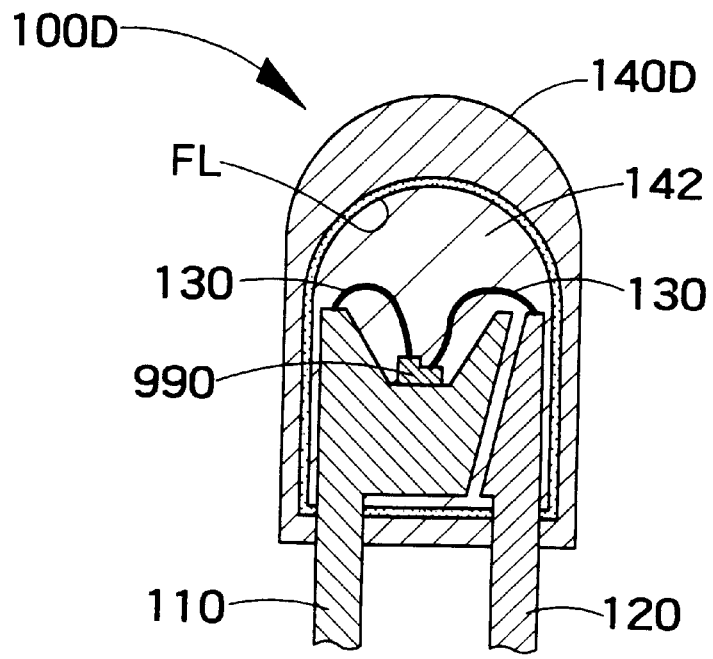
FIG. 35 is a roughly illustrated cross-sectional view of a example of the light emitting device according to the embodiment.

FIG. 35 is a roughly illustrated cross-sectional view of a example of the light emitting device according to the embodiment. The light emitting device 100D shown here is a LED lamp of the lead frame type. The semiconductor light emitting element 990 is mounted on the lead frame 110 then molded by the resin 140D. According to the embodiment, a cavity 142 is formed inside the resin 140D. The deposited layer FL of the fluorescent material is formed on the inner wall of the cavity 142.

In the embodiment, the element 990 need not to include a fluorescent material. However, the element preferably have a luminous emission in the wavelength range of blue or ultraviolet in order to obtain a high conversion yield by using the fluorescent materials which are easily available. As such a element having a light emitting layer made of, for example, gallium nitride, zinc selenide, silicon carbide or boron nitride may be employed.

As the fluorescent material of the embodiment, the inorganic materials or organic materials explained with reference to the first embodiment may be used as well. The material should be selected so that a high conversion efficiency is obtained for the given wavelength of semiconductor element and the desired wavelength of the secondary light. Also the fluorescent material preferably should be excited by the ultraviolet lights. Because if the fluorescent materials is excited by the visible lights, a cross-talk may occur between the adjacent devices. That is, the fluorescent material of one device is unnecessarily excited by the emission from another device.

According to the embodiment, the fluorescent material FL is uniformly deposited at the emission surface of the light emitting element 990. Therefore, almost 100% of the primary light emitted from the element is absorbed and uniformly converted by the fluorescent material. The embodiment is especially advantageous, if the emission wavelength is the ultraviolet having a wavelength shorter than 380 nanometers.

Besides, according to the embodiment, the light source is limited to the vicinity of the emission point of the light emitting element. Therefore, the optical path of the primary light in the fluorescent layer FL becomes uniform and independent to the direction. This solves the problem that the wavelength of the secondary light varies depending to the direction of the light.

Further, according to the embodiment, the light source is limited to the vicinity of the emission point of the light emitting element. Therefore, the secondary light is easily converged by the lens effect of the resin 140D, which realizes the luminous output. This is especially advantageous for the application of traffic signals and the outdoor displays. If the cavity 142 is made big, the spot size of the light becomes larger, which is advantageous for the indicators.

Figure 36:
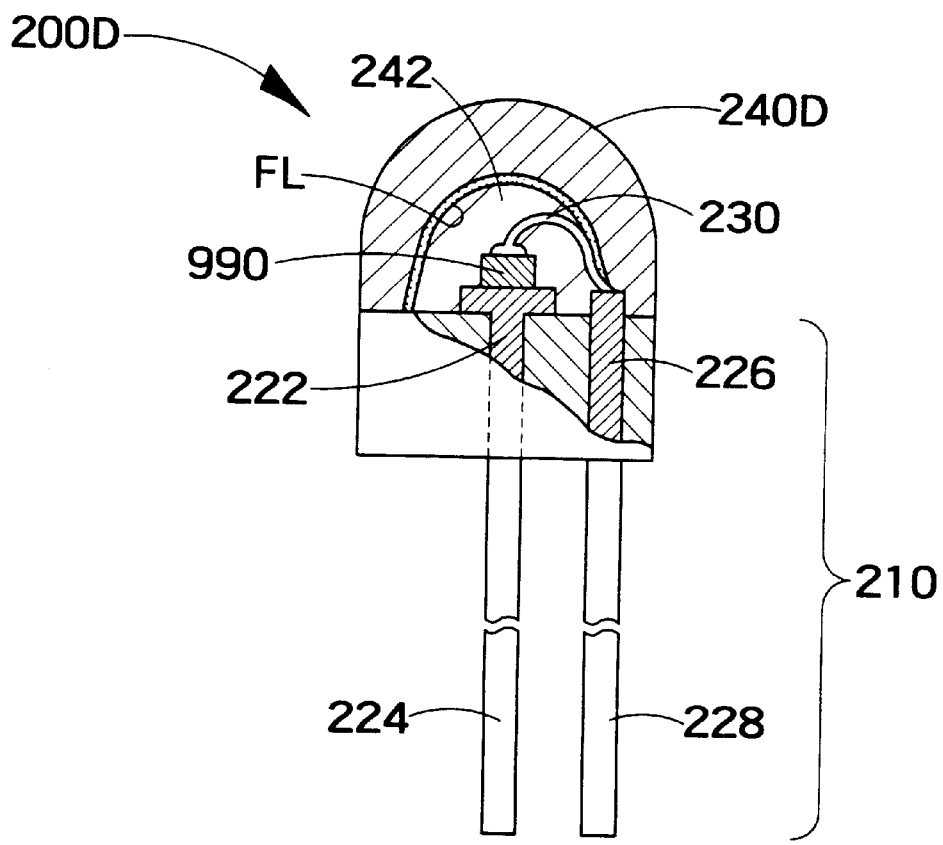
FIG. 36 is a roughly illustrated cross-sectional view of a light emitting device according to the embodiment.

Next explained are specific examples of the embodiment. In the explanation of these examples, the same components as those of the light emitting device shown in FIGS. 1 through 35 are labeled with common reference numerals, and their detailed explanation is omitted. FIG. 36 is a roughly illustrated cross-sectional view of a light emitting device according to the embodiment. The light emitting device 200D shown here is a LED lamp of a stem type. A cavity 242 is formed in the resin 240D. The deposited layer FL of the fluorescent material is formed on the inner wall of the cavity 242.

Figure 37:
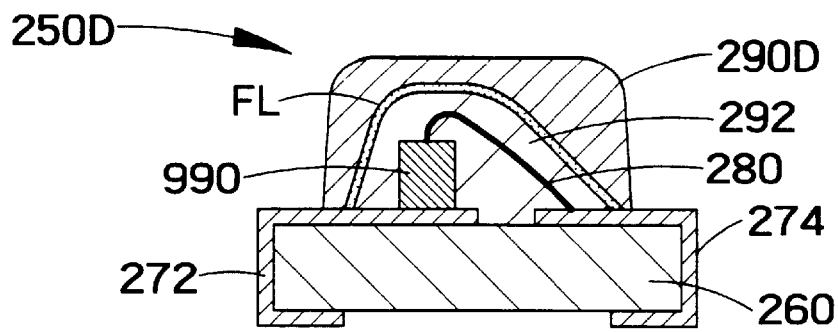
FIG. 37 is a roughly illustrated cross-sectional view of a third example of the light emitting device according to the embodiment.

FIG. 37 is a roughly illustrated cross-sectional view of a third example of the light emitting device according to the embodiment. The light emitting device 250D shown here is an SMD lamp of a substrate type. A cavity 292 is formed in the resin 290D. The deposited layer FL of the fluorescent material is formed on the inner wall of the cavity 292.

Figure 38:
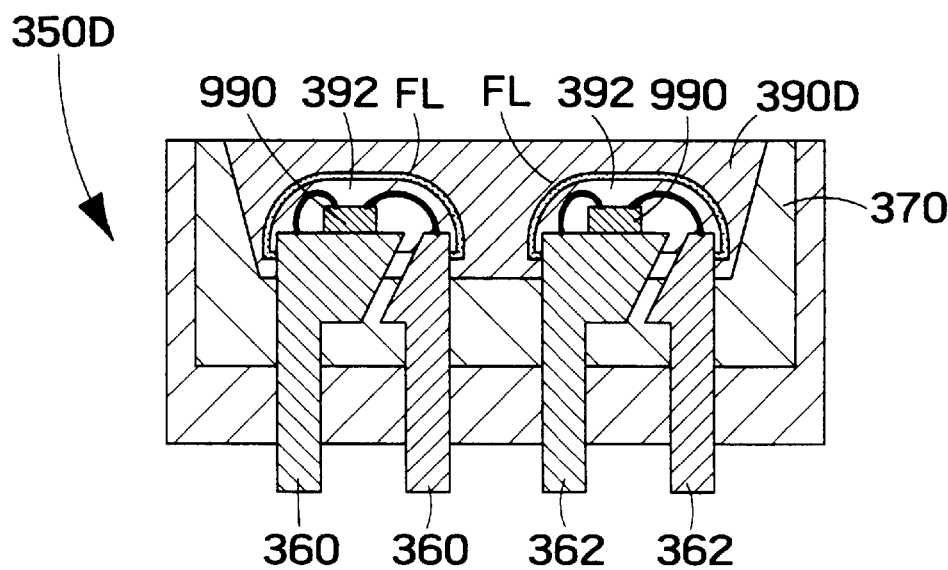
FIG. 38 is a roughly illustrated cross-sectional view of a forth example of the light emitting device according to the embodiment.

FIG. 38 is a roughly illustrated cross-sectional view of a forth example of the light emitting device according to the embodiment. The light emitting device 350D shown here is a device of a planar emission type. A cavity 392 is formed in the resin 390D. The deposited layer FL of the fluorescent material is formed on the inner wall of the cavity 392.

Figure 39:
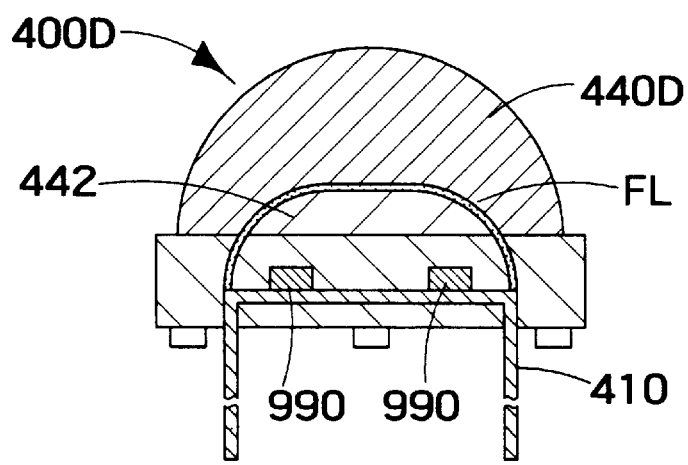
FIG. 39 is a roughly illustrated cross-sectional view of a fifth example of the light emitting device according to the embodiment.

FIG. 39 is a roughly illustrated cross-sectional view of a fifth example of the light emitting device according to the embodiment. The light emitting device 400D shown here is a device of a dome type. A cavity 442 is formed in the resin 440D. The deposited layer FL of the fluorescent material is formed on the inner wall of the cavity 442.

Figure 40:
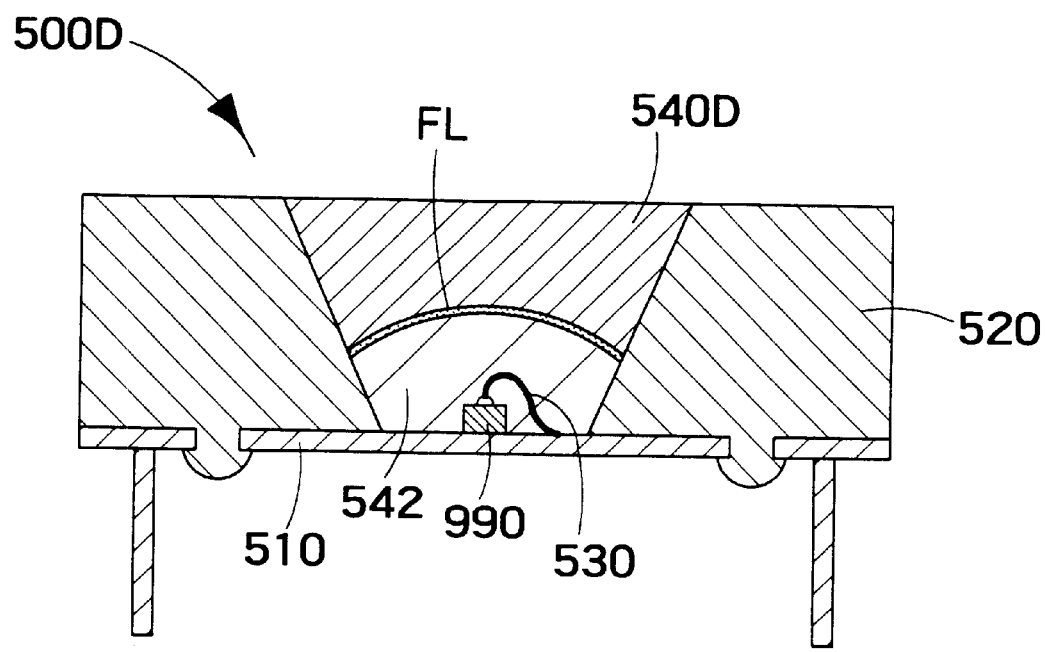
FIG. 40 is a roughly illustrated cross-sectional view of a sixth example of the light emitting device according to the embodiment.

FIG. 40 is a roughly illustrated cross-sectional view of a sixth example of the light emitting device according to the embodiment. The light emitting device 500D shown here is a device of a seven segment type of a substrate type. A cavity 542 is formed in the resin 540D. The deposited layer FL of the fluorescent material is formed on the inner wall of the cavity 542.

The above explained specific examples shown in FIGS. 36 through 40 also have various advantages as explained with reference to FIG. 35.

Next explained is a sixth embodiment of the invention. In the following explanations, the same components as those of the light emitting device shown in FIGS. 1 through 40 are labeled with common reference numerals, and their detailed explanation is omitted.

Figure 41:
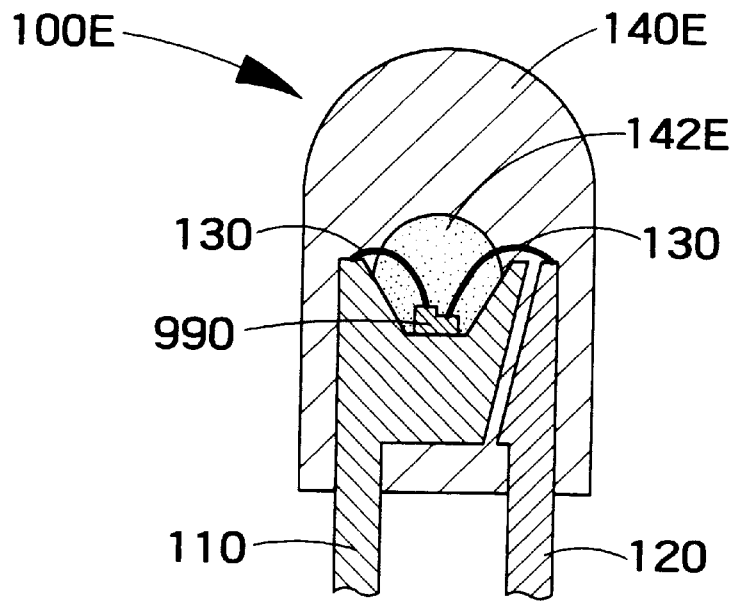
FIG. 41 is a roughly illustrated cross-sectional view of a example of the light emitting device according to the embodiment.

FIG. 41 is a roughly illustrated cross-sectional view of a example of the light emitting device according to the embodiment. The light emitting device 100E shown here is a LED lamp of the lead frame type. The semiconductor light emitting element 990 is mounted on the lead frame 110 then the resin 140E is molded. According to the embodiment, a dipping resin 142E is formed inside the molded resin 140E. The resin 142E contains the fluorescent material. The resin called hereafter "dipping resin" is a resin formed without using a mold. The "dipping resin" is formed by dripping the resin material from a dispenser onto the element or by dipping the element in the resin material. The resin material contains the resin in a appropriate solvent. According to the embodiment, the element 990 is first sealed by the dipping resin 142E which contains the fluorescent material, then the molded resin 140E is formed.

In the embodiment, the element 990 need not to include a fluorescent material. However, the element preferably have a luminous emission in the wavelength range of blue or ultraviolet in order to obtain a high conversion yield by using the fluorescent materials which are easily available. As such a element having a light emitting layer made of, for example, gallium nitride, zinc selenide, silicon carbide or boron nitride may be employed.

As the fluorescent material of the embodiment, the inorganic materials or organic materials explained with reference to the first embodiment may be used as well. The material should be selected so that a high conversion efficiency is obtained for the given wavelength of semiconductor element and the desired wavelength of the secondary light. Also the fluorescent material preferably should be excited by the ultraviolet lights. Because if the fluorescent materials is excited by the visible lights, a cross-talk may occur between the adjacent devices. That is, the fluorescent material of one device is unnecessarily excited by the emission from another device.

According to the embodiment, the fluorescent material FL is uniformly located around the light emitting element 990. Therefore, almost 100% of the primary light emitted from the element is absorbed and uniformly converted by the fluorescent material. The embodiment is especially advantageous, if the emission wavelength is the ultraviolet having a wavelength shorter than 380 nanometers.

Also, the emission wavelength becomes fairly stabilized because the primary light from the element is converted into the secondary light. The wavelength of the resultant secondary light is not affected by the fluctuation of the wavelength of the primary emission. Accordingly, the wavelength of the secondary light is independent to the operating current or voltage applied to the element.

Further, according to the embodiment, the light source is limited to the vicinity of the emission point of the light emitting element. Therefore, the secondary light is easily converged by the lens effect of the resin 140E, which realizes the luminous output. This is especially advantageous for the application of traffic signals and the outdoor displays. If the dipping resin 142E is made big, the spot size of the light becomes larger, which is advantageous for the indicators.

Figure 42:
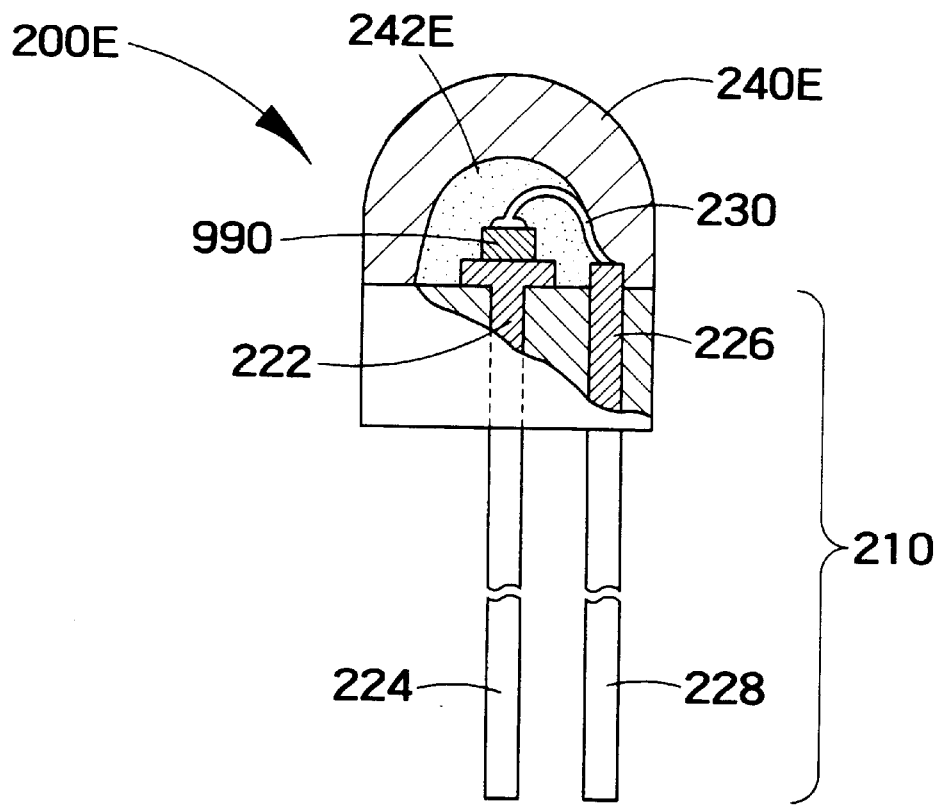
FIG. 42 is a roughly illustrated cross-sectional view of a light emitting device according to the embodiment.

Next explained are specific examples of the embodiment. In the explanation of these examples, the same components as those of the light emitting device shown in FIGS. 1 through 41 are labeled with common reference numerals, and their detailed explanation is omitted. FIG. 42 is a roughly illustrated cross-sectional view, of a light emitting device according to the embodiment. The light emitting device 200E shown here is a LED lamp of a stem type. A dipping resin 242E is formed in the dipped resin 240E. The dipping resin 242E contains the fluorescent material.

Figure 43:
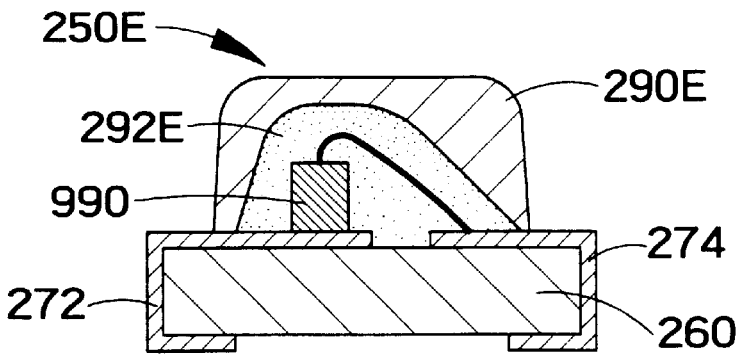
FIG. 43 is a roughly illustrated cross-sectional view of a third example of the light emitting device according to the embodiment.

FIG. 43 is a roughly illustrated cross-sectional view of a third example of the light emitting device according to the embodiment. The light emitting device 250E shown here is an SMD lamp of a substrate type. A dipping resin 292E is formed in the molded resin 290E. The dipping resin 292E contains the fluorescent material.

Figure 44:
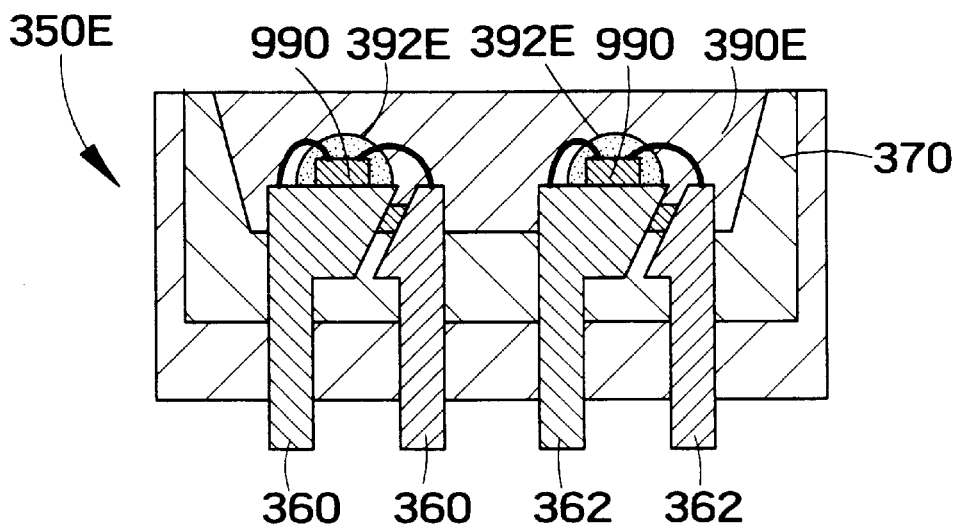
FIG. 44 is a roughly illustrated cross-sectional view of a forth example of the light emitting device according to the embodiment.

FIG. 44 is a roughly illustrated cross-sectional view of a forth example of the light emitting device according to the embodiment. The light emitting device 350E shown here is a device of a planar emission type. A dipping resin 392E is formed in the molded resin 390E. The dipping resin 392E contains the fluorescent material.

Figure 45:
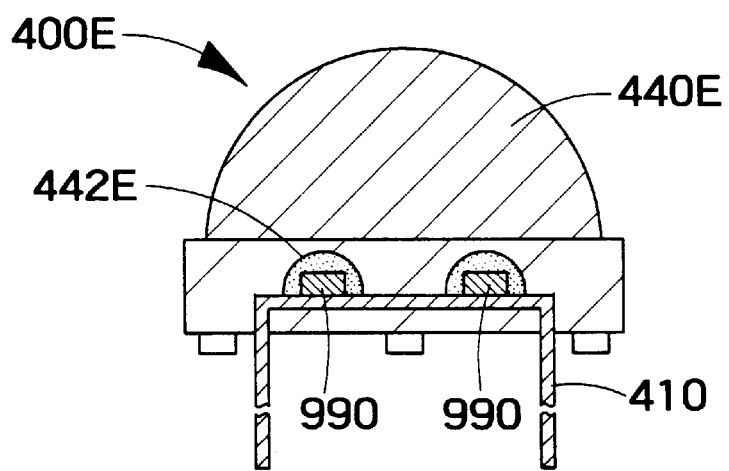
FIG. 45 is a roughly illustrated cross-sectional view of a fifth example of the light emitting device according to the embodiment.

FIG. 45 is a roughly illustrated cross-sectional view of a fifth example of the light emitting device according to the embodiment. The light emitting device 400E shown here is a device of a dome type. A dipping resin 442B is formed in the molded resin 440E. The dipping resin 442E contains the fluorescent material.

Figure 46:
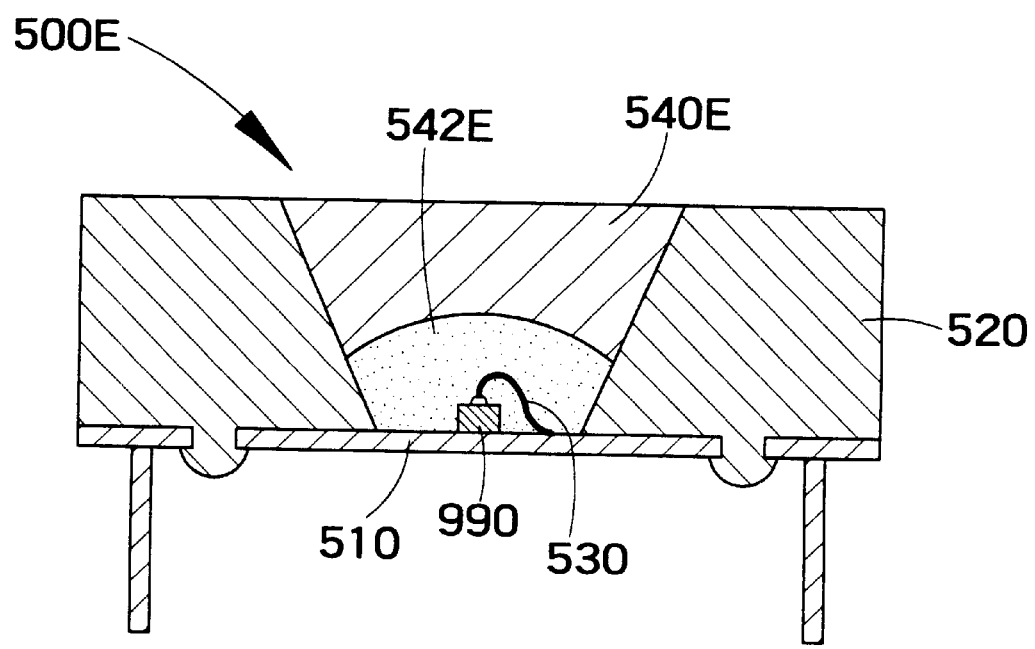
FIG. 46 is a roughly illustrated cross-sectional view of a sixth example of the light emitting device according to the embodiment.

FIG. 46 is a roughly illustrated cross-sectional view of a sixth example of the light emitting device according to the embodiment. The light emitting device 500E shown here is a device of a seven segment type of a substrate type. A dipping resin 542E is formed under the molded resin 540E. The dipping resin 542E contains the fluorescent material.

The above explained specific examples shown in FIGS. 42 through 46 also have various advantages as explained with reference to FIG. 41.

Next explained is a seventh embodiment of the invention.

In the following explanations, the same components as those of the light emitting device shown in FIGS. 1 through 46 are labeled with common reference numerals, and their detailed explanation is omitted.

Figure 47:
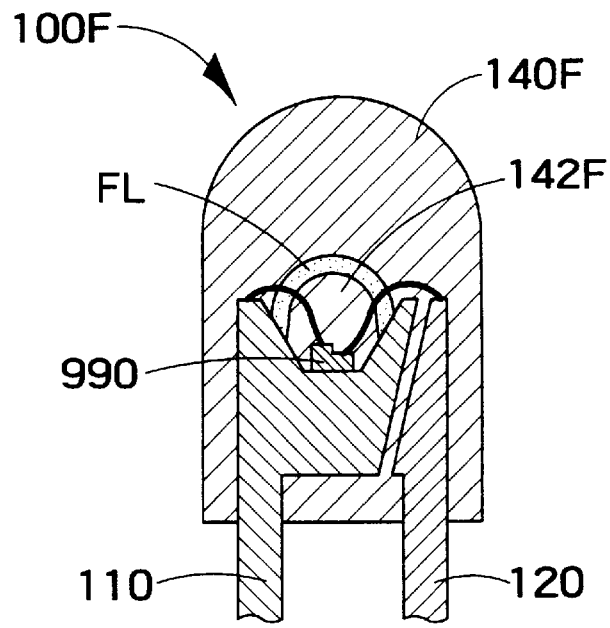
FIG. 47 is a roughly illustrated cross-sectional view of a example of the light emitting device according to the embodiment.

FIG. 47 is a roughly illustrated cross-sectional view of a example of the light emitting device according to the embodiment. The light emitting device 100F shown here is a LED lamp of the lead frame type. The semiconductor light emitting element 990 is mounted on the lead frame 110 then the resin 140F is molded. According to the embodiment, a dipping resin 142F is formed inside the molded resin 140F. The layer FL of the fluorescent material is formed on the surface of the dipping resin 142F. The element 990 is first sealed by the dipping resin 142F. Then the fluorescent material with an appropriate medium is coated on the surface of the dipping resin 142F. Finally, the resin 140F is molded.

In order to form the layer FL containing the fluorescent material, first, the methods as explained with reference to FIG. 16 can be used as well. That is, the fluorescent material is dispersed into an appropriate solvent, then, it is coated on the surface of the element 990 and finally, it is dried up. Another way to form the fluorescent layer is, first, coat an appropriate solvent on the surface of the element 990, then, scatter or spray the fluorescent material onto the solvent, finally, harden it up.

The solvent is preferably adhesive. The examples of the solvent are the ones including an inorganic polymer as a main component. The ones including a rubber material, farinaceous material or protein as a main component are also usable as the solvent. If the inorganic solvent is used, the product advantageously becomes highly durable against the heat and chemicals and becomes flame-retardant. If the rubber material, the farinaceous material or the protein is used, the residual stress of the dried product is relaxed. The farinaceous material and the protein are also easy to handle because they are water-soluble. The specific examples of the solvent are the alkalic silicate solution, the silicate colloid aqua-solution, the phosphate aqua-solution, the organic solvent containing silicate compound, the organic solvent containing rubber and the natural glue aqua-solution.

In the embodiment, the element 990 need not to include a fluorescent material. However, the element preferably have a luminous emission in the wavelength range of blue or ultraviolet in order to obtain a high conversion yield by using the fluorescent materials which are easily available. As such a element having a light emitting layer made of, for example, gallium nitride, zinc selenide, silicon carbide or boron nitride may be employed.

As the fluorescent material of the embodiment, the inorganic materials or organic materials explained with reference to the first embodiment may be used as well. The material should be selected so that a high conversion efficiency is obtained for the given wavelength of semiconductor element and the desired wavelength of the secondary light. Also the fluorescent material preferably should be excited by the ultraviolet lights. Because if the fluorescent materials is excited by the visible lights, a cross-talk may occur between the adjacent devices. That is, the fluorescent material of one device is unnecessarily excited by the emission from another device.

According to the embodiment, the fluorescent material FL is uniformly located around the light emitting element 990. Therefore, almost 100% of the primary light emitted from the element is absorbed and uniformly converted by the fluorescent material. The embodiment is especially advantageous, if the emission wavelength is the ultraviolet having a wavelength shorter than 380 nanometers.

Also, the emission wavelength becomes fairly stabilized because the primary light from the element is converted into the secondary light. The wavelength of the resultant secondary light is not affected by the fluctuation of the wavelength of the primary emission. Accordingly, the wavelength of the secondary light is independent to the operating current or voltage applied to the element.

Further, according to the embodiment, the light source is limited to the vicinity of the emission point of the light emitting element. Therefore, the secondary light is easily converged by the lens effect of the resin 140F, which realizes the luminous output. This is especially advantageous for the application of traffic signals and the outdoor displays. If the dipping resin 142F is made big, the spot size of the light becomes larger, which is advantageous for the indicators.

Figure 48:
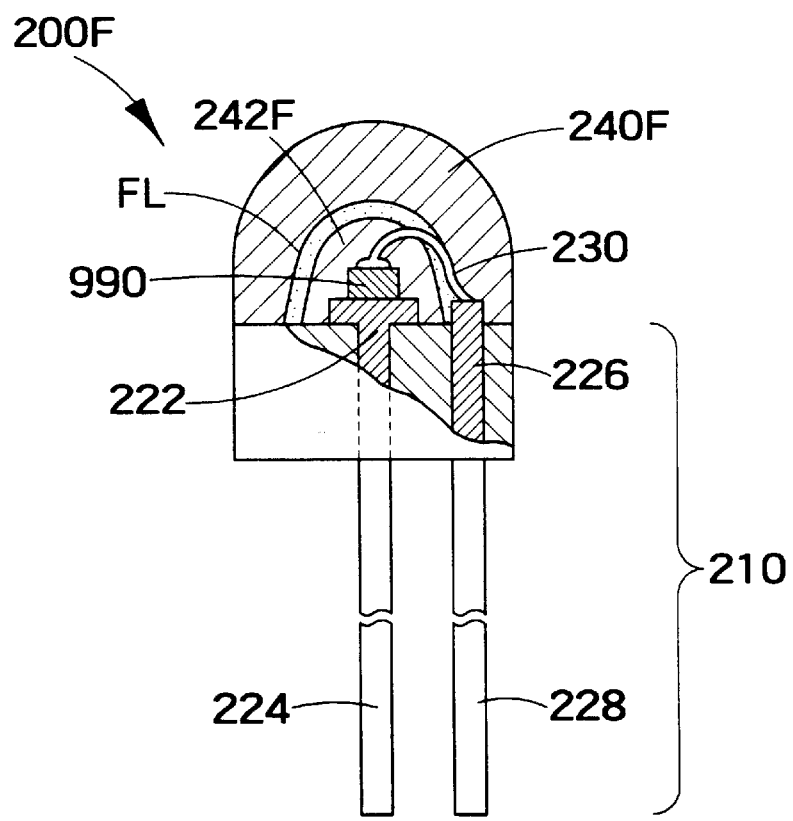
FIG. 48 is a roughly illustrated cross-sectional view of a light emitting device according to the embodiment.

Next explained are specific examples of the embodiment. In the explanation of these examples, the same components as those of the light emitting device shown in FIGS. 1 through 47 are labeled with common reference numerals, and their detailed explanation is omitted. FIG. 48 is a roughly illustrated cross-sectional view of a light emitting device according to the embodiment. The light emitting device 200F shown here is a LED lamp of a stem type. A dipping resin 242F is formed in the dipped resin 240F. The layer FL containing the fluorescent material is formed on the dipping resin 242F.

Figure 49:
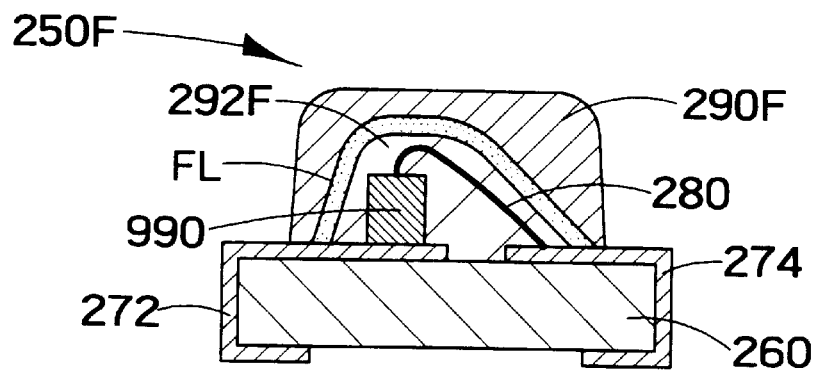
FIG. 49 is a roughly illustrated cross-sectional view of a third example of the light emitting device according to the embodiment.

FIG. 49 is a roughly illustrated cross-sectional view of a third example of the light emitting device according to the embodiment. The light emitting device 250F shown here is an SMD lamp of a substrate type. A dipping resin 292F is formed in the molded resin 290F. The layer FL containing the fluorescent material is formed on the dipping resin 292F.

Figure 50:
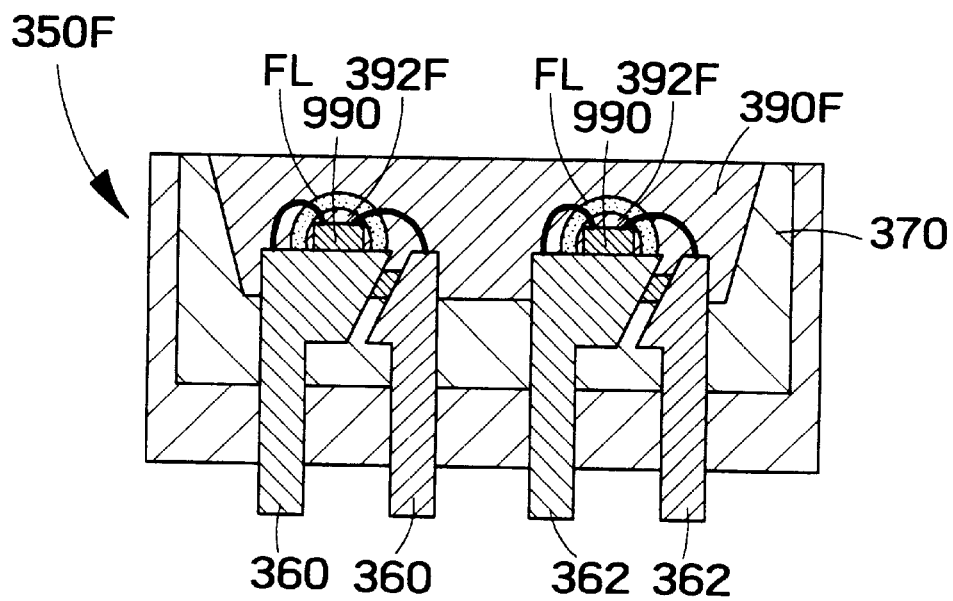
FIG. 50 is a roughly illustrated cross-sectional view of a forth example of the light emitting device according to the embodiment.

FIG. 50 is a roughly illustrated cross-sectional view of a forth example of the light emitting device according to the embodiment. The light emitting device 350F shown here is a device of a planar emission type. A dipping resins 392F are formed in the molded resin 390F. The layers FL containing the fluorescent material are formed on the dipping resins 392F.

Figure 51:
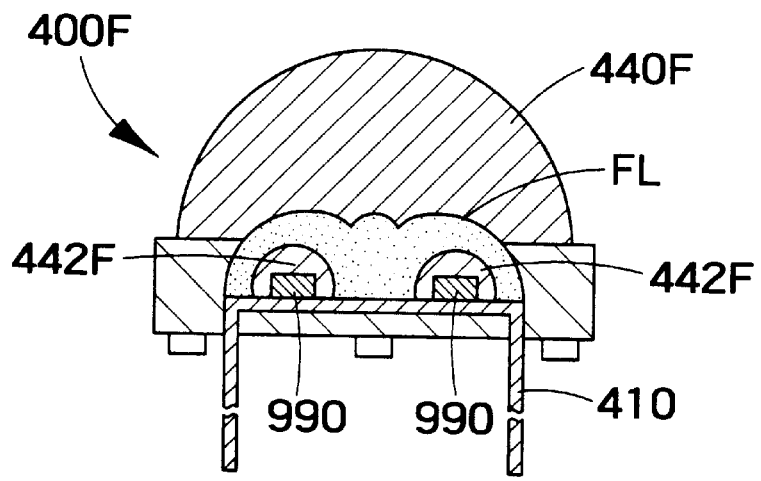
FIG. 51 is a roughly illustrated cross-sectional view of a fifth example of the light emitting device according to the embodiment.

FIG. 51 is a roughly illustrated cross-sectional view of a fifth example of the light emitting device according to the embodiment. The light emitting device 400F shown here is a device of a dome type. A dipping resin 442F is formed in the molded resin 440F. The layer FL containing the fluorescent material is formed on the dipping resin 442F.

Figure 52:
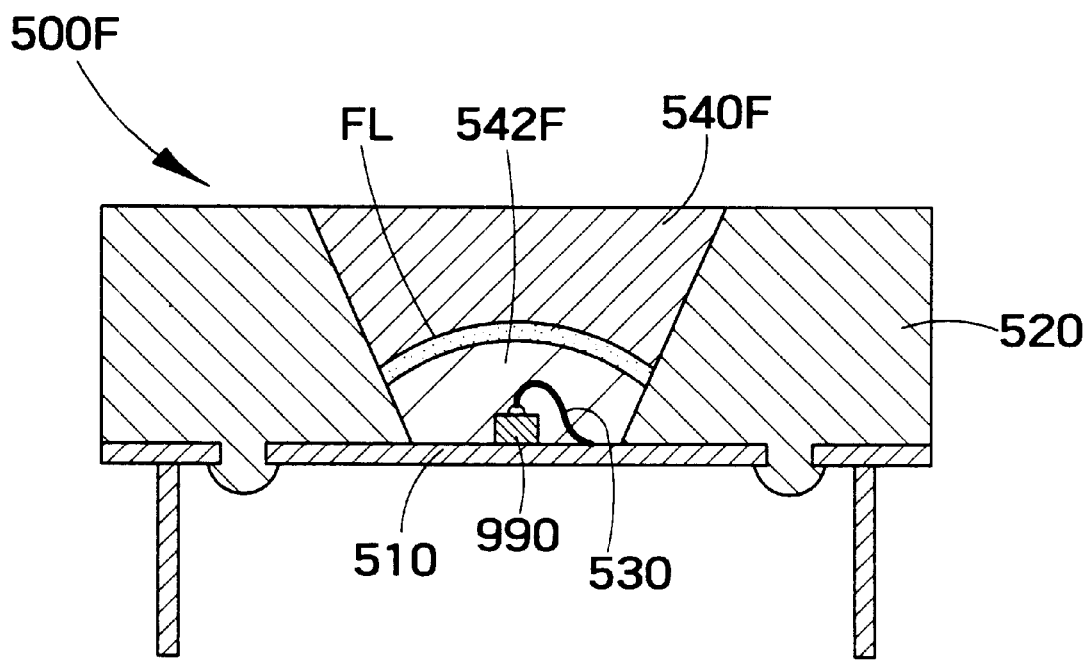
FIG. 52 is a roughly illustrated cross-sectional view of a sixth example of the light emitting device according to the embodiment.

FIG. 52 is a roughly illustrated cross-sectional view of a sixth example of the light emitting device according to the embodiment. The light emitting device 500F shown here is a device of a seven segment type of a substrate type. A dipping resin 542F is formed under the molded resin 540F. The layer FL containing the fluorescent material is formed on the dipping resin 542F.

The above explained specific examples shown in FIGS. 48 through 52 also have various advantages as explained with reference to FIG. 47.

Next explained is a eighth embodiment of the invention. In the following explanations, the same components as those of the light emitting device shown in FIGS. 1 through 52 are labeled with common reference numerals, and their detailed explanation is omitted.

Figure 53:
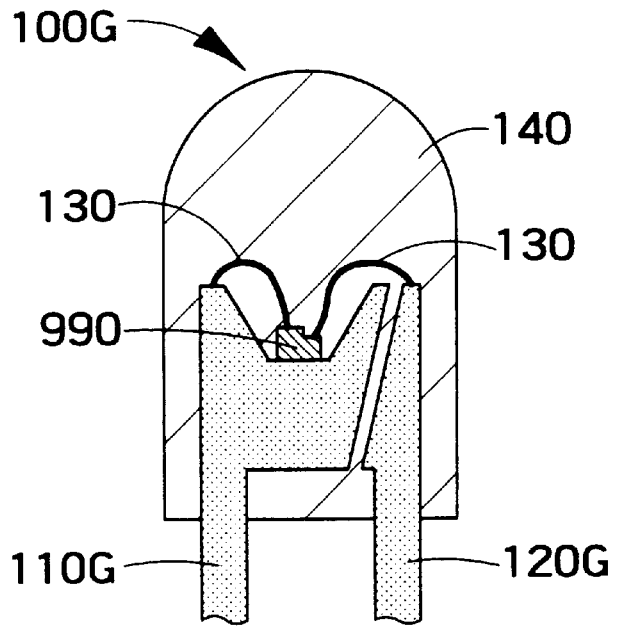
FIG. 53 is a roughly illustrated cross-sectional view of a example of the light emitting device according to the embodiment.

FIG. 53 is a roughly illustrated cross-sectional view of a example of the light emitting device according to the embodiment. The light emitting device 100G shown here is a LED lamp of the lead frame type. The semiconductor light emitting element 990 is mounted on the lead frame 110G then the resin 140 is molded. According to the embodiment, the lead frame 110G and 120G contains the fluorescent material which absorbs the primary light emitted from the element 990 and emits the secondary light.

In the embodiment, the element 990 also need not to include a fluorescent material. However, the element preferably have a luminous emission in the wavelength range of blue or ultraviolet in order to obtain a high conversion yield by using the fluorescent materials which are easily available. As such a element having a light emitting layer made of, for example, gallium nitride, zinc selenide, silicon carbide or boron nitride may be employed.

As the fluorescent material of the embodiment, the inorganic materials or organic materials explained lath reference to the first embodiment may be used as well. The material should be selected so that a high conversion efficiency is obtained for the given wavelength of semiconductor element and the desired wavelength of the secondary light. Also the fluorescent material preferably should be excited by the ultraviolet lights. Because if the fluorescent materials is excited by the visible lights, a cross-talk may occur between the adjacent devices. That is, the fluorescent material of one device is unnecessarily excited by the emission from another device.

According to the embodiment, the emission wavelength becomes fairly stabilized because the primary light from the element is converted into the secondary light. The wavelength of the resultant secondary light is not affected by the fluctuation of the wavelength of the primary emission. Accordingly, the wavelength of the secondary light is independent to the operating current or voltage applied to the element.

Figure 54:
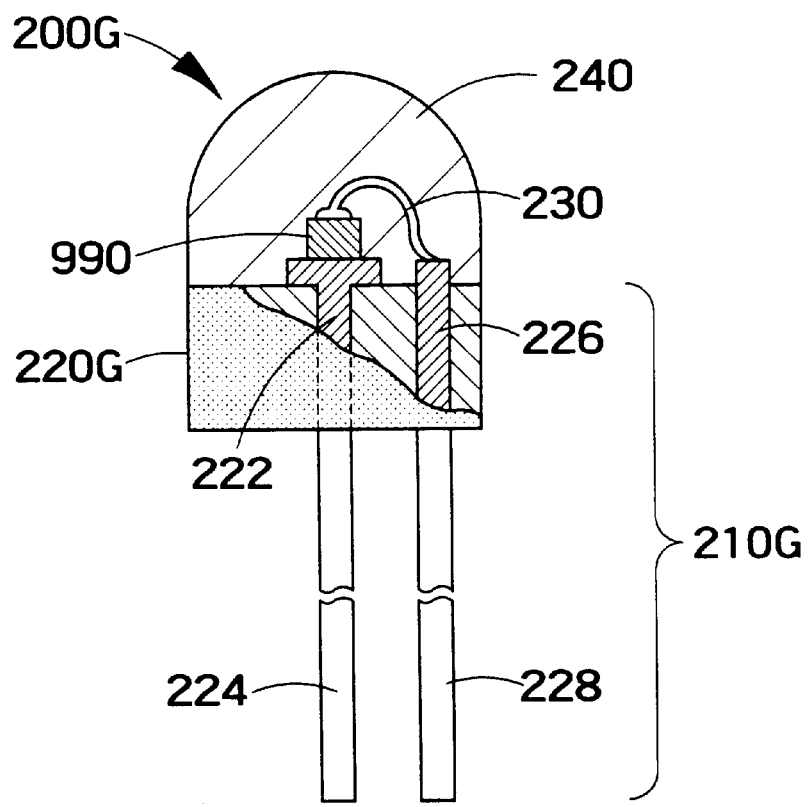
FIG. 54 is a roughly illustrated cross-sectional view of a light emitting device according to the embodiment.

Next explained are specific examples of the embodiment. In the explanation of these examples, the same components as those of the light emitting device shown in FIGS. 1 through 53 are labeled with common reference numerals, and their detailed explanation is omitted. FIG. 54 is a roughly illustrated cross-sectional view of a light emitting device according to the embodiment. The light emitting device 200G shown here is a LED lamp of a stem type. The fluorescent material is incorporated in the insulative part 220G of the stem 210G.

Figure 55:
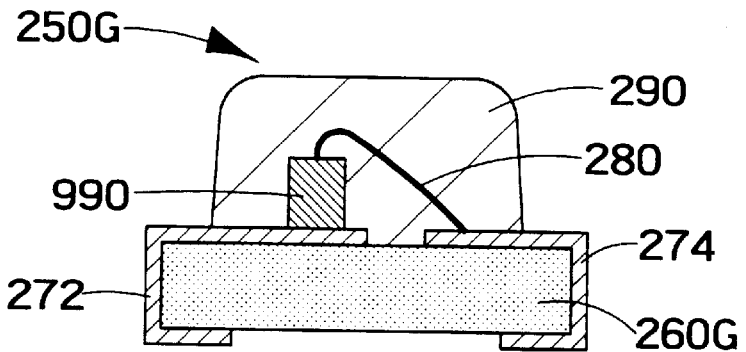
FIG. 55 is a roughly illustrated cross-sectional view of a third example of the light emitting device according to the embodiment.

FIG. 55 is a roughly illustrated cross-sectional view of a third example of the light emitting device according to the embodiment. The light emitting device 250G shown here is an SMD lamp of a substrate type. The fluorescent material is incorporated in the substrate 260G.

Figure 56:
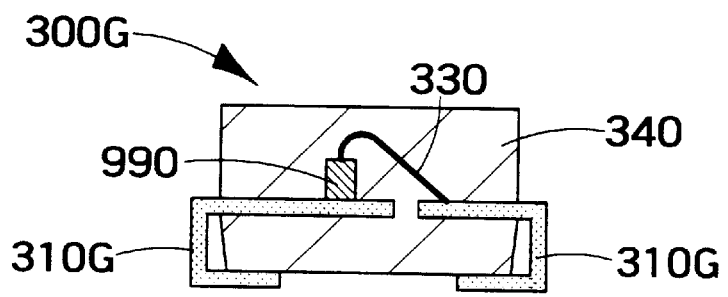
FIG. 56 is a roughly illustrated cross-sectional view of a forth example of the light emitting device according to the embodiment.

FIG. 56 s a roughly illustrated cross-sectional view of a forth example of the light emitting device according to the embodiment. The light emitting device 300G shown here is an SMD lamp of a lead frame type. The fluorescent material is incorporated in the lead frame 310G.

Figure 57:
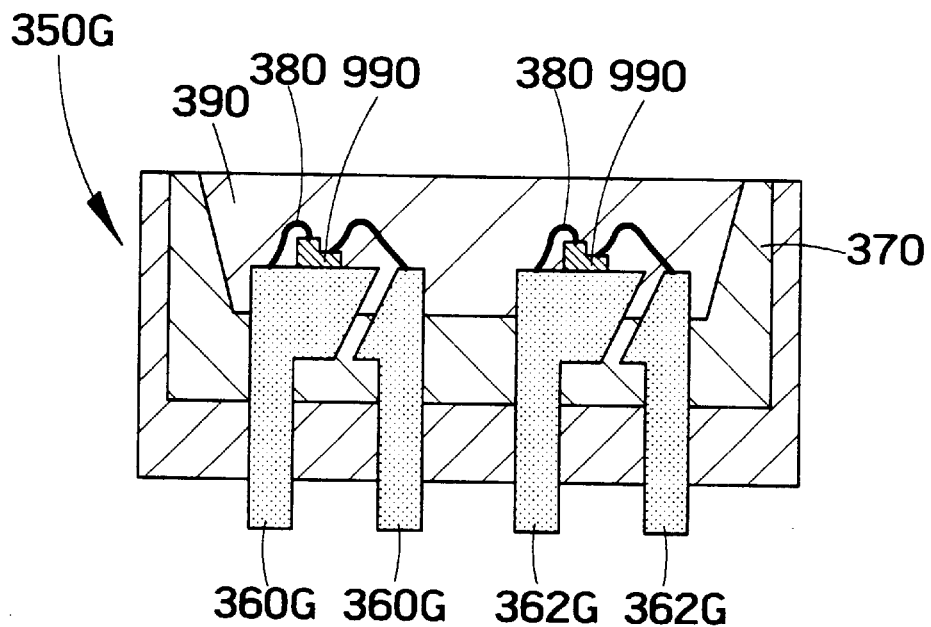
FIG. 57 is a roughly illustrated cross-sectional view of a fifth example of the light emitting device according to the embodiment.

FIG. 57 is a roughly illustrated cross-sectional view of a fifth example of the light emitting device according to the embodiment. The light emitting device 350G shown here is a device of a planar emission type. The fluorescent material is incorporated in the lead frame 360G and 362G.

Figure 58:
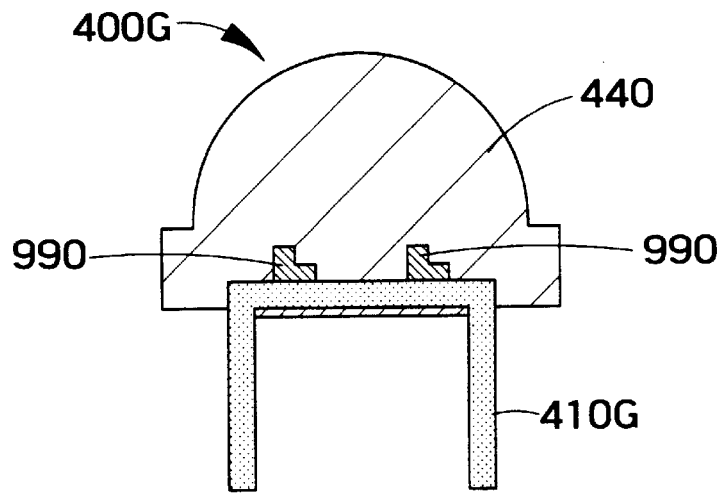
FIG. 58 is a roughly illustrated cross-sectional view of a sixth example of the light emitting device according to the embodiment.

FIG. 58 is a roughly illustrated cross-sectional view of a sixth example of the light emitting device according to the embodiment. The light emitting device 400G shown here is a device of a dome type. The fluorescent material is incorporated in the lead frame 410G.

Figure 59A:
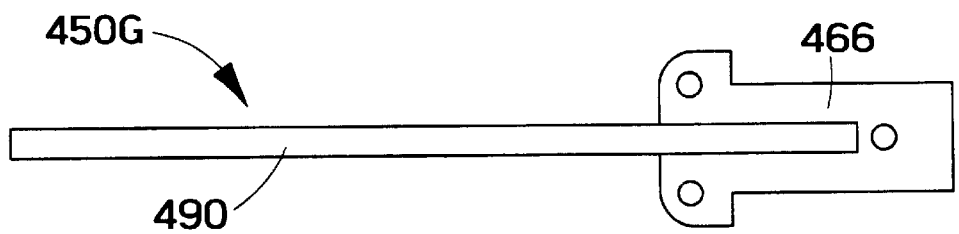
FIGS. 59A and 59B are a roughly illustrated view and a cross-sectional view of a seventh example of the light emitting device according to the embodiment respectively.
Figure 59B:
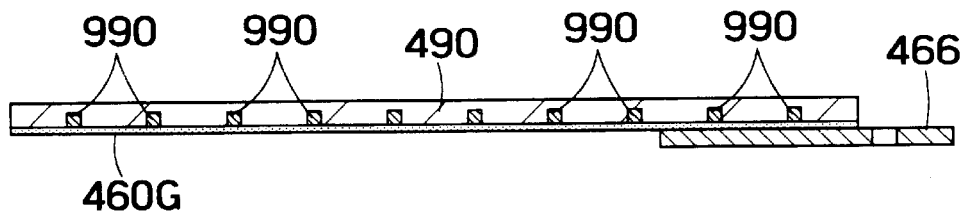

FIGS. 59A and 59B are a roughly illustrated view and a cross-sectional view of a seventh example of the light emitting device according to the embodiment respectively. The light emitting device 450G shown here is a device of a meter needle type. The fluorescent material is incorporated in the substrate 460G.

Figure 60:
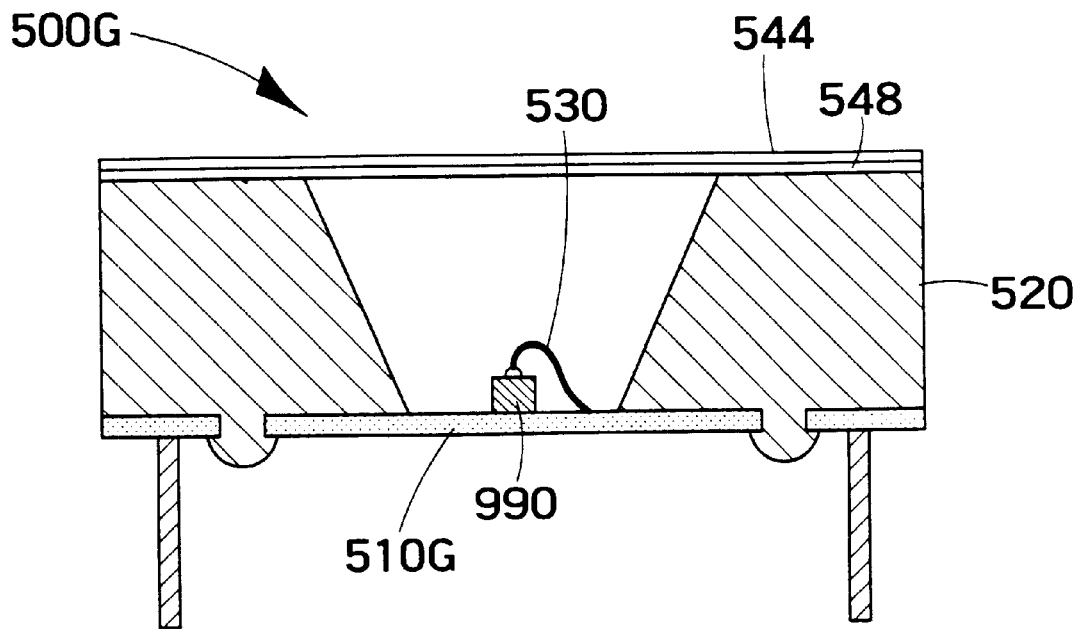
FIG. 60 is a roughly illustrated cross-sectional view of a eighth example of the light emitting device according to the embodiment.

FIG. 60 is a roughly illustrated cross-sectional view of a eighth example of the light emitting device according to the embodiment. The light emitting device 500G shown here is a device of a seven segment type of a substrate type. The fluorescent material is incorporated in the substrate 5010G. The embodiment is also applied to the device of a resin mold tape in addition to the illustrated cavity type in the figure.

Figure 61:
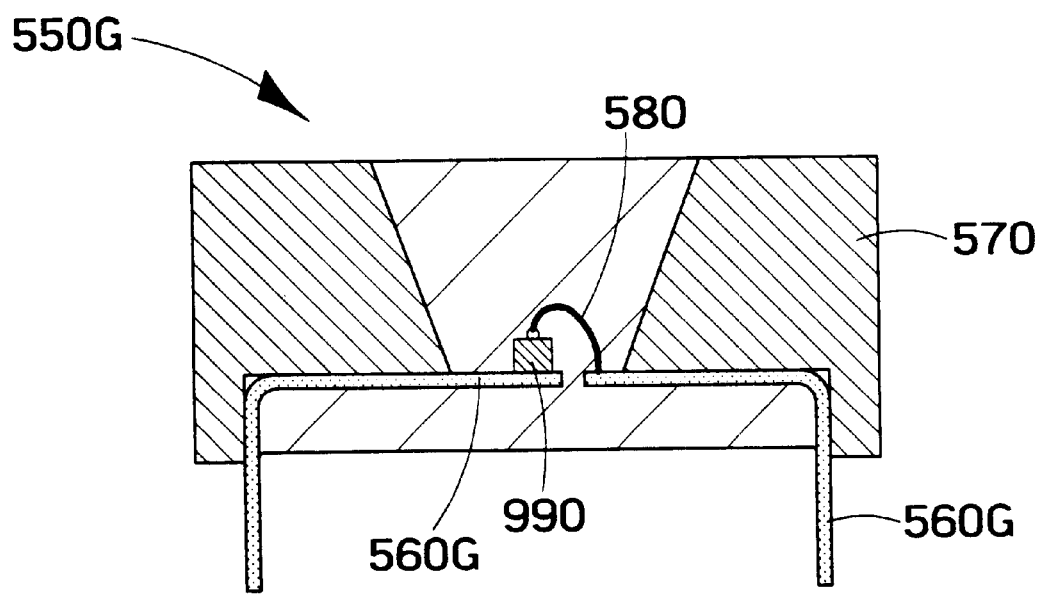
FIG. 61 is a roughly illustrated cross-sectional view of a ninth example of the light emitting device according to the embodiment.

FIG. 61 is a roughly illustrated cross-sectional view of a ninth example of the light emitting device according to the embodiment. The light emitting device 550G shown here is a device of a seven segment type of a lead frame type. The fluorescent material is incorporated in the lead frame 560G.

Figure 62:
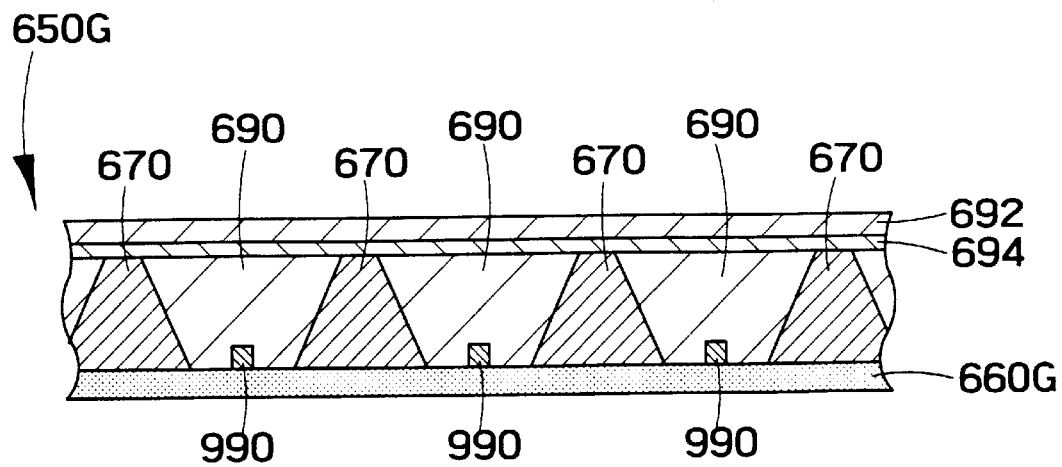
FIG. 62 is a roughly illustrated cross-sectional view of a tenth example of the light emitting device according to the embodiment.
Figure 63:
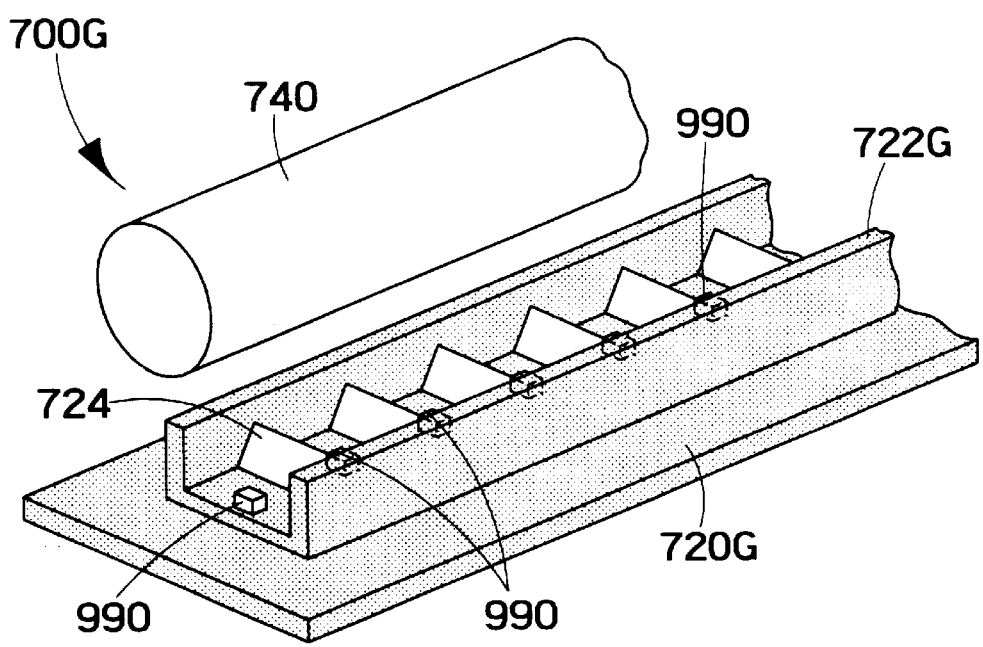
FIG. 63 is a roughly illustrated cross-sectional view of a eleventh example of the light emitting device according to the embodiment.

FIG. 62 is a roughly illustrated cross-sectional view of a tenth example of the light emitting device according to the embodiment. The light emitting device 650G shone here is a device of a matrix type. The fluorescent material is incorporated in the substrate 660G. FIG. 63 is a roughly illustrated cross-sectional view of a eleventh example of the light emitting device according to the embodiment. The light emitting device 700G shown here is a device of an array tape. The fluorescent material is incorporated in the substrate 720G or the reflector 722G.

Figure 64:
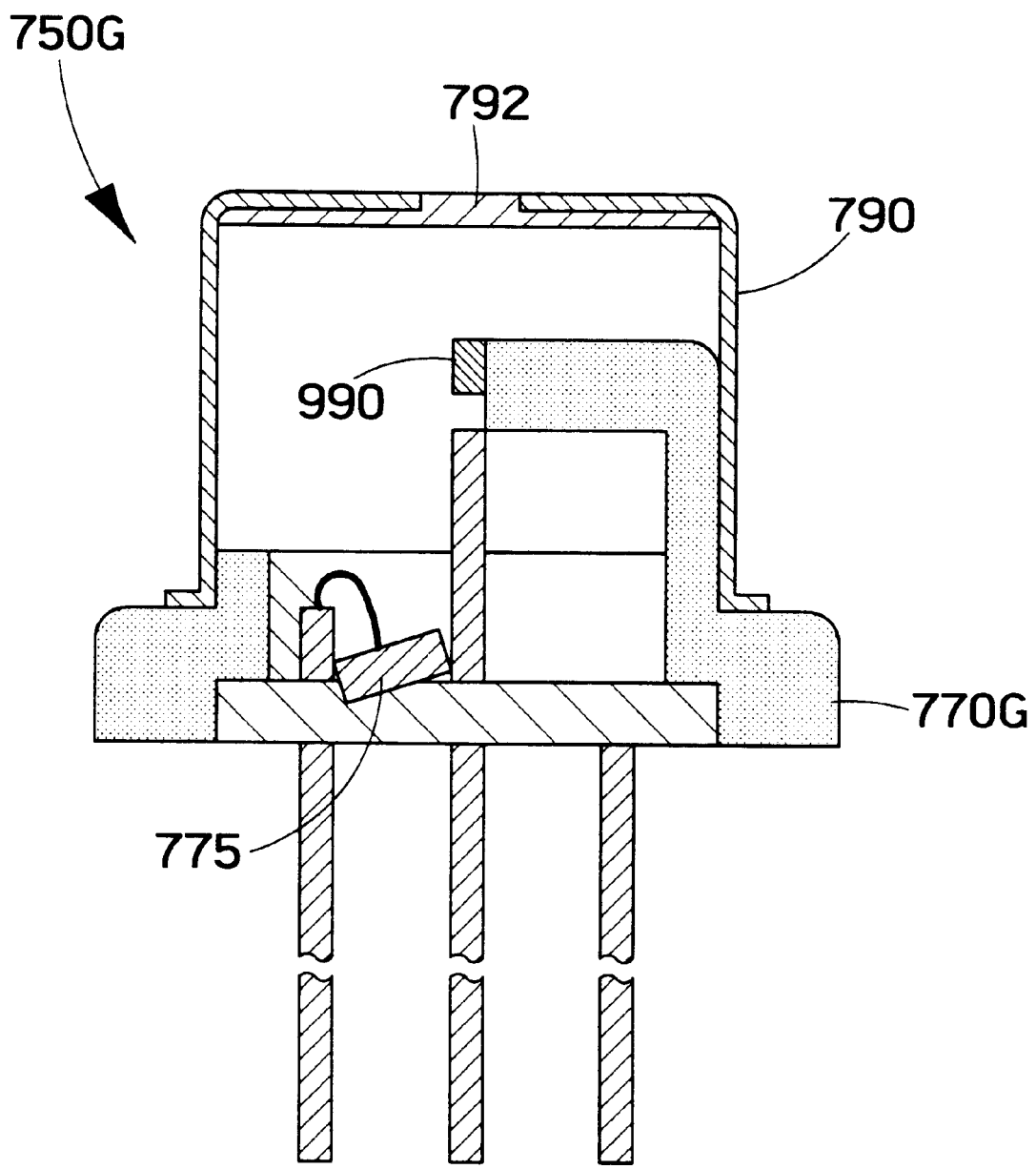
FIG. 64 is a roughly illustrated cross-sectional view of a twelfth example of the light emitting device according to the embodiment.

FIG. 64 is a roughly illustrated cross-sectional view of a twelfth example of the light emitting device according to the embodiment. The light emitting device 750G shown here is a laser sol device of a can type. The fluorescent material is incorporated in the stem 770G.

The above explained specific examples shown in FIGS. 54 through 64 also have various advantages as explained with reference to FIG. 53.

Next explained is a ninth embodiment of the invention. According to the embodiment, the fluorescent material is located under the light emitting element. More specifically, the fluorescent material is placed at the mounting part of the lead frame, stem or substrate, on which the element is mounted.

In the following explanations, the same components as those of the light emitting device shown in FIGS. 1 through 64 are labeled with common reference numerals, and their detailed explanation is omitted.

Figure 65:
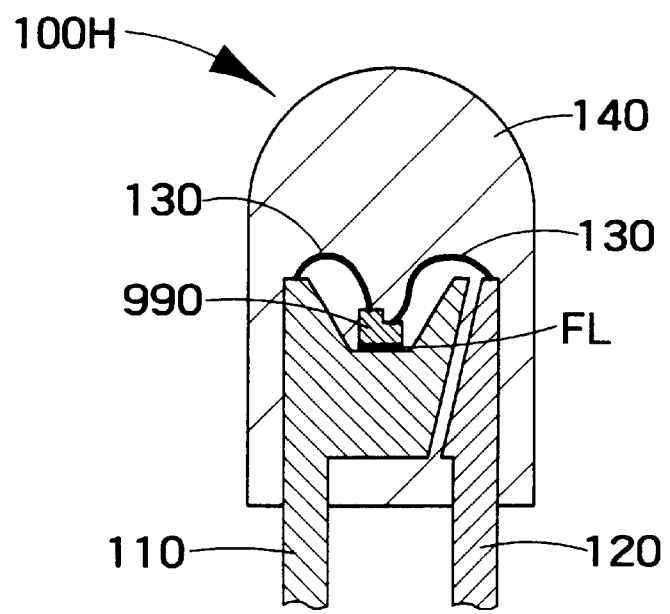
FIG. 65 is a roughly illustrated cross-sectional view of a example of the light emitting device according to the embodiment.

FIG. 65 is a roughly illustrated cross-sectional view of a example of the light emitting device according to the embodiment. The light emitting device 100H shown here is a LED lamp of the lead frame type. The semiconductor light emitting element 990 is mounted on the lead frame 110 then the resin 140 is molded. According to the embodiment, the layer FL containing the fluorescent material is placed between the lead frame 110 and the light emitting element 990. The fluorescent material in the layer FL absorbs the primary light emitted from the element 990 and emits the secondary light.

The one method to form the layer FL is to incorporate the fluorescent material into the adhesive which is used to fix the element 990 onto the lead frame. As such a adhesive, for example, resin materials, rubber materials, organic materials, inorganic materials, farinaceous materials, protein materials, tar materials or metal solders can be used. If the inorganic material is used, the product advantageously becomes highly durable against the heat and chemicals and becomes flame-retardant. If any of the rubber materials, organic materials, the farinaceous materials or the protein materials is used, the residual stress of the dried product is relaxed. Therefore, the problems caused by the stress such as deterioration of the device or the breakage of the wire are advantageously prevented. The farinaceous materials and the protein materials are also easy to handle because they are water-soluble.

According to the embodiment, the fluorescent material is dispersed in the adhesive and coated onto the lead frame to from the layer FL.

The another method to form the layer FL is to coat the fluorescent material on the mounting surface of the lead frame first, then to mount the element 990 by using a adhesive. As the solvent to disperse the fluorescent materials, the one as explained with reference to FIG. 16 can be used as well.

The third method to form the layer FL is to use a preformed tablet of the layer FL including the fluorescent material. That is, fix the preform onto the mounting surface of the lead frame, then mount the light emitting element 990 on the tablet.

In the embodiment, the element 990 also need not to include a fluorescent material. However, the element preferably have a luminous emission in the wavelength range of blue or ultraviolet in order to obtain a high conversion yield by using the fluorescent materials which are easily available. As such a element having a light emitting layer made of, for example, gallium nitride, zinc selenide, silicon carbide or boron nitride may be employed.

As the fluorescent material of the embodiment, the inorganic materials or organic materials explained with reference to the first embodiment may be used as well. The material should be selected so that a high conversion efficiency is obtained for the given wavelength of semiconductor element and the desired wavelength of the secondary light. Also the fluorescent material preferably should be excited by the ultraviolet lights. Because if the fluorescent materials is excited by the visible lights, a cross-talk may occur between the adjacent devices. That is, the fluorescent material of one device is unnecessarily excited by the emission from another device.

According to the embodiment, the emission wavelength becomes fairly stabilized because the primary light from the element is converted into the secondary light. The wavelength of the resultant secondary light is not affected by the fluctuation of the wavelength of the primary emission. Accordingly, the wavelength of the secondary light is independent to the operating current or voltage applied to the element.

Figure 66:
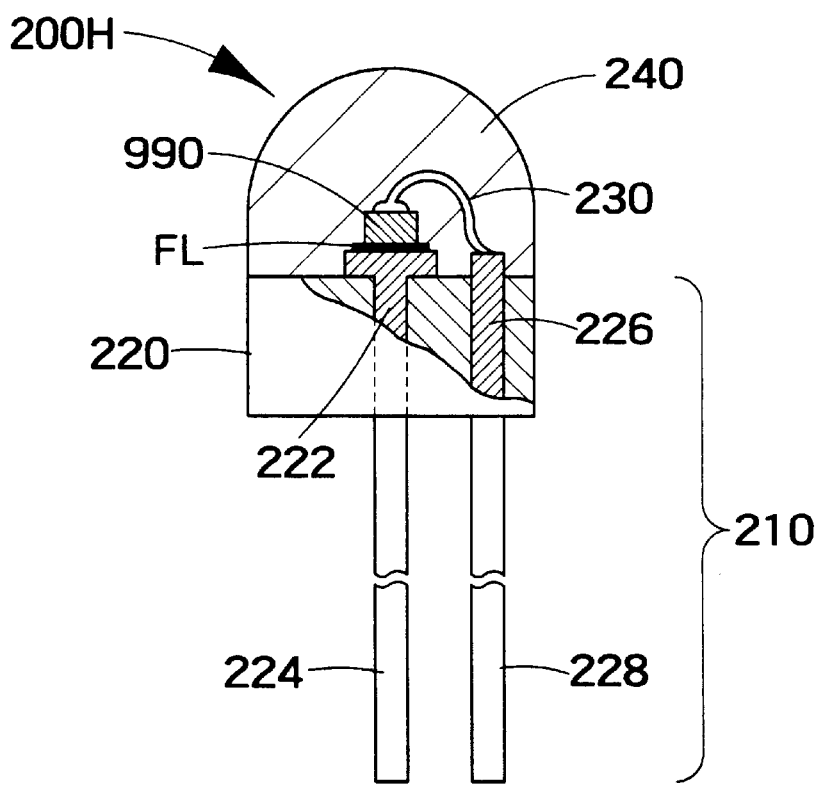
FIG. 66 is a roughly illustrated cross-sectional view of a light emitting device according to the embodiment.

Next explained are specific examples of the embodiment. In the explanation of these examples, the same components as those of the light emitting device shown in FIGS. 1 through 65 are labeled with common reference numerals, and their detailed explanation is omitted. FIG. 66 is a roughly illustrated cross-sectional view of a light emitting device according to the embodiment. The light emitting device 200H shown here is a LED lamp of a stem type. The layer FL including the fluorescent material is placed between the stem 210 and the light emitting element 990 by one of any method as explained above.

Figure 67:
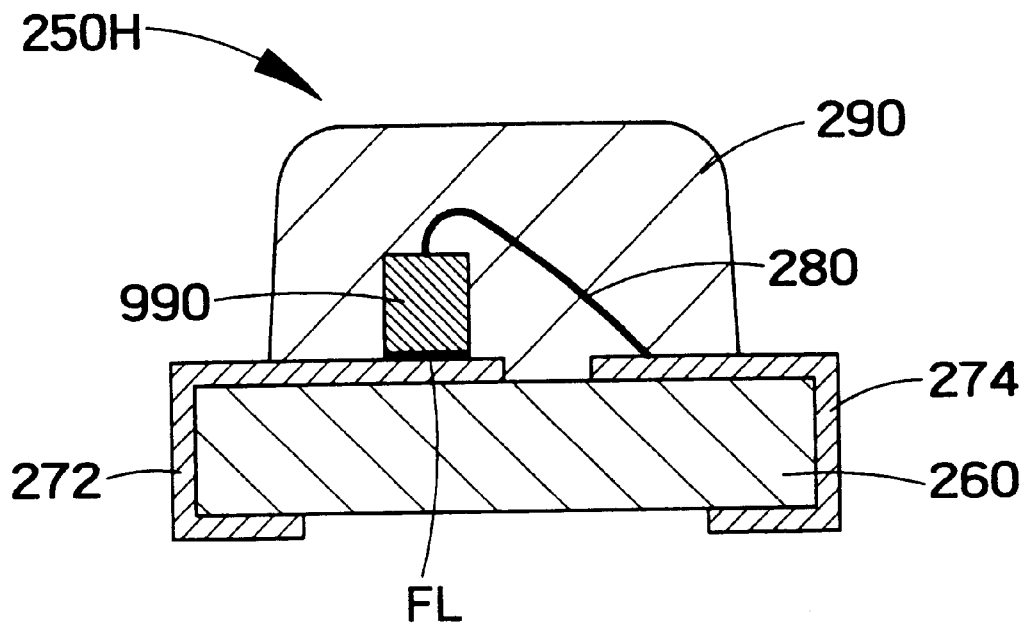
FIG. 67 is a roughly illustrated cross-sectional view of a third example of the light emitting device according to the embodiment.

FIG. 67 is a roughly illustrated cross-sectional view of a third example of the light emitting device according to the embodiment. The light emitting device 250H shown here is an SMD lamp of a substrate type. The layer FL including the fluorescent material is placed between the substrate 260 and the light emitting element 990.

Figure 68:
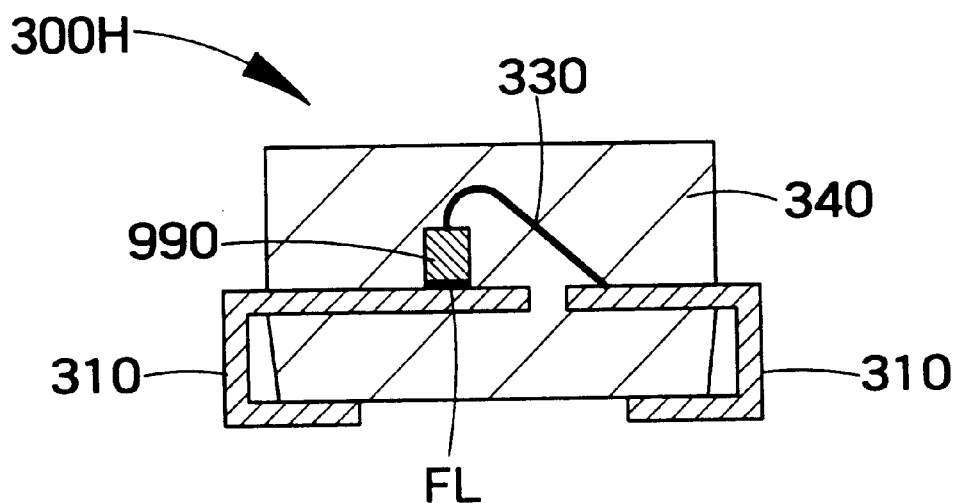
FIG. 68 is a roughly illustrated cross-sectional view of a forth example of the light emitting device according to the embodiment.

FIG. 68 is a roughly illustrated cross-sectional view of a forth example of the light emitting device according to the embodiment. The light emitting device 300H shown here is an SMD lamp of a lead frame type. The layer FL including the fluorescent material is placed between the lead frame 310 and the light emitting element 990.

Figure 69:
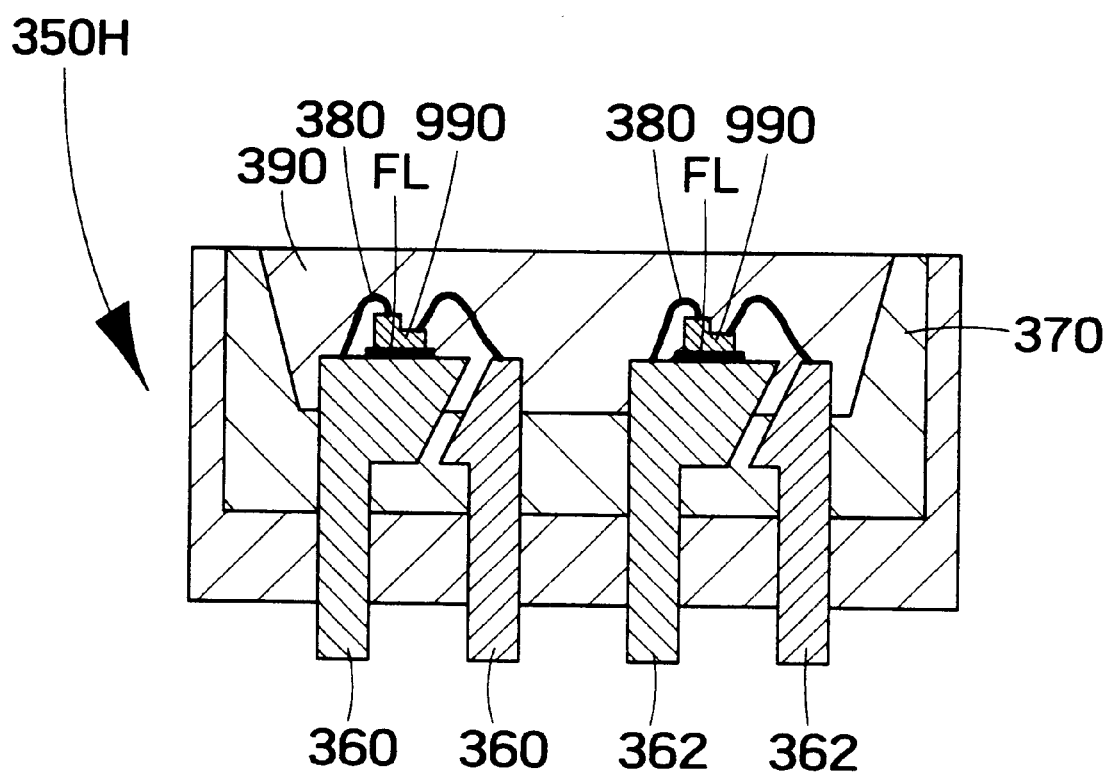
FIG. 69 is a roughly illustrated cross-sectional view of a fifth example of the light emitting device according to the embodiment.

FIG. 69 is a roughly illustrated cross-sectional view of a fifth example of the light emitting device according to the embodiment. The light emitting device 350H shown here is a device of a planar emission type. The layers FL including the fluorescent material are placed between the lead frames 360, 362 and the light emitting element 990.

Figure 70:
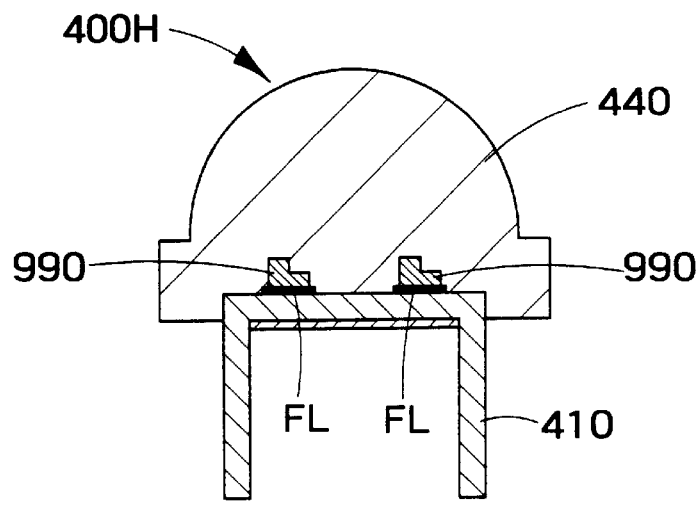
FIG. 70 is a roughly illustrated cross-sectional view of a sixth example of the light emitting device according to the embodiment.

FIG. 70 is a roughly illustrated cross-sectional view of a sixth example of the light emitting device according to the embodiment. The light emitting device 400H shown here is a device of a dome type. The layer FL including the fluorescent material is placed between the lead frames 410 and the light emitting element 990.

Figure 71A:
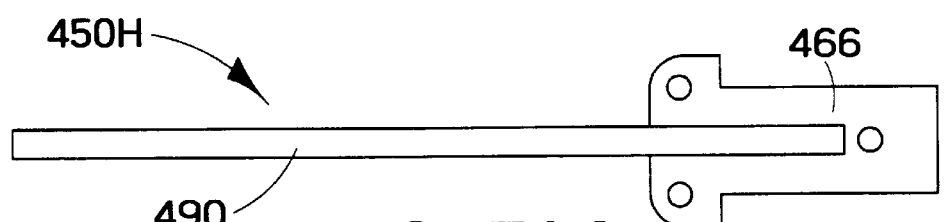
FIGS. 71A and 71B are a roughly illustrated plan view and a cross-sectional view of a seventh example of the light emitting device according to the embodiment respectively.
Figure 71B:
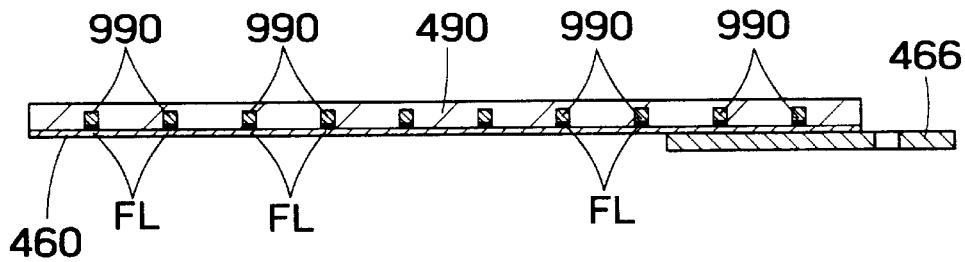

FIGS. 71A and 71B are a roughly illustrated plan view and a cross-sectional view of a seventh example of the light emitting device according to the embodiment respectively. The light emitting device 450H shown here is a device of a meter needle type. The layer FL including the fluorescent material is placed between the substrate 460 and the light emitting element 990.

Figure 72:
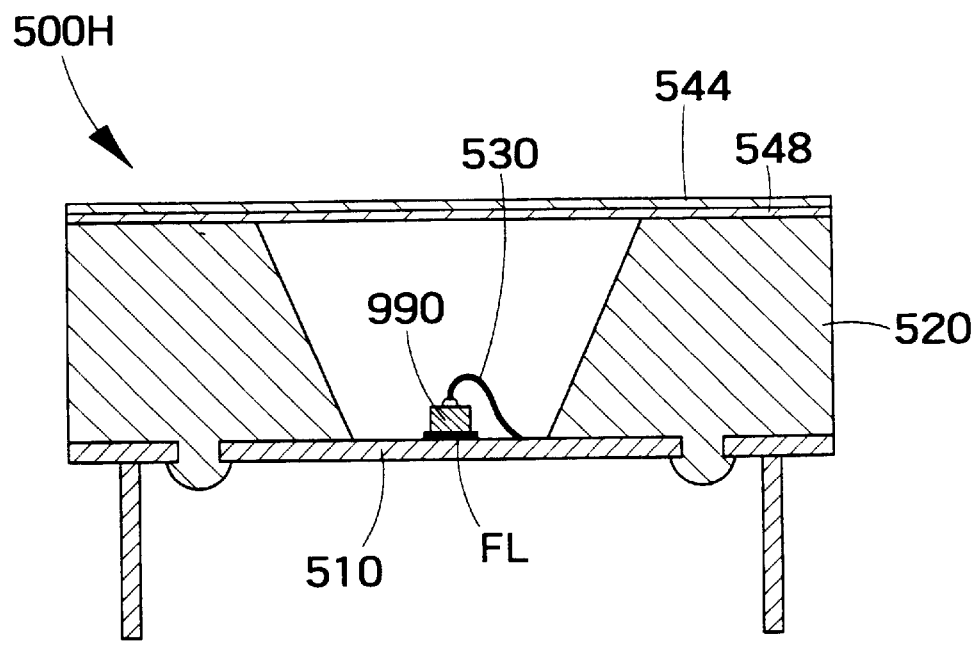
FIG. 72 is a roughly illustrated cross-sectional view of a eighth example of the light emitting device according to the embodiment.

FIG. 72 is a roughly illustrated cross-sectional view of a eighth example of the light emitting device according to the embodiment. The light emitting device 500H shown here is a device of a seven segment type of a substrate type. The layer FL including the fluorescent material is placed between the substrate 510 and the light emitting element 990. The embodiment is also applied to the device of a resin mold type in addition to the cavity type illustrated in the figure.

Figure 73:
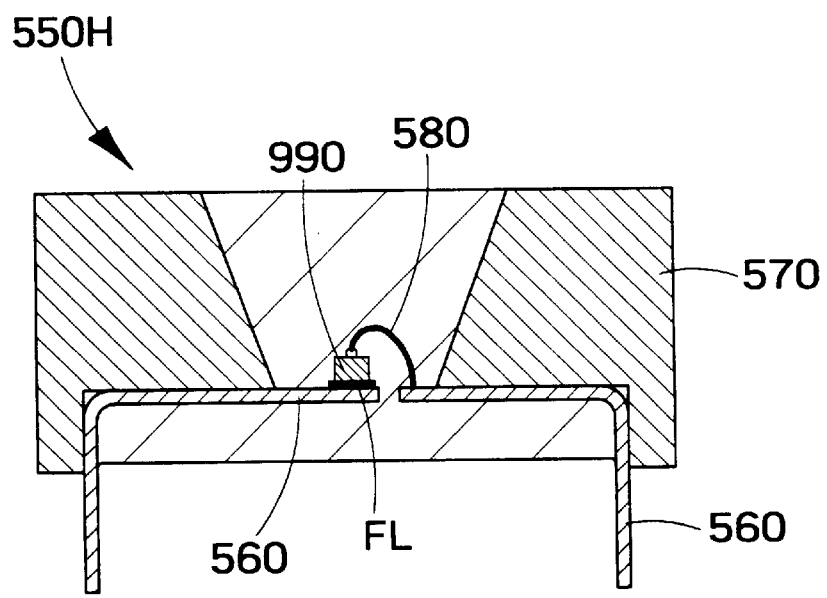
FIG. 73 is a roughly illustrated cross-sectional view of a ninth example of the light emitting device according to the embodiment.

FIG. 73 is a roughly illustrated cross-sectional view of a ninth example of the light emitting device according to the embodiment. The light emitting device 950H shown here is a device of a seven segment type of a lead frame type. The layer FL including the fluorescent material is placed between the lead frame 560 and the light emitting element 990.

Figure 74:
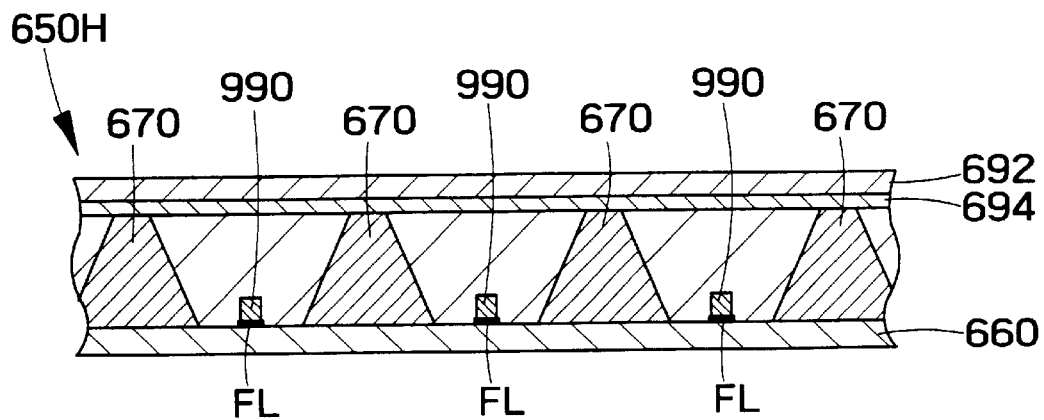
FIG. 74 is a roughly illustrated cross-sectional view of a tenth example of the light emitting device according to the embodiment.

FIG. 74 is a roughly illustrated cross-sectional view of a tenth example of the light emitting device according to the embodiment. The light emitting device 650H shown here is a device of a matrix tripe. The layer FL including the fluorescent material is placed between the substrate 660 and the light emitting element 990.

Figure 75:
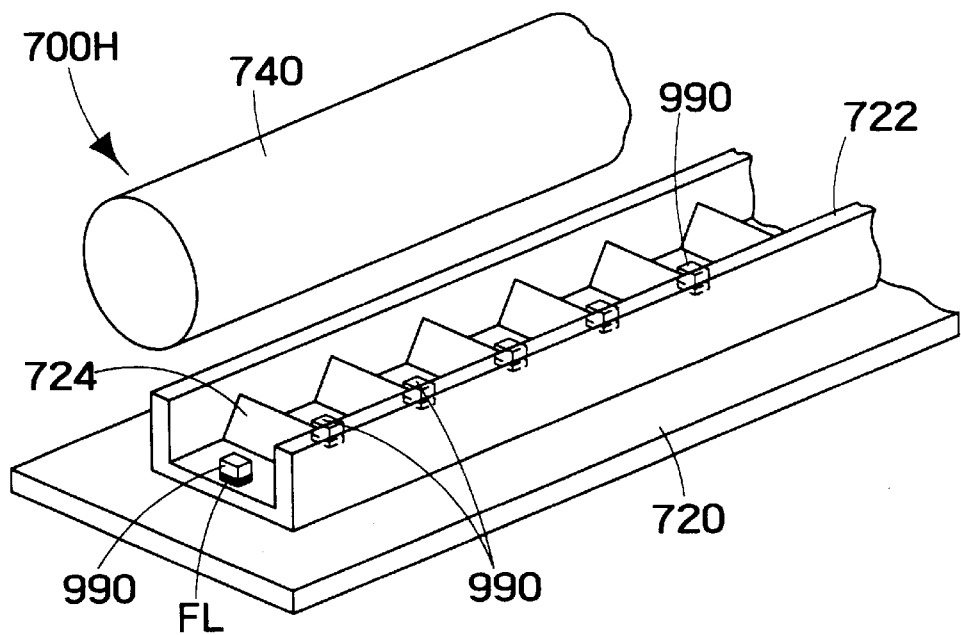
FIG. 75 is a roughly illustrated cross-sectional view of a eleventh example of the light emitting device according to the embodiment.

FIG. 75 is a roughly illustrated cross-sectional view of a eleventh example of the light emitting device according to the embodiment. The light emitting device 700H shown here is a device of an array type. The layer FL including the fluorescent material is placed between the reflector 722 and the light emitting element 990.

Figure 76:
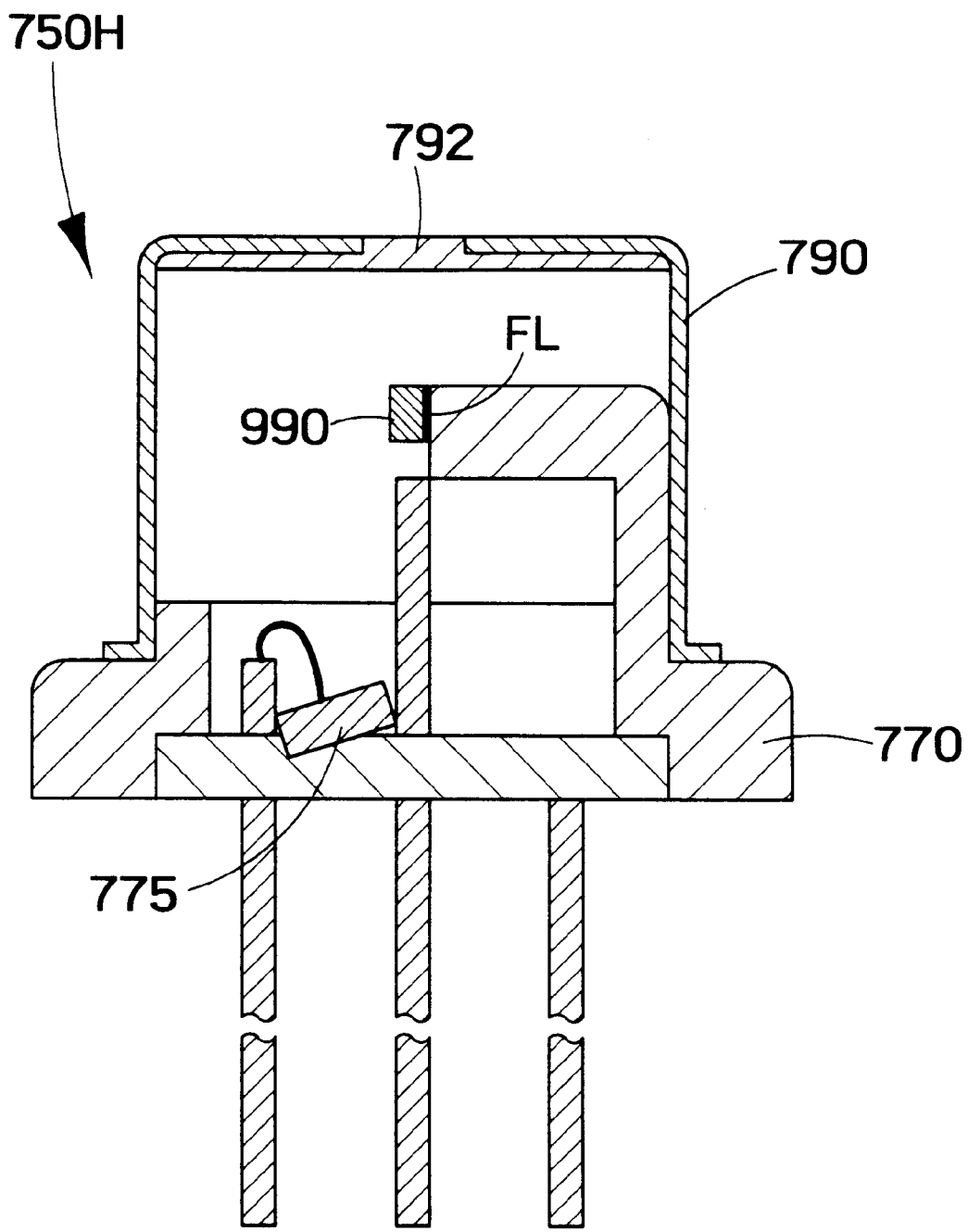
FIG. 76 is a roughly illustrated cross-sectional view of a twelfth example of the light emitting device according to the embodiment.

FIG. 76 is a roughly illustrated cross-sectional view of a twelfth example of the light emitting device according to the embodiment. The light emitting device 750H shown here is a laser device of a can type. The layer FL including the fluorescent material is placed between the stem 770 and the light emitting element 990.

The above explained specific examples shown in FIGS. 66 through 76 also have various advantages as explained with reference to FIG. 65.

Next explained is a tenth embodiment of the invention. According to the embodiment, the fluorescent material is coated onto the reflective surface, such as the upper surface of a lead frame, of the light emitting device.

In the following explanations, the same components as those of the light emitting device shown in FIGS. 1 through 76 are labeled with common reference numerals, and their detailed explanation is omitted.

Figure 77:
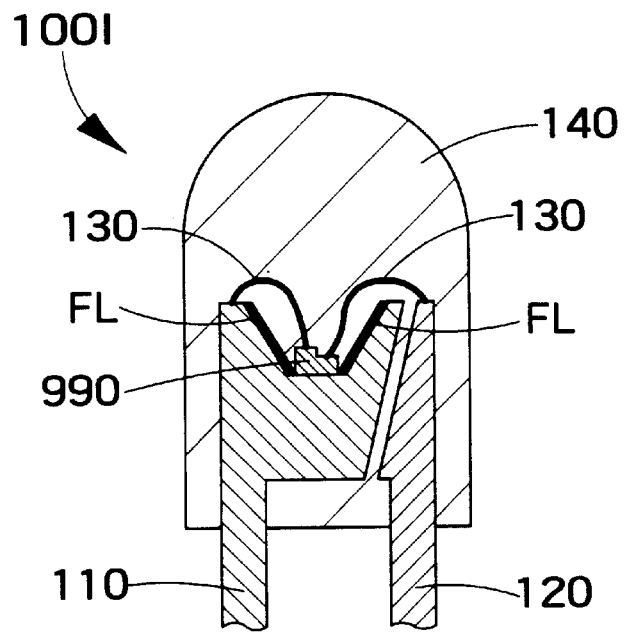
FIG. 77 is a roughly illustrated cross-sectional view of a example of the light emitting device according to the embodiment.

FIG. 77 is a roughly illustrated cross-sectional view of a example of the light emitting device according to the embodiment. The light emitting device 100I shown here is a LED lamp of the lead frame type. The semiconductor light emitting element 990 is mounted on the lead frame 110 then the resin 140 is molded. According to the embodiment, the layer FL containing the fluorescent material is formed on the reflective surface of the lead frame 110, which absorbs the primary light emitted from the element 990 and emits the secondary light.

According to the embodiment, the fluorescent material is dispersed in an appropriate medium or solvent and coated onto the lead frame, then it is dried up. As such a medium or a solvent, for example, resin materials, rubber materials, organic materials, inorganic materials, farinaceous materials, protein materials, tar materials or metal solders can be used. If the inorganic material is used, the product advantageously becomes highly durable against the heat and chemicals and becomes flame-retardant. If any of the rubber materials, organic materials, the farinaceous materials or the protein materials is used, the residual stress of the dried product is relaxed. Therefore, the problems caused by the stress such as deterioration of the device or the breakage of the wire are advantageously prevented. The farinaceous materials and the protein materials are also easy to handle because they are water-soluble.

In the embodiment, the element 990 also need not to include a fluorescent material. However, the element preferably have a luminous emission in the wavelength range of blue or ultraviolet in order to obtain a high conversion yield by using the fluorescent materials which are easily available. As such a element having a light emitting layer made of, for example, gallium nitride, zinc selenide, silicon carbide or boron nitride may be employed.

As the fluorescent material of the embodiment, the inorganic materials or organic materials explained with reference to the first embodiment may be used as well. The material should be selected so that a high conversion efficiency is obtained for the given wavelength of semiconductor element and the desired wavelength of the secondary light. Also the fluorescent material preferably should be excited by the ultraviolet lights. Because if the fluorescent materials is excited by the visible lights, a cross-talk may occur between the adjacent devices. That is, the fluorescent material of one device is unnecessarily excited by the emission from another device.

According to the embodiment, the emission wavelength becomes fairly stabilized because the primary light from the element is converted into the secondary light. The wavelength of the resultant secondary light is not affected by the fluctuation of the wavelength of the primary emission. Accordingly, the wavelength of the secondary light is independent to the operating current or voltage applied to the element.

Figure 78:
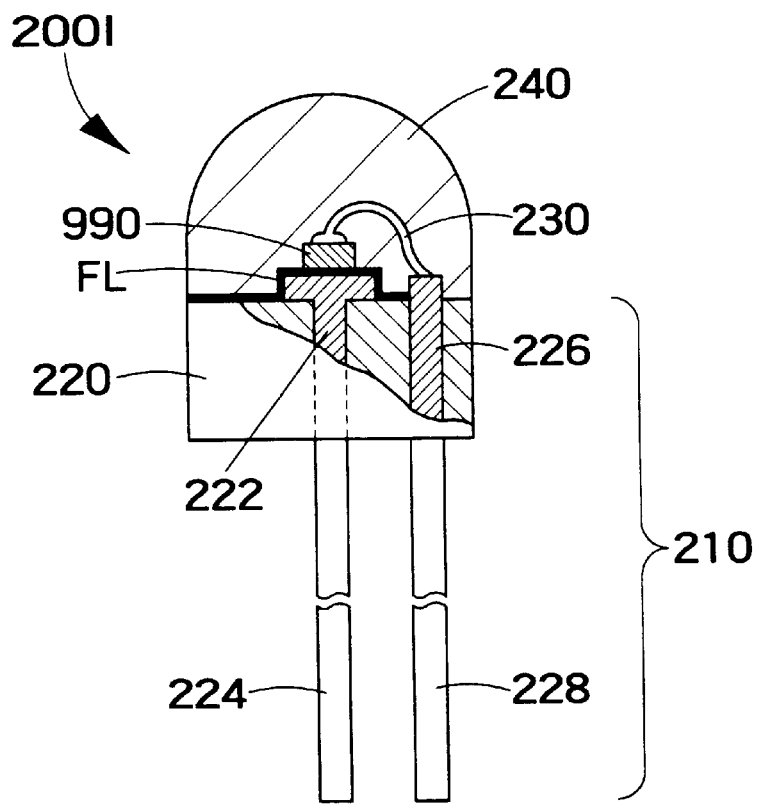
FIG. 78 is a roughly illustrated cross-sectional view of a light emitting device according to the embodiment.

Next explained are specific examples of the embodiment. In the explanation of these examples, the same components as those of the light emitting device shown in FIGS. 1 through 77 are labeled with common reference numerals, and their detailed explanation is omitted. FIG. 78 is a roughly illustrated cross-sectional view of a light emitting device according to the embodiment. The light emitting device 200I shown here is a LED lamp of a stem type. The layer FL including the fluorescent material is formed on the reflective surface of the stem 210.

Figure 79:
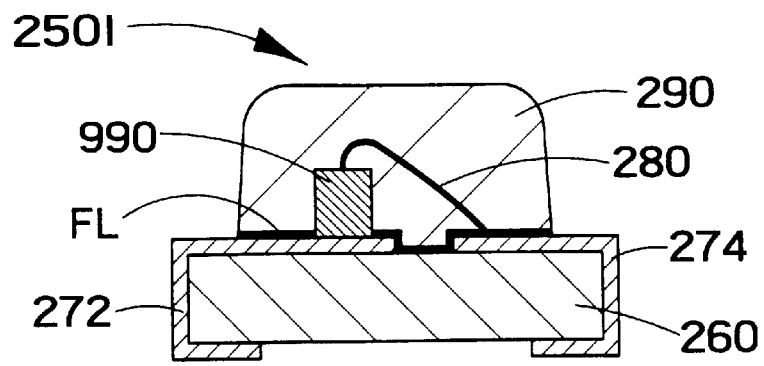
FIG. 79 is a roughly illustrated cross-sectional view of a third example of the light emitting device according to the embodiment.

FIG. 79 is a roughly illustrated cross-sectional view of a third example of the light emitting device according to the embodiment. The light emitting device 250I shown here is an SMD lamp of a substrate type. The layer FL including the fluorescent material is formed on the reflective surface of the substrate 260.

Figure 80:
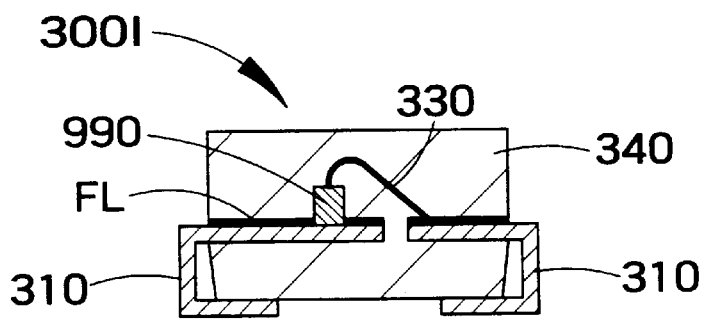
FIG. 80 is a roughly illustrated cross-sectional view of a forth example of the light emitting device according to the embodiment.

FIG. 80 is a roughly illustrated cross-sectional view of a forth example of the light emitting device according to the embodiment. The light emitting device 300I shown here is an SMD lamp of a lead frame type. The layer FL including the fluorescent material is formed on the reflective surface of the lead frame 310.

Figure 81:
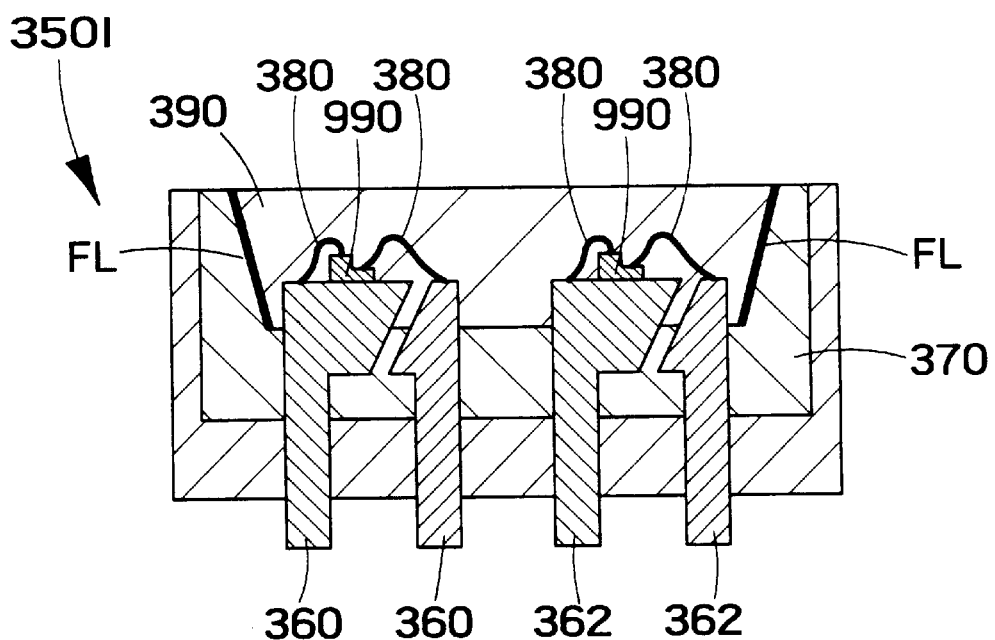
FIG. 81 is a roughly illustrated cross-sectional view of a fifth example of the light emitting device according to the embodiment.

FIG. 81 is a roughly illustrated cross-sectional view of a fifth example of the light emitting device according to the embodiment. The light emitting device 350I shown here is a device of a planar emission type. The layer FL including the fluorescent material is formed on the reflector 370.

Figure 82:
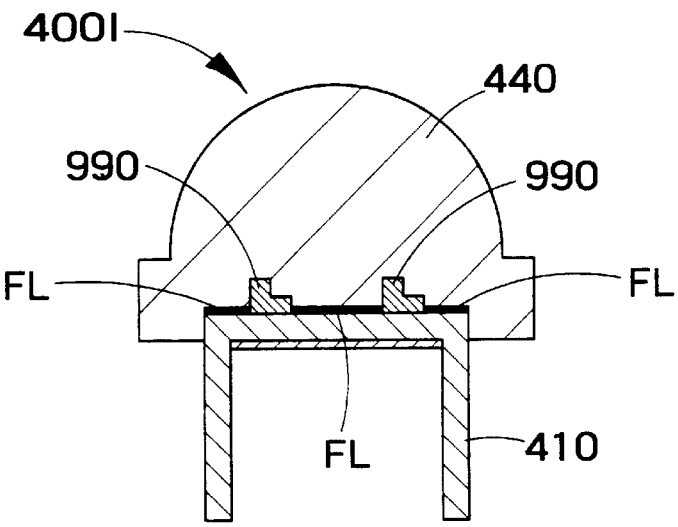
FIG. 82 is a roughly illustrated cross-sectional view of a sixth example of the light emitting device according to the embodiment.

FIG. 82 is a roughly illustrated cross-sectional view of a sixth example of the light emitting device according to the embodiment. The light emitting device 400I shown here is a device of a dome type. The layer FL including the fluorescent material is formed in the reflective surface of the lead frame 410.

Figure 83A:
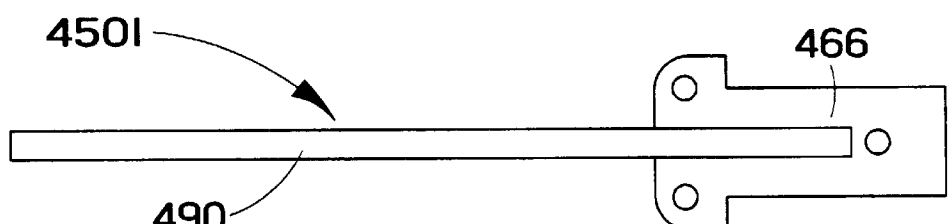
FIGS. 83A and 83B are a roughly illustrated plan view and a cross-sectional view of a seventh example of the light emitting device according to the embodiment respectively.
Figure 83B:
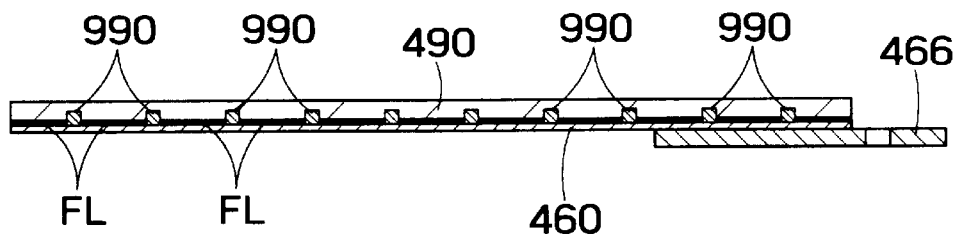

FIGS. 83A and 83B are a roughly illustrated plan view and a cross-sectional view of a seventh example of the light emitting device according to the embodiment respectively. The light emitting device 450I shown here is a device of a meter needle type. The layer FL including the fluorescent material is formed on the reflective surface of the substrate 460.

Figure 84:
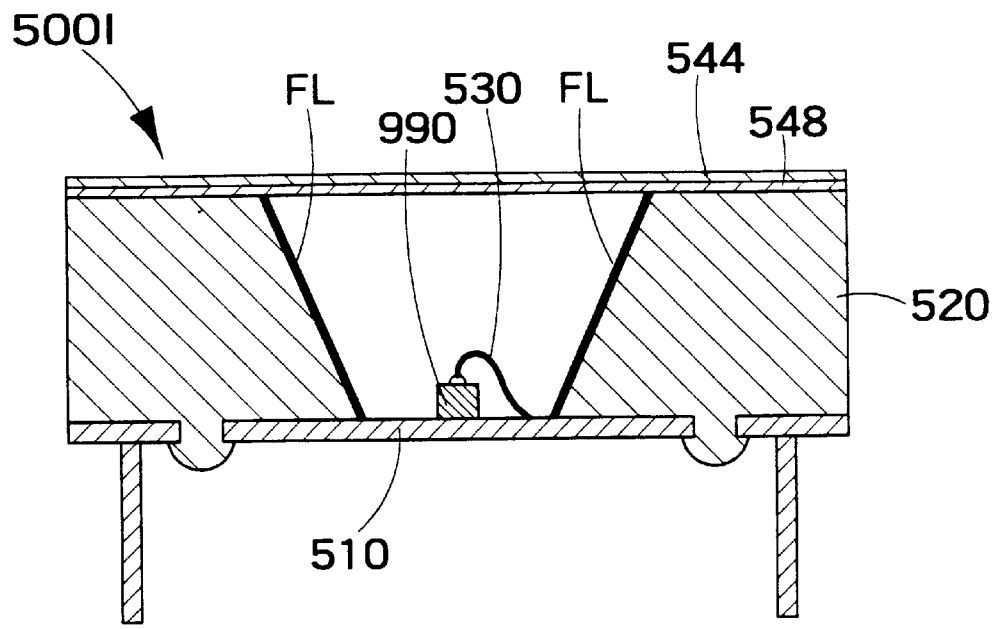
FIG. 84 is a roughly illustrated cross-sectional view of a eighth example of the light emitting device according to the embodiment.

FIG. 84 is a roughly illustrated cross-sectional view of a eighth example of the light emitting device according to the embodiment. The light emitting device 500I shown here is a device of a seven segment type of a substrate type. The layer FL including the fluorescent material is formed on the reflector 520. The embodiment is also applied to the device of a resin mold type in addition to the cavity type illustrated in the figure.

Figure 85:
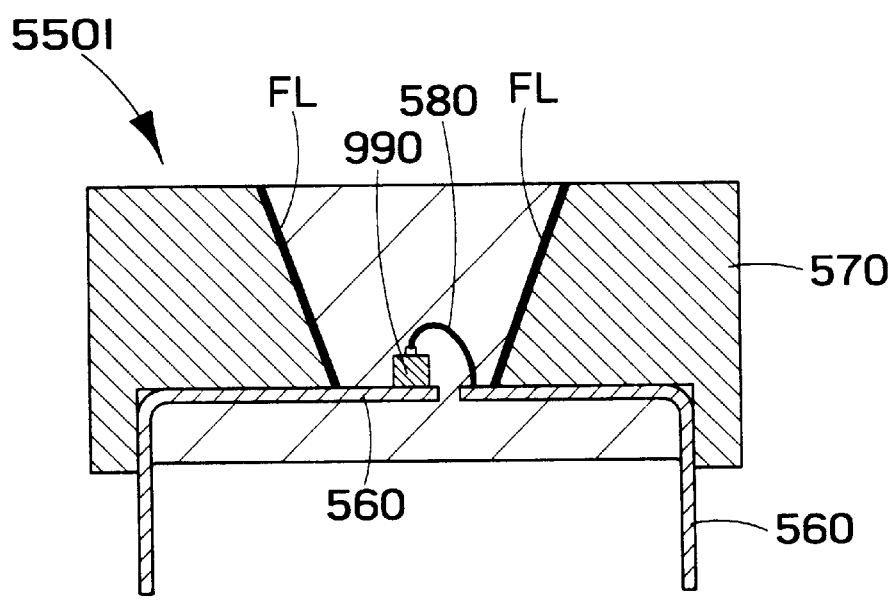
FIG. 85 is a roughly illustrated cross-sectional view of a ninth example of the light emitting device according to the embodiment.

FIG. 85 is a roughly illustrated cross-sectional view of a ninth example of the light emitting device according to the embodiment. The light emitting device 550I shown here is a device of a seven segment type of a lead frame type. The layer FL including the fluorescent material is formed on the reflector 570.

Figure 86:
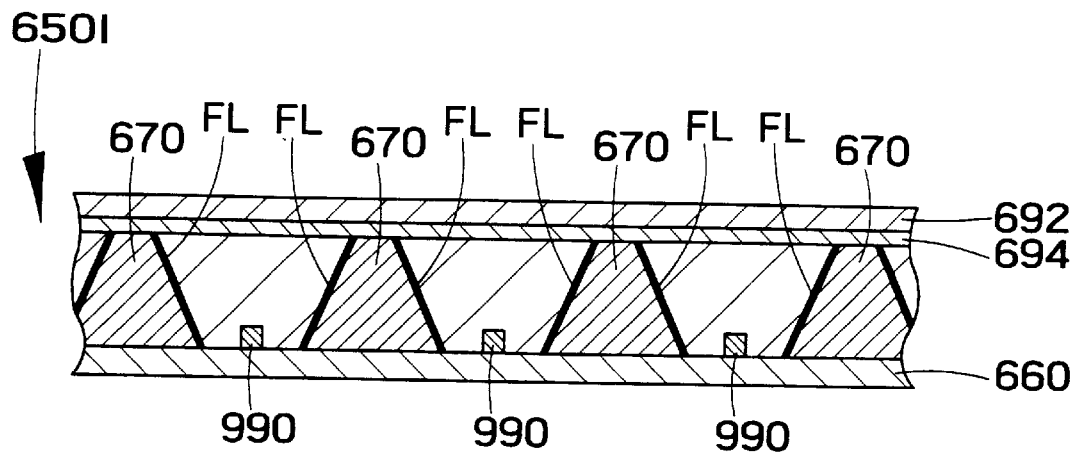
FIG. 86 is a roughly illustrated cross-sectional view of a tenth example of the light emitting device according to the embodiment.

FIG. 86 is a roughly illustrated cross-sectional view of a tenth example of the light emitting device according to the embodiment. The light emitting device 650I shown here is a device of a matrix type. The layer FL including the fluorescent material is placed on the reflector 670.

Figure 87:
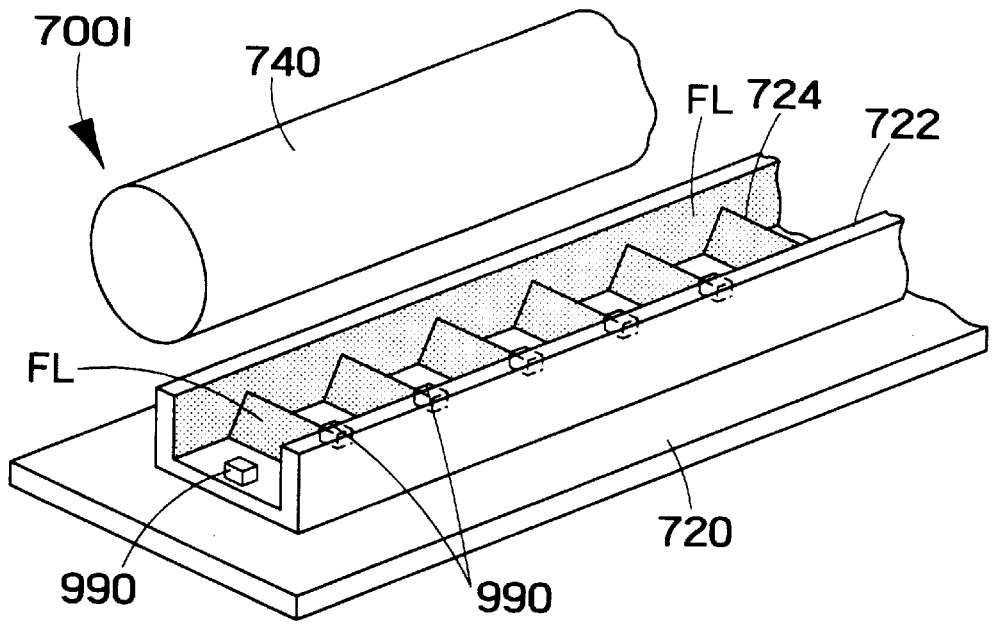
FIG. 87 is a roughly illustrated cross-sectional view of a eleventh example of the light emitting device according to the embodiment.

FIG. 87 is a roughly illustrated cross-sectional view of a eleventh example of the light emitting device according to the embodiment. The light emitting device 700I shown here is a device of an array type. The layer FL including the fluorescent material is formed on the reflector 722 and/or on the separator 724.

Figure 88:
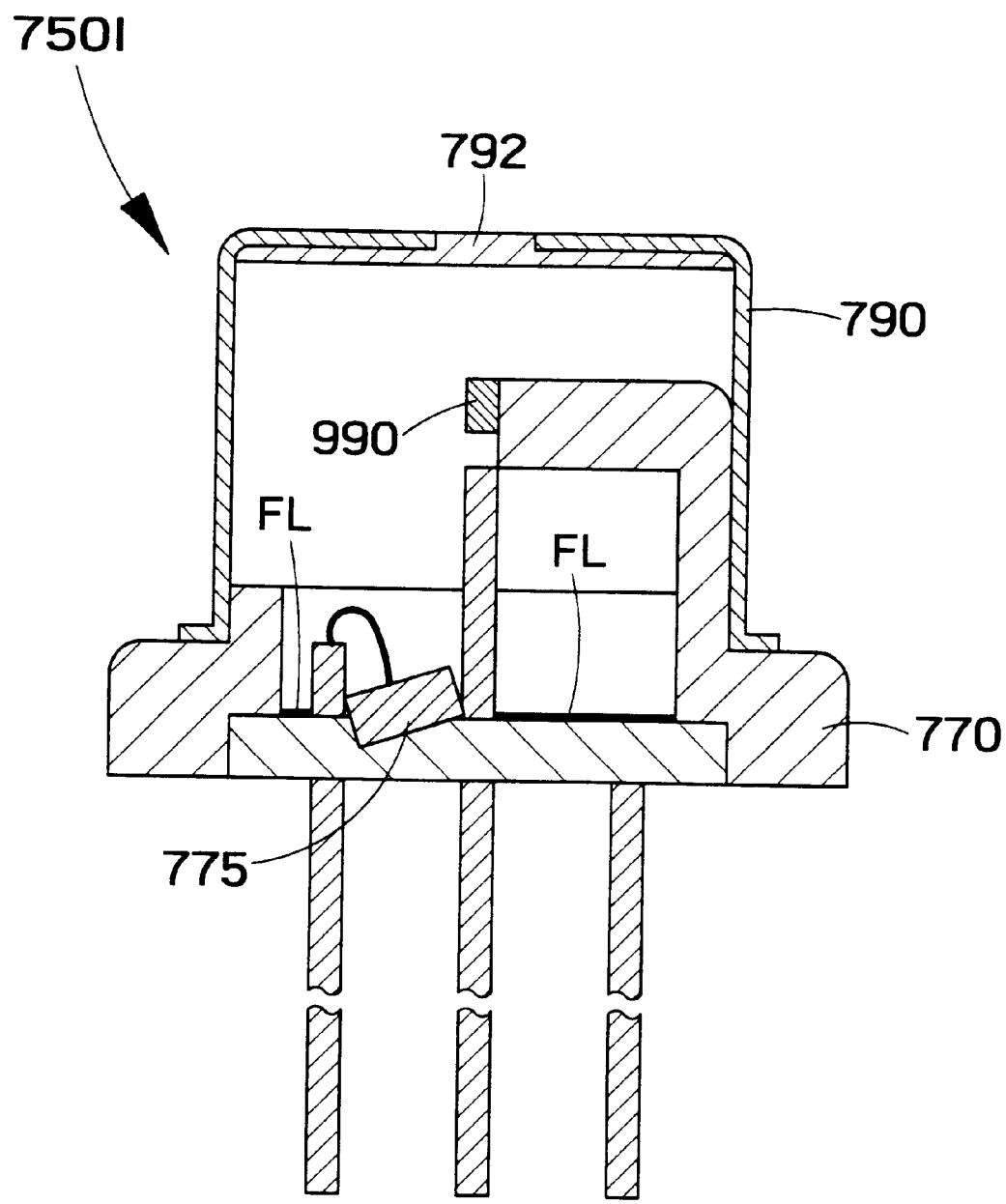
FIG. 88 is a roughly illustrated cross-sectional view of a twelfth example of the light emitting device according to the embodiment.

FIG. 88 is a roughly illustrated cross-sectional view of a twelfth example of the light emitting device according to the embodiment. The light emitting device 750I shown here is a laser device of a can type. The layer FL including the fluorescent material is formed on the reflective surface of the stem 770.

The above explained specific examples shown in FIGS. 78 through 88 also have various advantages as explained with reference to FIG. 77.

Next explained is a eleventh embodiment of the invention. According to the embodiment, the fluorescent material is located at the light extraction part, such as the surface of the resin, the lens, or the window, of the light emitting devices.

In the following explanations, the same components as those of the light emitting device shown in FIGS. 1 through 88 are labeled with common reference numerals, and their detailed explanation is omitted.

Figure 89:
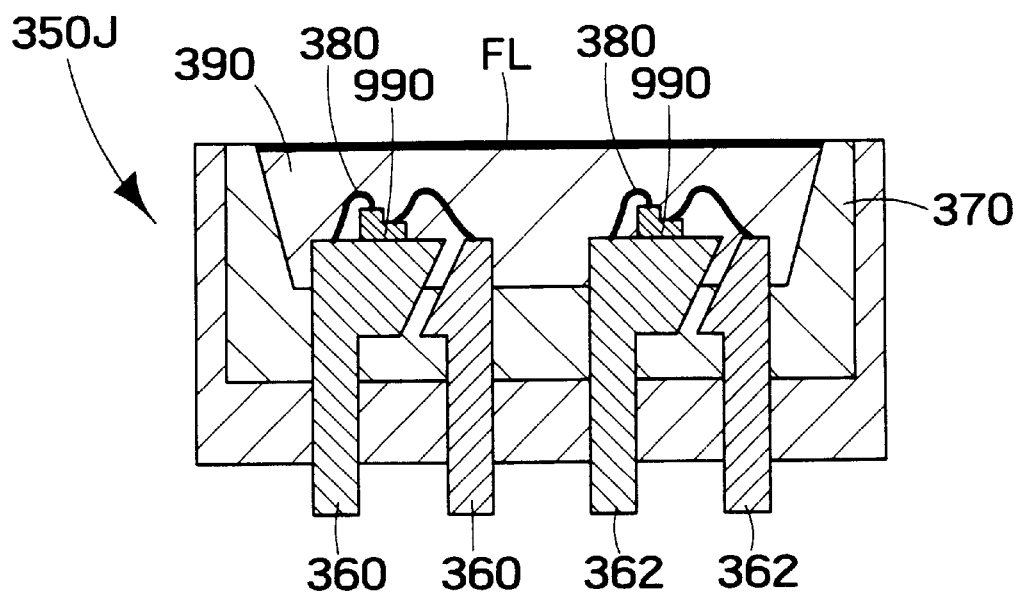
FIG. 89 is a roughly illustrated cross-sectional view of an example of the light emitting device according to the embodiment.

FIG. 89 is a roughly illustrated cross-sectional view of a example of the light emitting device according to the embodiment. The light emitting device 300J shown here is a light emitting device of the planer emission type. The layer FL containing the fluorescent material is formed on the window, i.e. the resin 390, which absorbs the primary light emitted from the element 990 and emits the secondary light.

In order to from the layer FL, the fluorescent material can also be dispersed in an appropriate medium or solvent and coated onto the lead frame, then dried up. As such a medium or a solvent, for example, resin materials, rubber materials, organic materials, inorganic materials, farinaceous materials, protein materials, tar materials or metal solders can be used. If the inorganic material is used, the product advantageously becomes highly durable against the heat and chemicals and becomes flame-retardant. If any of the rubber materials, organic materials, the farinaceous materials or the protein materials is used, the residual stress of the dried product is relaxed. Therefore, the problems caused by the stress such as a crack of the layer are advantageously prevented. The farinaceous materials and the protein materials are also easy to handle because they are water-soluble.

Alternatively, a light transmissive film can be employed to form the layer FL. The fluorescent material can be coated on the surface of the film or dispersed in the film.

In the case of the device having a lens, the fluorescent material can be coated on the surface of the lens of dispersed in the lens.

According to the embodiment, the light emitting element 990 also need not to include a fluorescent material. However, the element preferably have a luminous emission in the wavelength range of blue or ultraviolet in order to obtain a high conversion yield by using the fluorescent materials which are easily available. As such a element having a light emitting layer made of, for example, gallium nitride, zinc selenide, silicon carbide or boron nitride may be employed.

As the fluorescent material of the embodiment, the inorganic materials or organic materials explained with reference to the first embodiment may be used as well. The material should be selected so that a high conversion efficiency is obtained for the given wavelength of semiconductor element and the desired wavelength of the secondary light. Also the fluorescent material preferably should be excited by the ultraviolet lights. Because if the fluorescent materials is excited by the visible lights, a cross-talk may occur between the adjacent devices. That is, the fluorescent material of one device is unnecessarily excited by the emission from another device.

According to the embodiment, the emission wavelength becomes fairly stabilized because the primary light from the element is converted into the secondary light. The wavelength of the resultant secondary light is not affected by the fluctuation of the wavelength of the primary emission. Accordingly, the wavelength of the secondary light is independent to the operating current or voltage applied to the element.

Next explained are specific examples of the embodiment. In the explanation of these examples, the same components as those of the light emitting device shown in FIGS. 1 through 89 are labeled with common reference numerals, and their detailed explanation is omitted.

Figure 90A:
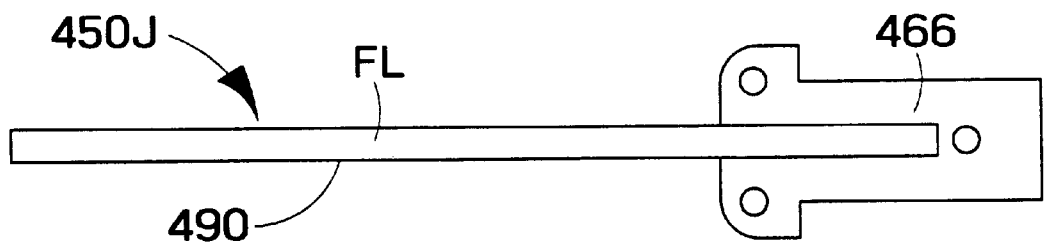
FIGS. 90A and 90B are a roughly illustrated plan view and a cross-sectional view of a second example of the light emitting device according to the embodiment respectively.
Figure 90B:
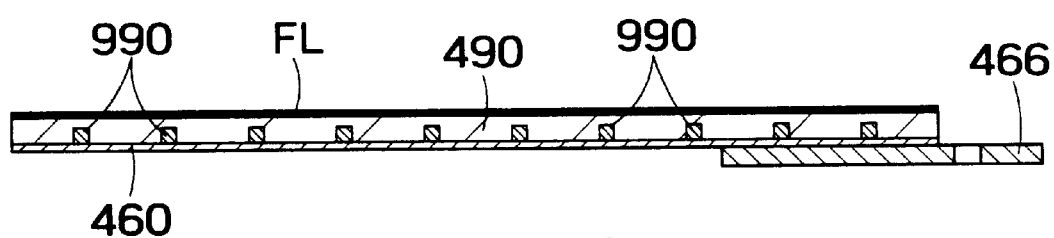

FIGS. 90A and 90B are a roughly illustrated plan view and a cross-sectional view of a-second example of the light emitting device according to the embodiment respectively. The light emitting device 450J shown here is a device of a meter needle type. The layer FL including the fluorescent material is formed on the light extraction part of the device by any method as described above.

Figure 91:
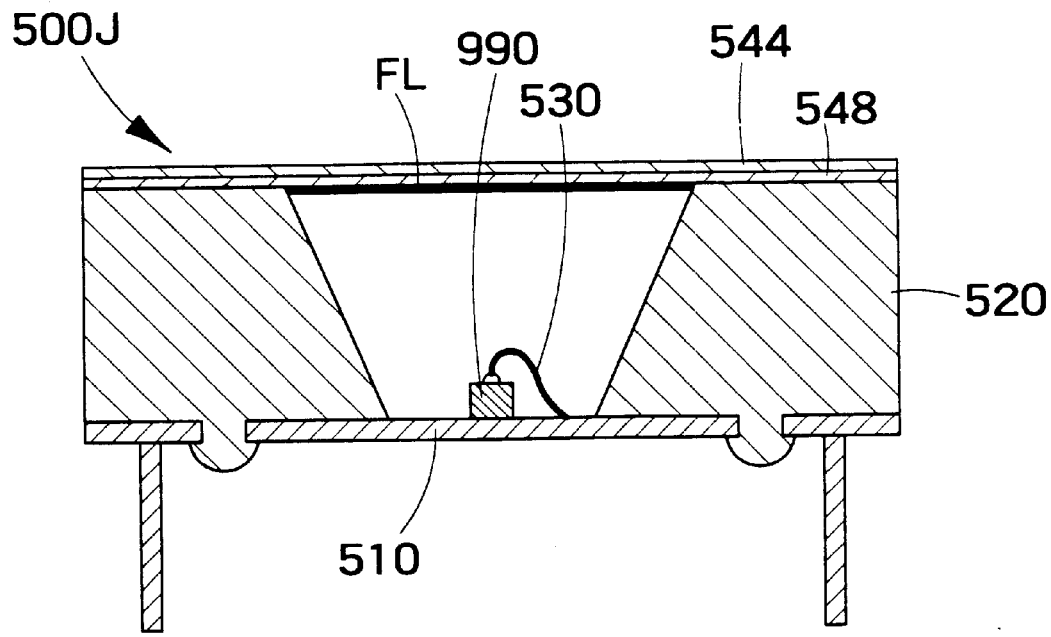
FIG. 91 is a roughly illustrated cross-sectional view of a third example of the light emitting device according to the embodiment.

FIG. 91 is a roughly illustrated cross-sectional view of a third example of the light emitting device according to the embodiment. The light emitting device 500J shown here is a device of a seven segment type of a substrate type. The layer FL including the fluorescent material is formed on the light extraction part of the device by any method as described above. The embodiment can also be applied to the device of a resin mold type in addition to the cavity type illustrated in the figure.

Figure 92:
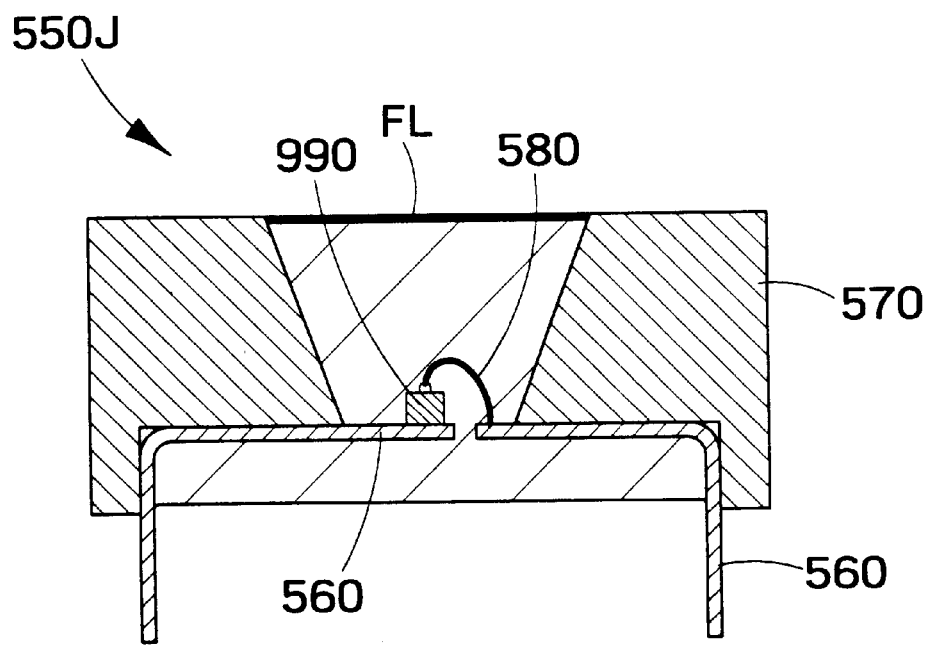
FIG. 92 is a roughly illustrated cross-sectional view of a forth example of the light emitting device according to the embodiment.

FIG. 92 is a roughly illustrated cross-sectional view of a forth example of the light emitting device according to the embodiment. The light emitting device 550J shown here is a device of a seven segment type of a lead frame type. The layer FL including the fluorescent material is formed on the light extraction part of the device by any method as described above.

Figure 93:
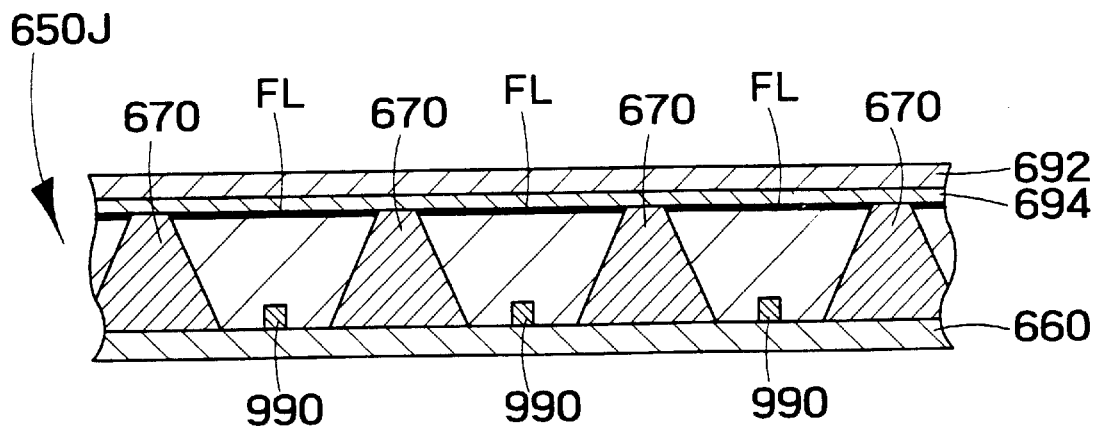
FIG. 93 is a roughly illustrated cross-sectional view of a fifth example of the light emitting device according to the embodiment.

FIG. 93 is a roughly illustrated cross-sectional view of a fifth example of the light emitting device according to the embodiment. The light emitting device 650J shown here is a device of a matrix type. The layer FL including the fluorescent material is formed on the light extraction part of the device by any method as described above.

Figure 94:
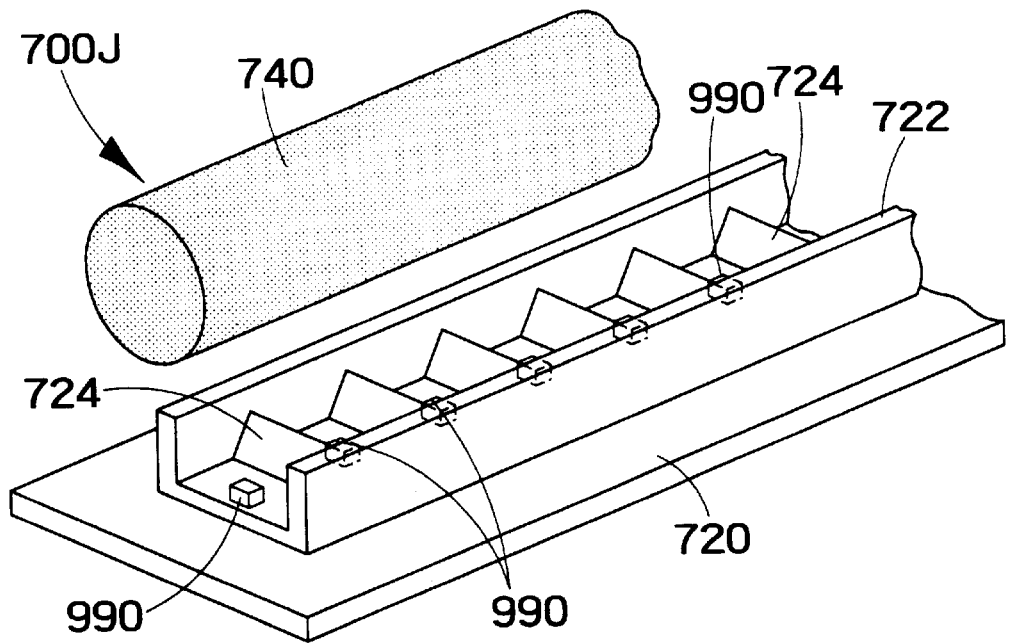
FIG. 94 is a roughly illustrated cross-sectional view of a sixth example of the light emitting device according to the embodiment.

FIG. 94 is a roughly illustrated cross-sectional views of a sixth example of the light emitting device according to the embodiment. The light emitting device 700J shown here is a device of an array type. The layer FL including the fluorescent material is dispersed in the rod lens 740. Alternatively, the layer FL can be coated on the surface of the lens 740, a film including the fluorescent material can be sticked on the lens 740.

Figure 95:
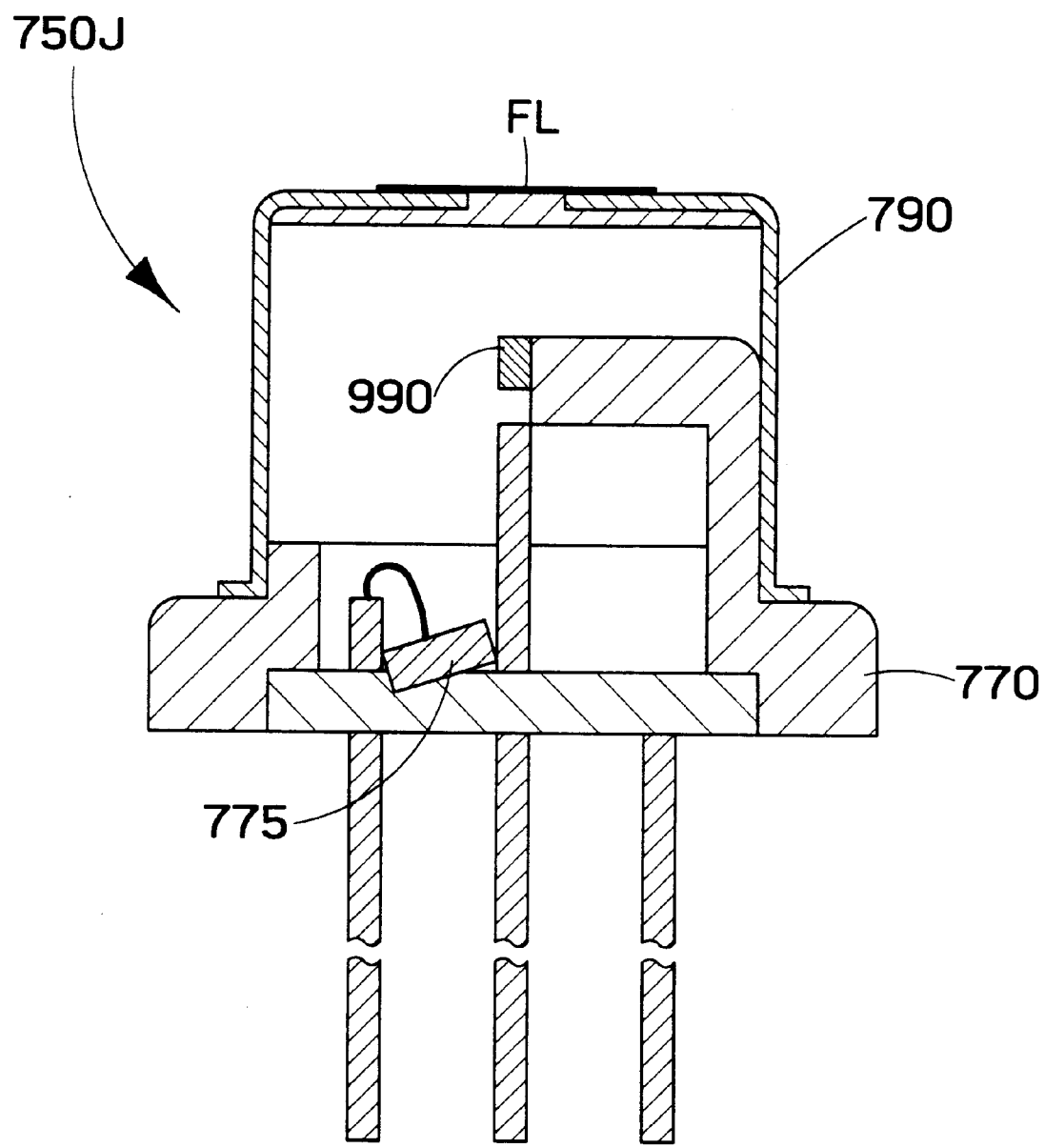
FIG. 95 is a roughly illustrated cross-sectional view of a seventh example of the light emitting device according to the embodiment.

FIG. 95 is a roughly illustrated cross-sectional view of a seventh example of the light emitting device according to the embodiment. The light emitting device 750J shown here is a laser device of a can type. The layer FL including the fluorescent material is formed on the light extraction part, i.e. the window of the cap, of the device by any method as described above.

The above explained specific examples shown in FIGS. 90 through 95 also have various advantages as explained with reference to FIG. 89.

Next explained is a twelfth embodiment of the invention. According to the embodiment, a piece including the fluorescent material is placed near the light extraction part of the light emitting element.

In the following explanations, the same components as those of the light emitting device shown in FIGS. 1 through 95 are labeled with common reference numerals, and their detailed explanation is omitted.

Figure 96A:
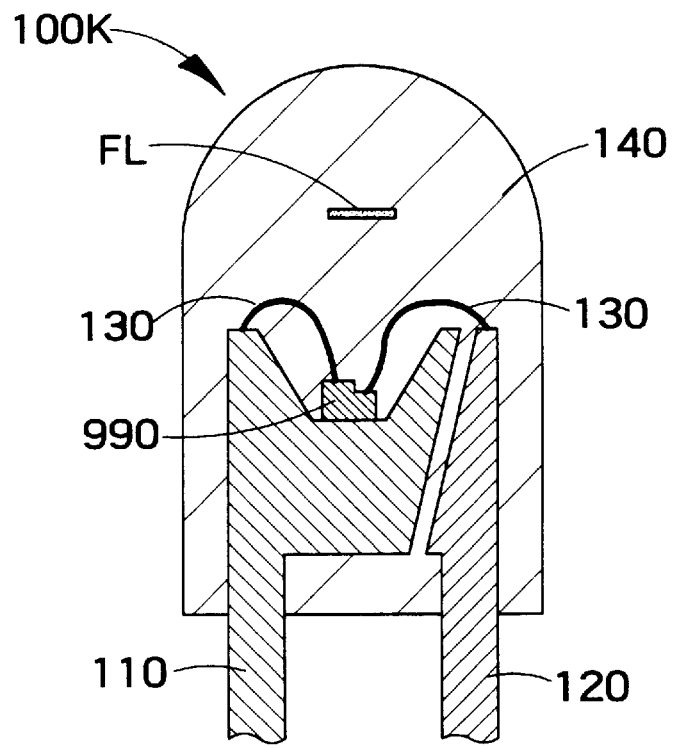
FIG. 96A is a roughly illustrated cross-sectional view of a example of the light emitting device according to the embodiment.

FIG. 96A is a roughly illustrated cross-sectional view of a example of the light emitting device according to the embodiment. The light emitting device 100K shown here is an LED lamp of the lead frame type. According to the embodiment, a planar piece FL including the fluorescent material is place above the light extraction part of the light emitting element 990, which absorbs the primary light emitted from the element 990 and emits the secondary light.

Figure 96B:
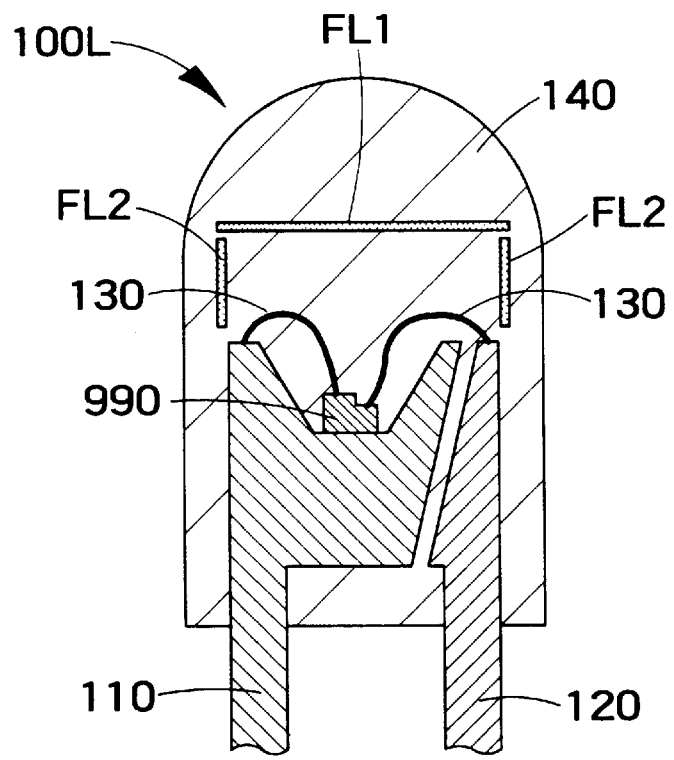
FIG. 96B is a roughly illustrated cross-sectional view of a second example of the light emitting device according to the embodiment.

FIG. 96B is a roughly illustrated cross-sectional view of a second example of the light emitting device according to the embodiment. The light emitting device 100L shown here is also an LED lamp of the lead frame type. In the example, a planar piece FL1 including the fluorescent material is place above the light extraction part of the light emitting element 990. Besides, another piece FL2 is placed to enclose the space between the element 990 and the piece FL1. The piece FL2 also includes the fluorescent material and has a cylindlycal shape with a hollow, for example.

The pieces FL, FL1 and FL2 according to the embodiment can be formed by sintering a mixed material consisting an appropriate medium and the fluorescent material. As such a medium, organic material or inorganic material can be used. The fluorescent material is dispersed in the medium. The shapes and the locations of the pieces FL, FL1 and FL2 may be appropriately decided depending to the construction of the light emitting device. These pieces FL, FL1 and FL2 also absorb the primary light emitted from the element 990 and emit the secondary light. Accordingly, the same advantages as explained fifth reference to the above embodiments can be obtained as well.

In the above-explained first through twelfth embodiments with reference to FIGS. 1 through 96B, the light emitting elements and the light emitting devices including a fluorescent material as a wavelength converter are disclosed.

Next explained are further advanced elements and devices. In the following explanation of thirtieth through twenty-sixth embodiments with reference to FIGS. 97 through 125, various elements and devices having a light absorber and/or a optical reflector in addition to the wavelength converter will be disclosed.

Figure 97:
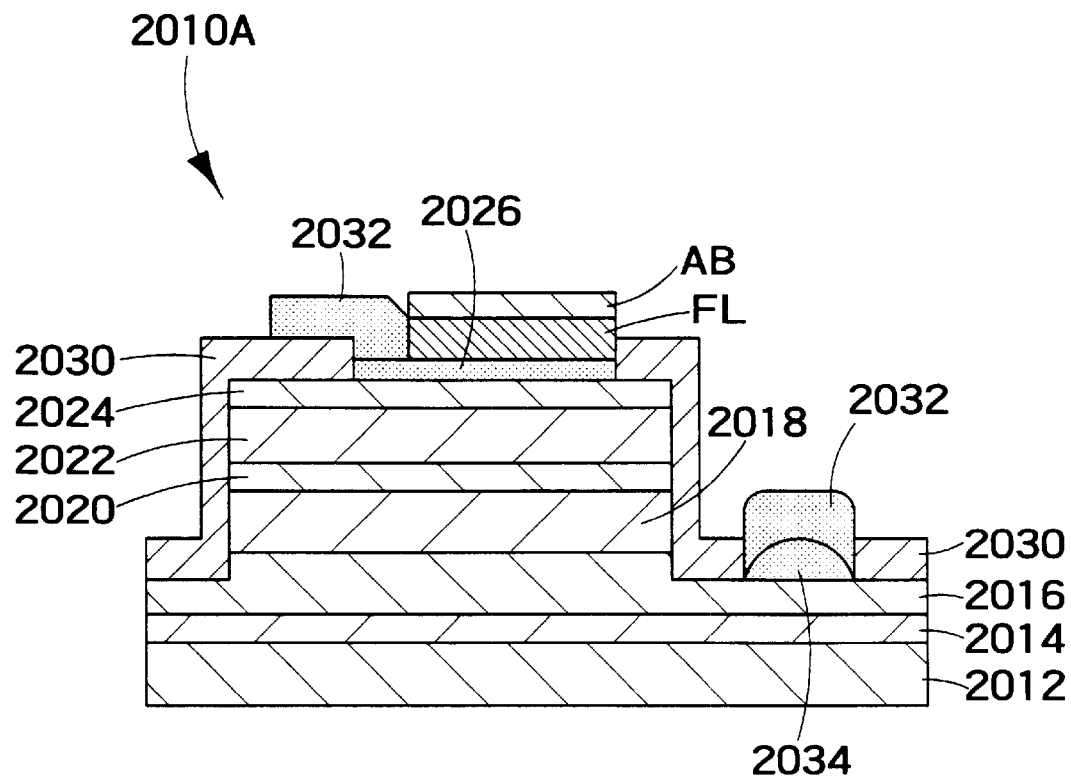
FIG. 97 is a cross-sectional view schematically showing a semiconductor light emitting element taken as the thirtieth embodiment of the invention.

FIG. 97 is a cross-sectional view schematically showing a semiconductor light emitting element taken as the thirtieth embodiment of the invention. The semiconductor light emitting element 2010A shown here is a semiconductor light emitting element including a wavelength converter FL and light absorber AB aligned along the path for extracting the light. The light emitting layer employed here may be of any kind of material which can emit a primary light having desired wavelength for the wavelength converter FL. For example, gallium nitride, silicon carbide (SiC) or zinc selenide (ZnSe) may be employed as the material of the light emitting layer to obtain the primary light of blue or violet wavelength range. The following description shows exemplary cases having a gallium nitride light emitting layer.

The light emitting element 2010A may have a multi-layered structure of semiconductors stacked on a sapphire substrate 2012, namely, a buffer layer 2014, n-type contact layer 2016, n-type cladding layer 2018, light emitting layer 2020, p-type cladding layer 2022 and p-type contact layer 2024 which are stacked in this order on the sapphire substrate 2012. These layers may be grown by MOCVD (metal-organic chemical vapor deposition).

The buffer layer 2014 may be made of n-type GaN, for example. The n-type contact layer 2016 has a high n-type carrier concentration to ensure ohmic contact with the n-side electrode 2034, and its material may be GaN, for example. The n-type cladding layer 2018 and the p-type cladding layer 2022 function to confine carriers within the light emitting layer 2020. The light emitting layer 2020 is a layer in which emission occurs due to recombination of electric charges injected as a current into the light emitting element. The light emitting layer 2020 may be made of undoped InGaN, for example, and the cladding layers 2018 and 2022 may be made of AlGaN having a larger band gap than the light emitting layer 2020. The p-type contact layer 2024 has a high p-type carrier concentration to ensure ohmic contact with the p-side electrode 2026, and its material may be GaN, for example.

Stacked on the p-type contact layer 2024 is the p-side electrode 2026 which is transparent to light. Stacked on the n-type contact layer 2018 is the n-side electrode 2034.

Bonding pads 2032 of Au (gold) are stacked on these electrodes, respectively, so that the wires (not shown) for supplying a operating current to the element be bonded. The surface of the element is covered by a passivating film 2030 of silicon oxide, for example.

Stacked on the p-side electrode 2026 are the wavelength converter FL and light absorber AB, in this order. The wavelength converter FL, among these elements, is explained first.

The wavelength converter FL functions to absorb the primary light emitted from the light emitting layer 2020 and to emit secondary light having a longer wavelength. The wavelength converter FL may be a layer made of a predetermined medium containing a fluorescent material. The fluorescent material absorbs the primary light emitted from the light emitting layer 2020 and is excited thereby to release a secondary light with a predetermined wavelength. For example, if the primary light emitted from the light emitting layer 2020 is the ultraviolet rays having the wavelength of about 330 nm, the wavelength converter FL may be configured so that the secondary light wavelength-converted by the fluorescent material has a predetermined wavelength in the visible band or infrared band. The wavelength of the secondary light can be adjusted by selecting an appropriate fluorescent material. Appropriate fluorescent materials absorbing the primary light in the ultraviolet band and efficiently emitting the secondary light are, for example, $Y_2O_2S:Eu$ or $La_2O_2S:(Eu,Sm)$ for mission of red light, $(Sr, Ca, Ba, Eu)_{10}(PO_4)_6.Cl_2$ for emission of blue light, and $3(Ba, Mg, Eu, Mn)O.8Al_2O_3$ for emission of green light. By mixing these fluorescent materials by an appropriate ratio, substantially all colors in the visible band can be expressed.

Most of these fluorescent materials have their absorption peaks in the wavelength band of about 300 to 380 nm. Therefore, in order to ensure efficient wavelength conversion by the fluorescent materials, the light emitting layer 2020 is preferably designed to emit ultraviolet rays in the wavelength band below 380 nm. For maximizing the conversion efficiency by the fluorescent materials, the light emitting layer is more preferably designed to emit ultraviolet rays of a wavelength near 330 nm.

Next explained is the light absorber AB. The light absorber AB has a wavelength selectivity to absorb the primary light with a high efficiency and to pass secondary light. That is, the light absorber AB has absorption characteristics in which the absorptance is high to the light lath the wavelength of the primary light, and low to the light with the wavelength of the secondary light. The light absorber AB with such characteristics can be made of an absorber dispersed in a translucent medium. Absorbers usable here are, for example, benzotriazole and cyanoacrylate. P-amino benzoic acid, benzophenone and cinnamic acid may also be usable as the absorber having the similar characteristics. Besides, among, the dye materials, cadmium red or red oxide is usable for red secondary light, and cobalt blue or ultramarine blue is usable for blue secondary light.

By using the light absorber AB, part of the primary light passing through the wavelength converter FL1 is absorbed and prevented from leakage to the exterior. At the same time, the spectrum of extracted light can be adjusted to improve the chromatic pureness. Additionally, the light absorber AB absorbs ultraviolet rays entering from the outside of the element and prevents that such external-turbulent light unnecessarily excites the wavelength converter FL into undesired emission.

Next explained is a semiconductor light emitting element according to the fortieth embodiment of the invention.

Figure 98:
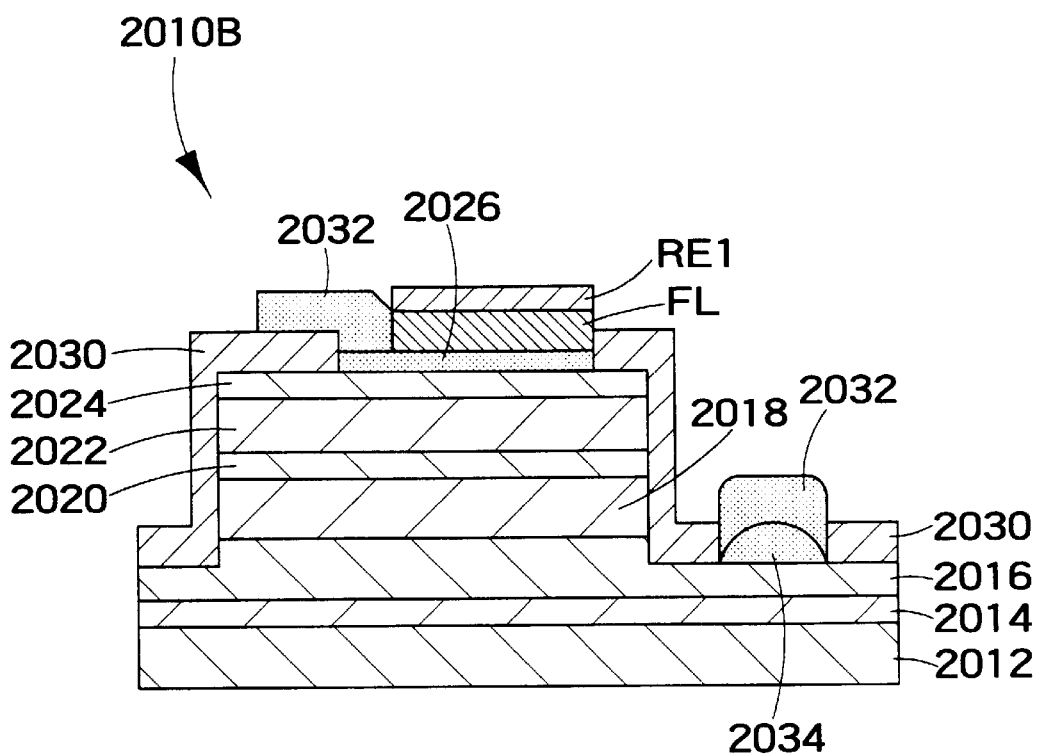
FIG. 98 is a cross-sectional view schematically shorting the semiconductor light emitting element according to the fortieth embodiment.

FIG. 98 is a cross-sectional view schematically showing the semiconductor light emitting element according to the fortieth embodiment. Also the semiconductor light emitting element 2010B shown here may have a gallium nitride compound semiconductor light emitting layer. In this embodiment, the element has a wavelength converter FL and optical reflector RE1 along the path for extracting light. The same components as those of the light emitting element shown in FIG. 97 are labeled with common reference numerals, and their explanation is omitted.

The embodiment is different from the aforementioned embodiment for having the optical reflector RE1 instead of the light absorber AB. The optical reflector RE1 is a reflector having a wavelength selectivity and functions to reflect the primary light and pass the secondary light in the light. That is, the optical reflector RE1 functions as a cut-off filter or a band-pass filter which reflects light with the wavelength of the primary light and passes light with the wavelength of the secondary light.

If the primary light is of the ultraviolet wavelength range, titanium oxide ($TiO_x$) or zinc oxide ($ZnO_x$) may be employed to form the RE1. By dispersing these materials in an appropriate solvent and by coating it on the wavelength converter FL, the optical reflector RE1 is formed.

A Bragg reflecting mirror, which can be made by alternately stacking two kinds of thin films different in refractive index to form a reelecting mirror having a high reflectance against light in a specific wavelength band, may be employed as the optical reflector RE1. If the wavelength of the primary light is $\lambda$ and the optical refractive index of the thin film layer is n, a reflecting mirror exhibiting a very high reflectance to the primary light can be made by alternately stacking two kinds of thin films each having the thickness of $\lambda/(4n)$. These two kinds of thin films preferably have a large difference in optical refractive index. Appropriate combinations are, for example, silicon oxide ($SiO_2$) and titanium oxide ($TiO_2$); aluminum nitride (AlN) and indium nitride (InN); and a thin film made of any one of these materials and a thin film of aluminum gallium arsenide, aluminum gallium phosphide, tantalum pentoxide, polycrystalline silicon or amorphous silicon.

The optical reflector RE1 made in this manner reflects and returns part of the primary light passing through the wavelength converter FL back to same with a high efficiency. The returned primary light is then wavelength-converted by the wavelength converter FL and permitted to pass through the optical reflector RE1 as secondary light. That is, by locating the optical reflector RE1 adjacent to the emission end of the wavelength converter FL, it is possible to prevent leakage of the primary light and to return part of the primary light passing through the wavelength converter FL. Therefore, the primary light can be efficiently converted in wavelength. The optical reflector RE1 also functions to reflect ultraviolet rays which undesirably enter into the element from the outside of the element. It is therefore prevented that the wavelength converter FL is excited by external turbulent light into undesirable emission.

Next explained is a semiconductor light emitting element according to the fiftieth embodiment of the invention.

Figure 99:
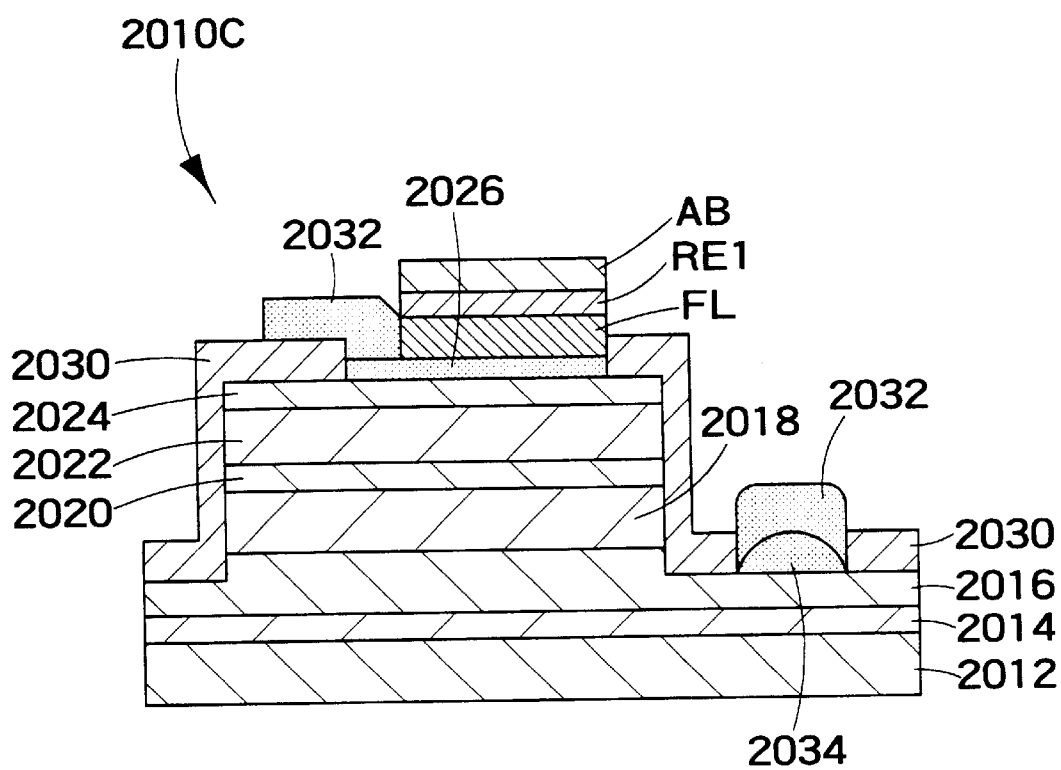
FIG. 99 is a cross-sectional view schematically showing the semiconductor light emitting element according to the fiftieth embodiment.

FIG. 99 is a cross-sectional view schematically showing the semiconductor light emitting element according to the fiftieth embodiment. Also the semiconductor light emitting element 2010C shown here may have a gallium nitride compound semiconductor light emitting layer. In this embodiment, the element has a wavelength converter FL, a optical reflector RE1 and a light absorber AB along the path for extracting light. The same components as those of the light emitting elements shown in FIGS. 97 and 98 are labeled with common reference numerals, and their explanation is omitted.

According to the embodiment, by combining the optical reflector RE1 and the light absorber AB, further improved light emitting element is realized. That is, the optical reflector RE1 made in this manner reflects and returns part of the primary light passing through the wavelength converter FL back to same with a high efficiency. The returned primary light is then wavelength-converted by the wavelength converter FL and permitted to pass through the optical reflector RE1 as secondary light. That is, by locating the optical reflector RE1 adjacent to the emission side of the wavelength converter FL, it is possible to prevent leakage of the primary light and to return the unconverted primary light back to the wavelength converter FL. Therefore, the primary light can be efficiently converted. The optical reflector RE1 also functions to reflect ultraviolet rays which undesirably enter into the element from the outside. It is therefore prevented that the wavelength converter FL is unnecessarily excited by external turbulent light into undesirable emission.

In addition to this, by arranging the light absorber AB on the optical reflector RE1, part of the primary light passing through the reflector RE1 is absorbed and prevented from leakage to the outside. At the same time, the spectrum of extracted light can be adjusted to improve the chromatic pureness. Additionally, the light absorber AB absorbs ultraviolet rays entering from the exterior and prevents that such external turbulent light excites the wavelength converter FL into undesired emission.

Next explained is a semiconductor light emitting element according to the sixtieth embodiment of the invention.

Figure 100:
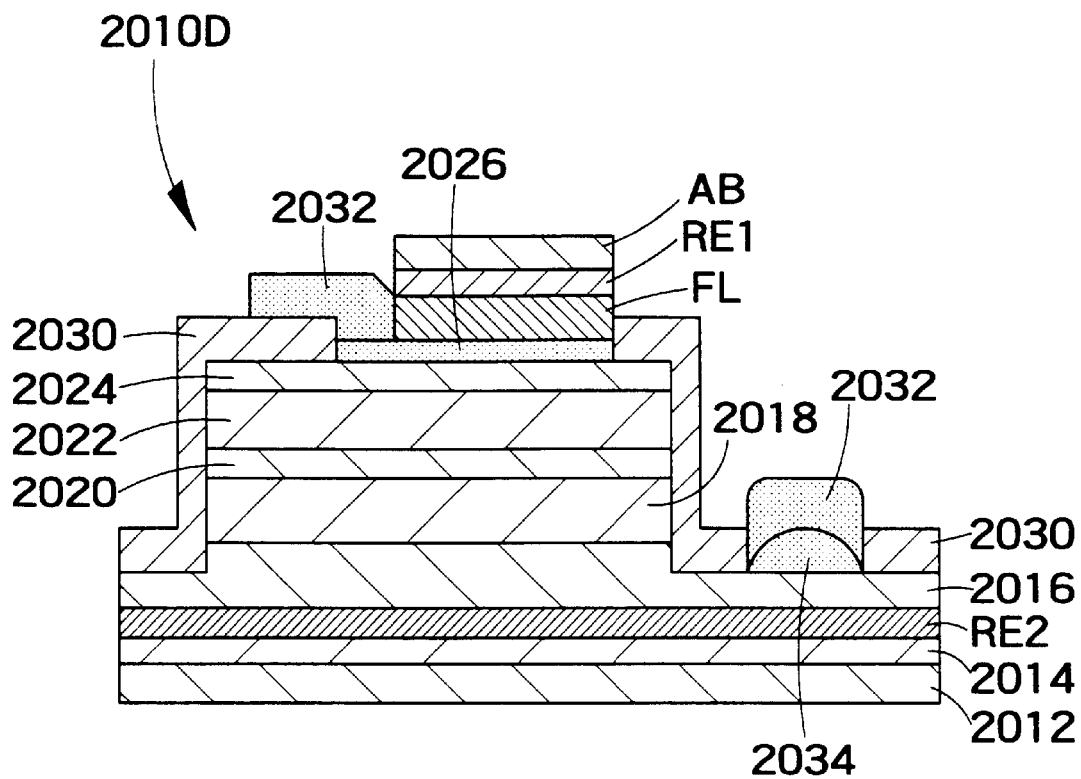
FIG. 100 is a cross-sectional view schematically showing the semiconductor light emitting element according to the sixtieth embodiment.

FIG. 100 is a cross-sectional view schematically showing the semiconductor light emitting element according to the sixtieth embodiment. Also the semiconductor light emitting element 2010D shown here may have a gallium nitride compound semiconductor light emitting layer, and a wavelength converter FL, a optical reflector RE1 and a light absorber AB are arranged along the path for extracting light. The same components as those of the light emitting elements shown in FIGS. 97 and 98 are labeled with common reference numerals, and their explanation is omitted.

The embodiment shown here further includes a second optical reflector RE2 on one side of the light emitting layer 2020 nearer to the substrate. The optical reflector RE2 functions to reflect the primary light emitted from the light emitting layer 2020 into the wavelength converter FL. Therefore, the primary light emitted from the light emitting layer 2020 toward the substrate 2012 can be used effectively. When the reflector RE2 is not provided, the primary light from the light emitting layer 2020 toward the substrate 2012 is absorbed in the interposed layers or scattered at the bottom surface of the substrate 2012, and cannot be converted efficiently in the wavelength converter FL. In the embodiment shown here, however, the optical reflector RE2 reflects it and makes it enter into the wavelength converter FL. As a result, primary light can be converted and extracted externally with a higher efficiency.

The optical reflector RE2 may be a Bragg reflecting mirror having a high reflectance to primary light so that primary light emitted from the light emitting layer 2020 toward the substrate 2012 can be returned back to the wavelength converter FL with a high reflectance. The Bragg reflecting mirror may be made by alternately stacking thin films of aluminum nitride (AlN) and indium nitride (InN), indium nitride and aluminum gallium arsenide, or indium nitride and aluminum gallium phosphide, for example.

Alternatively, the optical reflector RE2 may be a total reflection mirror instead of a wavelength selective mirror. That is, by using a reflecting mirror having a high reflectance to both the primary light and the secondary light as the optical reflector RE2, any secondary light departing from the wavelength converter FL toward the substrate 2012 can be reflected and extracted efficiently. The total reflection mirror may be a single-layer metal film, for example, having a high reflectance, instead of a Bragg reflector.

The location of the optical reflector RE2 is not limited to the position shown in FIG. 100, but it may be located either along the boundary of any adjacent two of the crystal layers 2012 through 2020 or on the bottom surface of the substrate 2012. Alternatively, one of the crystal layers 2014 through 2018 may be used and made as the optical reflector RE2.

Next explained is a semiconductor light emitting element according to the seventieth embodiment of the invention.

Figure 101:
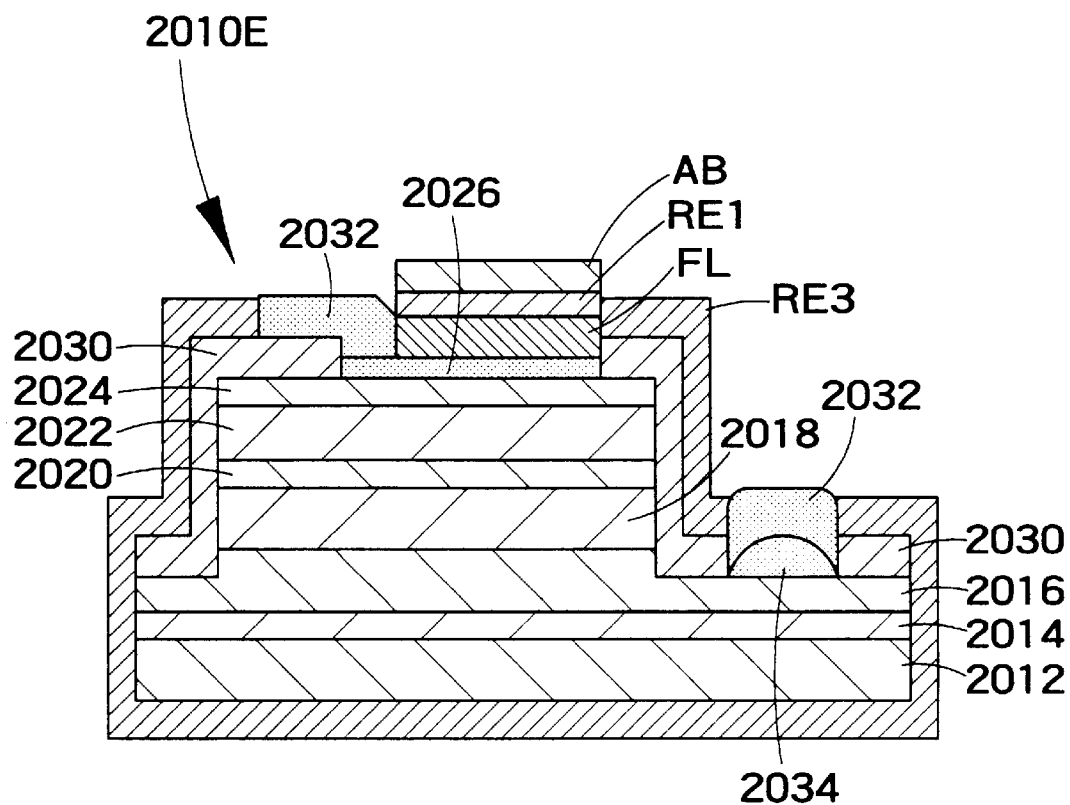
FIG. 101 is a cross-sectional view schematically showing the semiconductor light emitting element according to the seventieth embodiment.

FIG. 101 is a cross-sectional view schematically showing the semiconductor light emitting element according to the seventieth embodiment. Also the semiconductor light emitting element 2010E shown here includes a wavelength converter FL, optical reflector RE1 and light absorber AB along the path for extracting light. Here again, the same components as those of the light emitting element shown in FIGS. 97 and 98 are labeled with common reference numerals, and their explanation is omitted.

The embodiment shown here further includes an optical reflector RE3 which envelopes the light emitting element. The optical reflector RE3 may be either a wavelength selective reflector or a total reflection mirror having no wavelength selectivity.

When the optical reflector RE3 has a wavelength selectivity, it reflects the primary light emitted from the light emitting layer 2020, and prevents its leakage to the outside. The primary light respectively reflected in this manner finally enters into the wavelength converter FL and is converted to the secondary light. Therefore, the wavelength conversion efficiency is improved. The wavelength selectivity can be realized by using a Bragg reflecting mirror.

When the optical reflector RE3 has no wavelength selectivity, it prevents external leakage of not only the primary light but also other wavelength components including secondary light. The total reflection mirror may be made of a metal film, for example. The total reflection mirror results in limiting the light emitting path only to an opening where the optical reflector RE3 is not made. That is, by covering the surfaces of the light emitting element 2010C with the optical reflector RE3 to permit secondary light to be emitted only through a predetermined opening, the optical radiation pattern can be readily controlled in accordance with the configuration of the opening. For example, when the optical reflector RE3 is configured to define a very small opening, a light emitting element as a point light source with a high brightness can be made easily. A point light source enables effective convergence of light by means of an optical means including lenses, and is practically advantageous in most cases.

Next explained is a semiconductor light emitting element according to the eightieth embodiment of the invention.

Figure 102:
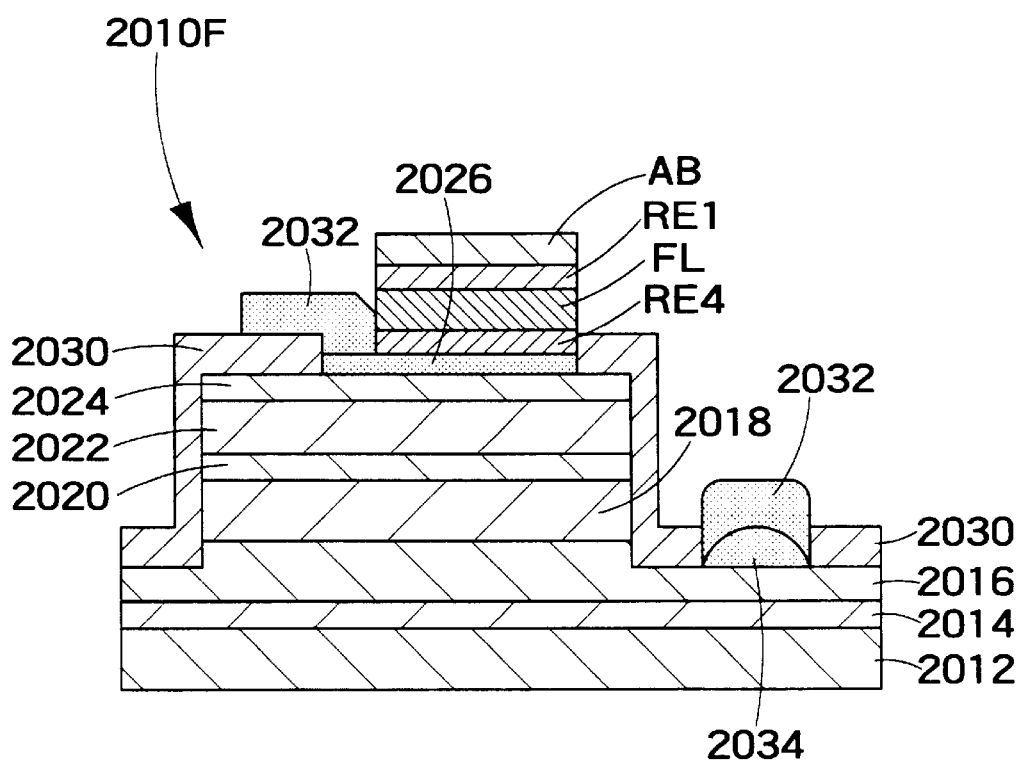
FIG. 102 is a cross-sectional view schematically showing the semiconductor light emitting element according to the eightieth embodiment.

FIG. 102 is a cross-sectional view schematically showing the semiconductor light emitting element according to the eightieth embodiment. The semiconductor light emitting element 2010F shown here has a second optical reflector RE4 which is provided adjacent to the optical entry side of the wavelength converter FL. That is, the optical reflector RE4 wavelength converter FL, optical reflector RE1 and light absorber AB are provided in this order alone the path for extracting light. Here again, the same components as those of the light emitting element shown in FIGS. 97 through 101 are labeled with common reference numerals, and their explanation is omitted.

The optical reflector RE4 used in the present embodiment has a wavelength selectivity to pass the primary light emitted from the light emitting layer 2020 and to reflect the secondary light emitted from the wavelength converter after conversion. That is, the optical reflector RE4 has a low reflectance to the light with the wavelength of the primary light and a high reflectance to the light with the wavelength of the secondary light. Such a wavelength selectivity can be realized by using a Bragg reflecting mirror mentioned before, for example.

The wavelength converter FL functions to absorb primary light and release secondary light with a longer wavelength. Details thereof are the same as explained with reference to the thirtieth embodiment.

The optical reflector RE1 is configured to exhibit a low, reflectance to the secondary light emitted from the wavelength converter and a high reflectance to the primary light. Also this type of wavelength selectivity can be realized by using a Bragg reflecting mirror.

The light absorber AB is configured to exhibit a high optical absorptance to primary light and a low absorptance to secondary light. Structural details thereof may be the same as explained with reference to the thirtieth embodiment.

According to the present embodiment, primary light emitted from the light emitting layer 2020 passes through the optical reflector RE4, then enters into the wavelength converter FL, and is converted into secondary light. Part of the primary light passing through the wavelength converter FL without wavelength conversion is reflected by the optical reflector RE1 back to the wavelength converter FL. Part of the primary light not reflected by and passing through the optical reflector RE1 is absorbed by the light absorber AB not to leak to the outside.

Part of the secondary light emitted from the wavelength converter FL and running toward the optical reflector RE1 passes through the optical reflector RE1 and the light absorber AB, and can be extracted to the exterior. Part of the secondary light released from the wavelength converter FL and running toward the light emitting layer 2020 is reflected by the optical reflector RE4, passes through the wavelength converter FL, optical reflector RE5 and light absorber AB, and can be extracted to the outside.

If the optical reflector RE4 is not provided, secondary light released from the wavelength converter FL toward the light emitting layer 2020 cannot be efficiently extracted to the outside because the most part thereof is absorbed in the layers 2012 through 2026, or scattered by interfaces of these layers or by the surfaces of the substrate. In contrast, according to the embodiment, the optical reflector RE4 reflects secondary light released from the wavelength converter FL toward the light emitting layer 2020 and makes it be efficiently extracted to the outside.

The present embodiment mall be combined with the sixtieth embodiment or the seventieth embodiment to realize a more efficient semiconductor light emitting element. When the optical reflector RE2 used in the sixtieth embodiment is added to the present embodiment, the primary light released from the light emitting layer 2020 can be more efficiently introduced into the wavelength converter FL for wavelength conversion there. When the optical reflector RE3 used in the seventieth embodiment is added to the present embodiment, the emission aperture of the light emitting element is easily controlled and a point-sized light source can be made.

The above explanation with reference to FIGS. 97 through 102 has been made on gallium nitride semiconductor light emitting elements grown on sapphire substrates. However, the invention is not limited to these specific examples but similarly applicable to a gallium nitride semiconductor light emitting element grown on a SiC substrate or any other appropriate substrate, ensuring the same effects. Materials of the light emitting layer and other layers are not limited to gallium nitride compound semiconductors. Any other materials may be used as far as they ensure emission of a primary light which can be efficiently converted in the wavelength converter FL. In the case where a fluorescent material is used to obtain visible light, the light emitting layer is preferably configured to emit light with a wavelength in bands from blue to ultraviolet rays. Usable materials of the light emitting layer of this type are, ZnSe, ZnS, SiC and BN, for example, in addition to gallium nitride compound semiconductors.

Next explained are semiconductor light emitting devices according to the ninetieth embodiment of the invention.

Figure 103:
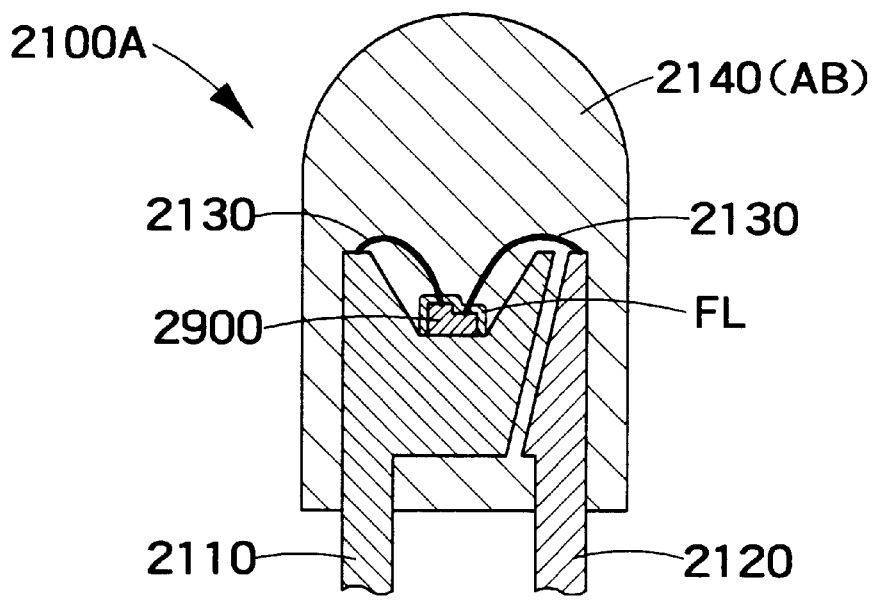
FIG. 103 is a roughly illustrated cross-sectional view of a semiconductor device according to the invention.

FIG. 103 is a roughly illustrated cross-sectional view of a semiconductor device according to the invention. The semiconductor light emitting device 2100A shown here is a device called "LED (light emitting diode) lamp" of a so-called "lead frame type". The device 2100A includes a semiconductor light emitting element 2900 mounted on the bottom of a cup of a lead frame 2110. The p-side electrode and the n-side electrode of the light emitting element 2900 are connected to lead frames 2110 and 2120 by wires 2130, 2130, respectively. Inner lead parts of the lead frames are molded in and protected by a resin 2140.

In the embodiment shown here, a wavelength converter FL is located on the light emitting element 2900. Further, the resin 2140 functions as a light absorber AB which has an wavelength selectivity.

The wavelength converter FL functions to absorb primary light emitted from the semiconductor light emitting element 2900 and to release secondary light with a longer wavelength. Its structure may be the same as the wavelength converter FL explained with reference to FIG. 97. That is, it may be made by dispersing a predetermined fluorescent material in a translucent medium.

The light absorber AB (resin 2140) has a wavelength selectivity to pass the secondary light and to absorb the primary light. It may be made by dispersing a predetermined light absorber in the resin 2140. Structural details thereof may be the same as the light absorber AB explained with reference to FIG. 97. Absorbers usable for the ultraviolet primary light are, for example, benzotriazole, cyanoacrylate, p-amino benzoic acid, benzophenone and cinnamic acid as mentioned before.

The semiconductor light emitting element 2900 is preferably one for a short emission wavelength in order to increase the conversion efficiency in the wavelength converter FL. The light emitting element of this type may be one using gallium nitride compound semiconductors, ZnSe, ZnS, SiC or BN, for example, as the material of the light emitting layer 2020.

In the device shown here, since the wavelength converter FL is provided, primary light from the semiconductor light emitting element 2900 is converted into desired visible light or infrared rays.

Moreover, since the light absorber AB is provided, the primary light passing through the wavelength converter FL is absorbed and prevented from leakage to the outside, and the spectrum of extracted light can be adjusted to improve the chromatic pureness. Additionally, the light absorber AB absorbs ultraviolet rays entering from the outside and prevents that such external turbulent light unnecessarily excites the wavelength converter FL into undesired emission.

The above explanation with reference to FIG. 103 has been made on an LED lamp of a lead frame type. However, the invention is not limited to these specific example but similarly applicable to an LED lamp of an SMD (surface mount device) type.

Next explained is a semiconductor light emitting device according to the twentieth embodiment of the invention.

Figure 104:
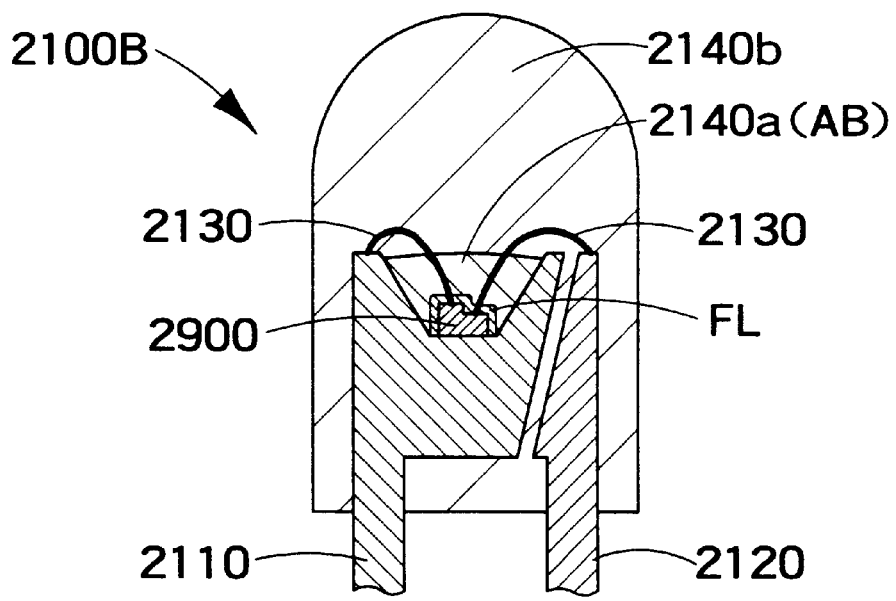
FIG. 104 is a roughly illustrated cross-sectional view of a semiconductor device according to the invention.

FIG. 104 is a roughly illustrated cross-sectional view of a semiconductor device according to the invention. The device 200B shown here is also a LED lamp of a lead frame type. In FIG. 104, the same components as those of the light emitting device shown in FIG. 103 are labeled with common reference numerals, and their explanation is omitted.

In the embodiment, the wavelength convertor FL is located on the light emitting element 2900. The resin 2140 is composed of the inner mold part 2140a and the outer mold part 2140b. The inner mold part 140a is located inside the cup region of the lead frame 110 and functions as the light absorber AB having a wavelength selectivity. The inner mold part 2140a may be made of epoxy resin. The absorber dispersed therein may be benzotriazole and so on as explained with reference to FIG. 103. The outer mold part 2140b is preferably made of a translucent material to the secondary light.

A specific example of the fabricating the device is explained below. A fluorescent material having the desired wavelength conversion function dispersed in a desired solvent or a coating material and coated on the surface of the light emitting element 2900. A absorber having the wavelength selectivity is dispersed in a resin and molded into the cup region of the lead frame 2110 to form the inner mold part 2140a. Then, a optically transparent resin is applied around the inner mold part to form the outer mold part 2140b.

Alternatively, a desired matrix such as solvent, coating material or resin mixed with the fluorescent material and the absorber may be applied into the cup region of the lead frame 2110. By utilizing the difference of the segregating speed between the fluorescent material and the absorber, the fluorescent layer FL and the light absorber AB may be stacked on the light emitting element in this order. The fluorescent materials used in the invention segregates first because they have lager specific gravities than the light absorbers. The light absorber tends to remain in the matrix because of their high viscosity. By selecting the light absorber so that its melting temperature is similar to the curing temperature of the matrix, the absorber may be uniformly dispersed in the matrix by performing the curing process.

Since the light absorber AB is provided, the primary light passing through the wavelength converter FL is absorbed and prevented from leakage to the outside, and the spectrum of extracted light can be adjusted to improve the chromatic pureness. Additionally, the light absorber AB absorbs ultraviolet rays entering from the outside and prevents that such external turbulent light unnecessarily excites the wavelength converter FL into undesired emission.

Next explained is a semiconductor light emitting devices according to the twenty-first embodiment of the invention.

Figure 105:
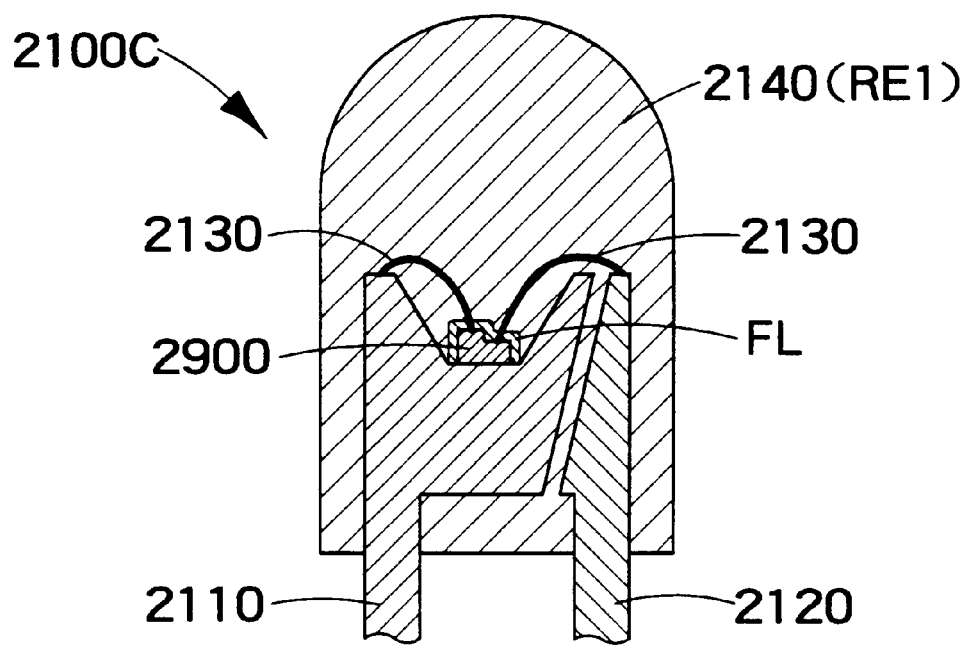
FIG. 105 is a roughly illustrated cross-sectional view of a semiconductor device according to the invention.
Figure 106:
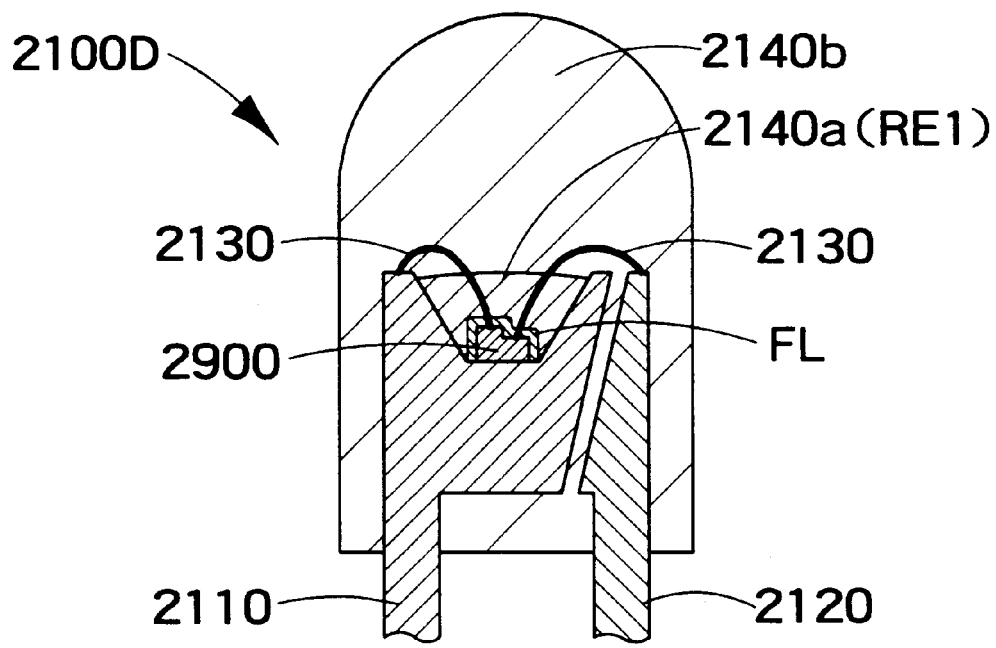
FIG. 106 is a roughly illustrated cross-sectional view of a semiconductor device according to the invention.

FIG. 105 is a roughly illustrated cross-sectional view of a semiconductor device according to the invention. The device 2100C shown here is also a LED lamp of a lead frame type. In FIG. 106, the same components as those of the light emitting device shown in FIG. 105 are labeled with common reference numerals, and their explanation is omitted.

The resin 2140 functions as the optical reflector RE1 having a wavelength selectivity. For example, the resin 2140 is made of epoxy resin in which a optical reflector having a wavelength selectivity is dispersed. The reflector dispersed in the resin functions to reflect the primary light and pass the secondary light in the light entering from the wavelength converter FL. If the primary light is of the ultraviolet wavelength range, titanium oxide ($TiO_x$) or zinc oxide ($ZnO_x$) may be employed to form the RE1 as explained above.

The optical reflector RE1 made in this manner reflects and returns part of the primary light passing through the wavelength converter FL back to same with a high efficiency. The returned primary light is then converted by the wavelength converter FL and permitted to pass through the optical reflector RE1 as secondary light. That is, by locating the optical reflector RE1 adjacent to the emission end of the wavelength converter FL, it is possible to prevent leakage of the primary light and to return part of the primary light passing through the wavelength converter FL. Therefore, the primary light can be efficiently converted in wavelength. The optical reflector RE1 also functions to reflect ultraviolet rays which undesirably enter into the element from the outside of the element. It is therefore prevented that the wavelength converter FL is excited by external turbulent light into undesirable emission.

Next explained is a-semiconductor light emitting devices according to the twenty-second embodiment of the invention.

FIG. 106 is a roughly illustrated cross-sectional view of a semiconductor device according to the invention. The device 2100D shown here is also a LED lamp of a lead frame type. In FIG. 106, the same components as those of the light emitting device shown in FIG. 103 are labeled with common reference numerals, and their explanation is omitted.

In the device shown here, the wavelength convertor FL is located on the light emitting element 2900. The resin 2140 is composed of the inner mold part 2140a and the outer mold part 2140b. The inner mold part 2140a is located inside the cup region of the lead frame 110 and functions as the optical reflector RE1 having a wavelength selectivity.

The inner mold part 2140a may be made of epoxy resin. The reflector dispersed therein may be titanium oxide ($TiO_x$) and so on as explained with reference to FIG. 10D. The outer mold part 2140b is preferably made of a translucent material to the secondary light.

A specific example of the fabricating the device may be essentially the same as explained with reference to FIG. 106. A fluorescent material having the desired wavelength conversion function dispersed in a desired solvent or a coating material and coated on the surface of the light emitting element 2900. A reflector having the wavelength selectivity is dispersed in a resin and molded into the cup region of the lead frame 2110 to form the inner mold part 2140a. Then, a optically transparent resin is applied around the inner mold part to form the outer mold part 2140b.

Alternatively, a desired matrix such as solvent, coating material or resin mixed with the fluorescent material and the reflector may be applied into the cup region of the lead frame 2110. By utilizing the difference of the segregating speed between the fluorescent material and the reflector, the fluorescent layer FL and the optical reflector RE1 may be stacked on the light emitting element in this order.

By locating such an optical reflector RE1, various advantages as explained with reference to FIG. 105 can be achieved as well.

Next explained is a semiconductor light emitting devices according to the twenty-third embodiment of the invention.

Figure 107:
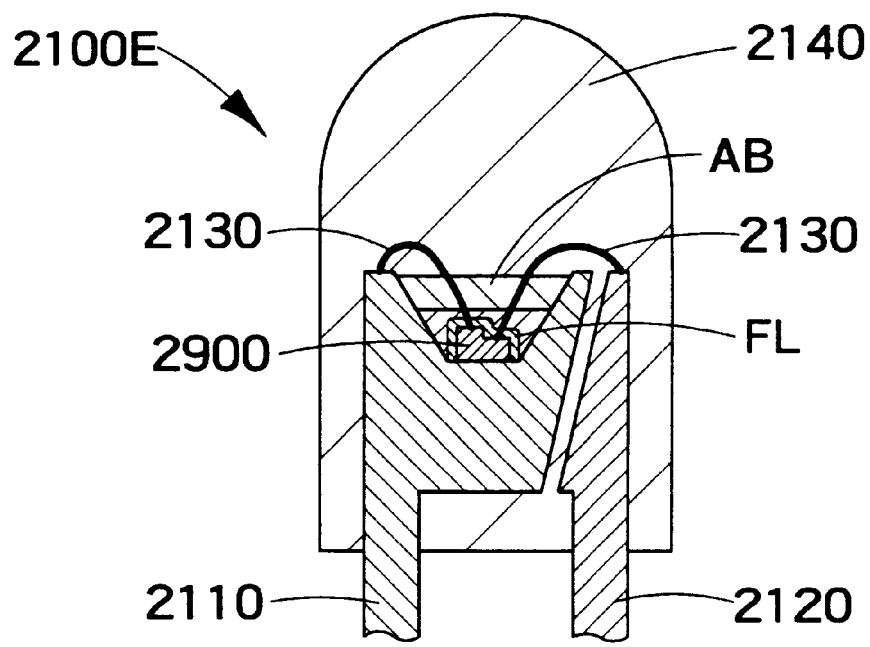
FIG. 107 is a roughly illustrated cross-sectional view of a semiconductor device according to the invention.

FIG. 107 is a roughly illustrated cross-sectional view of a semiconductor device according to the invention. The device 2100E shown here is also a LED lamp of a lead frame type. In FIG. 107, the same components as those of the light emitting device shown in FIG. 106 are labeled with common reference numerals, and their explanation is omitted.

In the device shown here, the wavelength convertor FL is located on the light emitting element 2900. The details about the convertor FL may be the same as described with reference to FIG. 103. Above the convertor FL, the light absorber AB is located and the resin 2140 buries the inner lead part.

The light absorber AB in the embodiment also has a wavelength selectivity to absorb the primary light with a high efficiency and to pass the secondary light. A dichroic filter or a ultraviolet-cut filter can be employed as the absorber AB. The space between the light emitting element and the absorber AB may be either filled with appropriate material such as resin or filled with appropriate gas.

By locating such an light absorber AB, various advantages as explained with reference to FIG. 103 can be achieved as well.

Next explained is a semiconductor light emitting devices according to the twenty-forth embodiment of the invention.

Figure 108:
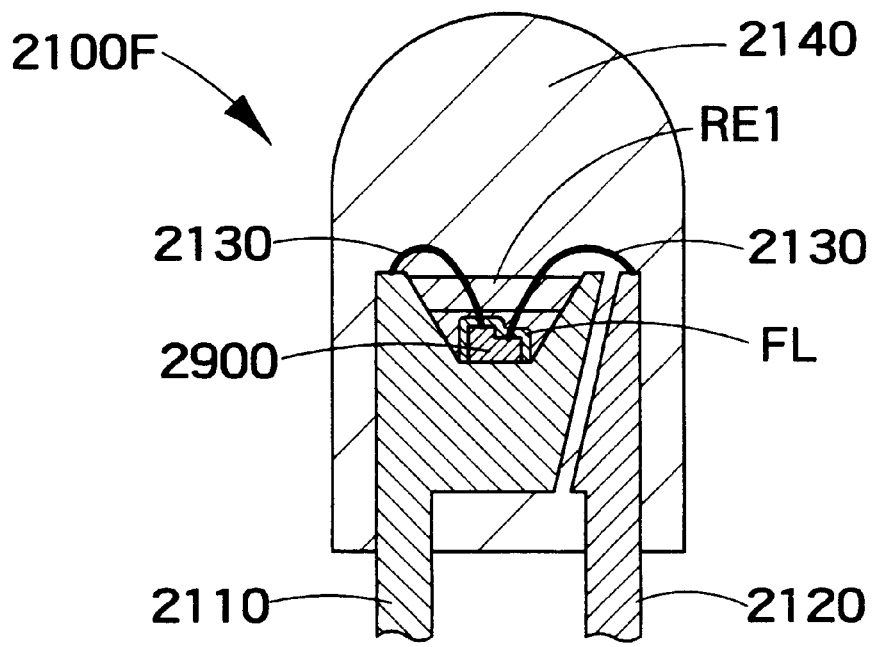
FIG. 108 is a roughly illustrated cross-sectional view of a semiconductor device according to the invention.

FIG. 108 is a roughly illustrated cross-sectional view of a semiconductor device according to the invention. The device 2100F shown here is also a LED lamp of a lead frame type. In FIG. 108, the same components as those of the light emitting device shown in FIG. 103 are labeled with common reference numerals, and their explanation is omitted.

In the device shown here, the wavelength convertor FL is located on the light emitting element 2900. The details about the convertor FL may be the same as described with reference to FIGS. 103 through 107. Above the convertor FL, the optical reflector RE1 is located and the resin 2140 buries the inner lead part.

The optical reflector RE1 in the embodiment also has a wavelength selectivity to absorb the primary light with a high efficiency and to pass the secondary light. A dichroic mirror can be employed as the reflector REB. The Bragg reflector as explained above may also be employed as the reflector RE1. The space between the light emitting element and the reflector RE1 may be either filled with appropriate material such as resin or filled with appropriate gas.

By locating such an optical reflector RE1, various advantages as explained with reference to FIG. 105 can be achieved as well.

Next explained is a semiconductor light emitting devices according to the twenty-fifth embodiment of the invention.

Figure 109:
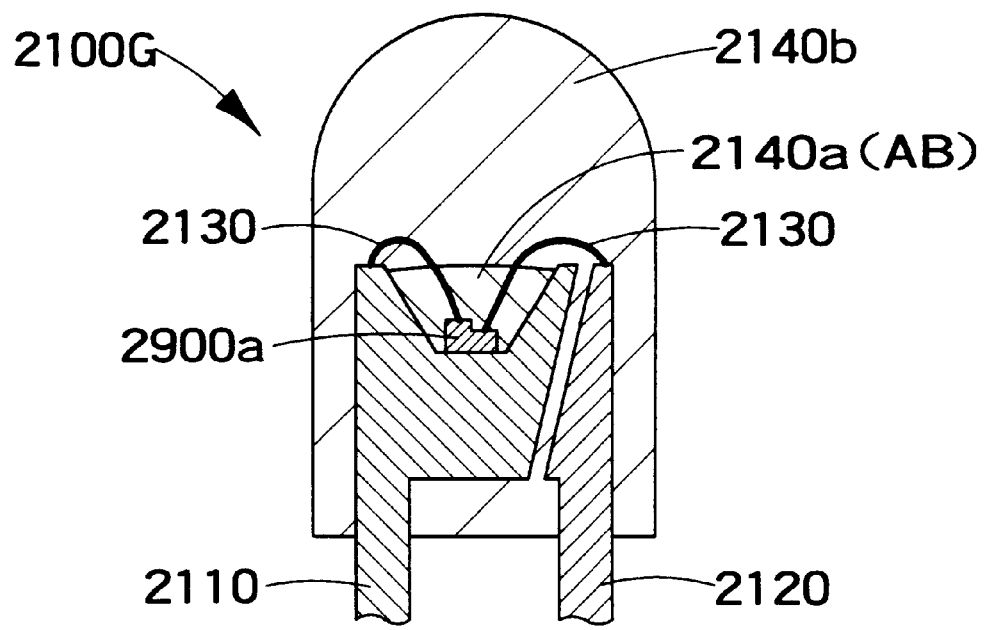
FIG. 109 is a roughly illustrated cross-sectional view of a semiconductor device according to the invention.

FIG. 109 is a roughly illustrated cross-sectional view of a semiconductor device according to the invention. The device 2100G shown here is also a LED lamp of a lead frame type. In FIG. 109, the same components as those of the light emitting device shown in FIGS. 103 through 108 are labeled with common reference numerals, and their explanation is omitted.

In the device shown here, the light emitting element 2900a is a semiconductor light emitting element which emits light of the wavelength range of blue or violet. Generally, in the semiconductor elements of this wavelength range, the emission takes place by the energy transition through the impurity level. As a result, the emission spectrum extends to the ultraviolet wavelength range in most cases. That is, the emitted light includes ultraviolet component to some extent in addition to the desired blue or violet light. For example, LEDs made of the gallium nitride compound, zinc selenide, silicon carbide or boron nitride show this phenomenon.

According to the embodiment, the inner mold part 2140a functions as the light absorber AB. That is, the light absorber AB absorbs the ultraviolet component and passes the desired blue or violet light. As a result, the leakage of the harmfull ultraviolet component is efficiently prevented and the desired blue or violet light can be extracted successfully. The details of the light absorber AB is as explained above. Instead of the inner mold part 2140a, the outer mold part 2140b may be configured to function as the light absorber AB as well.

Next explained is a semiconductor light emitting devices according to the twenty-sixth embodiment of the invention.

Figure 110:
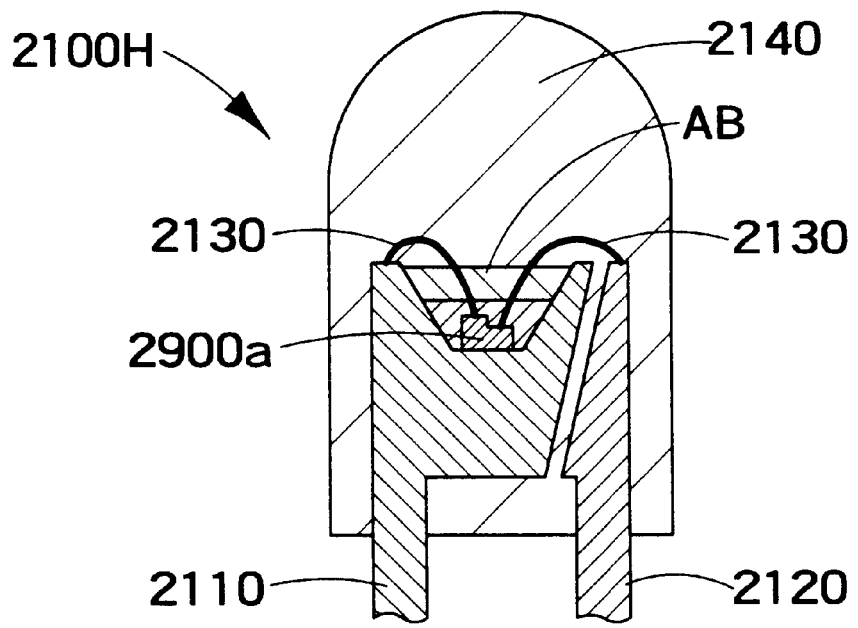
FIG. 110 is a roughly illustrated cross-sectional view of a semiconductor device according to the invention.

FIG. 110 is a roughly illustrated cross-sectional view of a semiconductor device according to the invention. The device 100H shown here is also a LED lamp of a lead frame type. In FIG. 110, the same components as those of the light emitting device shown in FIGS. 103 through 109 are labeled with common reference numerals, and their explanation is omitted.

In the device shown here, the light emitting element 2900a is also a semiconductor light emitting element which emits light of the wavelength range of blue or violet. The details about the element 2900a may be the same as described with reference to the FIG. 109. On the element 2900a, the light absorber AB having a wavelength selectivity is located and molded by the resin 2140.

The light absorber AB absorbs the ultraviolet component emitted from the element 2900a and passes the desired blue or violet light. A dichroic filter or a UV (ultraviolet)-cut filter may be employed as the absorber AB. The space between the light emitting element and the reflector RE1 may be either filled fifth appropriate material such as resin or filled with appropriate gas.

By locating such a light absorber AB, various advantages as explained with reference to FIG. 109 can be achieved as well.

Next explained is a semiconductor light emitting devices according to the twenty-seventh embodiment of the invention.

Figure 111:
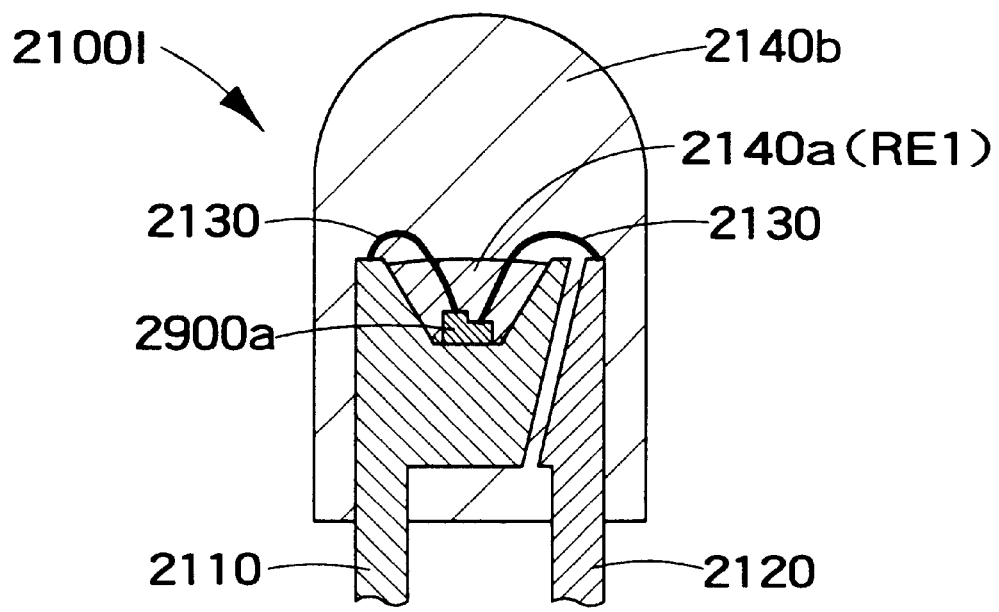
FIG. 111 is a roughly illustrated cross-sectional view of a semiconductor device according to the invention.

FIG. 111 is a roughly illustrated cross-sectional view of a semiconductor device according to the invention. The device 2100I shown here is also a LED lamp of a lead frame type. In FIG. 111, the same components as those of the light emitting device shown in FIGS. 103 through 110 are labeled with common reference numerals, and their explanation is omitted.

In the device shown here, the light emitting element 2900a is also a semiconductor light emitting element which emits light of the wavelength range of blue or violet. The inner mold part 2140a functions as the optical reflector RE1 having a wavelength selectivity. That is, the reflector RE1 reflects the ultraviolet component emitted from the element 2900a and passes the desired blue or violet light. As a result, the leakage of the harmful ultraviolet component is efficiently prevented and the desired blue or violet light can be successfully extracted. The details of the reflector RE1 is as explained with reference to FIG. 105. In addition to the inner mold part 2140a, the outer mold part 2140b may also be configured to function as the reflector RE1 as well.

Next explained is a semiconductor light emitting devices according to the twenty-eighth embodiment of the invention.

Figure 112:
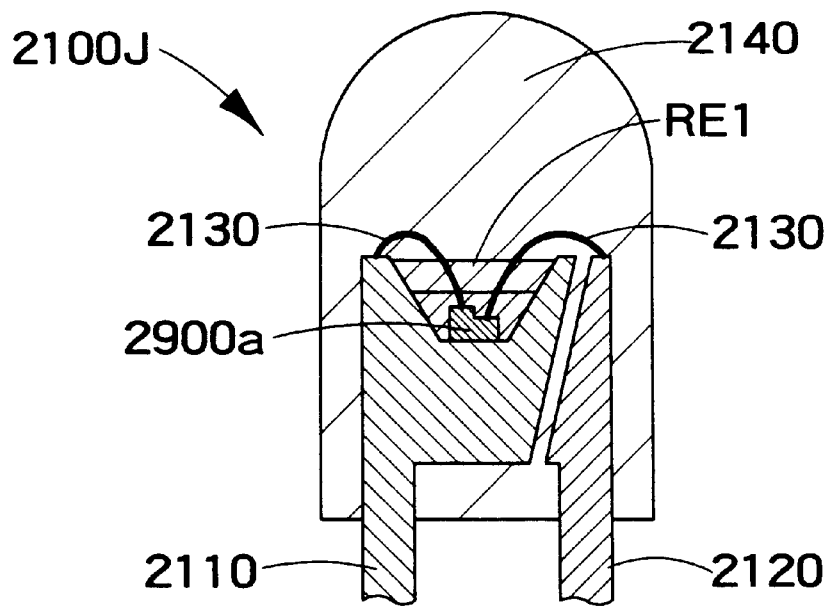
FIG. 112 is a roughly illustrated cross-sectional view of a semiconductor device according to the invention.

FIG. 112 is a roughly illustrated cross-sectional view of a semiconductor device according to the invention. The device 2100J shown here is also a LED lamp of a lead frame type. In FIG. 112, the same components as those of the light emitting device shown in FIGS. 103 through 111 are labeled with common reference numerals, and their explanation is omitted.

In the device shown here, the light emitting element 2900a is also a semiconductor light emitting element which emits light of the wavelength range of blue or violet. On the element 2900a, the optical reflector RE1 having a wavelength selectivity is located and the resin 2140 is molded.

The reflector RE1 reflects the ultraviolet component emitted from the element 2900a and passes the desired blue or violet light. A dichroic mirror or a UV (ultraviolet)-cut mirror may be employed as the reflector RE1. The space between the light emitting element and the reflector RE may be either filled fifth appropriate material such as resin or filled with appropriate gas.

By locating such an optical reflector RE1, various advantages as explained with reference to FIG. 111 can be achieved as well.

With reference to FIGS. 103 through 112, the lead frame type LED lamps are exemplarily shown. However, the invention is not limited to these specific examples. In addition to these, the invention can be advantageously applied to the LED lamps of SMD (surface mount device) type or any other various kinds of light emitting devices as well.

Next explained is a semiconductor light emitting device according to the twenty-ninth embodiment of the invention.

Figure 113:
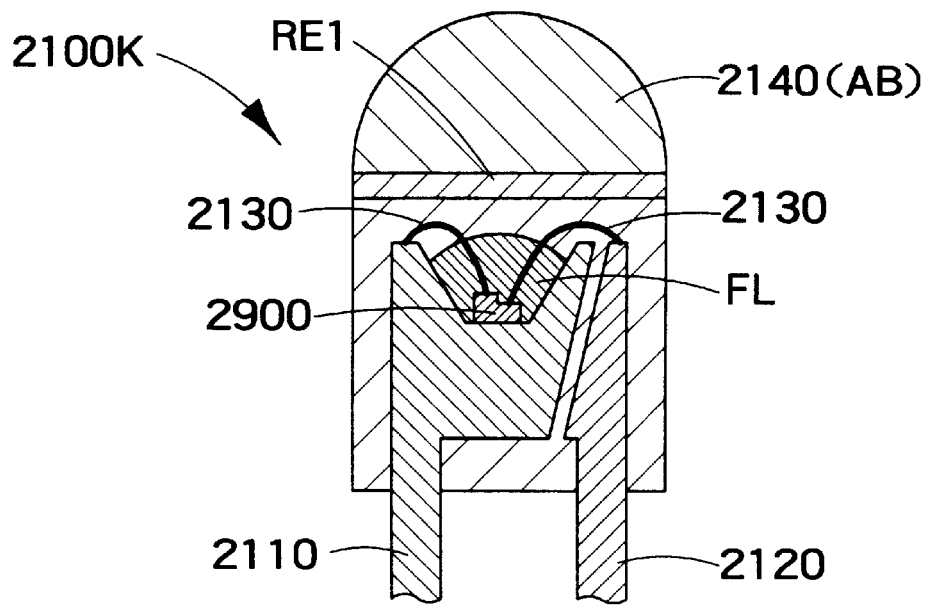
FIG. 113 is a roughly illustrated cross-sectional view of a semiconductor device according to the twenty-ninth embodiment of the invention.

FIG. 113 is a roughly illustrated cross-sectional view of a semiconductor device according to the twenty-ninth embodiment of the invention. The semiconductor light emitting device 2100K shown here is also an LED lamp of a lead frame type. In FIG. 113, the same components as those of the light emitting device shown in FIGS. 103 through 112 are labeled with common reference numerals, and their explanation is omitted.

In the embodiment shown here, a wavelength converter FL and an optical reflector RE1 are located adjacent to the emission end of the semiconductor light emitting element 2900. The resin 2140 functions as an light absorber AB having a wavelength selectivity.

The wavelength converter FL functions to absorb primary light emitted from the semiconductor light emitting element 2900 and to release secondary light with a longer wavelength. Its structure may be the same as the wavelength converter FL explained with reference to FIG. 97. That is, it may be made by dispersing a predetermined fluorescent material in a translucent medium.

The optical reflector RE1 has a wavelength selectivity to reflect primary light emitted from the semiconductor light emitting element 2900 and to pass secondary light after conversion by the wavelength converter FL. Here again, its structure may be the same as the optical reflector RE1 explained with reference to FIG. 98.

The light absorber AB has a wavelength selectivity to pass secondary light and to absorb primary light. It may be made by dispersing a predetermined light absorber in the resin 2140. Structural details thereof may be the same as the light absorber AB explained with reference to FIG. 97.

The semiconductor light emitting element 2900 is preferably one for a short emission wavelength in order to increase the wavelength conversion efficiency in the wavelength converter FL. The light emitting element of this type may be one using gallium nitride compound semiconductors, ZnSe, ZnS, SiC or BN, for example, as the material of the light emitting layer.

In the device shown here, since the wavelength converter FL is provided, primary light from the semiconductor light emitting element 2900 is converted into desired visible light or infrared rays. Moreover, since the optical reflector RE1 is provided, part of the primary light which leaks through the wavelength converter FL is reflected with a high efficiency and returned back to the wavelength converter FL. The primary light returned back in this manner is wavelength-converted in the wavelength converter FL, and then passes through the optical reflector RE1 as secondary light. That is, by locating the optical reflector RE1 adjacent to the emission end of the wavelength converter FL, it is possible to prevent leakage of the primary light and to return primary light passing through the wavelength converter FL for wavelength conversion once again. Therefore, primary light can be converted very efficiently.

Furthermore, since the light absorber AB is provided, primary light passing through the optical reflector RE1 is absorbed and prevented from leakage to the exterior, and the spectrum of extracted light can be adjusted to improve the chromatic pureness.

Figure 114:
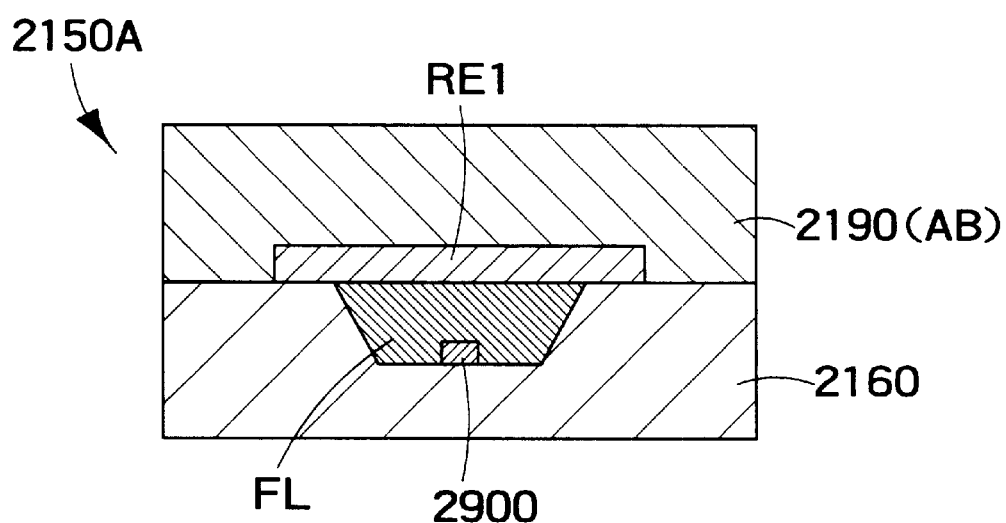
FIG. 114 is a cross-sectional schematic view of the second semiconductor light emitting device according to the present embodiment.

FIG. 114 is a cross-sectional schematic view of the second semiconductor light emitting device according to the present embodiment. The semiconductor light emitting device 2150A shown here is a device called "surface mounted lamp (SMD lamp)". The SMD lamp 2150A includes a semiconductor light emitting element 2900 mounted on a packaging surface of a packaging member and protected by a resin 2190. Also in the SMD lamp 2150A of a substrate type shown in FIG. 114, by providing the wavelength converter FL, optical reflector RE1 and light absorber AB, the same effects as explained with reference to FIG. 113 can be obtained. Although the light absorber AB is illustrated as being the resin 2190 itself, it may be another thin film stacked on the surface of the resin.

Figure 115:
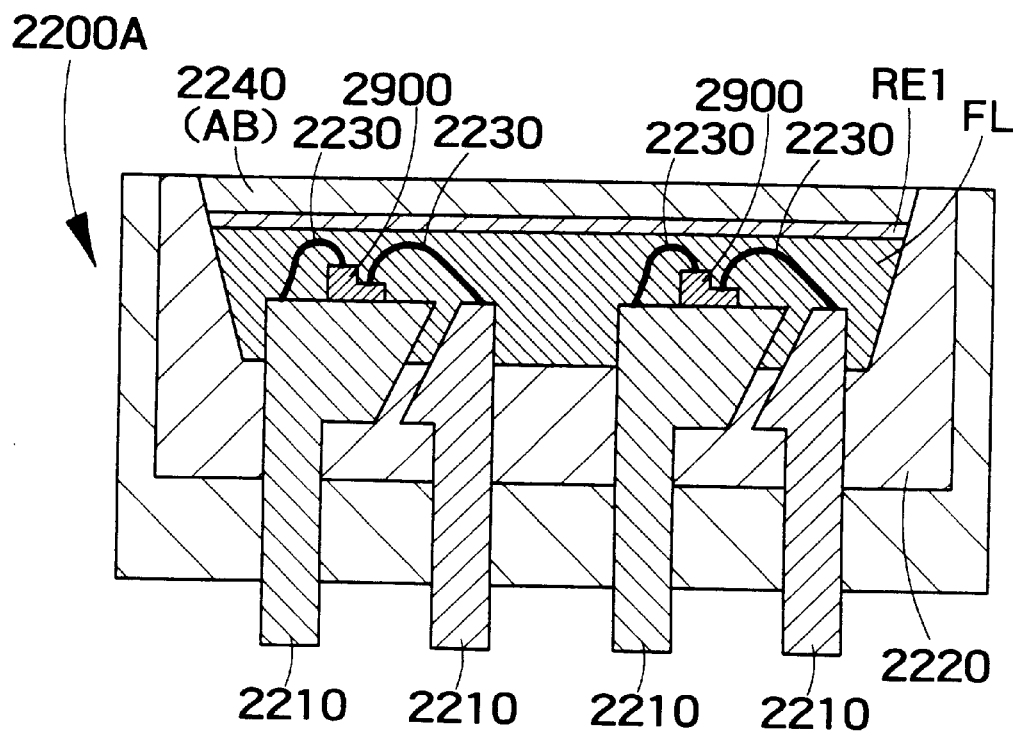
FIG. 115 is a cross-sectional schematic view of the third semiconductor light emitting device according to the present embodiment.

FIG. 115 is a cross-sectional schematic view of the third semiconductor light emitting device according to the present embodiment. The semiconductor light emitting device 2200A shown here is a "surface emission type" semiconductor light emitting device. The surface emission type device 2200A includes semiconductor light emitting elements 2900 mounted on lead frames 2210 and 2212, respectively, and molded in a resin 2240 within a cup of the reflection plate 2220.

Light emitted from each semiconductor light emitting element is reflected by the reflection plate 2220, and extracted as wide-spread light to the exterior.

Also in the surface emission type semiconductor light emitting device 2200A shown in FIG. 115, by providing the wavelength converter FL, optical reflector RE1 and light absorber AB, the same effects as those of the semiconductor light emitting device explained with reference to FIG. 113 can be obtained.

Figure 116:
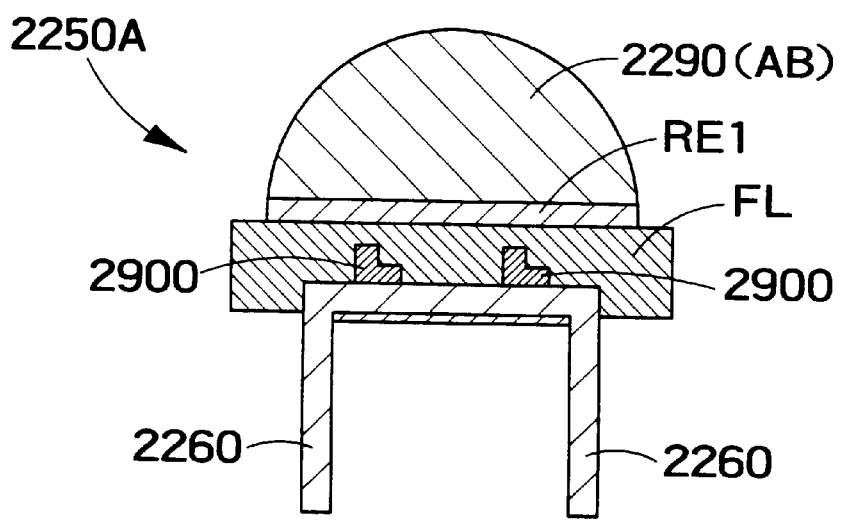
FIG. 116 is a cross-sectional schematic view of the fourth semiconductor light emitting device according to the present embodiment.

FIG. 116 is a cross-sectional schematic view of the fourth semiconductor light emitting device according to the present embodiment. The semiconductor light emitting device 2250A shown here is a device called "dome type". The dome type device 2250A has a plurality of semiconductor elements 2900, e.g. five to ten elements 2900, which are mounted on a lead frame 2260. These semiconductor light emitting elements are connected, respectively, to terminals of the lead frame 2260 by shires (not shown), and are molded in an encapsulating resin 2290.

The dome type semiconductor light emitting device 2250 having a number of semiconductor light emitting elements is advantageous in high luminance and in releasing uniformly spread light.

Also in the dome type semiconductor light emitting device 2250A, by using the wavelength converter FL, optical reflector RE1 and optical absorber AB, the same effects as those of the semiconductor light emitting device shown in FIG. 113 can be obtained.

Figure 117:
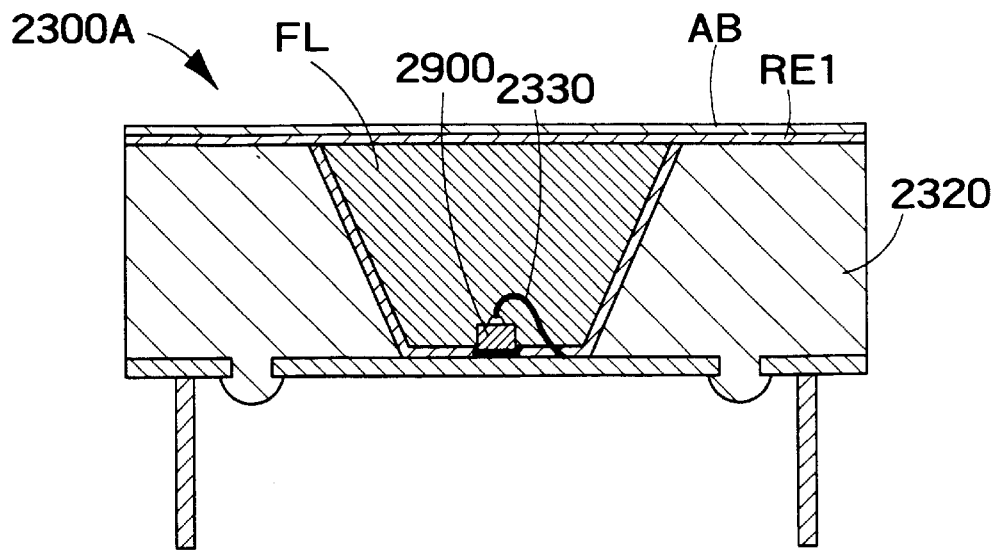
FIG. 117 is a schematic view of the fifth semiconductor light emitting device according to the present embodiment.

FIG. 117 is a schematic view of the fifth semiconductor light emitting device according to the present embodiment. The semiconductor light emitting device 2300A shown here is a device called "7 segment type", and more particularly, "substrate type". The central part thereof is illustrated here in a cross-sectional view. The "7 segment type light emitting device" is a light emitting device for display of numerals. That is, a semiconductor light emitting element 2900 is mounted on a substrate 2310. Light emitted from the semiconductor light emitting element 2900 is reflected by a reflection plate 2320.

Also in the 7 segment type semiconductor light emitting device 2300A shown in FIG. 117, by using the wavelength converter FL, optical reflector RE1 and light absorber AB, the same effects as those of the semiconductor light emitting device shown in FIG. 113 are obtained.

Figure 118:
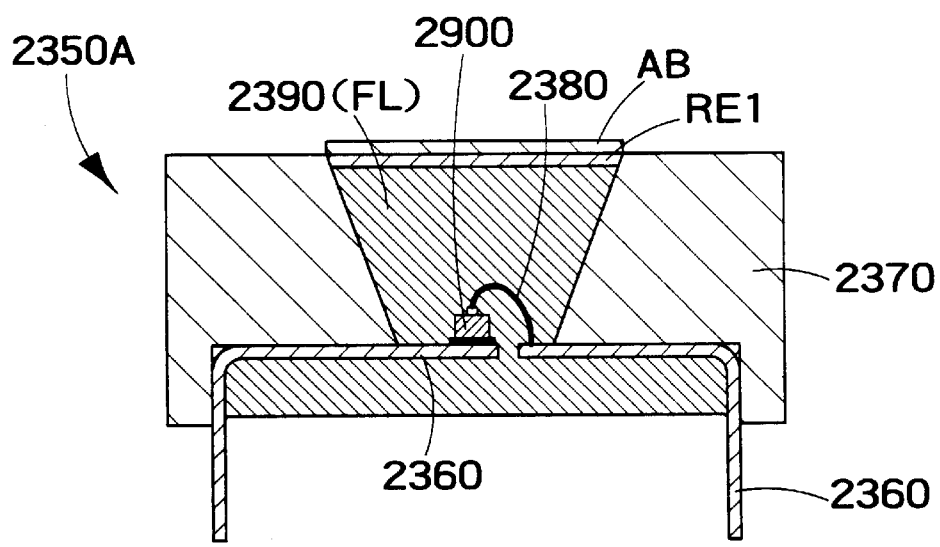
FIG. 118 is a schematic view of the sixth semiconductor light emitting device according to the present embodiment.

FIG. 118 is a schematic view of the sixth semiconductor light emitting device according to the present embodiment. Also the semiconductor light emitting device 2350A shown here is a 7 segment type semiconductor light emitting device, and more particularly, a device called "lead frame type". The central part thereof is illustrated here in a cross-sectional view. That is, the device includes a semiconductor light emitting element 2900 mounted on a lead frame 2360 and connected appropriately by a wire. The semiconductor light emitting element 2900 is sealed by a resin 2390. Light emitted from the semiconductor light emitting element 900 is reflected by a reflection plate 2370 and can be extracted to the exterior.

Also in the 7 segment type semiconductor light emitting device 2350A shown in FIG. 118, by using the wavelength converter FL, optical reflector RE1 and light absorber AB, the same effects as those of the semiconductor light emitting device shown in FIG. 113 can be obtained.

Figure 119:
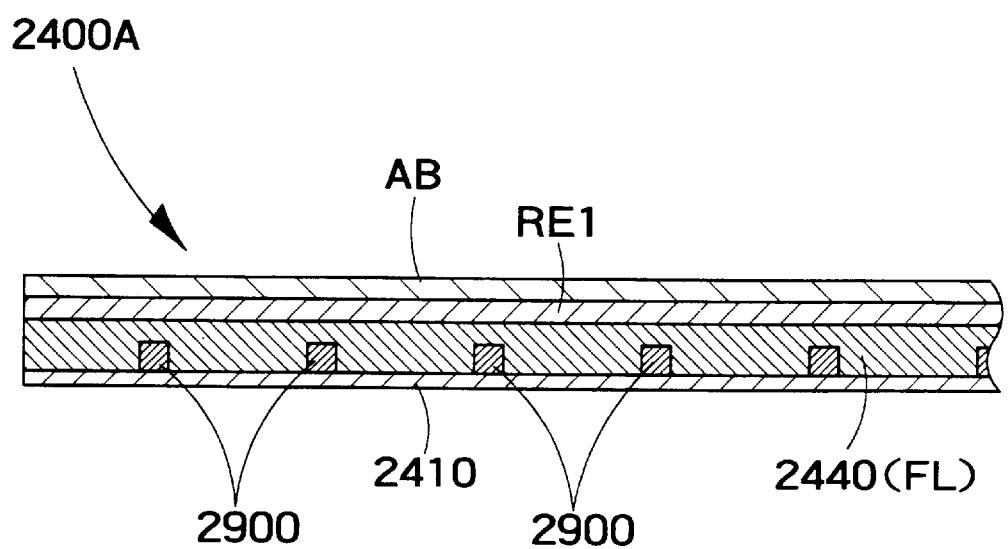
FIG. 119 is a schematic view of the seventh semiconductor light emitting device according to the present embodiment.

FIG. 119 is a schematic view of the seventh semiconductor light emitting device according to the present embodiment. The semiconductor light emitting device 2400A whose central part is shown here in a cross-sectional view is a semiconductor light emitting device called "LED array type", "meter indicator type", "level meter type" or "matrix type". The semiconductor light emitting device 2400A includes a plurality of semiconductor light emitting elements mounted in predetermined intervals on a substrate or a lead frame 2410 and connected to terminals by wires (not shown). These semiconductor light emitting elements are molded in an encapsulating resin 2440.

The semiconductor light emitting device 2400A is compact and light, and has the advantage of releasing highly luminous and uniform-spread light because a number of semiconductor light emitting elements are mounted.

Also in the semiconductor light emitting device 2400A shown in FIG. 119, by using the wavelength converter FL, optical reflector RE1 and light absorber AB, the same effects as those of the semiconductor light emitting device shown in FIG. 113 can be obtained. The wavelength converter FL is illustrated here as being mixed in the encapsulating resin 2440; however, it may be a fluorescent layer stacked on surfaces or around the semiconductor light emitting elements.

If some wavelength converters FL are aligned to release different kinds of secondary light of different wavelengths, a distribution of emission colors can be made easily on the indicator. In this case, the present invention can realize it only by changing the material of the fluorescent layer while using identical materials and structure for semiconductor elements, and therefore has the advantage that common driving current or supply voltage may be applied to all semiconductor elements.

Figure 120:
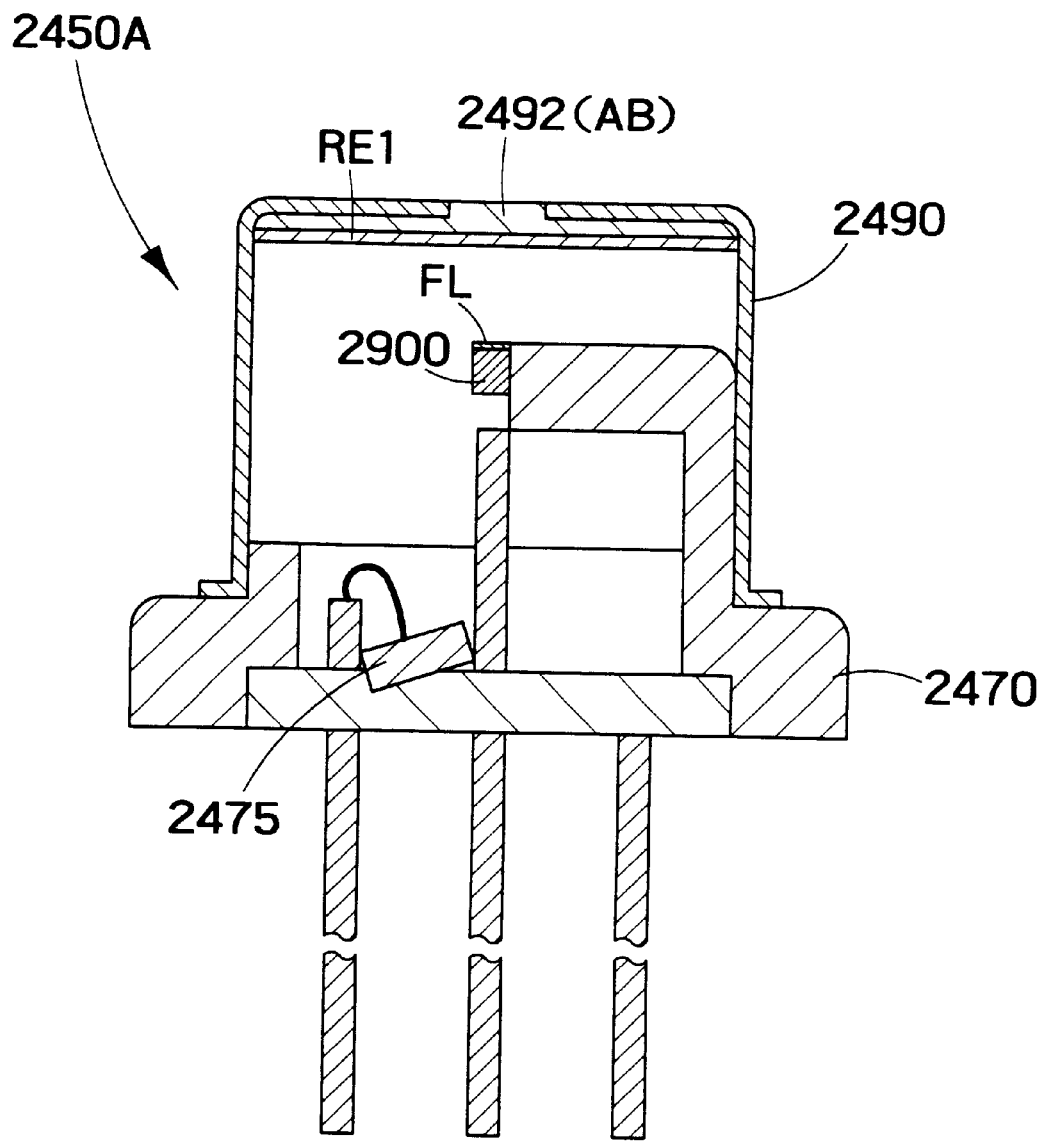
FIG. 120 is a schematic view of the eighth semiconductor light emitting device according to the present embodiment.

FIG. 120 is a schematic view of the eighth semiconductor light emitting device according to the present embodiment. The semiconductor light emitting device 2450A shown here in a cross-sectional view is a so-called "can type" semiconductor light emitting device having a semiconductor light emitting element 2900 attached to an end of a stem 2470. The semiconductor light emitting element 2900 is a laser element. A photodetector 2475 for monitoring purposes is located behind the semiconductor light emitting element to monitor optical outputs from the semiconductor light emitting element 2900. The head portion of the stem 2470 is sealed by a can 2490, and laser light can be extracted through a window 2492.

Also in the can type laser semiconductor light emitting deice 2450A shown in FIG. 120, by using the wavelength converter FL, optical reflector RE1 and light absorber AB, the same effects as those of the semiconductor light emitting device shown in FIG. 113 can be obtained.

Heretofore, semiconductor light emitting devices according to the twenty-ninth embodiment of the invention, each using the wavelength converter FL, optical reflector RE1 and light absorber AB, were explained by way of specific examples shown in FIGS. 113 through 120.

Next explained is the thirtieth embodiment of the invention in form of a semiconductor light emitting device having a second optical reflector RE2 as used in seventieth embodiment of the invention.

Figure 121:
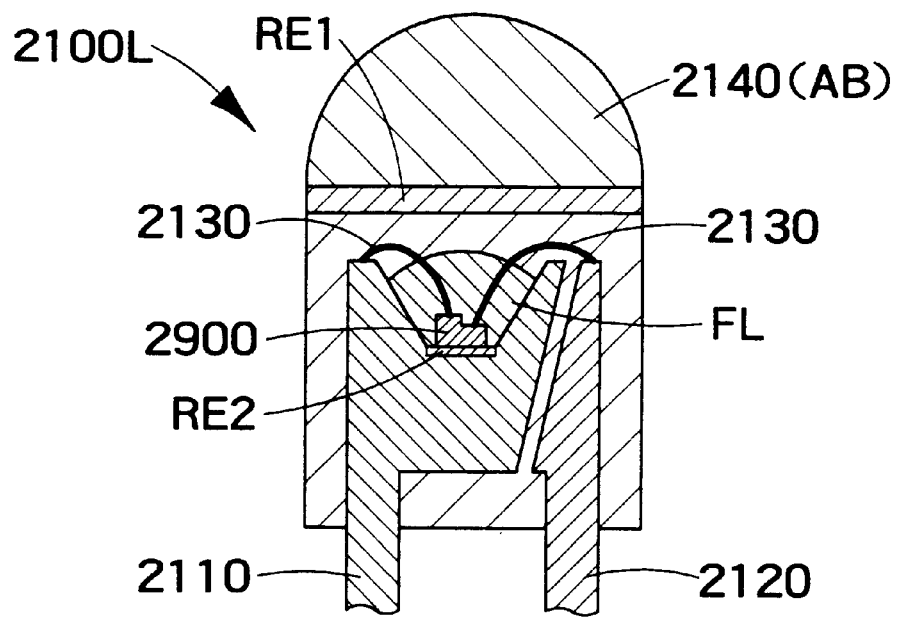
FIG. 121 is a schematic cross-sectional view showing the semiconductor light emitting device according to the thirtieth embodiment of the invention.

FIG. 121 is a schematic cross-sectional view showing the semiconductor light emitting device according to the thirtieth embodiment of the invention. The semiconductor light emitting device 2100L shown here is a "lead frame type" "LED lamp". Also the semiconductor light emitting device 2100L shown here has the wavelength converter FL, optical reflector RE1 and light absorber AB along the path for extracting light from the semiconductor light emitting element 2900. Here again, the same components as those of the light emitting device shown in FIG. 103 are labeled with common reference numerals, and their explanation is omitted.

In this embodiment, a second optical reflector RE2 is provided under the semiconductor light emitting element 2900. The optical reflector RE2 functions to reflect primary light emitted from the semiconductor light emitting element 2900 and to guide it into the wavelength converter FL. That is, the optical reflector RE2 makes part of the primary light departing from the semiconductor light emitting element 2900 toward the lead frame 2110 be used effectively. In a device without the reflector RE2, most of the primary light from the semiconductor light emitting element 2900 toward the lead frame 2110 is randomly reflected by the mounting surface of the element, and is not guided efficiently to the wavelength converter FL for wavelength conversion therein. In the embodiment, however, the optical reflector RE2 reflects the primary light into the wavelength converter FL to ensure wavelength conversion of the primary light and extraction thereof with a high efficiency.

The optical reflector RE2 may be a Bragg reflecting mirror, for example, as explained before. That is, by using a Bragg reflecting mirror having a high reflectance to primary light as the optical reflector RE2, primary light departing from the semiconductor light emitting element 2900 toward the lead frame 2110 can be returned back to the wavelength converter FL with a high reflectance. The Bragg reflecting mirror may be made by alternately stacking thin films of aluminum nitride (AlN) and indium nitride (InN); indium nitride and aluminum gallium arsenide; and indium nitride and aluminum gallium phosphide, for example.

Alternatively, the optical reflector RE2 may be a total reflection mirror having no wavelength selectivity. When the optical reflector RE2 is a reflection mirror exhibiting a high reflectance to both primary light and secondary light, secondary light departing from the wavelength converter FL toward the lead frame 2110 can be reflected and extracted efficiently. The total reflection mirror may be made of a single-layered metal film, for example, having a high reflectance, instead of a Bragg reflecting mirror.

The present embodiment is not limited to the LED lamp shown in FIG. 121, but similarly applicable also to various kinds of semiconductor light emitting devices show in FIGS. 114 through 120 or any other semiconductor devices using a semiconductor light emitting element, while ensuring similar effects.

Next explained is the thirty-first embodiment of the invention in form of a semiconductor light emitting device having a third optical reflector RE3 around its semiconductor light emitting element, like the seventieth embodiment explained above.

Figure 122:
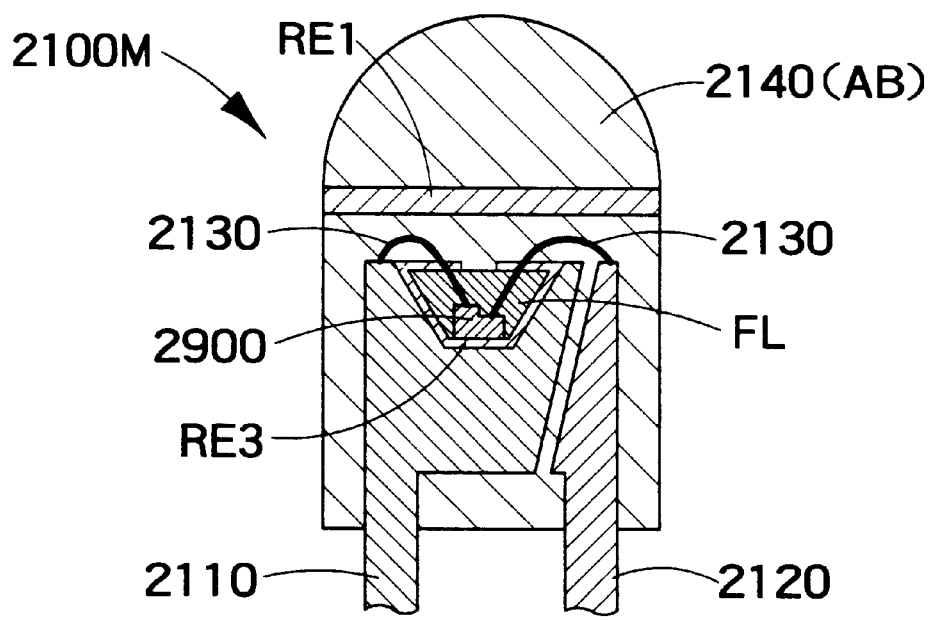
FIG. 122 is a schematic cross-sectional view of the semiconductor light emitting device according to the thirty-first embodiment.

FIG. 122 is a schematic cross-sectional view of the semiconductor light emitting device according to the thirty-first embodiment. The semiconductor light emitting device 2100M shown here is a "lead frame type" "LED lamp". Here again, the semiconductor light emitting device 2100M has the wavelength converter FL, optical reflector RE1 and light absorber AB along the path for extracting light from the semiconductor light emitting element 2900. Here again, the same components as those of the light emitting device shown in FIG. 113 are labeled with common reference numerals, and their explanation is omitted.

The embodiment shown here further includes a third optical reflector RE3 around the semiconductor light emitting element 2900. The optical reflector RE3 may be either a wavelength selective reflector or a total reflection mirror having no wavelength selectivity.

When the optical reflector RE3 has a wavelength selectivity, primary light from the semiconductor light emitting element 2900 can be reflected and prevented from external leakage. Primary light reflected again and again is finally introduced into the wavelength converter FL ad converted into secondary light therein. Therefore, the wavelength conversion efficiency is improved. The wavelength selectivity can be realized by using a Bragg reflecting mirror as explained before.

When the optical reflector RE3 has no wavelength selectivity, it prevents leakage of not only primary light but also other optical components having wavelengths of secondary light, etc. Such a total reflection mirror may be made of a metal film, for example. By making the total reflection mirror, it is possible to limit the path for releasing light in the light emitting device 2100M to an opening made in the optical reflector RE3. That is, when the optical reflector RE3 covers surfaces of the light emitting device 2100M except the opening to permit secondary light to pass only through the opening, the radiation pattern of light can be controlled easily in accordance with the configuration of the opening. For example, when the opening of the optical reflector RE3 is very small, the semiconductor light emitting device is readily made as a point-sized light source. Such a point-sized light source is practically advantageous in most cases because light can be effectively collected by an optical system including lenses among others.

Here again, the embodiment is not limited to the LED lamp shown in FIG. 122 but similarly applicable also to various kinds of semiconductor light emitting devices explained with reference to FIGS. 114 through 120 and any other semiconductor light emitting devices using semiconductor light emitting elements, while ensuring similar effects.

Next explained is the thirty-second embodiment of the invention.

In this embodiment, a fourth optical reflector RE4 is interposed between the semiconductor light emitting element 2900 and the wavelength converter FL, like the eighteenth embodiment explained before.

Figure 123:
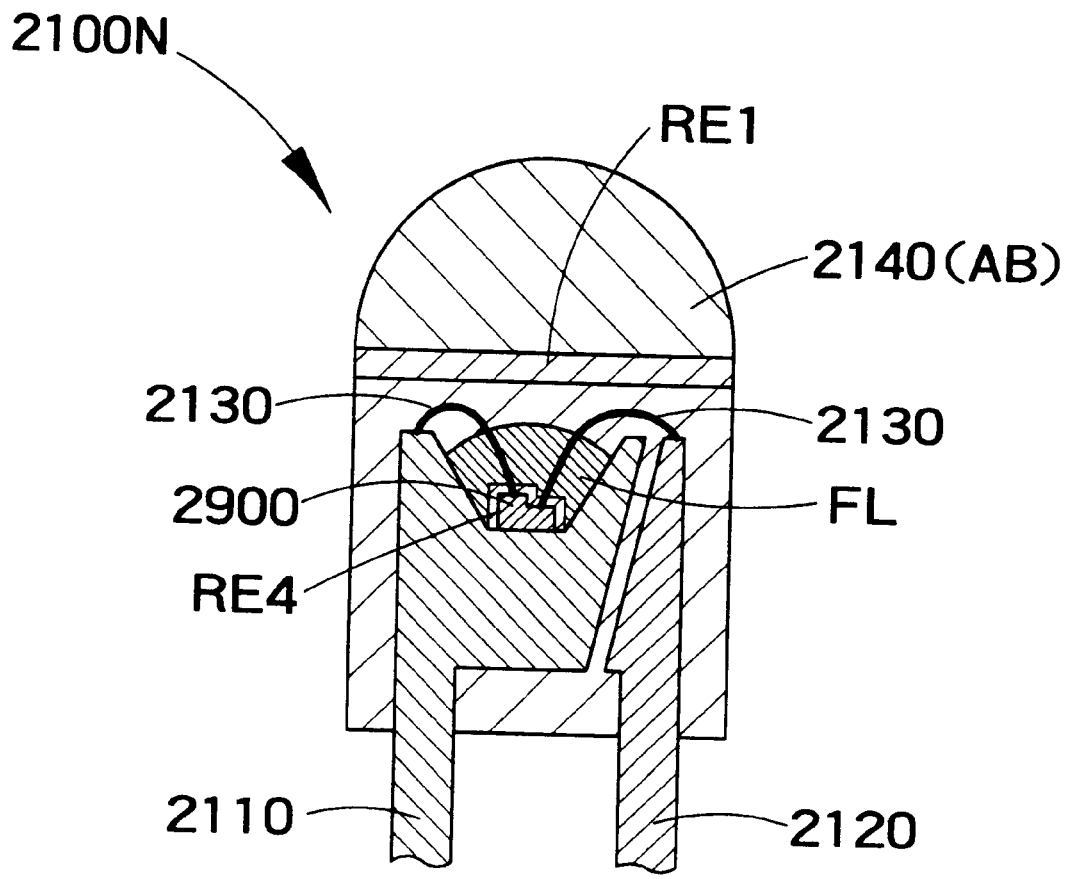
FIG. 123 is a schematic cross-sectional view of the semiconductor light emitting device according to the thirty-second embodiment.

FIG. 123 is a schematic cross-sectional view of the semiconductor light emitting device according to the thirty-second embodiment. The semiconductor light emitting device 100N shown here is a "lead frame type" "LED lamp" having the optical reflector RE4, wavelength converter FL, optical reflector RE1 and light absorber AB located in this order along the path for extracting light from the semiconductor light emitting element 2900. Here again, the same components as those of the light emitting device shown in FIG. 113 are labeled with common reference numerals, and their explanation is omitted.

The optical reflector RE4 used in the present embodiment has a wavelength selectivity to pass primary light from the semiconductor light emitting element 2900 and to reflect secondary light released from the wavelength converter FL after conversion. That is, the optical reflector RE4 has a low reflectance to light with the wavelength of primarily light and a high reflectance to light with the wavelength of secondary light. The wavelength selectivity can be realized by using a Bragg reflecting mirror, for example, as explained before.

The wavelength converter FL functions to absorb primary light and to release secondary light having a longer wavelength. Details thereof are the same as already explained with reference to the thirteenth embodiment.

The optical reflector RE1 is configured to exhibit a low reflectance to secondary light from the wavelength converter FL and a high reflectance to primary light. Here again, the wavelength selectivity can be realized by using a Bragg reflecting mirror.

The light absorber AB is configured to exhibit a high optical absorptance to primary light and a low absorptance to secondary light. Here again, details thereof may be the same as explained with reference to the thirteenth embodiment.

According to the present embodiment, primary light emitted from the semiconductor light emitting element 2900 passes through the optical reflector RE4, then enters into the wavelength converter FL, and is converted into secondary light. Part of the primary light, which passes through the wavelength converter FL without being converted in wavelength, is reflected b the optical reflector RE1 back to the wavelength converter FL. Part of the primary light passing even through the optical reflector RE1 is absorbed in the light absorber AB and prevented from external leakage.

Optical components running toward the optical reflector RE1 among the secondary light released from the wavelength converter FL pass through the optical reflector RE1 and light absorber AB, and can be extracted to the exterior. Optical components running toward the semiconductor light emitting element 2900 among the secondary light released from the wavelength converter FL are reflected by the optical reflector RE4, then pass through the wavelength converter FL, optical reflector REB1 and light absorber AB, and can be extracted to the exterior.

In a device without the optical reflector RE4, secondary light released from the wavelength converter FL toward the semiconductor light emitting element 2900 is absorbed by the semiconductor light emitting element 2900, or randomly reflected by the mounting surface of the semiconductor light emitting element 2900, and cannot be extracted effectively. In the present embodiment, however, since the optical reflector RE4 is provided, secondary light released from the wavelength converter FL toward the semiconductor light emitting element 2900 is reflected by the optical reflector RE4, and can be efficiently extracted to the exterior.

The instant embodiment may be combined with the thirtieth embodiment or thirty-first embodiment to realize a more efficient semiconductor light emitting device. That is, by adding the optical reflector RE2 used in the thirtieth embodiment to the structure of the present embodiment, primary light emitted from the semiconductor light emitting element 2900 can be introduced into the wavelength converter FL for more efficient wavelength conversion therein. When the optical reflector RE3 used in the thirty-first embodiment is added to the structure of the present embodiment, a point-sized light source can be made easily by controlling the emission pattern of the light emitting device.

Next explained is the thirty-third embodiment of the invention in form of an image display device having a combination of a semiconductor light emitting element, wavelength converter, optical reflector and light absorber.

Figure 124:
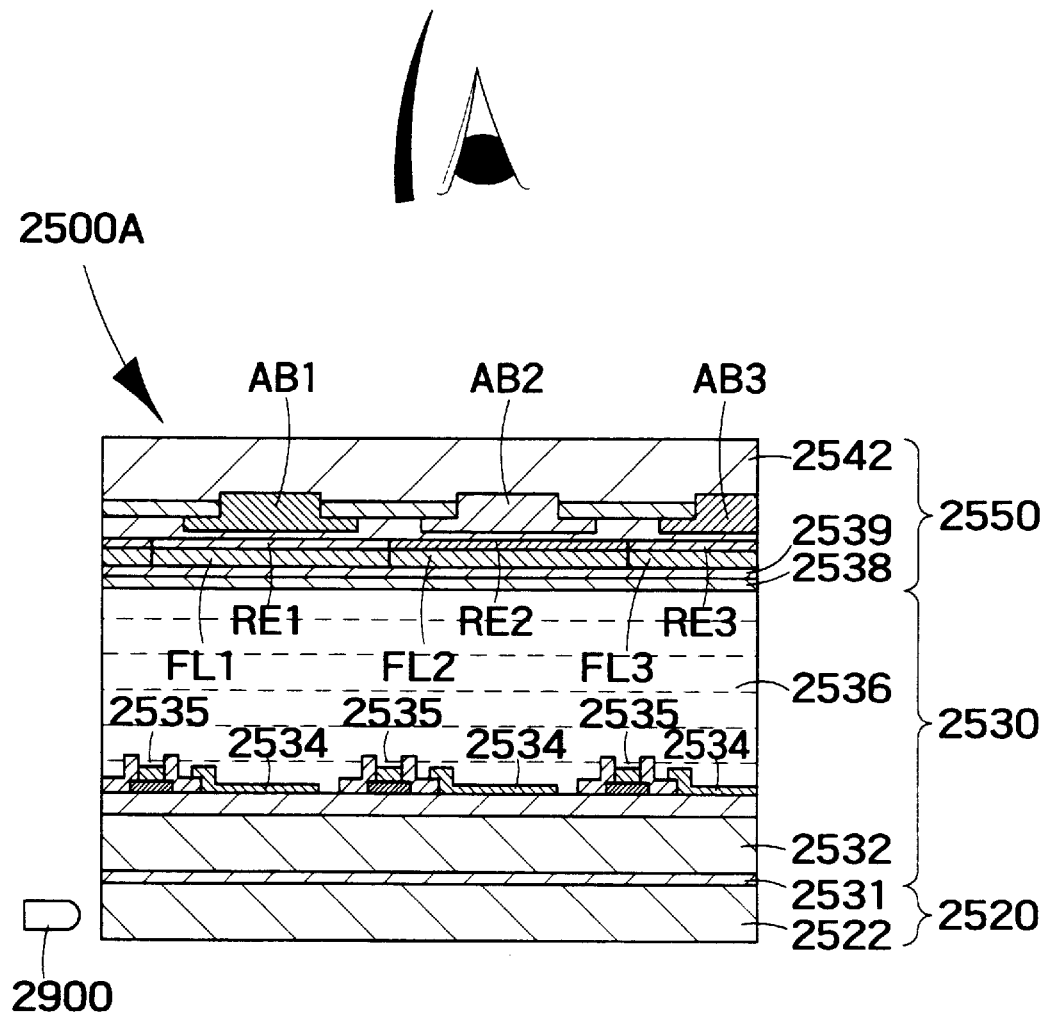
FIG. 124 is a schematic cross-sectional view of an exemplar) structure of the image display device according to the embodiment.

FIG. 124 is a schematic cross-sectional view of an exemplary structure of the image display device according to the embodiment. The image display device 2500A shown here includes a light source section 2520, luminance adjuster 2530 and converter 2550.

The light source section 2520 includes a semiconductor light emitting element 2900 lath a predetermined emission spectrum as its light source, and an optical guide plate 2522 for uniformly spreading light from the semiconductor light emitting element 2900 to irradiate the luminance adjuster.

The luminance adjuster 2530 is configured to adjust optical transmittance by means of a liquid crystal, for example. That is, the luminance adjuster 2530 includes a liquid crystal layer 2536 interposed between polarizing plates 2531 and 2539. When a predetermined voltage is applied across the pixel electrode 2534 and an opposite electrode 2538, the liquid crystal layer 2536 is controlled in orientation of its molecules and controls the optical transmittance in cooperation with the upper and lower polarizing plates 2531 and 2539. Each pixel electrode 2534 formed on a translucent substrate 2532 is supplied with a predetermined voltage via a switching element 2535. The switching element 2535 may be a metal-insulator-metal (MIM) bonded element or a thin film transistor (TFT) made of hydrogenated amorphous silicon or polycrystalline silicon, for example.

The converter 2550 includes wavelength converters FL1 through FL3, optical reflectors RE1 through RE3 and light absorbers AB1 through AB3 under the translucent substrate 2542. The wavelength converters FL may be partitioned for individual pixels by a black matrix made of a light screen material. The wavelength converters FL may be located over the translucent substrate 2542.

In the image display device 2000A, light from the light source section 2520 is adjusted in quantity of light for individual pixels in the luminance adjuster 2530 in response to the voltage applied to the liquid crystal layer 2536, and enters into the wavelength converters FL1 through FL3. In the wavelength converters FL1 to FL3, the incident primary light is converted into secondary light with predetermined wavelengths depending upon the natures of respective fluorescent materials. For example, the light may be converted to red light in FL1, to green light in FL2 and to blue light in FL3, respectively.

Secondary light released from the wavelength converters FL1 through FL3 enters into the optical reflectors RE1 through RE3. Each optical reflector has a wavelength selectivity to reflect primary light and to pass only secondary light.

Secondary light passing through the optical reflectors RE1 to RE3 enters into the light absorbers AB1 through AB3. Each of the light absorbers AB 1 to AB3 has a wavelength selectivity to pass specific secondary light and to absorb primary light. They may be formed as color filters so that, for example, AB1 passes red light, AB2 passes green light and AB3 passes blue light.

According to the invention, since the semiconductor light emitting element is used as the light source, the photoelectric conversion efficiency is higher than those of conventional cathode fluorescent tubes, and the power consumption can be reduced. Additionally, as a result of employing the novel structure configured to excite the fluorescent materials by light from the highly efficient semiconductor light emitting element, the power consumption of the entire image display device can be reduced.

Especially, in the present invention, by providing the optical reflectors RE and light absorbers AB in addition to the wavelength converters, the conversion efficiency is further improved. Moreover, when the fourth optical reflector RE4 as explained with reference to FIG. 102 or FIG. 123 is provided adjacent to incident ends of the wavelength converters FL1 to FL3 in the image display device 2500A, secondary light released from the wavelength converters FL1 through FL3 can be reflected and extracted to the exterior with a higher efficiency.

In a practically prepared device, namely, a 10.4 inch TFT liquid crystal display device using a conventional cathode fluorescent tube as its light source, the power consumption was about 9 Watt. In contrast, in the image display device according to the invention using an ultraviolet LED and a fluorescent material, the power consumption is about 4 Watts, which is less than a half of the power consumption of the conventional liquid crystal display device. As a result, the invention can elongate the life of batteries of portable electronic apparatuses such as note-type computers or terminal apparatuses of various kinds of information network systems.

Additionally, according to the invention, since the wavelength converters FL can be located nearest to the surface of the image display screen, the visual angle is improved significantly.

It is further possible to simplify the circuit and to reduce the driving voltage as compared with conventional cathode fluorescent tubes. Cathode fluorescent tubes required a stabilizing circuit and an inverter to apply a high voltage therethrough. In the present invention, however, the semiconductor light emitting element used as the light source promises a sufficient emission intensity with a d.c. voltage as small as 2 to 3.5 V, approximately, and the stabilizing circuit and the inverter circuit need not be used. Therefore, the circuit for driving the light source can be simplified remarkably, and the driving voltage can be reduced.

Moreover, according to the invention, the life of the light source can be largely elongated than conventional ones. Conventional cathode fluorescent tubes are subject to a rapid decrease in luminance and further to no emission after a predetermined life time due to sputtering or other like phenomenon at the electrode portion. In the present invention, however, the semiconductor light emitting element used as the light source maintains the original luminance without substantial deterioration even after a long use as long as tens of thousands hours, and its life is approximately eternal. Therefore, the image display device according to the invention has a remarkably longer life as compared with conventional devices.

Additionally, in the image display device according to the invention, the rising time for operation is very short. The time after powering the power source to driving the light source for its normal luminance is remarkably short as compared with conventional cathode fluorescent tubes. That is, the light source operates quickly.

The present invention improves the reliability as well. Conventional cathode fluorescent tubes have a structure confining a gas within a glass tube. Therefore, they are liable to break with shocks or vibrations. In the present invention, however, since the semiconductor light emitting element used as the light source is a solid state component, the durability against shocks or vibrations is much higher. As a result, the invention significantly improves the reliability of various types of portable electronic apparatuses using image display devices.

Additionally, the present invention does not use harmful mercury. Many of conventional cathode fluorescent tubes contained a predetermined amount of mercury in the glass tube. The present invention, however, need not use harmful mercury.

Next explained is a image display device according to the thirty-fourth embodiment of the invention.

Figure 125:
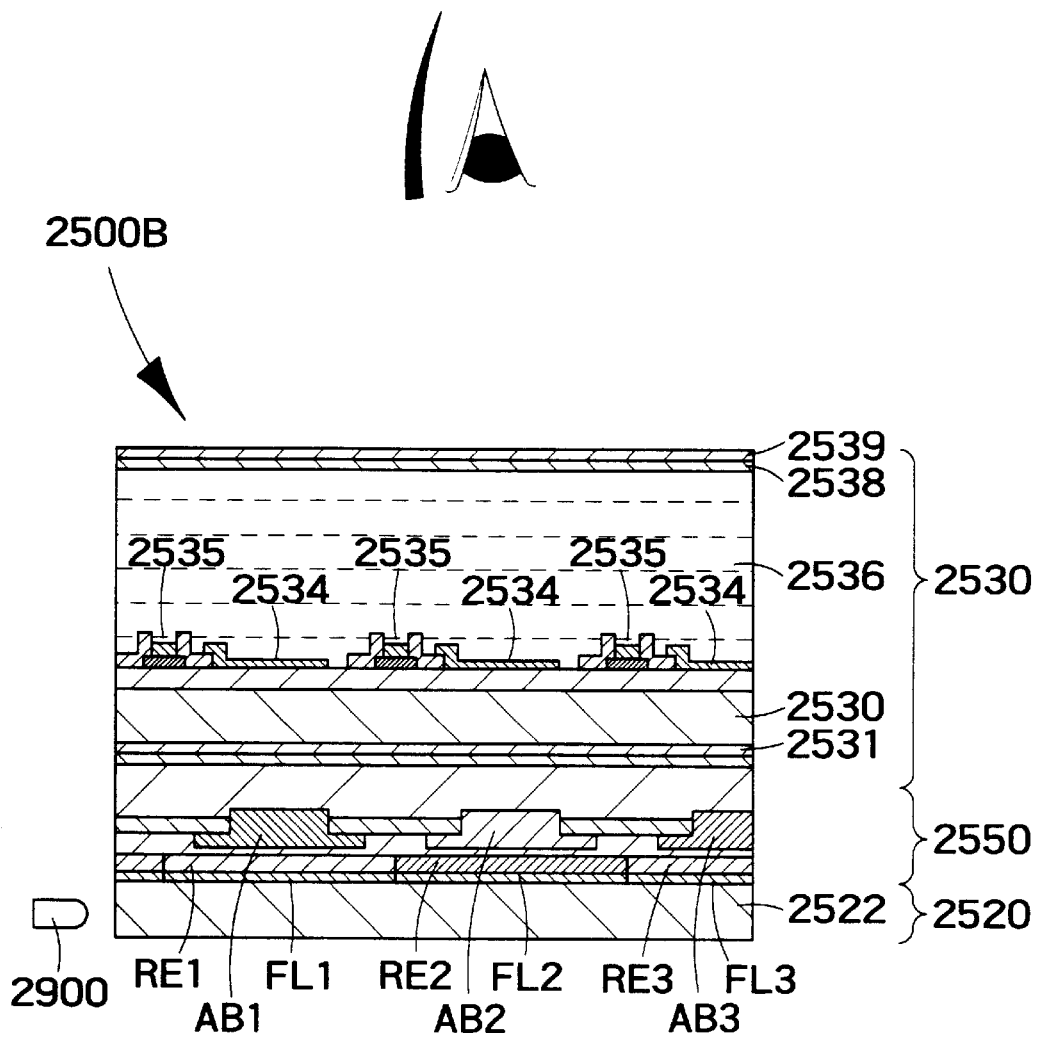
FIG. 125 is a schematic cross-sectional view of the modified image display device according to the thirty-forth embodiment of the invention.

FIG. 125 is a schematic cross-sectional view of the modified image display device according to the thirty-forth embodiment of the invention. Here again, the image display device 2500B includes the light source section 2520, luminance adjuster 2530 and converter 2550. The image display device 2500B, however, is different from the image display device 2500A in location of the converter 2550 which is located between the light source 2520 and the luminance adjuster 2530. The same components of the device shown here as those of the image display device 2500A are labeled with common reference numerals, and their explanation is omitted.

In the image display device 2500B, primary light emitted from the semiconductor light emitting element 2900 enters into the wavelength converters FL1 through FL3 via the optical guide plate 2522. The incident primary light is converted into secondary light having predetermined wavelengths in respective wavelength converters, and enters into the optical reflectors RE1 through RE3. Then, primary light components are reflected, and secondary light components pass them and enter into the light absorbers AB1 through AB3. Also in the light absorbers AB1 to AB3, primary light components are absorbed, and secondary light passes therethrough, ad explained before.

Also the image display device 2500B shown in FIG. 125 promises the same effects as those of the image display device 2500A explained above. In the image display device 2000B, primary light, such as ultraviolet rays, emitted from the semiconductor light emitting element 2900 is wavelength-converted into secondary light with a longer wavelength, and then enters into the luminance adjusters. Therefore, this version overcomes the problem that the switching elements 2535 and the liquid crystal layer 2536 are exposed to and deteriorated by ultraviolet rays as primary light.

In the above-explained thirteenth through thirty-forth embodiments with reference to FIGS. 97 through 125, the light emitting elements, the light emitting devices and image display device having a combination of a wavelength converter, a light absorber and a optical reflector are disclosed.

Next explained are the exemplary products, such as illuminators, projectors or purifiers, which include the light emitting device explained above.

Figure 126A:
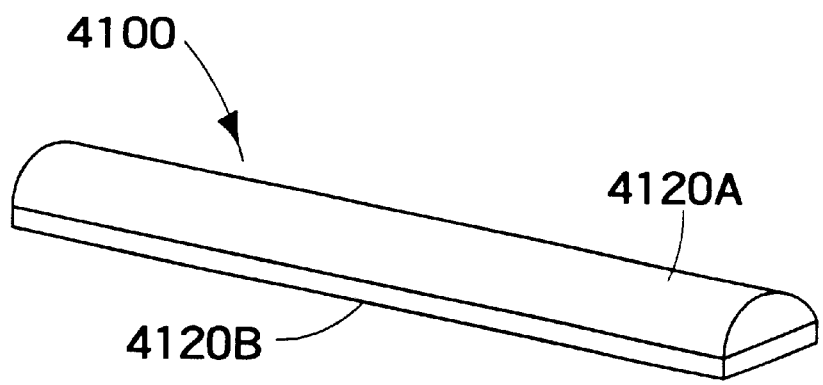
FIG. 126A is a perspective view of the entirely of the illuminator 4100.
Figure 126B:
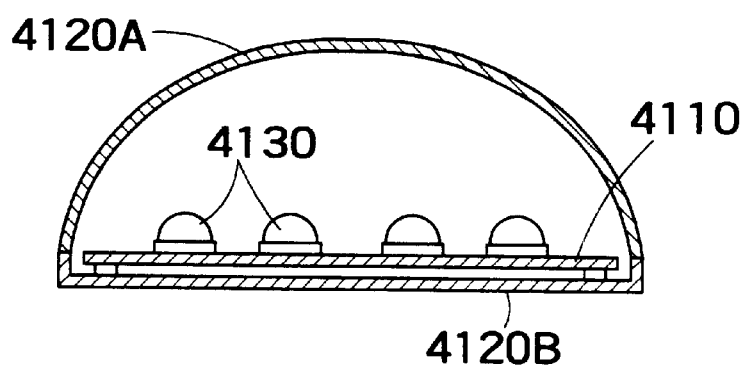
FIG. 126B is a cross-sectional view.
Figure 126C:
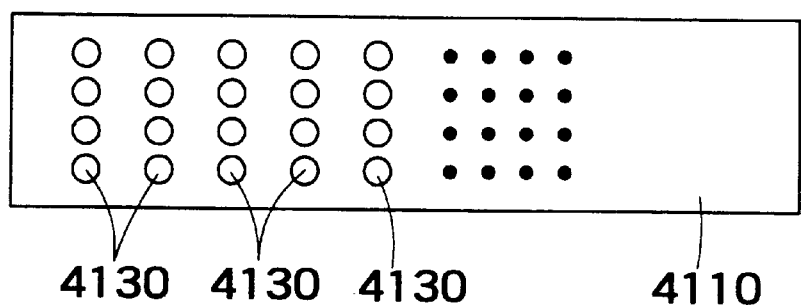
FIG. 126C is a schematic plan view of a showing board used therein.

FIGS. 126A through 126C are schematic diagrams showing an novel illuminator according to an embodiment of the invention. Fit. 126A is a perspective view of the entirely of the illuminator 4100, FIG. 126B is a cross-sectional view, and FIG. 126C is a schematic plan view of a wiring board used therein.

Figure 126D:
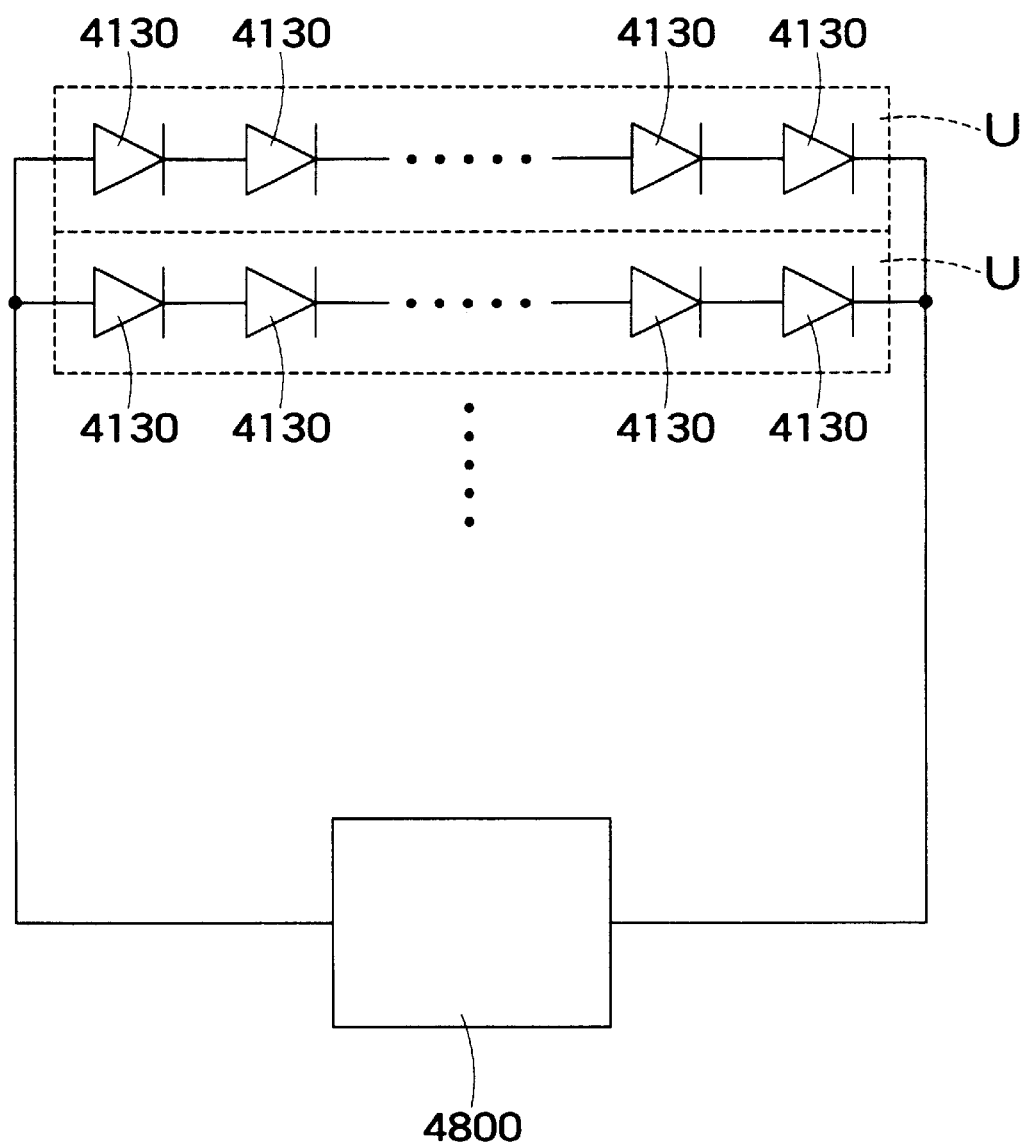
FIG. 126D is a schematic diagram showing the electrical circuit of the illuminator 4100.

FIG. 126D is a schematic diagram showing the electrical circuit of the illuminator 4100.

Figure 127:
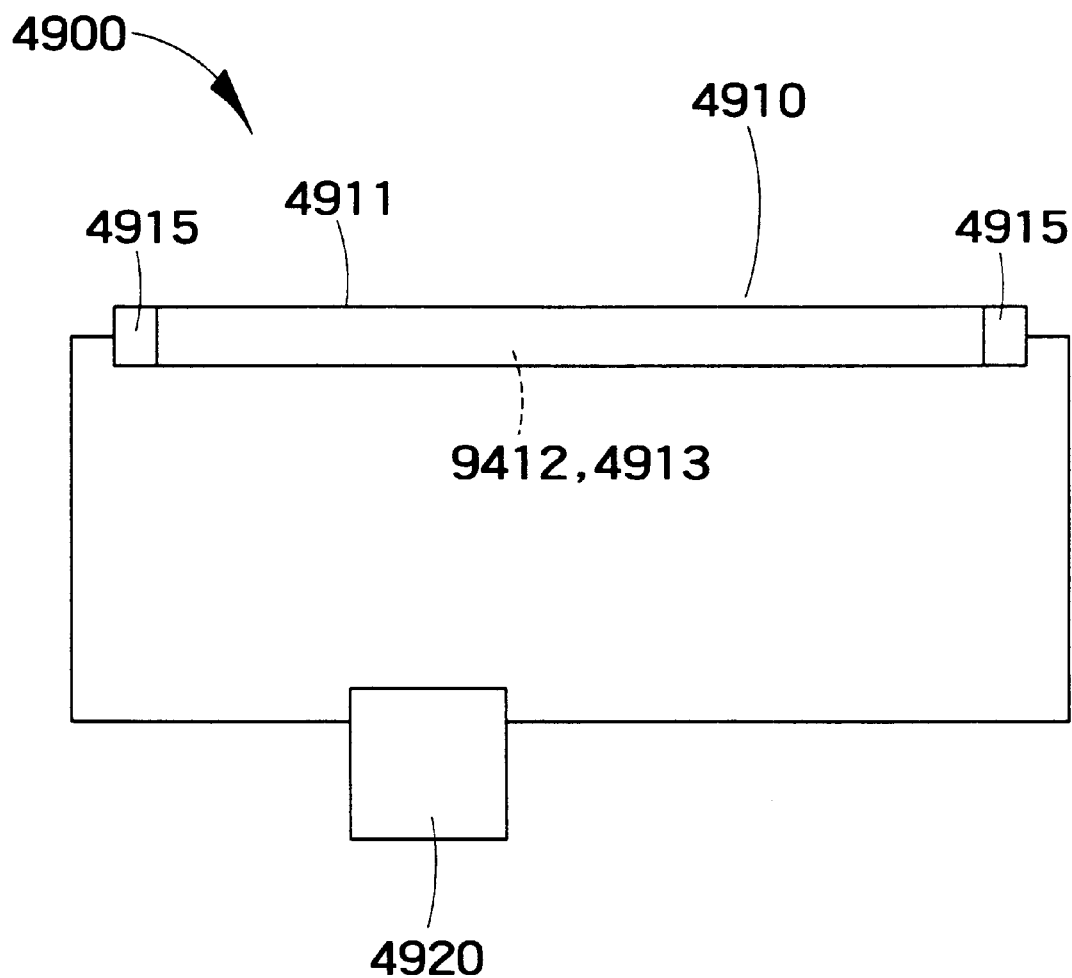
FIG. 127 is a schematic diagram shorting a conventional fluorescent lamp system.

FIG. 127 is a schematic diagram showing a conventional fluorescent lamp system. The system 4900 comprises a fluorescent lamp 4910 and a power supply 4920. The fluorescent lamp 4910 has a glass tube 4911 and a fluorescent material is coated onto the inner surface of the tube 4911. A mixed gas 4912 containing a mercury vapor and a inert gas such as argon (Ar) is sealed inside the tube 4911. The power supply 4920 is connected to the electrodes 4915, 4915 which are located at the opposite ends of the tube 4911. The power supply 4920 generates a alternative voltage having a high frequency. The voltage is supplied to the electrodes 4915, 4915 and the mercury vapor generates a glow discharge which generates the ultraviolet rays. The emitted UV rays are absorbed in by the fluorescent material 4913 and converted to a visible light which is emitted through the glass tube 4911 to the outside.

However, the fluorescent system as shown in FIG. 127 requires the power supply 4920 to be equipped with a circuitry of increasing voltage and generating high frequency to supply the high frequency voltage to the fluorescent lamp. As a result, the power supply must have a complicated structure, which increases the cost, deteriorates the reliability and shorten the life of the system.

Another problem is that the starting speed is slow and the light power is unstable just after the starting because the conventional system utilizes the glow discharge of the mercury vapor. Further, the output power tends to decrease especially at the lower temperature because the state of the discharge is affected by the ambient temperature.

Besides, when the conventional fluorescent lamp is used, it is hard to downsize the system, to improve the life and to improve the mechanical durability against the mechanical shock or vibration. It is also necessary to prevent the environmental pollution by the mercury.

Another conventional technique widely used for an illuminator is a electric light bulb. However, the conventional light bulb has the glass bulb which seals a hot filament inside. This classical construction also requires many improvements about, for example, power consumption, efficiency, the heat generation, life, mechanical reliability, size, weight, and so on.

In contrast to these conventional technique, the novel illuminator 4100 according to the invention has drastically improved construction. As shown in FIGS. 126A through 126D, the illuminator 4100 includes a showing board 110 contained in shells 120A and 120B. The shells 4120A and 4120B may be made of a resin, for example. The shell 4120A is a translucent cover, and the shell 4120B is used also as a base for attachment to a ceiling, for example.

The wiring board 4110 supports an arrangement of semiconductor light emitting devices 130 for emitting white light. Each semiconductor light emitting device 4130 includes a light emitting diode (LED) for emitting ultraviolet rays and a fluorescent member as explained later in greater detail. The semiconductor light emitting devices 4130 preferably have "three waveform type" white emission characteristics in which the intensity reaches peaks in red, green and blue wavelength bands, for example.

Figure 128:
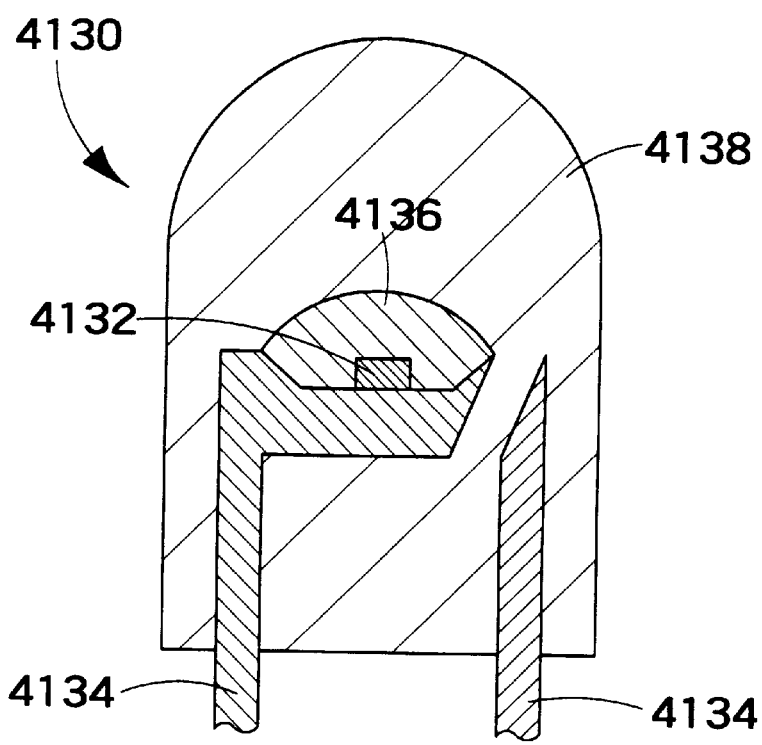
FIG. 128 is a schematic cross-sectional view of a semiconductor light emitting device 4130 suitable for use in the present embodiment.

FIG. 128 is a schematic cross-sectional view of a semiconductor light emitting device 4130 suitable for use in the present embodiment. The semiconductor light emitting device 4130 includes at least a semiconductor light emitting element 4132 and a fluorescent element (a wavelength converter) 4136. The semiconductor light emitting element 4132 is mounted on a packaging member 4134 such as lead frame. The fluorescent element 4136 is disposed on a path for extracting light from the semiconductor light emitting element 4132. The semiconductor light emitting element 4132 may be sealed in a resin 4138, for example.

The semiconductor light emitting element 4132 releases ultraviolet rays, and the fluorescent element 4136 absorbs the ultraviolet rays, converts them in wavelength, and release visible light or infrared rays of a predetermined wavelength to the exterior.

The wavelength of light released from the fluorescent element can be adjusted by selecting an appropriate material therefor. Exemplar fluorescent materials for absorbing ultraviolet rays from the semiconductor light emitting element 4132 and for efficiently releasing secondary light are $Y_2O_2S$:Eu or $La_2O_2S$:(Eu,Sm) for releasing red light; (Sr, Ca, Ba, Eu)$_{10}$(PO$_4$)$_6$.C$_{12}$ for releasing blue light; and 3(Ba, Mg, Eu, Mn)O.8Al$_2$O$_3$ for releasing green light. By mixing these fluorescent materials by an appropriate ratio, almost all colors in visible bands can be made.

Most of these fluorescent materials exhibit absorption peaks in wavelength bands around 330 nm. Therefore, in order to ensure efficient wavelength conversion by using these fluorescent materials, the semiconductor light emitting element 4132 preferably emits ultraviolet rays in a wavelength band near 330 nm. The semiconductor light emitting element 4132 having these characteristics may be obtained by using GaN containing boron (B) as its light emitting layer, and its preferable structure will be explained later in greater detail.

The fluorescent element 4136 may be provided in a location distant from the semiconductor light emitting element 4132 along the path for emitting light therefrom or may be stacked on the surface of the semiconductor light emitting element 4132. Alternatively the fluorescent element 4136 may be disposed or contained within the semiconductor light emitting element 4132.

Returning, back to FIGS. 126A through 126D, semiconductor light emitting devices 4130 are arranged in predetermined intervals on the major surface of the wiring board 4110 in accordance with required conditions, such as quantity of illumination light, size, power, and so on. In order to ensure compact and dense packaging on the substrate 4110, semiconductor light emitting devices 4130 are preferably configured as "surface mounted (SMD)" lamps. By miniaturizing individual light sources in this manner, light from the light sources can be collected by combining optical reflectors with individual light sources, and a highly efficient and bright illuminator can be realized.

As to mutual connection of semiconductor light emitting devices 4130, 4130 packaged on the substrate 4110, it is preferable to make units U each containing a predetermined number of serially connected semiconductor light emitting devices 4130 and to connect these units U in parallel as exemplarily shown in FIG. 126D. In the figure, the element denoted by the numeral 4800 is a power supply.

If this manner of connection is used, the power source voltage and driving current need not be set high, and, even when a trouble occurs in one or more of the semiconductor light emitting devices 4130, adverse affection to the other semiconductor light emitting devices 4130, such as changes in driving voltage, can be reduced. That is, even when any one or more of the units fall in malfunctions, the other units can operate normally. Therefore, unlike the conventional fluorescent lamps, the illuminator shown here is not damaged totally, and is much more advantageous in reliability. However, the present invention is not limited to this, all of the semiconductor light emitting devices 4130 on the wiring board 4110 may be connected in series or in parallel.

Although the above-explained example uses semiconductor light emitting devices 4130 for white emission, the invention is not limited to it. For example, semiconductor light emitting devices for ultraviolet emission may be provided on the wiring board, combining a fluorescent element stacked on an inner wall surface of a resin cover 4120A, so as to absorb ultraviolet rays, convert them in wavelength and release white light to the exterior.

In order to ensure interchangeability with conventional fluorescent lamps, it is convenient to provide a converter circuit for converting an RF driving voltage to be applied to a fluorescent lamp into a d.c. voltage and for supplying, it to the semiconductor light emitting device 4130. Such a converter circuit may be provided to the supply 4800 shown in the FL. 126D. The illuminator according to the embodiment is usable in wide applications, such as street lamps, spot light for the inspection of semiconductor wafers, mask aligning machine or other light sources of various kinds of manufacturing equipments, light sources for plant cultivation, in addition to home-use or office-use room lamps.

According to estimation by the inventor, semiconductor light emitting devices 4130 arranged in four lines each containing 66 devices, for example, will be sufficient to obtain a quantity of light corresponding to a conventional 40 W fluorescent lamp.

The illuminator according to the invention is lower in power consumption, longer in life, more easily reduced in size and weight, and mechanically much stronger against shocks and vibrations than conventional fluorescent lamps. Moreover, the problem of environmental pollution by mercury can be overcome.

Next explained is the second example of the applied products.

Figure 129:
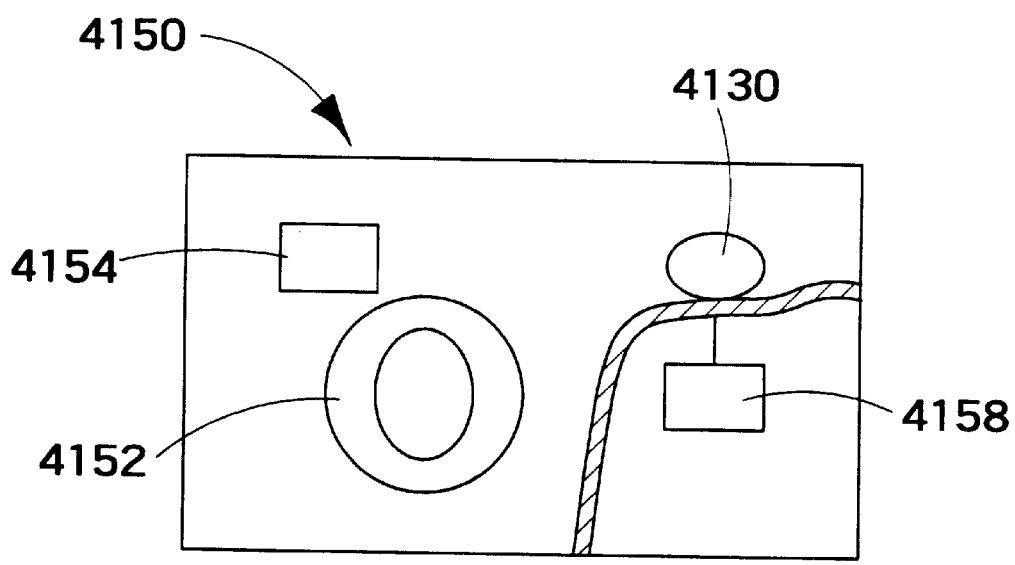
FIG. 129 is a schematic diagram showing a flashing device for a camera according to the invention.

FIG. 129 is a schematic diagram showing a flashing device for a camera according to the invention. The camera 4150 shown here includes a lens 4152, finder 4154 and a semiconductor light emitting device 4130 according to the invention as its flash. The semiconductor light emitting device 4130 releases white light having a predetermined wavelength distribution by means of a semiconductor light emitting element and a fluorescent element as explained with reference to FIG. 128. Depending on the material of the fluorescent element 4136 used in the semiconductor light emitting device 4130, it is applicable also to enhancement of a specific emission wavelength or to infrared camera. The semiconductor light emitting device 4130 is connected to a pulse generator 4158, and behaves as a flash when supplied with a pulsating driving current.

The flash device according to the invention is lower in power consumption and longer in life as compared with conventional camera flashing devices using bulbs. Additionally, using the characteristics of the semiconductor light emitting element, the flashing device can be used for special applications, such as ultra-high speed cameras.

Next explained is the third example of the applied products.

Figure 130:
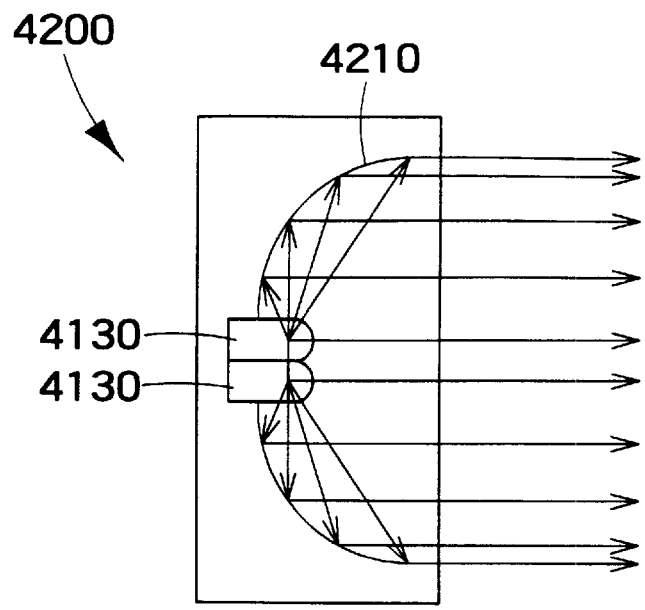
FIG. 130 is a schematic diagram shorting a lamp according to the invention.

FIG. 130 is a schematic diagram showing a lamp according to the invention. The lamp unit 4200 shown here includes a semiconductor light emitting device 4130 near the focal point of a concave mirror 4210. Within the semiconductor light emitting device 4130, ultraviolet rays emitted from a semiconductor light emitting element is wavelength-converted by a fluorescent element, and released to the exterior as white light, for example. The light is collected and released toward a predetermined direction by the concave mirror 4210. The focal power can be improved by concentrating the fluorescent substance behaving as the light source near the focal point of the concave mirror within the semiconductor light emitting device 130.

The lamp unit 4200 according to the invention is applicable to car-borne head lamps or flash lamps, for example. The semiconductor light emitting device 4130 shown here is readily miniaturized as compared fifth conventional bulbs. Therefore, the semiconductor light emitting devices 4130 for different emission colors can be located adjacent to the focal point of the concave mirror 4210. As a result, a plurality of emission colors can be made with a single lamp 4200. For example, a head lamp and a fog lamp can be incorporated in a common lamp unit. It is also possible to combine a back lamp and a stop lamp.

Instead of using the semiconductor light emitting device 4130, a semiconductor light emitting element 4132 for ultraviolet emission can be provided so that, after the ultraviolet rays are reflected directly by the concave mirror 4210, the light be wavelength-converted by a fluorescent element. In this case, the fluorescent element may be stacked on the reflecting surface of the concave mirror 4210, or may be located at the emission window of the lamp unit.

The device according to the invention is lower in power consumption, longer in life and much higher in mechanical strength against vibration and shocks than conventional lamp units using bulbs. Moreover, since the light source can be made small, the focal power is increased remarkably, and it is especially advantageous for illuminating a distant object with a high luminance.

Next explained is the fourth example of the applied products.

Figure 131:
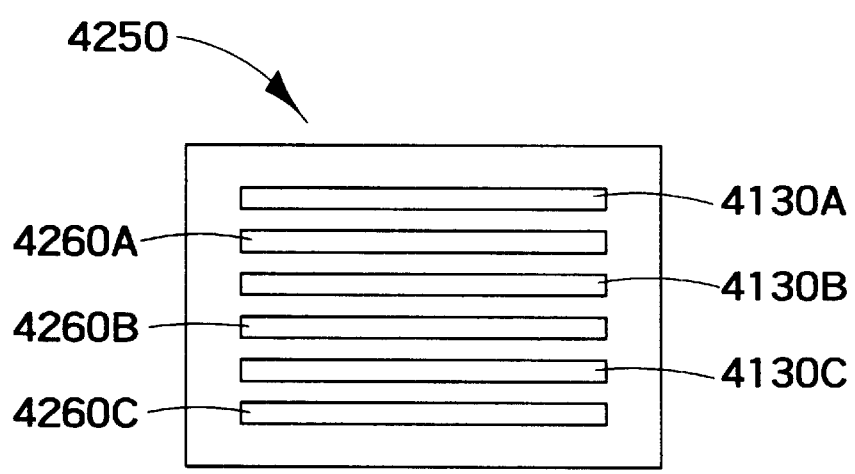
FIG. 131 is a schematic diagram showing a read-out device according to the invention.

FIG. 131 is a schematic diagram showing a read-out device according to the invention. The read-out device 4250 shown here includes a semiconductor light emitting device 4130A for emitting red light, a semiconductor light emitting device 4130B for emitting green light and a semiconductor light emitting device 4130C for emitting blue light. These semiconductor light emitting devices 4130A through 4130C can be configured to emit light of their respective colors by changing the material of the fluorescent element 4136 contained therein.

Red light, green light and blue light from the semiconductor light emitting devices 4130A through 4130C are irradiated onto a manuscript, not shown, and reflected rays of these different-colored rays are detected by photodetectors 4260A through 4260C, respectively. The photodetectors 4260A through 4260C may be photosensitive elements or CCDs (charge coupled devices), for example. The read-out device according to the invention may be incorporated into a facsimile machine, scanner copy machine to read out information from a manuscript and convert it into electric signals.

The device according to the invention is lower in power consumption, much longer in life and much higher in mechanical strength against vibration and shocks than conventional read-out devices using fluorescent lamps.

Next explained is the fifth example of the applied products.

Figure 132:
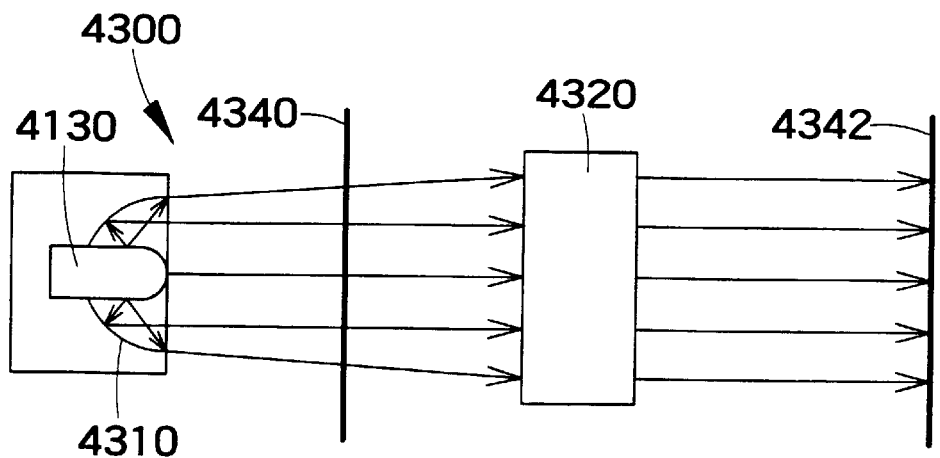
FIG. 132 is a schematic diagram showing a projector according to the invention.

FIG. 132 is a schematic diagram showing a projector according to the invention. The projector 4300 shown here includes a semiconductor light emitting device 4130 near a focal point of an concave mirror 4310, and a projecting lens 4320 in front of them. Light released from the semiconductor light emitting device 4130 is collected by the concave mirror 4310, and the transmission pattern of a manuscript drawn onto a translucent sheet is projected onto a screen 4342 by the projecting lens 4320.

The projector according to the invention is lower in power consumption and generated heat, much longer in life, easier for reducing in size and weight, and much higher in mechanical strength against vibration and shocks than conventional read-out devices using bulbs.

Next explained is the sixth example of the applied products.

Figure 133:
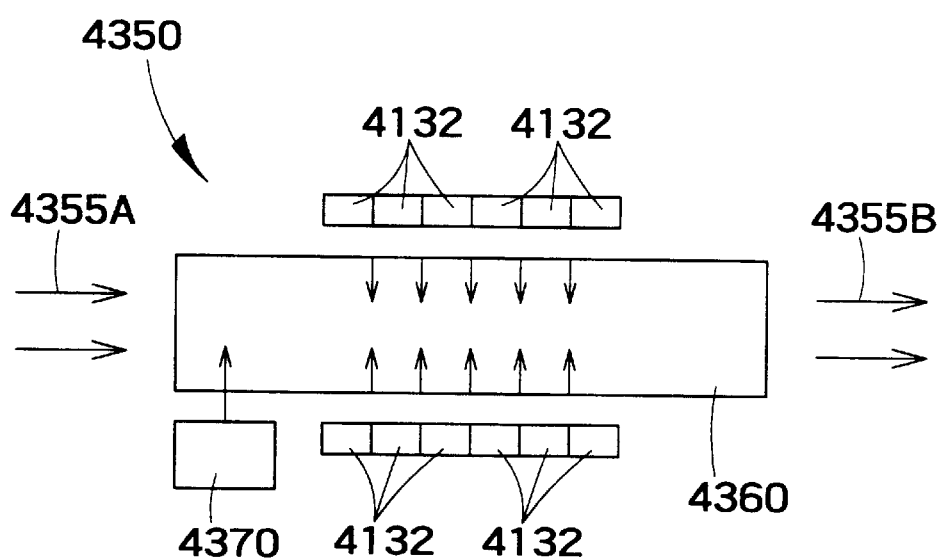
FIG. 133 is a schematic diagram showing a purifier according to the invention.

FIG. 133 is a schematic diagram showing a purifier according to the invention. The purifier 4350 shown here includes an ozone generator 4370 and a semiconductor light emitting element 4132 disposed along a puffing circuit 4360. When water 435A is supplied to the purifying circuit 4360, it is sterilized and purified by ultraviolet rays from the semiconductor light emitting element 4132, and discharged as clean water 4355B. If ozone is solved into water by the ozone generator 4370 prior to irradiation of ultraviolet rays, the sterilizing and purifying effects is improved because of the sterilization and purification by ozone and generation of active oxygen by irradiation of ultraviolet rays.

The purifier 4350 according to the invention is also useful for air purification. When air is supplied to the purifying circuit 4360, ultraviolet rays are irradiated to the air from the semiconductor light emitting device 4132 to sterilize and purify the air. When a heater, not shown, is added to heat the air and discharge hot air, the sterilizing effect of the purifier can be increased. The purifier 4350 according to the invention is applicable for sterilizing and purifying interiors of medical appliances storage cases, refrigerators, and so forth.

The purifier according to the invention is higher in intensity of ultraviolet rays and purifying ability, lower in power consumption, much longer in life, and much higher in mechanical strength against vibrations and shocks than conventional purifiers using ultraviolet fluorescent lamps. Moreover, the purifier can operate for its predetermined stable output immediately after the semiconductor light emitting element 4132 is turned on. Additionally, since the purifier can be miniaturized as a whole, it can be set in any location and especially useful in aquariums for decorative fish and home baths to purify water.

Next explained is the seventh embodiment of the invention.

Figure 134:
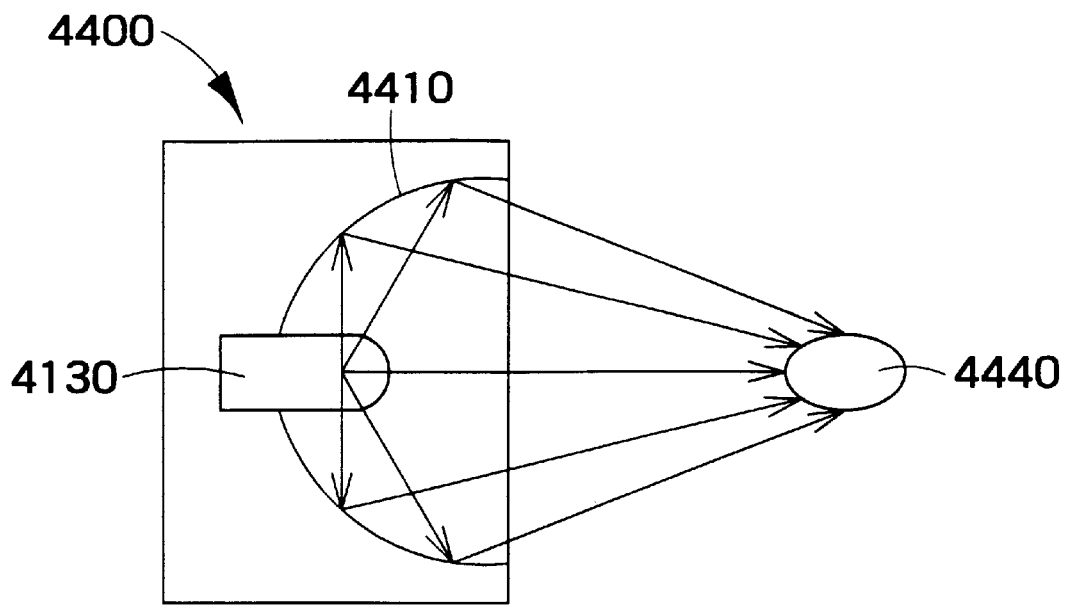
FIG. 134 is a schematic diagram of a ultraviolet irradiator according to the seventh embodiment of the invention.

FIG. 134 is a schematic diagram of a ultraviolet irradiator according to the seventh embodiment of the invention. The ultraviolet irradiator 4400 shown here includes a semiconductor light emitting element 4132 near the focal point of a concave mirror 4410. Ultraviolet rays emitted from the semiconductor light emitting element 132 are reflected and collected by the concave mirror 4410, and irradiated on a target 4440 with a high irradiation intensity. In this manner, the ultraviolet irradiator 4400 can be used for resin molding, sunburning and disinfection, for example. If a BGaN (boron gallium nitride) compound semiconductor light emitting element, explained later, is used, the ultraviolet irradiator 4400 can be used as physiotherapy instruments for generating ultraviolet rays near 300 nm which promote creation of vitamin D in human bodies.

The ultraviolet irradiator according to the invention is higher in intensity of ultraviolet rays, lower in power consumption much longer in life and much higher in mechanical strength against vibrations or shocks than conventional ultraviolet irradiators using ultraviolet fluorescent lamps. Moreover, since the invention can miniaturize the light source remarkably, the focal power is increased, and the ultraviolet irradiation density can be increased remarkably.

Next explained is the eighth example of the applied products.

Figure 135:
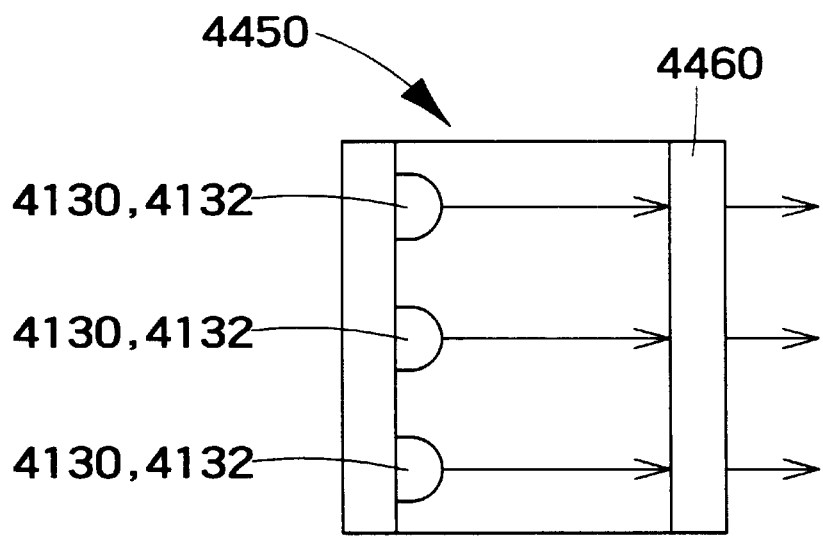
FIG. 135 is a schematic diagram showing a display device according to the invention.

FIG. 135 is a schematic diagram showing a display device according to the invention. The display device 4450 shown here includes a semiconductor light emitting element 4130 for emitting ultraviolet rays and a display panel 4460. On the back surface of the display panel 4460, characters and figures are drown by a plurality of fluorescent elements different in emission color. Ultraviolet rays emitted from the semiconductor light emitting element 4132 are converted in wavelength by the fluorescent elements on the back surface of the display panel 4460 and represent patterns of characters and figures.

Alternatively, a semiconductor light emitting device 4130 may be used instead of the semiconductor light emitting element 4132 for ultraviolet emission. In this case, white light or other visible light emitted from the semiconductor light emitting device 4130 can be used as back light to display characters or figures on the display panel.

The display device 4450 according to the invention can be used in wide applications, such as car-borne indicator lamps, display lamps of toys, alarm lamps and emergency lamps, for example.

The display device according to the invention is higher in display brightness, lower in power consumption, much longer in life and much higher in mechanical strength against vibrations and shocks than conventional display devices using fluorescent lamps or bulbs.

Next explained is the ninth example of the applied products.

Figure 136:
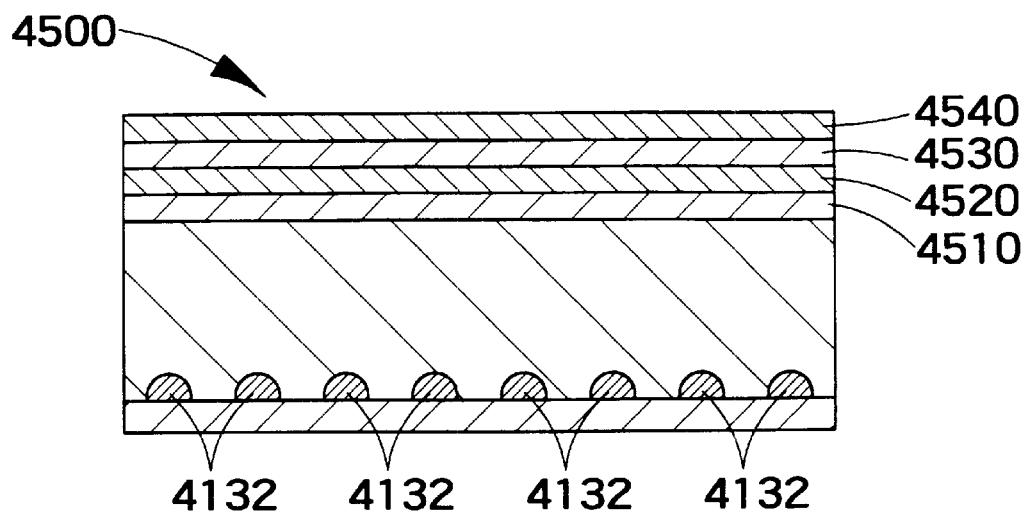
FIG. 136 is a schematic diagram shorting a semiconductor light emitting device according to the invention.

FIG. 136 is a schematic diagram showing a semiconductor light emitting device according to the invention. The semiconductor light emitting device 4500 shown here includes a semiconductor light emitting element 4132 for emitting ultraviolet rays, first optical reflector 4510, wavelength converter 4520, second optical reflector 4530 and light absorber 4540 formed in this order.

The first optical reflector 4510 has a wavelength selectivity to pass ultraviolet rays from the semiconductor light emitting element 4132 and to reflect visible light or other secondary light emitted from the wavelength converter 20 after wavelength conversion. That is, the first optical reflector 4510 has a low reflectance to ultraviolet rays from the semiconductor light emitting element 4132 and a high reflectance to light with a wavelength of the secondary light from the wavelength converter 4520.

The wavelength selectivity can be made by using a Bragg reflecting mirror, for example. That is, by alternately stacking two kinds of tin films different in refractive index, a reflecting mirror having a high reflectance to light in a particular wavelength band can be made. For example, when the wavelength of primary light is λ and the photorefractive index of the thin film layer is n, by alternately stacking two kinds of thin films each having the thickness of $\lambda/(4n)$, a reflecting mirror having a very high reflectance to primary light can be made. These two kinds of thin films preferably have a large difference in photorefractive index. Appropriate combinations are, for example, silicon oxide ($SiO_2$) and titanium oxide ($TiO_2$); aluminum nitride (AlN) and indium nitride (InN); and a thin film made of any one of these materials and a thin film of aluminum gallium arsenide, aluminum gallium phosphide, tantalum pentoxide, polycrystalline silicon or amorphous silicon.

The wavelength converter 4520 functions to absorb ultraviolet rays from the semiconductor light emitting element 4132 and to release secondary light with a longer wavelength. The wavelength converter 4520 may be a layer made of a predetermined medium containing a fluorescent element. The fluorescent element absorbs ultraviolet rays emitted from the light emitting element 4132 and is excited thereby to release secondary light with a predetermined wavelength. For example, if the ultraviolet rays emitted from the light emitting element 4132 have the wavelength of about 330 nm, the wavelength converter 4520 may be configured so that the secondary light wavelength-converted by the fluorescent element has a predetermined wavelength in the visible band or infrared band. The wavelength of the secondary light can be adjusted by selecting an appropriate material as the fluorescent element. Appropriate fluorescent materials absorbing primary light in the ultraviolet band and efficiently releasing secondary light are, for example, $Y_2O_2S:Eu$ or $La_2O_2S:(Eu,Sm)$ for mission of red light, $(Sr, Ca, Ba, Eu)_{10}(PO_4)_6.C_{12}$ for emission of blue light, and $3(Ba, Mg, Eu, Mn)O.8Al_2O_3$ for emission of green light. By mixing these fluorescent materials by an appropriate ratio, substantially all colors in the visible band can be expressed.

Most of these fluorescent materials have their absorption peaks in the wavelength band of about 300 to 380 nm. Therefore, in order to ensure efficient wavelength conversion by the fluorescent materials, the semiconductor light emitting element 4132 is preferably configured to emit ultraviolet rays in the wavelength band near 330 nm.

Next explained is the second optical reflector 4530. The optical reflector 4530 is a reflective mirror having a wavelength selectivity, and functions to reflect ultraviolet rays and pass secondary light in the light entering from the wavelength converter 4520. That is, the optical reflector 4530 behaves as a cut-off filter or a band pass filter which reflects light with the wavelength of the ultraviolet rays and passes light with the wavelength of the secondary light. It may be a Bragg reflecting mirror, for example, as explained before.

The optical reflector 4530 made in this manner reflects and returns ultraviolet rays passing through the wavelength converter 4520 back to same with a high efficiency. The returned ultraviolet rays are then wavelength-converted by the wavelength converter 4520 and permitted to pass through the optical reflector 4530 as secondary light. That is, by locating the optical reflector 4530 adjacent to the emission end of the wavelength converter 4520, it is possible to prevent leakage of the ultraviolet rays and to return part of the ultraviolet rays passing through the wavelength converter 520. Therefore, the ultraviolet rays can be efficiently converted in wavelength. The optical reflector 4530 also functions to reflect ultraviolet rays which undesirably enter into the element from the exterior. It is therefore prevented that the wavelength converter 4520 is excited by external turbulent light into undesirable emission.

Next explained is the light absorber 4540. The light absorber 4540 has a wavelength selectivity to absorb ultraviolet rays with a high efficiency and to pass secondary light. That is, the light absorber 4540 has absorption characteristics in which the absorptance is high to light with the wavelength of the ultraviolet rays, and low to light with the wavelength of the secondary light. The light absorber 4540 with such characteristics can be made of an absorber dispersed in a translucent medium. Absorbers usable here are, for example, cadmium red or red oxide for red secondary light, and cobalt blue or ultramarine blue for blue secondary light.

By using the light absorber 4540, part of ultraviolet rays passing through the optical reflector 4530 is absorbed and prevented from leakage to the exterior. At the same time, the spectrum of extracted light can be adjusted to improve the chromatic pureness. Additionally, the light absorber 4540 absorbs ultraviolet rays entering from the exterior and prevents that such external turbulent light excites the wavelength converter 4520 into undesired emission.

In the device shown here, ultraviolet rays emitted from the semiconductor light emitting element 4132 enter into the wavelength converter 4520 through the first optical reflector 4510 and wavelength-converted into secondary light. Part of the ultraviolet rays passing through the wavelength converter 4520 without being wavelength-converted therein is reflected by the second optical reflector 4530 back to the wavelength converter 520. Part of the ultraviolet rays passing even through the optical reflector 4530 is absorbed by the light absorber 4540 and prevented from external leakage.

Light components going toward the second optical reflector 4510 in the secondary light from the wavelength converter 4520 pass through the optical reflector 4530 and the light absorber 4540, and can be extracted to the exterior. Light components going toward the semiconductor light emitting element 4132 in the secondary light from the wavelength converter 4520 are reflected by the first optical reflector 4510, then pass through the optical reflector 4530 and the light absorber 4540, and can be extracted to the exterior.

In a device without the first optical reflector 4510, secondary light emitted from the wavelength converter 4520 toward the semiconductor light emitting element 4132 is absorbed or randomly reflected by the semiconductor light emitting element 4132, and cannot be extracted effectively. In contract, in the device according to the invention, the first optical reflector 4510 reflects the secondary light emitted from the wavelength converter 520 toward the semiconductor light emitting element 4132, and makes it be extracted efficiently. That is, light is reciprocated between two optical reflectors until it is wavelength-converted. Therefore, most of light is finally wavelength-converted and extracted. Thus, the invention realizes a highly efficient light emitting device having a high extraction efficiency.

Next explained are details of the semiconductor light emitting element 4132 suitable for use in the invention to emit ultraviolet rays.

Figure 137:
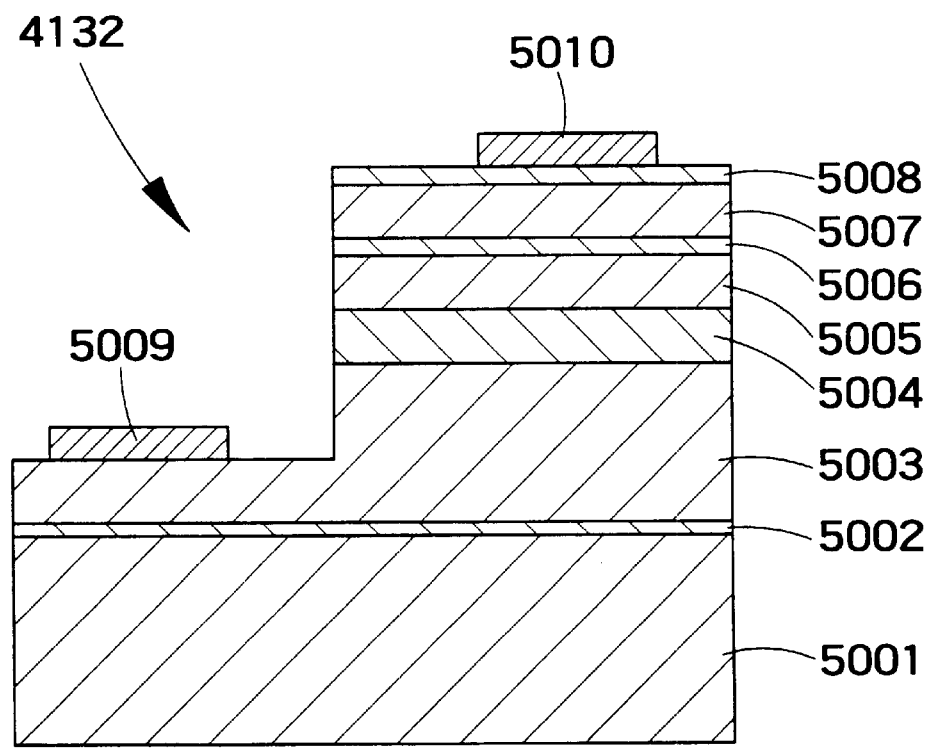
FIG. 137 is a schematic diagram showing a cross-sectional aspect of the semiconductor light emitting element 4132 suitable for use in the invention.

FIG. 137 is a schematic diagram showing a cross-sectional aspect of the semiconductor light emitting element 4132 suitable for use in the invention. The semiconductor light emitting element 4132 used here is a light emitting diode (LED) for emission in the ultraviolet wavelength band. As illustrated in FIG. 137, the semiconductor light emitting element 4132 includes semiconductor layers 5002 through 5008 stacked on a sapphire substrate 5001. Metal organic chemical vapor deposition (MOCVD), for example, may be used for crystalline growth of these semiconductor layers. Appropriate thicknesses and growth temperatures of respective semiconductor layers are as follows.

| | | |
|---|---|---|
| GaN buffer layer 5002 | 0.05 $\mu$m | 550° C. |
| n-GaN contact layer 5003 | 4.0 $\mu$m | 1100° C. |
| n-AlGaN cladding layer 5004 | 0.2 $\mu$m | 1100° C. |
| n-BGaN active layer 5005 | 0.5 $\mu$m | 1200° C. |
| p-AlGaN first cladding layer 5006 | 0.05 $\mu$m | 1100° C. |
| p-AlGaN second cladding layer 5007 | 0.2 $\mu$m | 1100° C. |
| p-GaN contact layer 5008 | 0.05 $\mu$m | 1100° C. |

Electrodes 5009 and 5010 for introducing electric current are formed on the n-GaN contact layer 5003 and p-GaN contact layer 5008, respectively. The semiconductor light emitting element 4132 is different from conventional elements in using a gallium nitride compound semiconductor containing boron (B) as its active layer 5005 and using AlGaN as layers adjacent to the active layer 5005. Development of crystals containing boron has been progressed mainly on BN. SiC was used as the substrate crystal and a high crystalline growth temperature as high as approximately 1300° C. was required. However, for incorporating B into GaN, there was the problem that B has a low solubility to GaN crystal and a large lattice mismatch with SiC used as the substrate. Therefore, no BGaN tertiary mixed crystal with a high quality in flatness of the crystalline surface morphology, for example, could be obtained.

An excellent feature of the semiconductor light emitting element 4132 shown here lies in promising growth of a high-quality BGaN crystal by using AlGaN containing Al highly resistant to heat as the underlying layer of GBaN. That is, even when the growth temperature is raised to 1200° C. relatively high for growth of gallium nitride compounds after AlGaN is grown under 1100° C., the surface of the crystal is maintained smooth, and growth of good-quality smooth BGaN crystal is ensured.

According to experiments by the inventor, when the growth temperature was raised further, surface roughness became apparent probably due to dropping of N from the surface of AlGaN, and lattice mismatching with AlGaN increased. That is, smoothness of the surface of the grown BGaN layer degraded. As the concentration of B increased, Smoothness of the crystal surface tended to degrade as the concentration B increased, and the mixture ratio (X) of B in $B_xGa_{1-x}N$ crystal with acceptably smooth surface was not higher than 0.1. Incorporation of B into a mixed crystal with a higher concentration is still difficult.

However, the mixed crystal ratio the inventor obtained was confirmed to be sufficient for a light emitting element for ultraviolet bands and its wavelength was confirmed to be within 365 to 300 nm.

Another advantage of the structure shown here lies in that a light emitting portion containing BGaN can be grown on the relatively thick n-GaN contact layer 5003. In order to make the element structure shown in FIG. 137, it is necessary to expose the n-type contact layer 5003 by etching the semiconductor layer upon making the n-side electrode 5009. For example allowance in processing accuracy during the etching process, the n-type contact layer 5003 is preferably grown relatively thick. However, BGaN mixed crystal is difficult to grow thick, and hence degrades the production yield in the etching process. Therefore, BGaN mixed crystal is not suitable for use as the n-type contact layer.

BGaN mixed crystal has a mixture ratio of B which is in lattice matching with a 6H-type SiC substrate. When it is grown on an electrically conductive SiC substrate, the etching process for making the electrode is not necessary, and thick crystal need not be made. However, the crystalline grown itself is difficult because the ratio of B in the mixed crystal is as high as 0.2, and the SiC substrate becomes opaque to wavelengths of ultraviolet rays. Therefore, it does not simply contribute to improvements of element characteristics.

For the above-explained reasons, the structure of the semiconductor light emitting element 4132 according to the invention, in which the BGaN light emitting layer is stacked on the GaN/AlGaN layers, facilitates growth of thick and smooth GaN/AlGaN layers without the need for lattice matching conditions, and is very effective to realize LED having BGaN as its light emitting layer.

Based on the structure shown in FIG. 137, a sample LED was prepared by making a semiconductor multi-layered structure which includes a $B_xGa_{1-x}N$ active layer 5005 with the mixture ratio (X) of B being 0.05, p-$A_yGa_{1-y}N$ first cladding layer 5006 lath the mixture ratio (Y) of Al being 0.3, n-$Al_zGa_{1-z}N$ cladding layer 1004 and p-$Al_zGa_{1-z}N$ cladding layer 5007 with the mixture ratio (Z) of Al being 0.2, and by processing it into chips of the size 350 μm×350 μm. As a result ultraviolet emission with emission spectral peaks of approximately 330 nm was obtained. The emission intensity responsive to the driving current of 20 mA was approximately 10 μW.

Figure 138:
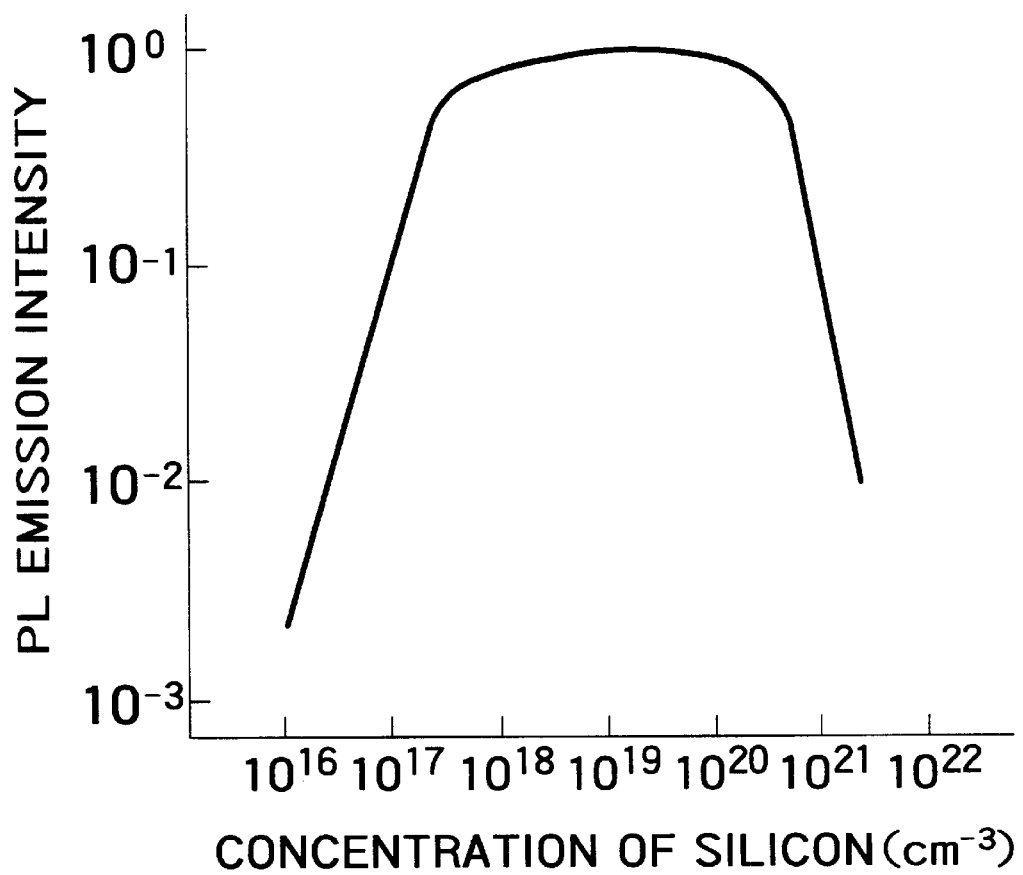
FIG. 138 is a graph showing the relation between concentration of silicon and photoluminescence (PL) emission intensity when silicon (Si) is doped into BGaN.

FIG. 138 is a graph showing the relation between concentration of silicon and photoluminescence (PL) emission intensity when silicon (Si) is doped into BGaN. The abscissa indicates concentration of silicon in BGaN, and the ordinate indicates PL emission intensity in arbitrary unit. It is known from the graph that emission intensity of LED changes with concentration of silicon. That is, as the concentration of silicon increases, emission intensity suddenly increases from near 1E16 $cm^{-3}$, maximizes near approximately 1E18 to 1E20 $cm^{-3}$, and suddenly decreases with higher concentrations of silicon. According to the inventor's experiment, even when the mixture ratio of B was changed, this tendency of changes in emission intensity was the same. In the layer structure shown in FIG. 137, when silicon was doped into the BGaN active layer 5005 by 1E19 $cm^{-3}$, the emission wavelength remained 330 nm, and emission intensity responsive to 20 mA was improved to approximately 2 mW. As a result of an additional experiment by changing concentration of silicon in the active layer, concentrations of silicon ranging from 1E17 $cm^{-3}$ to 1E21 cm were confirmed to be practically appropriate for improving characteristics and for making a stacked structure.

Figure 139:
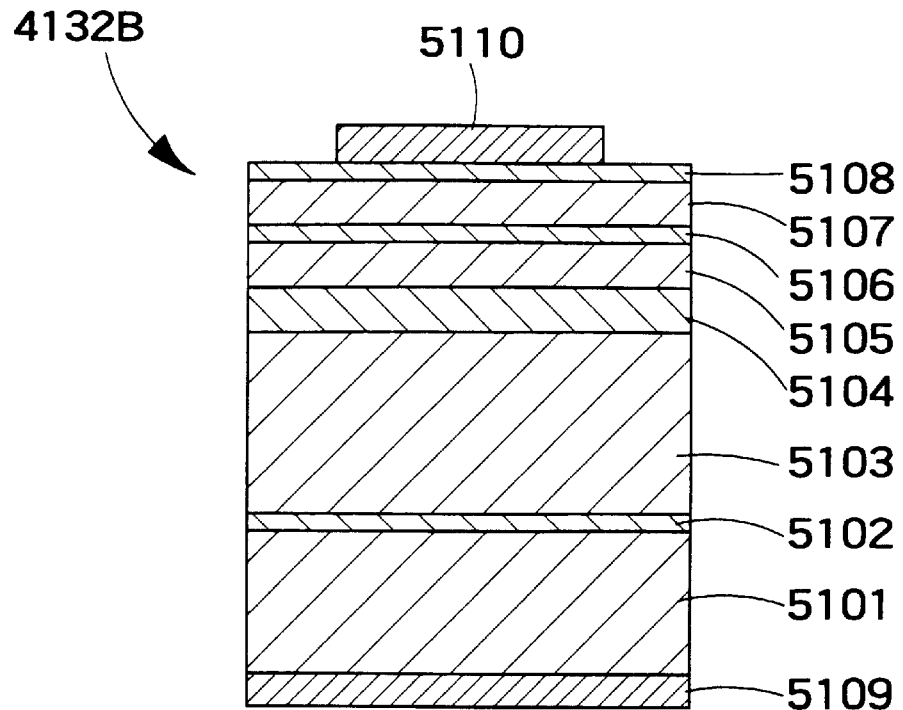
FIG. 139 is a diagram showing a schematic cross-sectional aspect of ultraviolet emission type semiconductor light emitting element according to another embodiment of the invention.

FIG. 139 is a diagram showing a schematic cross-sectional aspect of ultraviolet emission type semiconductor light emitting element according to another embodiment of the invention. The semiconductor light emitting element 4132B shown here has a multi-layered structure grown on a 6H-type SiC substrate 5101. The semiconductor light emitting element 4132B is substantially the same as the element explained with reference to FIG. 137 in thicknesses and growth temperatures of respective layers, but different therefrom in the GaN buffer layer 5102 being doped with n-type impurities and in the n-side electrode 5109 being formed on the bottom surface of the SiC substrate 5101. For growth of the crystals, metal organic chemical vapor deposition (MOCVD), for example, may be used. As explained before, when the 6H-type SiC substrate 1101 is used, the element 4132B becomes opaque to light in ultraviolet wavelength bands, and part of light radiated toward the substrate cannot be extracted to the exterior of the light emitting element. However, since the effective lattice mismatch ratio of the 6H-type SiC substrate with GaN is 3.4%, which is smaller than 13.8% of a sapphire substrate, then density of dislocation and other various crystallographic defects caused by lattice mismatch can be decreased. Thus, the quality of the crystal layer underlying the BGaN active layer 5105 is improved, which results in improving the crystallographic quality of the BGaN layer 5105 as well and in improving emission characteristics of the light emitting element. That is, an advantage of employment of the 6H-type SiC substrate 5101 is an improvement of emission characteristics by improvement of the crystalline property.

Based on the structure shown in FIG. 139, LED was prepared by making a multi-layered structure which includes a $B_xGa_{1-x}N$ active layer 5105 with the mixture ratio (X) of B being 0.05, p-$Al_yGa_{1-y}N$ first cladding layer 5106 with the mixture ratio (Y) of Al being 0.3, n-$Al_zGa_{1-z}N$ cladding layer 5104 and p-$Al_zGa_{1-z}N$ cladding layer 5107 with the mixture ratio (Z) of Al being 0.2, and by processing it into chips of the size 350 μm×350 μm. As a result ultraviolet emission with emission spectral peaks of approximately 330 nm was obtained. With an element prepared by doping silicon into the $B_xGa_{1-x}N$ active layer 5105 so that the concentration of silicon in the crystal be 1E19 $cm^{-3}$, emission intensity responsive to the driving current of 20 mA was approximately 1.3 mW.

Figure 140:
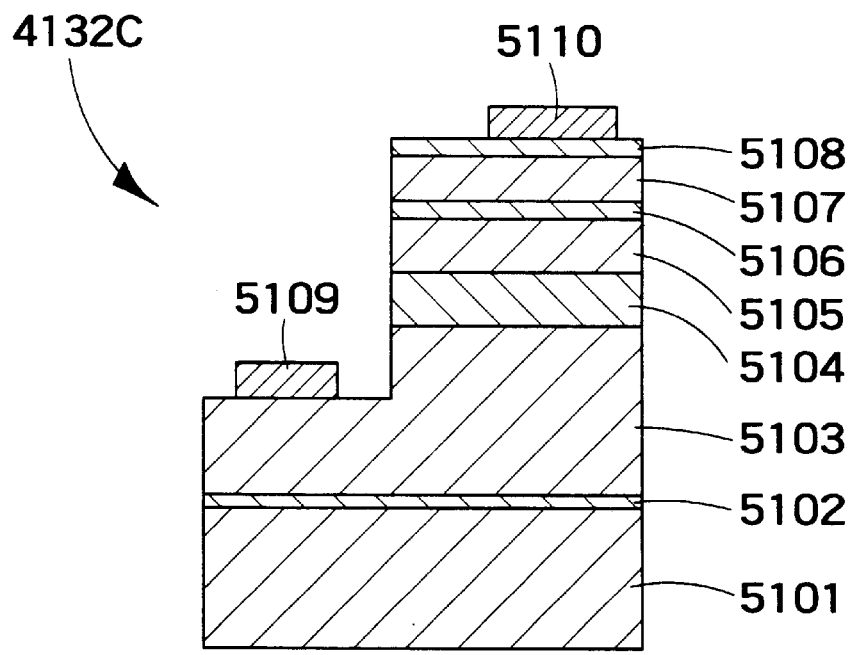
FIG. 140 is a cross-sectional schematic view showing a modified version of the semiconductor light emitting element 4132B shown in FIG. 139.
Figure 141:
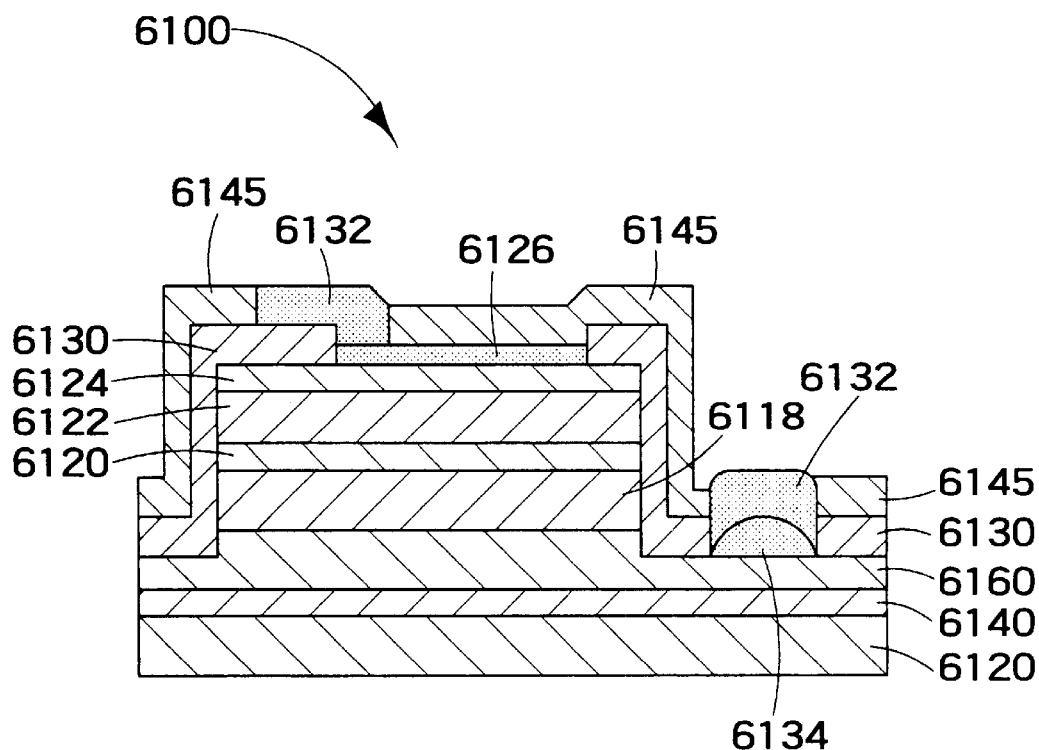
FIG. 141 is a cross-sectional view schematically showing a conventional semiconductor light emitting element.

FIG. 140 is a cross-sectional schematic view showing a modified version of the semiconductor light emitting element 4132B shown in FIG. 139. In the semiconductor light emitting element 4132C shown here, the n-side electrode 5109 is made by etching the semiconductor multi-layered structure of the semiconductor light emitting element 4132B from the top surface to expose the n-GaN contact layer 5103. Here again, influences given to the BGaN active layer important for element characteristics are the same, and its usefulness is great.

Above-explained embodiments of the invention are not limited to illustrated structures or proposed manufacturing methods. Although explanation has been made as using BGaN mixed crystal as the light emitting layer, any BInAlGaN compound material may be used other than BGaN tertiary compounds, as far as a heterojunction for confinement of injected carriers is formed.

Also the contact layer forming the p-side electrode is not limited to the GaN layer, any material selected from InAlGaN compounds will satisfy its characteristics, and materials having an absorption loss to emission from the active layer will sufficiently satisfy the characteristics provided the layer is made thin. Moreover, although explanation has been made on LED, the invention is applicable also to gallium nitride compound semiconductor lasers (LDs).

Also in other respects, the invention can be modified or changed in various modes without departing from the concept of the invention.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the show embodiments which can be embodied without departing from the principle of the invention as set forth in the appended claims.

What is claimed is:

1. A semiconductor light emitting element comprising:
   a light emitting layer for emitting primary light having a first wavelength;
   a wavelength converter located in the light extraction side of said light emitting layer to absorb said primary light emitted from said light emitting layer and to emit secondary light having a second wavelength different from said first wavelength; and a first optical reflector located in the light extraction side of said wavelength converter, and having a low reflectance to said secondary light emitted from said wavelength converter and a high reflectance to said primary light emitted from said light emitting layer.

2. The semiconductor light emitting element according to claim 1 wherein said light emitting layer contains as its major component a material selected from the group consisting of gallium nitride compound semiconductors, ZnSe, ZnS, ZnSSe, SiC and BN, said first wavelength is not longer than 380 nm, said wavelength converter contains a fluorescent material, and said secondary light is a visible light.

3. The semiconductor light emitting element according to one of claim 1 further comprising a light absorber located in the light extraction side of said wavelength converter, and having a low absorptance to said secondary light emitted from said wavelength converter and a high absorptance to said primary light emitted from said light emitting layer.

4. The semiconductor emitting element according to claim 3 wherein said first optical reflector is located between said light emitting layer and said light absorber.

5. A semiconductor light emitting element comprising:
a light emitting layer for emitting primary light having a first wavelength;
a wavelength converter located in the light extraction side of said light emitting layer to absorb said primary light emitted from said light emitting layer and to emit secondary light having a second wavelength different from said first wavelength;
a second optical reflector located on one side of said light emitting layer opposite from the light extraction side to reflect said primary light; and
a first optical reflector located in the light extraction side of said wavelength converter, and having a low reflectance to said secondary light emitted from said wavelength converter and a high reflectance to said primary light emitted from said light emitting layer.

6. A semiconductor light emitting element comprising:
a light emitting layer for emitting primary light having a first wavelength;
a wavelength converter located in the light extraction side of said light emitting layer to absorb said primary light emitted from said light emitting layer and to emit secondary light having a second wavelength different from said first wavelength;
a third optical reflector configured to enclose said light emitting layer except the light extraction part to reflect said primary light emitted from said light emitting layer; and
a first optical reflector located in the light extraction side of said wavelength converter, and having a low reflectance to said secondary light emitted from said wavelength converter and a high reflectance to said primary light emitted from said light emitting layer.

7. A semiconductor light emitting element comprising:
a light emitting layer for emitting primary light having a first wavelength;
a wavelength converter located in the light extraction side of said light emitting layer to absorb said primary light emitted from said light emitting layer and to emit secondary light having a second wavelength different from said first wavelength; and
a fourth optical reflector located between said light emitting layer and said wavelength converter, and having a low reflectance to said primary light and a high reflectance to said secondary light.

8. The semiconductor light emitting element according to claim 7 wherein said light emitting layer contains as its major component a material selected from the group consisting of gallium nitride compound semiconductors, ZnSe, ZnS, ZnSSe, SiC and BN, said first wavelength is not longer than 380 nm, said wavelength converter contains a fluorescent material, and said secondary light is a visible light.

9. The semiconductor light emitting element according to one of claim 7 further comprising a light absorber located in the light extraction side of said wavelength converter, and having a low absorptance to said secondary light emitted from said wavelength converter and a high absorptance to said primary light emitted from said light emitting layer.

10. The semiconductor light emitting element according to claim 7 further comprising a first optical reflector located in the light extraction side of said wavelength converter, and having a low reflectance to said secondary light emitted from said wavelength converter and a high reflectance to said primary light emitted from said light emitting layer.

11. A semiconductor light emitting device comprising:
a packaging member;
a semiconductor light emitting element packaged on said packaging member to emit primary light having a first wavelength;
a wavelength converter located in the light extraction side of said light emitting element to absorb said primary light emitted from said light emitting element and to emit secondary light having a second wavelength different from said first wavelength; and
a first optical reflector located in the light extraction side of said wavelength converter, and having a low reflectance to said secondary light emitted from said wavelength converter and a high reflectance to said primary light emitted from said light emitting element.

12. The semiconductor light emitting device according to claim 11 wherein said light emitting element contains in its light emitting layer a material selected from the group consisting of gallium nitride compound semiconductors, ZnSe, ZnS, ZnSSe, SiC and BN, said first wavelength is not longer than 380 nm, said wavelength converter contains a fluorescent material, and said secondary light is a visible light.

13. The semiconductor light emitting device according to claim 11 further comprising a light absorber located in the light extraction side of said wavelength converter, and having a low absorptance to said secondary light emitted from said wavelength converter and a high absorptance to said primary light emitted from said light emitting element.

14. The semiconductor light emitting device according to claim 13 wherein said first optical reflector is located between said light emitting element and said light absorber.

15. A semiconductor light emitting device comprising:
a packaging member;
a semiconductor light emitting element packaged on said packaging member to emit primary light having a first wavelength;
a wavelength converter located in the light extraction side of said light emitting element to absorb said primary light emitted from said light emitting element and to emit secondary light having a second wavelength different from said first wavelength;
a second optical reflector located on one side of said light emitting element opposite from the light extraction side to reflect said primary light; and
a first optical reflector located in the light extraction side of said wavelength converter, and having a low reflectance to said secondary light emitted from said wavelength converter and a high reflectance to said primary light emitted from said light emitting element.

16. A semiconductor light emitting device comprising:

a packaging member;

a semiconductor light emitting element packaged on said packaging member to emit primary light having a first wavelength;

a wavelength converter located in the light extraction side of said light emitting element to absorb said primary light emitted from said light emitting element and to emit secondary light having a second wavelength different from said first wavelength;

a third optical reflector configured to enclose said light emitting element except the light extraction part to reflect said primary light emitted from said light emitting element; and a first optical reflector located in the light extraction side of said wavelength converter, and having a low reflectance to said secondary light emitted from said wavelength converter and a high reflectance to said primary light emitted from said light emitting element.

17. A semiconductor light emitting device comprising:

a packaging member;

a semiconductor light emitting element packaged on said packaging member to emit primary light having a first wavelength;

a wavelength converter located in the light extraction side of said light emitting element to absorb said primary light emitted from said light emitting element and to emit secondary light having a second wavelength different from said first wavelength; and a fourth optical reflector located between said light emitting element and said wavelength converter, and having a low reflectance to said primary light and a high reflectance to said secondary light.

18. The semiconductor light emitting device according to claim 17 wherein said light emitting element contains in its light emitting layer a material selected from the group consisting of gallium nitride compound semiconductors, ZnSe, ZnS, ZnSSe, SiC and BN, said first wavelength is not longer than 380 nm, said wavelength converter contains a fluorescent material, and said secondary light is a visible light.

19. The semiconductor light emitting device according to claim 17 further comprising a light absorber located in the light extraction side of said wavelength converter, and having a low absorptance to said secondary light emitted from said wavelength converter and a high absorptance to said primary light emitted from said light emitting element.

20. The semiconductor light emitting device according to claim 17 further comprising a first optical reflector located in the light extraction side of said wavelength converter, and having a low reflectance to said secondary light emitted from said wavelength converter and a high reflectance to said primary light emitted from said light emitting element.

* * * * *